(12) United States Patent
Fukuzawa et al.

(10) Patent No.: US 6,338,899 B1
(45) Date of Patent: Jan. 15, 2002

(54) MAGNETORESISTANCE EFFECT ELEMENT, MAGNETIC HEAD, MAGNETIC HEAD ASSEMBLY, MAGNETIC STORAGE SYSTEM

(75) Inventors: Hideaki Fukuzawa; Yuzo Kamiguchi; Katsuhiko Koui; Shin-ichi Nakamura; Hitoshi Iwasaki, all of Kanagawa-ken; Kazuhiro Saito, Tokyo; Hiromi Fuke, Kanagawa-ken; Masatoshi Yoshikawa, Kanagawa-ken; Susumu Hashimoto, Kanagawa-ken; Masashi Sahashi, Kanagawa-ken, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/332,440

(22) Filed: Jun. 14, 1999

(30) Foreign Application Priority Data

| Jun. 30, 1998 | (JP) | 10-185475 |
| Aug. 24, 1998 | (JP) | 10-237821 |
| Apr. 2, 1999 | (JP) | 11-097072 |

(51) Int. Cl.$^7$ .............................................. G11B 5/66
(52) U.S. Cl. .................. 428/332; 428/336; 428/694 T; 428/694 TS; 428/694 TM; 428/692; 428/900; 360/113; 338/32 R; 324/252
(58) Field of Search ................. 428/694 T, 694 TS, 428/694 TM, 692, 332, 336, 900; 360/113, 338, 32 R; 324/252

(56) References Cited

U.S. PATENT DOCUMENTS 5,422,571 A * 6/1995 Gurney ..................... 324/252
5,465,185 A * 11/1995 Heim ........................ 360/113
5,688,605 A 11/1997 Iwasaki et al. ............ 428/611

FOREIGN PATENT DOCUMENTS

JP 10-261209 9/1998

OTHER PUBLICATIONS

M. Saito, et al., Digests of the 22$^{nd}$ Conf. On Magnetism in Japan, p. 309, "PtMn Dual Spin Valve Films Using Co/Ru/Co Synthetic Ferrimagnet Pinned Layers," 1998.

* cited by examiner

Primary Examiner—Leszek Kiliman
(74) Attorney, Agent, or Firm—Oblon, Spivak, McClelland, Maier & Neustadt, P.C.

(57) ABSTRACT

Disclosed are a high-sensitivity and high-reliability magnetoresistance effect device (MR device) in which bias point designing is easy, and also a magnetic head, a magnetic head assembly and a magnetic recording/reproducing system incorporating the MR device. In the MR device incorporating a spin valve film, the magnetization direction of the free layer is at a certain angle to the magnetization direction of a second ferromagnetic layer therein when the applied magnetic field is zero. In this, the pinned magnetic layer comprises a pair of ferromagnetic films as antiferromagnetically coupled to each other via a coupling film existing therebetween. The device is provided with a means of keeping the magnetization direction of either one of the pair of ferromagnetic films constituting the pinned magnetic layer, and with a nonmagnetic high-conductivity layer as disposed adjacent to a first ferromagnetic layer on the side opposite to the side on which the first ferromagnetic layer is contacted with a nonmagnetic spacer layer. With that constitution, the device has extremely high sensitivity, and the bias point in the device is well controlled.

35 Claims, 43 Drawing Sheets

EMBODIMENT IN TOP TYPE

EMBODIMENT IN BOTTOM P TYPE

PROBLEMS WHEN FREE LAYER IS THIN:
Hs'<Hs (INCLINATION BECOMES SHARP)
→ HARD TO ADJUST BIAS POINT
- ΔV'<ΔV (HR RATIO DECREASES)
→ CANNOT PRODUCE OUTPUT SIGNAL

Hshift = − Hin + Hpin − Hcu.
(OR + Hcu)

CONCEPTUAL GRAPH BIAS POINT (b.p.)
INDICATED ON TRANSFER CURVE

Sense Current: $I_s = I_1 + I_2 + I_3$ [mA]

DIAGRAMMATIC VIEW OF DIVIDED CURRENT FLOWS OF SPIN VALVE FILM

BIAS POINT OF FIRST COMPARATIVE CASE (No Spin Filter x Normal Pin)
 (- Controllability becomes bad to bring large Hpin to just bias by large Hcu    (height dependency is large)
 - Output drops because no Spin-Filter effect is utilized)

BIAS POINT OF 2ND COMPARATIVE CASE (SPIN FILTER EXISTS X NORMAL PIN)
(b.p. INCREASES CONSIDERABLY MORE THAN 50% BECAUSE Hpin IS LARGE AND Hcu IS SMALL)

BIAS POINT OF THIRD COMPARATIVE CASE
(-Bias point is stabilized when free layer is thick just by decreasing Hcu.
-When free layer is thinned, influence of Hpin is large and b.p. deviates. MR also deteriorates)

BIAS POINT OF FOURTH COMPARATIVE CASE (No Spin Filter x Synthetic AF)
(-Just bias cannot be obtained even when current is
flown in either direction when Hin and Hpin are small and
Hcu     is large near the place where -Hin+Hpin is almost 50%)

Fig.20
DIFFRACTION PATTERN
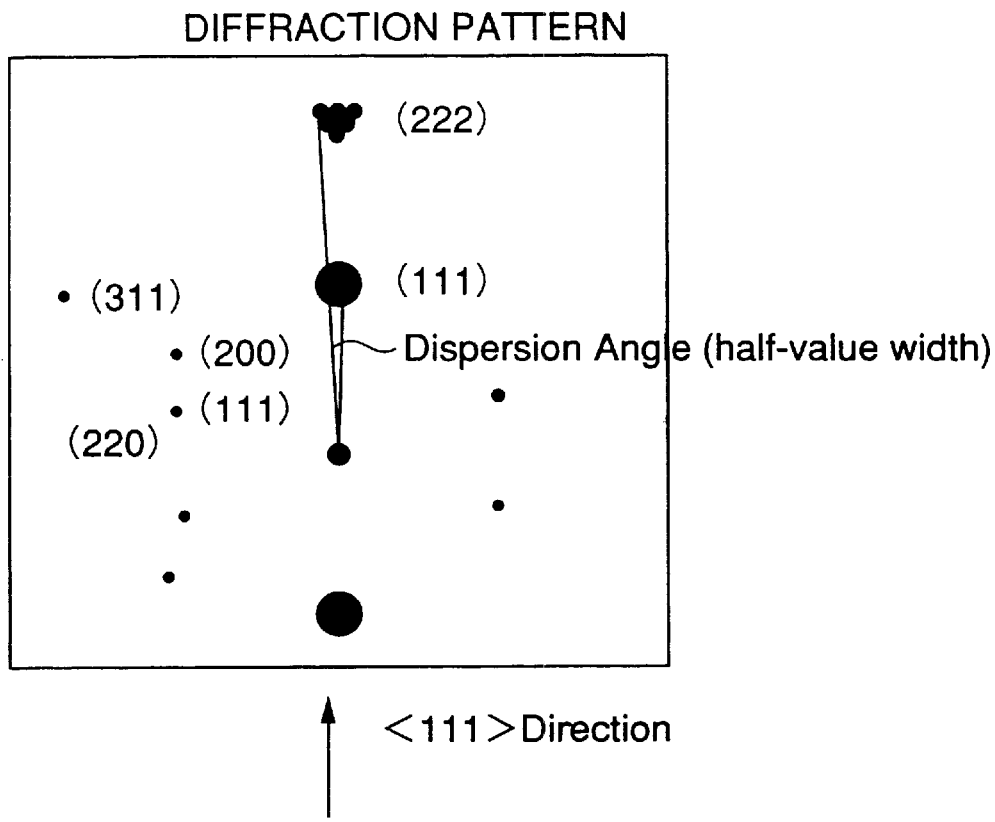
<111> Direction
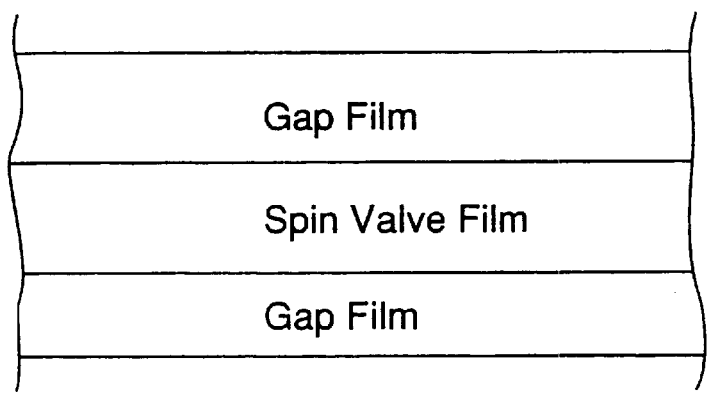
SECTIONAL VIEW OF SPIN VALVE ELEMENT PART

Fig.24A

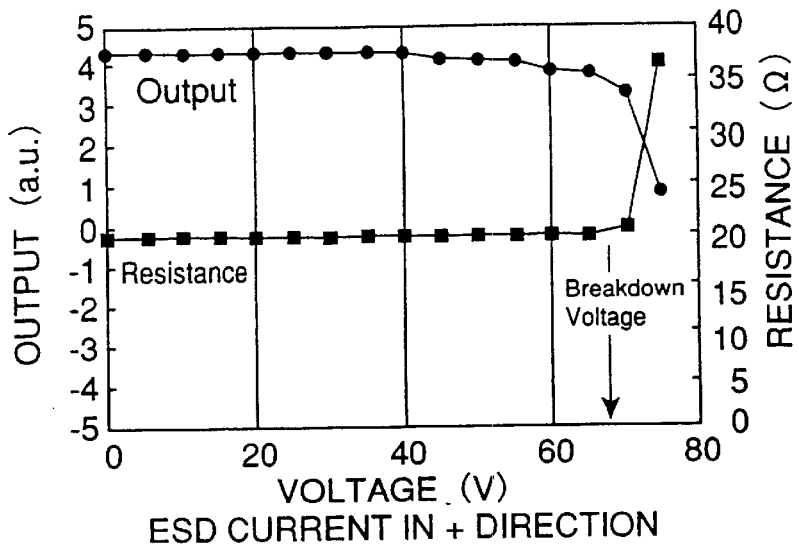

ESD CURRENT IN + DIRECTION

Fig.24B

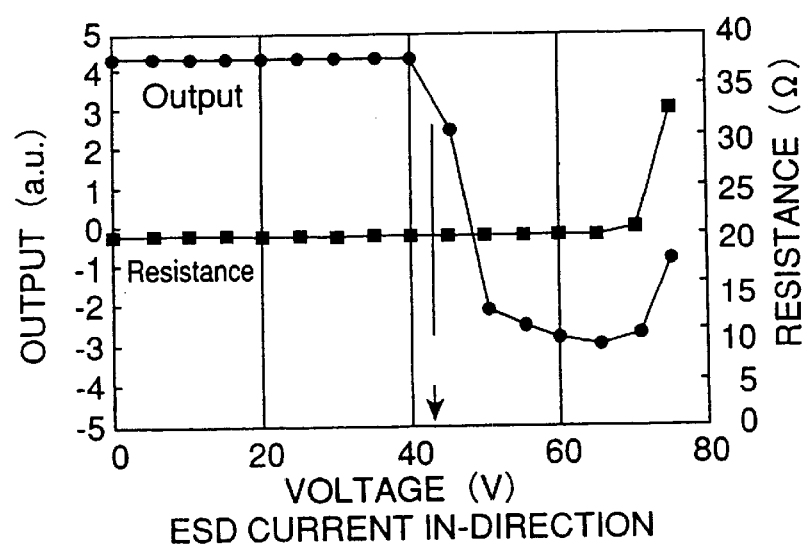

ESD CURRENT IN-DIRECTION

STRUCTURE OF SV FILM

{ VOLTAGE : ESD Voltage by Human Body Model.
ESD CURRENT : + Direction is direction in which ESD Current
Magnetic Field is applied in the Same Direction with Magnetization
of Ferro-magnetic Layer B }

WHEN THICKNESS OF MAGNETIC LAYER OF
FERRO-MAGNETIC LAYER A IS EQUAL WITH THAT OF
FERRO-MAGNETIC LEYER B

STRUCTURE OF SV FILM
{ VOLTAGE : ESD Voltage by Human Body Model
ESD CURRENT : + Direction is direction in which ESD Current
Magnetic Field is applied in the Same Direction with Magnetization
of Ferro - magnetic Layer B }

WHEN THICKNESS OF MAGNETIC LAYER OF
FERRO-MAGNETIC LAYER A > THICKNESS OF MAGNETIC
LAYER OF FERRO-MAGNETIC LEYER B

MAGNETORESISTANCE EFFECT ELEMENT, MAGNETIC HEAD, MAGNETIC HEAD ASSEMBLY, MAGNETIC STORAGE SYSTEM

FIELD OF THE INVENTION

The present invention relates to a magnetoresistance effect device, a magnetic head, a magnetic head assembly, and a magnetic recording/reproducing system. More precisely, it relates to a magnetoresistance effect device, a magnetic head, a magnetic head assembly, and a magnetic recording/reproducing system, in which is used a giant magnetoresistance effect element having high sensitivity and high reliability.

BACKGROUND OF THE INVENTION

The recent tendency in the art is toward small-sized, large-capacity magnetic recording media, for which there are increasing great expectations of high-power MR heads (magnetoresistance effect heads). For the MR film which is the basic constituent element in those MR heads, widely noticed is a spin valve film having a multi-layered magnetic film with a sandwich structure of magnetic layer/nonmagnetic layer/magnetic layer, in which one magnetic layer is pinned for its magnetization owing to the magnetic coupling bias applied thereto (this layer may be referred to as a "pinned magnetic layer" or "pinned layer") while the other magnetic layer is reversed for its magnetization owing to the applied magnetic field (this layer may be referred to as a "free magnetic layer" or "free layer"). The spin valve film of that type produces a giant magnetoresistance effect (GMR) through the relative angle change in the magnetization direction between those two magnetic layers.

As other types of MR films, known are an anisotropic magnetoresistance effect film (AMR film) made of an NiFe alloy or the like, an artificial lattice film, etc. Though smaller than that in an artificial lattice film, the MR ratio in a spin valve film is at least 4% and is much larger than that in an AMR film. A spin valve film can saturate its magnetization even in a low magnetic field, and is therefore suitable to MR heads. MR heads incorporating such a spin valve film receive much expectations for their practical applications. Specifically, for increasing the recording density in magnetic recording on magnetic discs and the like, high-sensitivity GMR heads (giant magnetoresistance effect heads) are indispensable.

Early GMR heads incorporate, in its GMR device, a spin valve film that comprises a free layer, a nonmagnetic spacer layer, a pinned magnetic layer and an antiferromagnetic layer. In those, the increase in the sensitivity of the film is indispensable for increasing the recording density through reduction in the recording track width. However, if the free layer is thinned so as to increase the sensitivity of the film for that purpose, the stray magnetic field from the pinned magnetic layer will shift the bias point. In that case, it is often difficult to effectively correct the thus-shifted operating point by the current magnetic field.

On the other hand, a so-called laminated pinned ferromagnetic layer (hereinafter referred to as "SyAF", or "Synthetic AF") has been proposed (U.S. Pat. No. 5,465,185), which comprises two ferromagnetic layers as antiferromagnetically coupled via an antiferromagnetically coupling layer existing therebetween. In principle, the antiferromagnetically coupled, pinned layer of that type would produce very small stray magnetic field, thereby readily ensuring the operating point.

One case of a spin valve film with SyAF is referred to, in which one of the two ferromagnetic layers adjacent to the nonmagnetic spacer layer is a ferromagnetic layer A while the other adjacent to the antiferromagnetic layer is a ferromagnetic layer B and in which the ferromagnetic layer A and the ferromagnetic layer B have the same magnetic thickness, thickness x saturation magnetization. In that case, the stray magnetic fields from the layer A and layer B cancel each other so that there is substantially no stray magnetic field generated by the pinned layer. As a result, the pinned layer of that type is no more susceptible to a magnetic field and has the significant advantage of stable pinned magnetization at around the blocking temperature, Tb, at which the magnetic coupling bias of the antiferromagnetic layer is lost.

SUMMARY OF THE INVENTION

The problem with the present technology, that an object of the present invention is to resolve, is that the inventors found, the bias point designing in an applied sense current is difficult, especially in device using thin free layer so as to increase the sensitivity of output signal for high density recording.

In a first aspect, the present invention provide a magnetoresistance effect element that attains the object mentioned above comprising a nonmagnetic spacer layer, a first ferromagnetic layer and a second ferromagnetic layer as separated by the nonmagnetic spacer layer, in which the first ferromagnetic layer has a magnetization direction different from the magnetization direction of the second ferromagnetic layer when the applied magnetic field is zero, and the second ferromagnetic layer comprises a pair of ferromagnetic films as antiferromagnetically coupled to each other and a coupling film that separates the pair of ferromagnetic films while antiferromagnetically coupling them, and a nonmagnetic high-conductivity layer adjacent to the first ferromagnetic layer on the plane opposite to the plane at which the first ferromagnetic layer is contacted with the nonmagnetic spacer layer.

In the present invention, the magnetoresistance effect device may realize extremely high sensitivity while maintaining a good bias point. Preferably, the MR device may be in the form of a so-called spin valve device (see U.S. Pat. No. 5,206,590), in which the first ferromagnetic layer is not coupled to the second ferromagnetic layer and the magnetization directions of the two layers are perpendicular to each other at zero applied magnetic field. Preferably, the applied magnetic field to change the magnetization of the first ferromagnetic layer may be smaller than that to change the magnetization of the second ferromagnetic layer, and the magnetization of the second ferromagnetic layer is pinned to such a degree that the magnetization direction may not change even in the presence of an applied magnetic field.

In the present invention, the nonmagnetic high-conductivity layer may contain an element of which the specific resistance in bulk at room temperature is not larger than 10 $\mu\Omega$cm, thereby realizing good characteristic, namely, high MR ratio owing to the spin filter effect in the ultra-thin first ferromagnetic layer and low Hcu.

For high density recording and for realizing the increase in MR ratio owing to the spin filter effect of the nonmagnetic high-conductivity layer, the thickness of the first ferromagnetic layer may be between 0.5 nanometers and 4.5 nanometers.

In the present invention, the thickness of the nonmagnetic high-conductivity layer and that of the second ferromagnetic layer may be so designed that the wave asymmetry, (V1−

V2)/(V1+V2), in which V1 indicates the peak value of the reproduction output in a positive signal field and V2 indicates the peak value of the reproduction output in a negative signal field, may fall between minus 0.1 and plus 0.1.

In the present invention, the MR device may satisfy the conditions of 0.5 nanometers$\leq$tm(pin1)−tm(pin2)+t(HCL)$\leq$4 nanometers and t(HCL)$\geq$0.5 nanometers, in which t(HCL) indicates the thickness of the nonmagnetic high-conductivity layer (in terms of the Cu layer having a specific resistance of 10 $\mu\Omega$cm), and tm(pin1) and tm(pin2) indicate the magnetic thicknesses of the pair of ferromagnetic films, respectively, in the second ferromagnetic layer in terms of saturation magnetization of 1 Tesla, where pin 1 is of one of the ferromagnetic films disposed adjacent to the nonmagnetic spacer layer and pin2 is of another one of the ferromagnetic films. Satisfying the conditions noted above, the MR device may realize the wave asymmetry falling between minus 0.1 and plus 0.1 and high MR.

In the present invention, the first ferromagnetic layer may have a magnetic thickness, thickness×saturation magnetization, of smaller than 4.5 nanometer Tesla.

In the present invention, the nonmagnetic high-conductivity layer may be of a metal film that contains at least one metal element selected from the group consisting of copper (Cu), gold (Au), silver (Ag), ruthenium (Ru), iridium (Ir), rhenium (Re), rhodium (Rh), platinum (Pt), palladium (Pd), aluminium (Al), osmium (Os) and nickel (Ni), all of which are advantageous for meeting the condition of realizing low Hin.

In the present invention, the nonmagnetic high-conductivity layer may have a laminate film composed of at least two layers, for attaining low Hin and soft magnetic characteristics control. In the present invention, in the laminate film, the layer adjacent to the first ferromagnetic layer may contain copper (Cu) which is especially suitable for realizing high MR ratio, low Hcu and soft magnetic characteristics. In the laminate film, the layer not adjacent to the first ferromagnetic layer may contain at least one element selected from the group consisting of ruthenium (Ru), rhenium (Re), rhodium (Rh), palladium (Pd), platinum (Pt), iridium (Ir) and osmium (Os) all of which are especially suitable for realizing low Hin, low Hcu and soft magnetic characteristics control.

In the present invention, the nonmagnetic high-conductivity layer may have a thickness of from 0.5 nanometers to 5 nanometers and the element may realize low Hcu and high MR ratio.

In the present invention, the layer that is contacted with the nonmagnetic high-conductivity layer at the plane opposite to the plane at which the nonmagnetic high-conductivity layer is contacted with the first ferromagnetic layer may contain at least one element selected from the group consisting of tantalum (Ta), titanium (Ti), zirconium (Zr), tungsten (W), hafnium (Hf), molybdenum (Mo), and chromium (Cr), and the device may realize low Hin and high MR ratio.

In the present invention, the first ferromagnetic layer may be of a laminate film that comprises an alloy layer containing nickel iron (NiFe) and a layer containing cobalt (Co) and the device may realize high MR ratio and soft magnetic characteristics.

In the present invention, the first ferromagnetic layer may be an alloy layer containing cobalt iron (CoFe) and the element may realize high MR ratio and soft magnetic characteristics.

In the present invention, for pinning the magnetization direction of the second ferromagnetic layer, an antiferromagnetic layer may be laminated over the layer.

In the present invention, for realizing still high MR ratio even after thermal treatment in its production, the antiferromagnetic layer may be made of a material, XzMn1-z in which x indicates at least one element selected from the group consisting of iridium (Ir), ruthenium (Ru), rhodium (Rh), platinum (Pt), palladium (Pd) and rhenium (Re) and the compositional factor z falls between 5 atm. % and 40 atm. %, in the present invention.

In the present invention, the antiferromagnetic layer may be made of a material, XzMn1-z in which X indicates at least one element selected from the group consisting of platinum (Pt) and palladium (Pd) and the compositional factor z falls between 40 atm. % and 65 atm. %, and the element may maintain high MR ratio.

In the present invention, the nonmagnetic spacer may be of a metal layer containing copper (Cu) and its thickness may be between 1.5 nanometers and 2.5 nanometers and the element may realize high MR ratio for more efficiently utilizing the effect of high MR ratio by the nonmagnetic high-conductivity layer, and may also realize low Hcu.

In the present invention, the pair of ferromagnetic films as antiferromagnetically coupled to each other may have the same thickness and the difference in the magnetic thickness, thickness×saturation magnetization, between the pair of ferromagnetic films may fall between 0 nanometer Tesla and 3 nanometer Tesla, and the element may realize high MR, improved ESD resistance, and the thermal stability of the second ferromagnetic layer.

In the present invention, the antiferromagnetically layer coupling the pair of ferromagnetic films to each other may comprise Ru and its thickness may fall between 0.8 nanometers and 1.2 nanometers.

In a second aspect, the present invention provides a magnetoresistance effect device comprising a nonmagnetic spacer layer, a first ferromagnetic layer and a second ferromagnetic layer as separated by the nonmagnetic spacer layer, in which the magnetization direction of the first ferromagnetic layer differs from that of the second ferromagnetic layer when the applied magnetic field is zero, and a nonmagnetic high-conductivity layer adjacent to the first ferromagnetic layer on the plane opposite to the plane at which the first ferromagnetic layer is contacted with the nonmagnetic spacer layer, in which the thickness of the nonmagnetic high-conductivity layer and the thickness of the ferromagnetic layer are so designed that the wave asymmetry, (V1−V2)/(V1+V2), in which V1 indicates the peak value of the reproduction output in a positive signal field and V2 indicates the peak value of the reproduction output in a negative signal field, falls between minus 0.1 and plus 0.1.

For attaining the wave asymmetry of falling between minus 0.1 and plus 0.1, it may not be always necessary to employ the constitution of SyAF in the device but also a single layer. In that case, it is desirable that the second ferromagnetic layer of a single layer may have a magnetic thickness of from 0.5 nanometer Tesla to 3.6 nanometer Tesla. If the magnetic thickness of the single layer of the second ferromagnetic layer is larger than 3.6 nanometer Tesla, it may be difficult to attain the wave asymmetry noted above. On the other hand, if it is smaller than 0.5 nanometer Tesla, the MR ratio in the device will be noticeably small.

In a third aspect, the present invention provides a magnetoresistance effect device comprising a nonmagnetic spacerlayer, first and second ferromagnetic layers separated by the nonmagnetic spacer layer, in which the magnetization direction of the first ferromagnetic layer differs from that of the second ferromagnetic layer when the applied magnetic field is zero, and a nonmagnetic high-conductivity layer adjacent to the first ferromagnetic layer on the plane opposite to the plane at which the first ferromagnetic layer is contacted with the nonmagnetic spacer layer and that the device satisfies the conditions of 0.5 nanometers≦tm(pin)+ t(HCL)≦4 nanometers and t(HCL)≧0.5 nanometers, in which t(HCL) indicates the thickness of the nonmagnetic high-conductivity layer in terms of copper having a specific resistance of 10 $\mu\Omega$cm, and tm(pin) indicates the magnetic thicknesses of the second ferromagnetic layer, respectively, in the second ferromagnetic layer in terms of saturation magnetization of 1Tesla.

Satisfying the conditions noted above, the MR device may realize the wave asymmetry falling between minus 0.1 and plus 0.1 and high MR, even when the second ferromagnetic layer therein is a single layer.

In a fourth aspect, the present invention provides a magnetoresistance effect device comprising a pinned magnetic layer and a free layer as separated by a nonmagnetic spacer layer disposed therebetween, and an antiferromagnetic layer as laminated on the pinned magnetic layer for pinning the magnetization of the pinned magnetic layer, the pinned magnetic layer comprises a pair of ferromagnetic layers, a ferromagnetic layer A as disposed adjacent to the nonmagnetic spacer layer and a ferromagnetic layer B as disposed adjacent to the antiferromagnetic layer, that those ferromagnetic layers A and B are antiferromagnetically coupled to each other via an antiferromagnetically coupling layer existing therebetween, and that the close-packed plane of the antiferromagnetic layer is so oriented that the half-value width of the diffraction peak from the closed packed plane of the layer in its rocking curve appears at 8° or smaller.

In a fifth aspect, the present invention provides a magnetoresistance effect element comprising a nonmagnetic spacer layer, and first and second ferromagnetic layers separated by the nonmagnetic spacer layer, a magnetization direction of the first ferromagnetic layer being at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned antiparallel with one another and remain antiparallel in the presence of an applied magnetic field, the magnetization of the first ferromagnetic layer freely rotating in signal magnetic field. The element further comprises a pair of electrodes coupled to the magnetoresistance effect film and having respective inner edges; and a pair of longitudinal biasing layers for providing bias magnetic fields to the first ferromagnetic layer in parallel with a longitudinal direction of the first ferromagnetic layer and having respective inner edges, wherein the inner edges of the pair of electrodes are disposed between the inner edges of the pair of longitudinal biasing layers.

In a sixth aspect, the present invention provides a magnetoresistance effect device comprising a spin valve film and a pair of electrodes for supplying sense current to the spin valve film, in which the spin valve film comprises at least one nonmagnetic spacer layer and at least two magnetic layers as separated by the nonmagnetic spacer layer existing therebetween. The spin valve film is provided with a magnetoresistance effect-improving layer of being a laminate film of a plurality of metal films as disposed adjacent to the magnetic layer on the plane opposite to the plane at which the nonmagnetic spacer layer is contacted with the magnetic layer, and with a nonmagnetic layer acting as a underlayer or a protecting layer as disposed adjacent to the magnetoresistance effect-improving layer on the plane opposite to the plane at which the magnetic layer is contacted with the magnetoresistance effect-improving layer, and that the element essentially constituting the metal film of the magnetoresistance effect-improving layer that is adjacent to the magnetic layer does not form a solid solution with the element essentially constituting the magnetic layer.

In the above described element, the magnetoresistance effect-improving layer may exhibit, as its one capability as follows. In the device in which the free layer is thin, the magnetoresistance effect-improving layer acts as a nonmagnetic high-conductivity layer such as that mentioned above. In this, the interface between the ultra-thin free layer and the nonmagnetic high-conductivity layer is formed of a combination of materials not producing a solid solution therein, thereby preventing any diffusive scattering of electrons in the interface so as to improve the up-spin transmittance. With that constitution, the device maintains high MR ratio therein. As not having a solid solution phase, the interface is stable to thermal treatment and does not cause the reduction in MR ratio in the device. The magnetoresistance effect-improving layer exhibits its ability to improve the magnetoresistance effect of the device, while being based not only on its spin filter capability but also on its additional capabilities to control the microcrystal structure of the spin valve film and to reduce the magnetostriction in the film.

In one specific example, the magnetic layer adjacent to the magnetoresistance effect-improving layer may be made of Co or a Co alloy, the magnetoresistance effect-improving layer may comprise at least one element selected from Cu, Au and Ag. In another example of the device where the magnetic layer adjacent to the magnetoresistance effect-improving layer may be made of an Ni alloy, the magnetoresistance effect-improving layer may comprise at least one element selected from Ru, Ag, Cu, and Au. In the device, the magnetoresistance effect-improving layer may comprise any one or more elements of Cu, Au, Ag, Pt, Rh, Ru, Al, Ti, Zn, Hf, Pd, Ir, etc.

The magnetoresistance effect device of the invention is based on the technique of reducing the magnetostriction in the CoFe alloys and others noted above by or Au/Cu laminate film, Ru/Cu laminate film, or Au—Cu alloys. Specifically, the device comprises a spin valve film and a pair of electrodes for supplying sense current to the spin valve film, in which the spin valve film comprises one nonmagnetic spacer layer and two magnetic layers as separated by the nonmagnetic spacer layer existing therebetween, and this is characterized in that, of at least two magnetic layers, one of which the magnetization direction varies, depending on the applied magnetic field, is oriented to fcc(111), and that the d(111) lattice spacing is between 0.2055 and 0.2035 nanometers.

In a seventh aspect, the present invention provides a magnetoresistance effect device comprising a giant magnetoresistance effect film and a pair of electrodes for supplying current to the giant magnetoresistance effect film, in which the giant magnetoresistance effect film comprises at least a pair of a pinned magnetic layer and a free layer as separated by a nonmagnetic spacer layer disposed therebetween, and an antiferromagnetic layer as laminated on the pinned magnetic layer for pinning the magnetization of the pinned magnetic layer, and which is characterized in that the pinned magnetic layer comprises a pair of ferromagnetic layers, a ferromagnetic layer A as disposed adjacent to the nonmagnetic spacer layer and a ferromagnetic layer B as disposed adjacent to the antiferromagnetic layer, that those ferromagnetic layers A and B are antiferromagnetically coupled to each other via an antiferromagnetically coupling layer existing therebetween, and that the antiferromagnetic layer has a thickness of at most 20 nanometers and has a magnetic coupling coefficient, J, for the ferromagnetic layer B of at least 0.02 erg/cm$^2$ at 200° C.

In an eighth aspect, the present invention provides a magnetoresistance effect element comprising a giant magnetoresistance effect film and a pair of electrodes for supplying current to the giant magnetoresistance effect film, in which the giant magnetoresistance effect film comprises at least a pair of a pinned magnetic layer and a free layer as separated by a nonmagnetic spacer layer disposed therebetween, and an antiferromagnetic layer as laminated on the pinned magnetic layer for pinning the magnetization of the pinned magnetic layer, the pinned magnetic layer comprises a pair of ferromagnetic layers, a ferromagnetic layer A as disposed adjacent to the nonmagnetic spacer layer and a ferromagnetic layer B as disposed adjacent to the antiferromagnetic layer, those ferromagnetic layers A and B are antiferromagnetically coupled to each other via an antiferromagnetically coupling layer existing therebetween, and the antiferromagnetic layer has a thickness of at most 20 nanometers and contains at least any one of $Z_xMn_{1-x}$ (where Z is at least one selected from Ir, Rh, Ru, Pt, Pd, Co and Ni, and 0<x<0.4), $Z_xMn_{1-x}$ (where Z is at least one selected from Pt, Pd and Ni, and $0.4 \leq x \leq 0.7$), or $Z_xCr_{1-x}$ (where Z is at least one selected from Mn, Al, Pt, Pd, Cu, Au, Ag, Rh, Ir and Ru, and 0<x<1).

The magnetic head and the magnetic recording/reproducing system of the invention incorporate the magnetoresistance effect device of the invention noted above. Specifically, the magnetic head of the invention is characterized by comprising a lower magnetic shield layer, a magnetoresistance effect device of the invention such as that noted above, which is formed on the lower magnetic shield layer via a lower reproducing magnetic gap therebetween, and an upper magnetic shield layer as formed on the magnetoresistance effect device via an upper reproducing magnetic gap therebetween.

The magnetic head for separated recording/reproducing of the invention is provided with a reproducing head that comprises a lower magnetic shield layer, a magnetoresistance she effect device of the invention such as that noted above, which is formed on the lower magnetic shield layer via a lower reproducing magnetic gap therebetween, and an upper magnetic shield layer as formed on the magnetoresistance effect device via an upper reproducing magnetic gap therebetween, and with a recording head that comprises a lower magnetic pole which is common to the upper magnetic shield layer, a recording magnetic gap as formed on the lower magnetic pole, and an upper magnetic pole as formed on the recording magnetic gap.

The magnetic head assembly of the invention is characterized by comprising a head slider having the separated recording/reproducing magnetic head of the invention noted above, and an arm having a suspension on which the head slider is mounted. The magnetic recording/reproducing system of the invention is characterized by comprising a magnetic recording medium, and a head slider provided with the separated recording/reproducing magnetic head of the invention noted above with which signals are written on the magnetic recording medium in a magnetic field and signals are read in the magnetic field as generated by the magnetic recording medium.

The magnetoresistance effect device of the invention mentioned above is applicable not only to magnetoresistance effect heads but also to magnetoresistance effect sensors.

Any one of the present invention may be provided not only in disc drive system but also other magnetic storage system, such as magnetic memory device. The magnetic disc drive system of the invention is characterized in that a current is applied to the magnetoresistance effect device in the magnetoresistance effect head to generate a magnetic field and that the system is provided with a mechanism capable of pinning the magnetization of the pinned magnetic layer in a predetermined direction in the thus-generated magnetic field.

Method for producing the magnetoresistance effect elements of the invention comprises heating the pair of ferromagnetic film A and the ferromagnetic film B of the synthetic pinned layer in a magnetic field, after the film of the giant magnetoresistance effect device has been formed but before it is patterned, thereby pinning the magnetization of the pinned magnetic layer in a predetermined direction.

BRIEF DESCRIPTION OF THE DRAWINGS

A more complete appreciation of the invention and many of the attendant advantage thereof is readily obtained as the same becomes better understood by reference to the following detailed description when electrode in connection with the accompanying drawings, wherein:

FIG. 20 shows the data of the half-value width of the diffraction peak from the close-packed plane of an antiferromagnetic layer in its rocking curve.

FIG. 24A and FIG. 24B are graphs of resistance versus output in a spin valve device to which has been applied a simulation ESD voltage by a human body model.

DESCRIPTION OF THE PREFERRED EMBODIMENTS

Embodiments of the invention are described in detail hereunder with reference to the drawings.

First Embodiment:

First mentioned is the embodiment of the invention in which the free layer (first ferromagnetic layer) is thinned.

The problems with the technique of "thinning the free layer" which the present inventors have recognized in the process of achieving this embodiment of the invention are described in detail.

As so mentioned hereinabove, remarkable increase in the sensitivity of magnetoresistance effect devices is realized not only by increasing the MR ratio but also by reducing the thickness of the free layer (that is, by reducing the product of Ms×t). In a broad way, the output increases, being in reverse proportion to the product of Ms×t of the free layer. However, the present inventors' own investigations have verified that the technique of thinning the free layer brings about the following problems.

The first problem is that the bias point designing in an applied sense current is difficult. When all the magnetic fields applied to the free layer being driven are summed up and when the bias point is in the center of the linear inclination of a transfer curve, the biasing condition will be the best. However, when the free layer is thinned, the inclination of the transfer curve becomes steep. In that condition, it is extremely difficult to lead the bias point to the center of the linear region of the transfer curve. In a bad bias point condition, asymmetric signals will be formed, and in a worse condition, no output level could be taken.

The second problem is that, if the free layer is thinned to an extreme degree according to a prior art technique, the MR ratio is greatly lowered. The reduction in the MR ratio causes the reduction in the reproducing output.

Figure 7A:
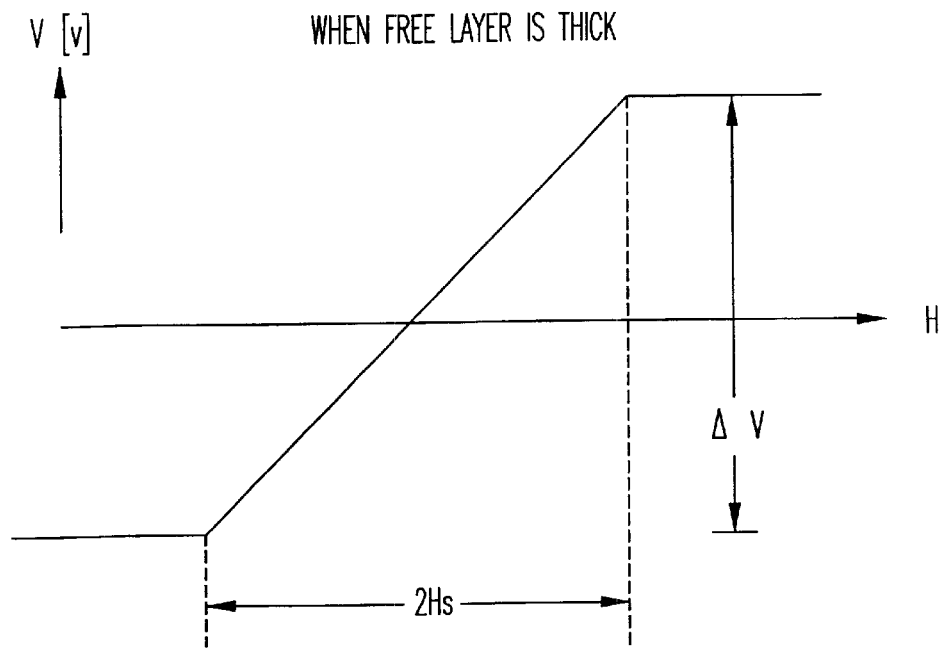
FIG. 7A and FIG. 7B are conceptual views for explaining two problems with conventional magnetoresistance effect devices.
Figure 7B:
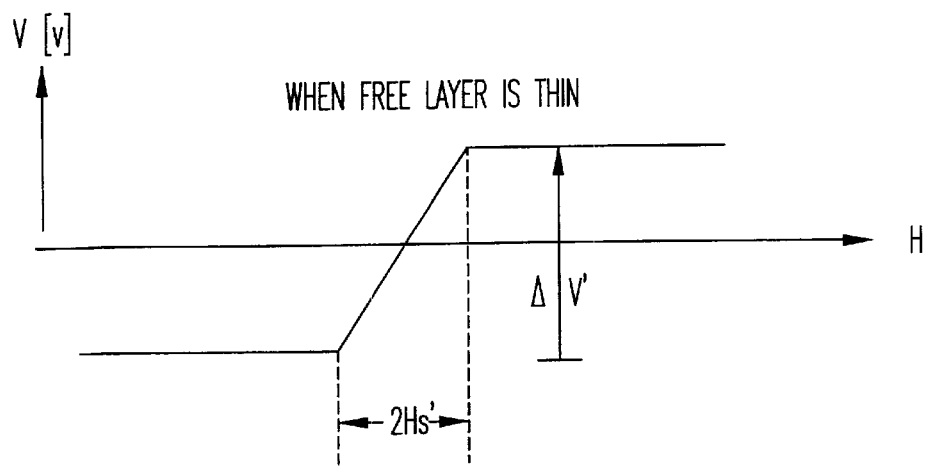

FIG. 7A and FIG. 7B are conceptual views for explaining the two problems with conventional magnetoresistance effect devices. In those drawings, shown are the transfer curves of magnetic heads each having a magnetoresistance effect device. FIG. 7A shows one case where the free layer is thick; and FIG. 7B shows another case where the free layer is thin. As mentioned above, when the free layer is thinned, the inclination of the transfer curve becomes steep (that is, Hs becomes small), and the MR ratio decreases. As a result, ΔV becomes small. From FIG. 7A and FIG. 7B, known are the two problems noted above.

Of the two problems, one relating to the bias point could not be recognized with ease even though the film structure is determined. Therefore, film structure designing was extremely difficult. This time, we, the present inventors carried out various simulations, and corrected the errors in the data we obtained, on the basis of our experiences. As a result, we have succeeded incorrect judgment of the bias point. The calculation of the bias point is mentioned below.

The bias point is shifted by various external magnetic fields applied to the free layer. The shift could approximate the sum total of (1) current magnetic field (Hcu), (2) the static magnetic field from the pinned layer (Hpin), (3) the interlayer coupling magnetic field from the pinned layer via a spacer (Hin), and (4) the stray magnetic field (Hhard) from the hard bias film for the purpose of imparting a longitudinal bias to the magnetoresistance effect film. Of those magnetic fields (1) to (4), the hard bias magnetic field (4) is relatively small. Having noted the sum of the magnetic fields (1) to (3), we, the present inventors have assiduously studied. The calculation formulae for the bias point which we employed this time are mentioned below.

$$B.P.=50\times(Hshift/Hs)+50 \quad (1\text{-}1)$$

$$Hshift=-Hin+Hpin\pm Hcu \quad (1\text{-}2)$$

$$Hs=Hd^{free}+Hk \quad (1\text{-}3)$$

$$Hd^{free}=\pi^2 (Ms\times t)_{free}/h \quad (1\text{-}3\text{-}1)$$

$$Hpin=\pi^2 (Ms\times t)_{pin}/h \quad (1\text{-}4)$$

$$Hcu=^2\pi C\times I_s/h \quad (1\text{-}5)$$

$$C=(I_1-I_3)/(I_1+I_2+I_3) \quad (1\text{-}5\text{-}1)$$

B.P. to be represented by the formula (1-1) is the bias point [%] to be specifically noted herein. The best bias point is 50%. Including the margin, the practicable range of the bias point will fall between 40 and 60%. If the bias point oversteps the range, asymmetric signals will be formed. In worse cases, no output could be obtainable.

Regarding the relationship between the bias point value and the asymmetry, the asymmetry will be +10% or so when the bias point is 40%, and it will be −10% or so when the bias point is 60%. As will be mentioned hereunder, the best bias point in calculation does not fall between 40 and 60%, but falls between 30 and 50% in experiences.

Figure 8:
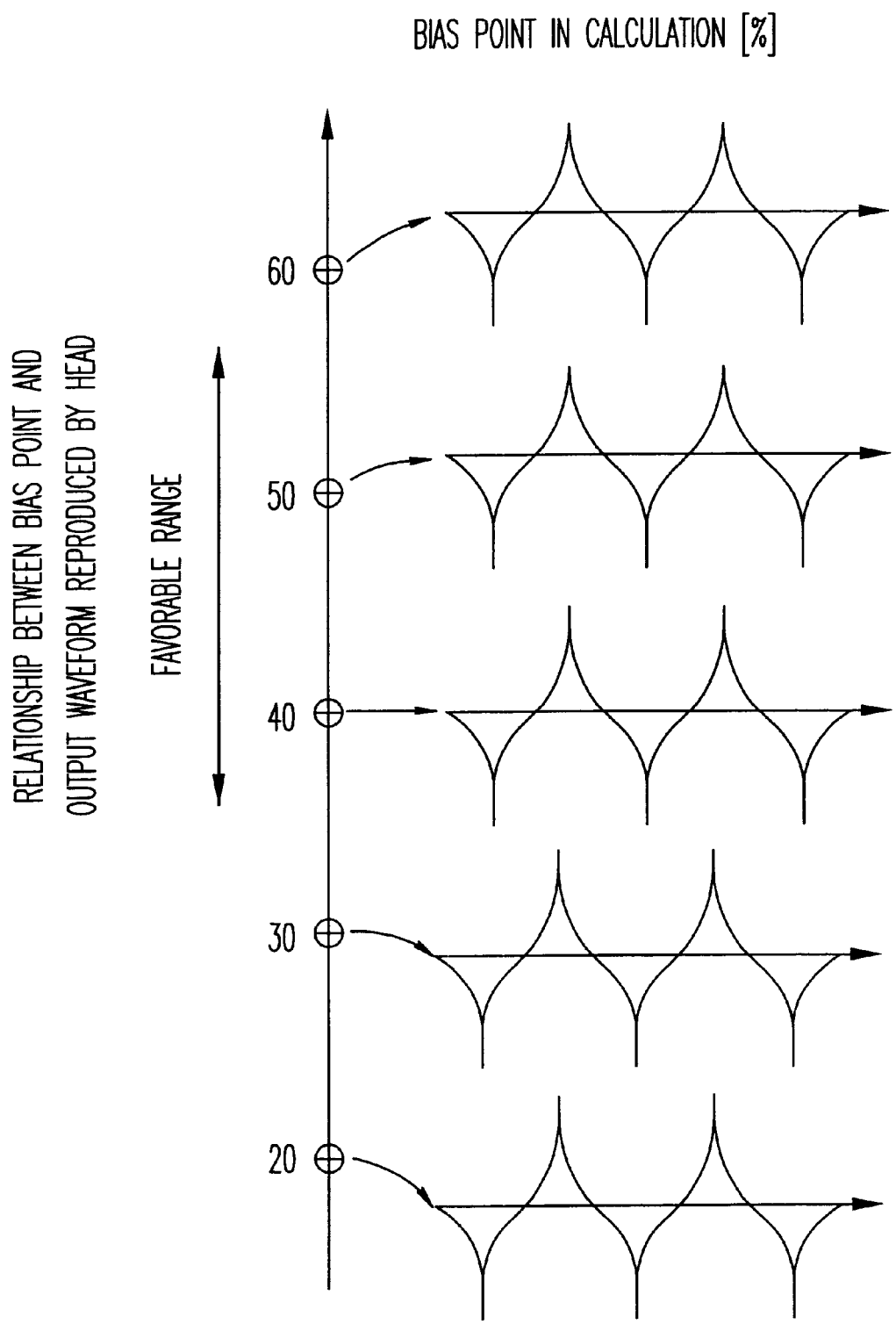
FIG. 8 is a graph of calculated bias point values versus head reproducing signal waves.

FIG. 8 is a graph of calculated bias point values versus head reproducing signal waves. As shown, when the bias point falls between 30 and 50%, the asymmetry is relatively small, and the signal profiles are good. However, when the bias point is outside the range, the asymmetry becomes great, as in FIG. 8, and the signal profiles are not practicable.

As in the formula (1-2), Hshift, is the sum of the magnetic fields [Oe] applied to the free layer. As in FIG. 7, Hs is the inclination of the transfer curve.

Figure 9:
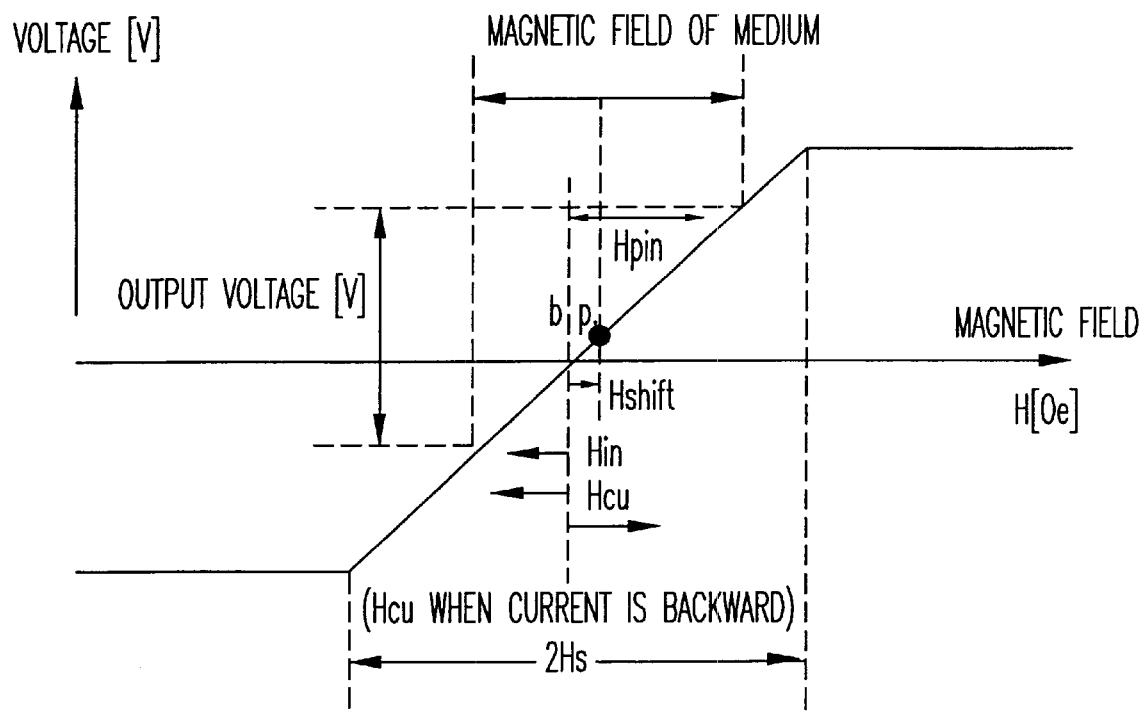
FIG. 9 is an explanatory view indicating magnetic fields acting on a free layer.

FIG. 9 is an explanatory view indicating magnetic fields acting on the free layer.

$Hd^{free}$ is an antimagnetic field for the free layer at a certain MR height. h is the MR height [$\mu$m]. Hpin is the pinned layer stray magnetic field from the pinned layer to the free layer. $(Ms\times t)_{free}$ is the product of the total saturation magnetization, Ms, and the thickness, t, of the free layer. $(Ms\times t)_{pin}$ is the product of the saturation magnetization and the thickness of the net pinned layer (for Synthetic AF, the difference in the magnetic thickness between the upper and lower pinned layers).

Hcu is the current magnetic field applied to the free layer. Is is the sense current [mA]. The coefficient, C, in the formula (1-5-1) is the ratio of the partial current flow running through the upper layer overlying the free layer to that running through the lower layer underlying it.

Figure 10:
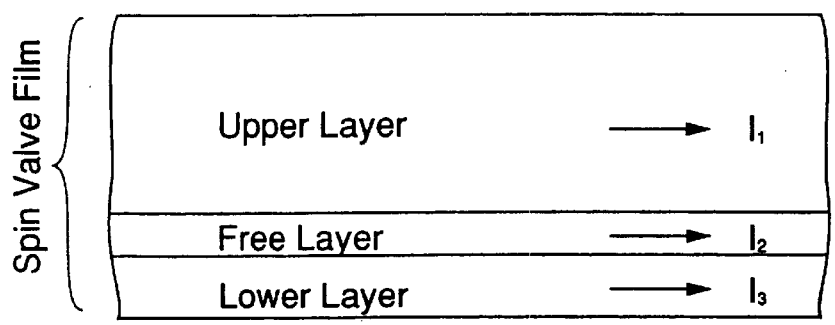
FIG. 10 is a sectional view of a magnetoresistance effect film, in which are shown current flows $I_1$ to $I_3$ running through the layers.

FIG. 10 is a conceptual view indicating the partial current flows $I_1$ to $I_3$ running through the layers.

For simplifying the calculation, the influences of the edges of the ABS plane and those of shields are not taken into consideration. In our experiences, we, the present inventors have found that the bias point values as estimated in calculation are shifted to the minus side by about 10% from those in actual heads. Considering the fact that the usable bias point range falls plus/minus 10% of the best bias point value, it can be said that the good bias point range will fall between 30% and 50% to be obtained in calculation. Accordingly, when the bias point falls between 30% and 50%, as obtained according to the calculation shown above, it could be judged that the bias point values within the range are good for practical use.

The problems with some conventional spin valve films are described in detail hereunder, with reference to the bias point calculation formulae mentioned above.

Comparative Case 1: ordinary spin valve (with neither high-conductivity film nor Synthetic AF)

5 nanometer Ta/2 nm NiFe/0.5 nm Co/2 nm Cu/2 nm CoFe/7 nm IrMn/5 nanometer Ta (1).

The formula (1) indicates the laminate structure of the spin valve, in which are shown the elements constituting the layers and their thicknesses (nanometers). The film of this Comparative Case is a modification of a prior art spin valve film in which only the free film is thinned. The bias points in this film constitution are calculated.

Of the bias point formulae (1-1) to (1-5) noted above, the current magnetic field of the formula (1-5) is the most difficult to obtain. This is because the current flow ratio, C, of the formula (1-5-1) is difficult to obtain. In the thinned film, the specific resistance of each layer is influenced by the crystallinity and the current distribution, and significantly differs from the specific resistance of the bulk. For practicable calculation as much as possible, we, the present inventors took the following measure and succeeded in obtaining the accurate current flow ratio, C.

For obtaining the specific resistance of each layer, a spin valve film sample having the constitution noted above is prepared. For obtaining the specific resistance of a predetermined layer, a few samples in which the thickness of the layer is varied by plus/minus 2 nanometers are prepared. In those samples, the relationship between the thickness of the layer and the conductance is obtained through linear extrapolation. The reason for the process is because actual data could not be obtained according to the well-known technique of obtaining the specific resistance of thin, single-layer films. In order to minimize the influences of crystallinity and those of current distribution, we, the present inventors have found through our experiments that the best way for accurate determination is to prepare film samples in which even the overlying and underlying layers are of practicable materials and to determine the conductance difference within the small thickness range as mentioned above.

The specific resistance of each layer as obtained according to the method is influenced little by the crystallinity and, in addition, could cancel the influences of current distribution thereon. Therefore, the data of the current flow ratio, C, of the formula (1-5-1) obtained according to this method are much more accurate than those obtained in a simple conductor in which is used the specific resistance of single-layer films. According to the method, it has become possible to calculate and estimate the current magnetic field with high accuracy, which, however, is difficult in the prior art technique.

The data of the specific resistance of each layer as obtained according to the method mentioned above are as follows: NiFe has 20 $\mu\Omega$cm; CoFe 13 $\mu\Omega$cm; spacer Cu 8$\mu\Omega$cm; IrMn 250 $\mu\Omega$cm. If the underlayer of Ta (tantalum) is thick, its specific resistance will greatly vary through crystallization. The cap Ta is much influenced by the surface oxides. Therefore, their accurate data could not be obtained. The specific resistance of the Ta layer is presumed to be 100 $\mu\Omega$cm. Based on those data, the current flow ratio of each layer is obtained, and the current magnetic field Hcu is calculated according to the formula (1-5).

The value of Hin is 25 Oe, as measured. Hpin is obtained according to the formula (1-4).

In the film constitution of this case, the height is shortened while the thickness of the pinned layer is thick. Therefore, the stray magnetic field, Hpin, from the pinned layer to the free layer is large. In addition, since more current flows above the free layer than below it, the current magnetic field Hcu applied to the free layer is large. Accordingly, for designing the bias point, it may be employable to control the bias point by canceling the large Hpin by the large current magnetic field Hcu.

The bias point values as calculated on the basis of the data obtained above are shown in Table 1. The sense current is 4 mA.

TABLE 1

Calculated Bias Point in Film of Comparative Case 1

| MR height [micrometers] | Bias Point |
|---|---|
| 0.3 | 70% |
| 0.5 | 61% |
| 0.7 | 53% |

As is known from Table 1, the bias point falls between 61 and 70% when the MR height falls between 0.3 and 0.5 micrometers, and this oversteps the calculated best bias point range.

Figure 11:
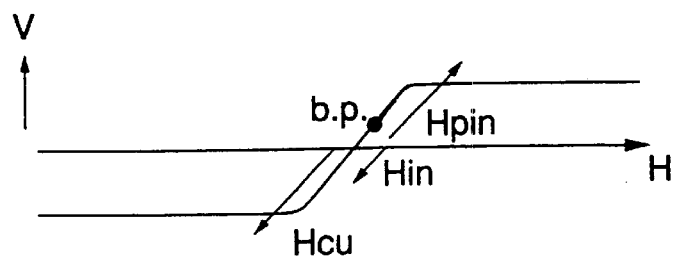
FIG. 11 is a conceptual view showing the condition of the bias point in Comparative Case 1.

FIG. 11 is a conceptual view showing the condition of the bias point in Comparative Case 1. It is understood that reducing the MR height results in shifting of the bias point to the antiferromagnetic site (to the site larger than 50%). The MR height inevitably fluctuates, owing to the mechanical polishing. It is understood that the MR height distribution lowers the yield. Qualitatively, the reason is because the bias point is controlled in the extremely unstable method where the large pinned layer stray magnetic field Hpin is canceled by the large current magnetic field Hcu.

Except for the bias point, the film of this Comparative Case has still another essential problem. The problem is that the ultra-thin free layer to which the present invention is directed lowers the MR ratio. Through our experiments, we, the present inventors have found the fact that the MR ratio in the devices having a thinned free layer is extremely lowered after thermal treatment, and this is a serious problem with the devices. For example, in the film constitution of Comparative Case 1, the MR ratio in the as-deposited condition is around 11%, but is 5.6% after thermal treatment. That is, the latter is about a half of the former. In that condition, spin valve films practicable in high-density recording/reproducing systems could not be realized.

In the spin valve film of this Comparative Case, the layers are all thinned, and the sheet resistance of the film is around 30 $\Omega$, and is large. In view of the electrostatic discharge (ESD), the film is not practicable. As well known, ESD increases with the increase in the resistance.

From the above, it is understood that the film of Comparative Case 1 is not practicable at all in high-density recording heads.

Comparative Case 2: U.S. Pat. No. 5,422,591 (with spin filter but no Synthetic AF)

5 nanometer Ta/x nm Cu/1.5 nm NiFe/2.3 nm Cu/5 nm NiFe/11 nm FeMn/5 nanometer Ta (2).

In order to improve MR in the ultra-thin free layer therein, a spin valve film has been proposed, in which a high-conductivity layer is laminated on the free layer at the side opposite to the side of the nonmagnetic spacer layer. For example, referred to are U.S. Pat. Nos. 2,637,360, 5,422,591 and 5,688,605.

The film (2) is an example of the spin valve film based on U.S. Pat. No. 5,422,591. In this spin valve film, the Cu layer adjacent to the free layer at the side opposite to the side of the spacer Cu is thickened, whereby the mean free path for up-spin is prolonged to increase the MR ratio. However, if the Cu layer is too much thickened over the mean free path, it will be a simple shunt layer. Therefore, in this film, the MR ratio peak appears at a certain Cu layer thickness. Based on this phenomenon, one problem with the film of Comparative Case 1, that is, the reduction in the MR ratio owing to the ultra-thin free layer could be overcome in some degree.

However, the film constitution of the spin valve film (2) based on U.S. Pat. No. 5,422,591 has two problems. One is the problem with the bias point, and the other is the problem with the thermal stability for the MR ratio.

First, regarding the viewpoint of the bias point, U.S. Pat. No. 5,422,591 has no disclosure of direct description or indirect suggestion. The constitution of the film (2) could not be used at all in practical heads. The reasons are mentioned in detail hereunder.

In the same manner as in Comparative Case 1, the current magnetic field, Hcu, is obtained on the basis of the experimental data of the specific resistance of each layer. In this case, the specific resistance of Ta is presumed to be 100 $\mu\Omega$cm, and the experimental data of FeMn, NiFe, spacer Cu and subbing Cu are 250 $\mu\Omega$cm, 20 $\mu\Omega$cm, 8 $\mu\Omega$cm and 10 $\mu\Omega$cm, respectively. The sense current is 4 mA. Though not described in U.S. Pat. No. 5,422,591, Hin has been found to fall between 15 Oe and 25 Oe through our experiments. In this case, Hin is 20 Oe.

The bias point is calculated for high-density recording heads for which the size of the device is as follows: track width=0.5 $\mu$m, MR height=0.3 to 0.5 $\mu$m. The data are in Table 2.

TABLE 2

Calculated Bias Point in the Constitution of Comparative Case 2 in which the subbing Cu thickness is varied

| MR height | Cu (0 nm) | Cu (1 nm) | Cu (2 nm) |
|---|---|---|---|
| 0.3 $\mu$m | 126% | 143% | 156% |
| 0.5 $\mu$m | 111% | 127% | 140% |

In this constitution, the pinned layer stray magnetic field from the pinned layer to the free layer is extremely large, and the bias point is readily shifted to the plus side. As is known from the data of the bias point in Table 2, in the samples with no spin filter effect in which the subbing Cu thickness is zero, the bias point falls between 111% and 126% at the MR height of from 0.3 to 0.5 $\mu$m. This means that the samples produce no output. This situation gets worse when the subbing Cu layer thickness is thick as shown in table 2.

Figure 12:
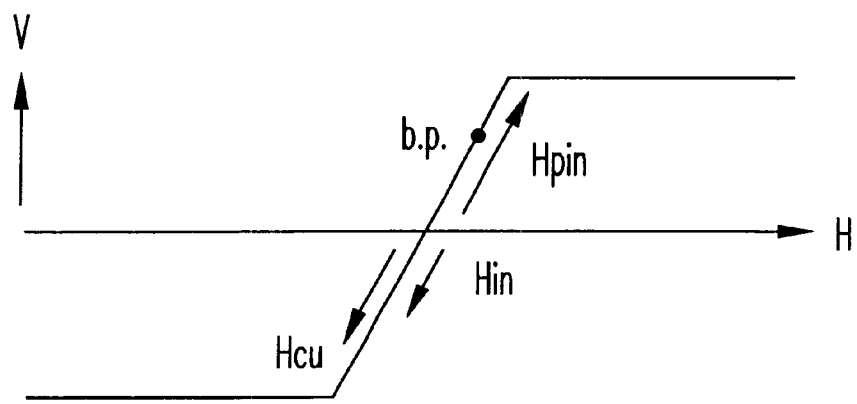
FIG. 12 is a conceptual view of the bias point versus Hin, Hpin and Hcu on a transfer curve.

FIG. 12 is a conceptual view of the bias point versus Hin, Hpin and Hcu on a transfer curve. As Hpin is large, the bias point oversteps the level when the current is zero. This constitution is so designed that the bias point is forcedly reduced to 50% by means of an applied current magnetic field. In this constitution, however, since the underlayer is a high-conductivity layer of Cu, $I_3$ in FIG. 10 shall be large and the current magnetic field, Hcu, to be obtained according to the formula (1-5) shall be small. In other words, the bias point controlling method is to cancel the large Hpin by the small Hcu that is opposite direction to Hpin, which is impossible to attain a good bias point value. It is further known from Table 2 that the increase in the subbing Cu thickness results in further increase in the bias point.

Through our experiments mentioned above, we, the present inventors have found that the bias point designing is quite difficult in the constitution of U.S. Pat. No. 5,422,591, and that forming the high-conductivity Cu layer as the underlayer of the comparative case makes the bias point more impracticable.

From the viewpoint of the thermal stability for the MR ratio, the film of U.S. Pat. No. 5,422,591 is not a practical one. As so described in comparative case, the MR ratio in the as-deposited film surely increases owing to the spin filter effect. However, after the thermal treatment for head fabrication, we, the present inventors have found that the MR ratio in the film of the comparative case is greatly reduced as the phenomenon peculiar to ultra-thin free films. This is a serious problem, if high output for high-density recording is intended.

In fact, the MR ratio in the as-deposited film of one example of U.S. Pat. No. 5,422,591 (this is film (2)) is 1.8% when the subbing Cu thickness is 1 nanometer. However, after the thermal treatment in our simulation, the MR ratio in the U.S. Pat. No. 5,422,591 lowered to 0.8%. As will be mentioned hereunder, the reason for the MR ratio reduction will be essentially because of the antiferromagnetic film of FeMn in U.S. Pat. No. 5,422,591. Even if the ultra-thin free layer, with which it is difficult to realize high MR, is used in the spin valve film so as to forcedly increase the MR ratio in the film owing to the spin filter effect, the film will be quite useless in practical applications. It is understood from the data noted above that the simple spin filter effect could not realize spin valve films having an ultra-thin free layer and exhibiting high MR ratio.

Comparative Case 3: JP-A 10-261209

5 nanometer Ta/3 nm Cu/1 nanometer Ta/5 nm NiFe/2.5 nm Cu/2.5 nm Co/10 nm FeMn/5 nanometer Ta (3).

In the film (3) disclosed in JP-A 10-261209, the Cu shunt layer disposed adjacent to the free layer via Ta therebetween is, being different from the layer as intended for the spin filter effect for the MR ratio as in U.S. Pat. No. 5,422,591 of Comparative Case 2, intended for stabilizing the asymmetry by reducing the current magnetic field Hcu and by retarding the bias point fluctuation owing to sense current. This idea will be effective in the region where the free layer is relatively thick as in the film (3), but is quite ineffective in the case of ultra-thin free layers to which the present invention is directed, in view of the bias point and the MR ratio. Based on this idea, practicable films having an ultra-thin free layer could not be obtained at all. The reasons are mentioned below.

First, regarding the bias point, when Hs is extremely reduced by the use of the ultra-thin free layer, as in the film (2) of Comparative Case 2, the best bias point could not be realized even though the current magnetic field Hcu is reduced, if the pinned layer stray magnetic field is large. The advantage of the structure of the film (3) is that, when the free layer is thick, or that is, when Hs is relatively large, then the best bias point having been once obtained depends little on the sense current. However, when the free layer in the film constitution of (3) is much reduced, it is naturally impossible to realize the best bias point. In other words, when the thickness of the free layer in the film constitution of (3) is reduced to 4.5 nanometers or smaller so as to make the free layer applicable to high-density recording systems, the bias point shall be shifted to the plus side.

To verify the fact, the calculated bias point data of the film constitution are shown in Table 3.

TABLE 3

Bias Point in Film of Comparative Case 3

| MR height | NiFe 5 nm | NiFe 3 nm |
|---|---|---|
| 0.3 $\mu$m | 86% | 108% |
| 0.5 $\mu$m | 83% | 104% |
| 0.7 $\mu$m | 81% | 100% |

Hin for the data calculation is 10 Oe. As in Table 3, it is understood that the bias point in the film constitution of Comparative Case 3 is naturally shifted to the plus side even when the thickness of the NiFe film therein is 5 nanometers, and the film constitution is not well designed. In this, the bias point is much more shifted to the plus side when the thickness of the free layer of NiFe is thinned to be 3 nanometers.

Figure 13:
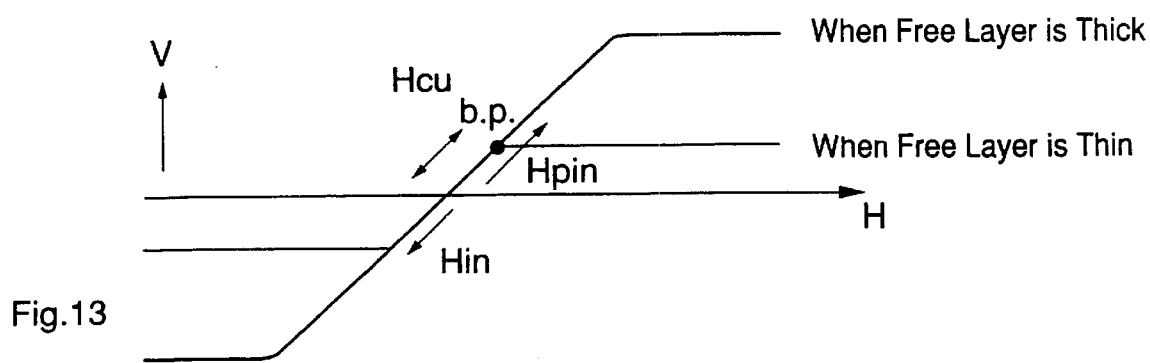
FIG. 13 is a conceptual view showing the determinant factors for the bias point in Comparative Case 3.

FIG. 13 is a conceptual view showing the determinant factors for the bias point in Comparative Case 3. As illustrated, since the current magnetic field Hcu only is reduced while Hpin is still large, no bias point is obtained at all in the region where the free layer is thick. Specifically, since the best bias point appears at the site A where the total sum of the current magnetic field Hcu, the interlayer coupling magnetic field Hin and the pinned layer stray magnetic field Hpin is zero, the film designing of such that the current center is made nearer to the free layer while only the current magnetic field is made zero, as in the constitution of (3), is quite meaningless.

The second problem with the constitution of (3) is that the film (3) could not have high MR ratio necessary for high-density recording. Specifically, in the constitution of (3), since a diffusion-preventing layer of a material having a relatively high resistance is put between the high-conductivity layer and the free layer, the film (3) could not enjoy the spin filter effect for MR, such as that in U.S. Pat. No. 5,422,591 noted above, when the free layer is an ultra-thin one. In the region where the free layer has a thickness of at most 4.5 nanometers and where the present invention is especially effective, as will be described in detail hereunder, the film (3) will be useless as the MR ratio therein is lowered.

For the two reasons mentioned above, the idea of the film constitution (3) is exclusively for the region where the free layer is relatively thick, and it is understood that the idea is useless in preparing practicable films having an ultra-thin free layer.

Comparative Case 4: Synthetic AF with no spin filter 5 nanometer Ta/2 nm NiFe/0.5 nm CoFe/2 nm Cu/2.5 nm CoFe/0.9 nm Ru/2 nm CoFe/7 nm IrMn/5 nanometer Ta (4).

In this Comparative Case, employed is a Synthetic AF structure for the purpose of improving the pinning characteristics. The two ferromagnetic layers are antiferromagnetically coupled to each other via Ru (ruthenium) One of the two ferromagnetic layers is pinned to the other via an antiferromagnetic layer existing therebetween. Even if the uni-directionally anisotropic magnetic field Hua is too small for normally pinned structures, but if it is on a certain level, such a small Hua is applicable to the Synthetic AF structure, and the pinning resistance of the Synthetic AF structure is high. As previously mentioned hereinabove, in the Synthetic AF structure, the magnetization directions of the upper and lower ferromagnetic layers as coupled via Ru are opposite to each other, and the coupling magnetic field is several kOe and is much larger than the medium magnetic field for head operation. Approximately for the magnetic moment running outward, therefore, it is considered that the difference in Ms×t between the upper and lower pinned layer will be equal to the net moment. Specifically, it is possible to reduce the influence of the magnetic field strayed from the pinned layer to the free layer, and it is expected that the reduction is advantageous for the bias point (see U.S. Pat. No. 5,465,185).

For example, in this Comparative Case, it is considered that the net pinning thickness will be equivalent to the pinned layer having a thickness of 0.5 nanometers, and it is possible to realize the pinned layer stray magnetic field equivalent to the thin pinned layer, which, however, could not be realized in normal pinning structures. Ideally, when the upper and lower pinned layers are controlled to have the same product of Ms×t, then the pinned layer stray magnetic field could be zero. It has heretofore been considered that only the reduction in the pinned layer stray magnetic field will be satisfactory for good bias point designing for spin valve films for high-density recording. This time, however, we, the present inventors have found that, if only the Synthetic AF structure is employed, it is impossible to realize stable bias points in ultra-thin free layers applicable to high-density recording. The matters we have found are described in detail hereunder.

Figure 14:
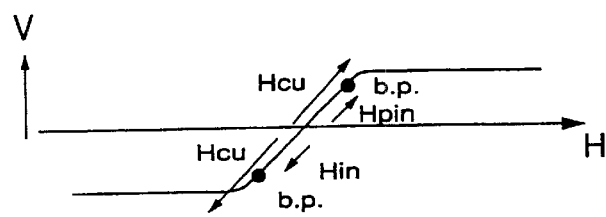
FIG. 14 is a conceptual view showing the determinant factors for the bias point in Comparative Case 4.

FIG. 14 is a conceptual view showing the determinant factors for the bias point in this Comparative Case 4. Specifically, in the constitution of this Comparative Case, the free layer is positioned, being much far from the current center of the current distribution in the spin valve film. In this, therefore, the current magnetic filed Hcu is extremely large. Hin is at most 20 Oe or so, and the pinned layer stray magnetic field is extremely reduced owing to the Synthetic AF structure employed. This means that the film constitution of this Comparative Case 4 is nearly in the just bias condition in the absence of current. When current is applied to the spin valve film of this constitution, and when the applied current is increased, then the film will much overstep the just bias condition owing to the increased current magnetic field Hcu.

The calculated bias point data of this Comparative Case are shown in Table 4.

TABLE 4

| Calculated Bias Point Data of Film of Comparative Case 4 | | |
|---|---|---|
| MR height | Hcu↑Hpin↑ | Hcu↓Hpin↓ |
| 0.3 μm | 88% | 22% |
| 0.5 μm | 80% | 16% |
| 0.7 μm | 73% | 10% |

Hin is 20 Oe. As so anticipated, it is understood from Table 4 that the bias point could not fall the range of from 30 to 50% irrespective of the direction of the current flow.

For obtaining the just bias in this constitution, one means may be taken into consideration, which comprises minimizing as much as possible the pinned layer stray magnetic field, or that is, making the upper and lower pinned layers have the same thickness in the Synthetic AF structure thereby to make the pinned layer stray magnetic field nearly zero. It further comprises enlarging Hin as much as possible so that the just bias could be in the current magnetic field for canceling the enlarged Hin. However, this means is undesirable. The enlarged Hin has some negative influences on external magnetic field response. The enlarged Hin shifts the linear region of the response and, in addition, reduces it. It will be good to control Hin to be small. However, fabricating spin valve films while the value is forcedly controlled to be an unnaturally large and constant one is extremely difficult in mass production and is unfavorable.

Since no high-conductivity layer is provided on the free layer at the side opposite to the side of the spacer adjacent to the free layer, the MR ratio is lowered when the free layer is an ultra-thin one, for the same reasons as in Comparative Case 1. Therefore, the film constitution of this Comparative Case 4 could not ensure satisfactory output, when applied to high-density recording heads. This is the essential problem with this film constitution.

For the two reasons of bias point and high output mentioned above, the spin valve film merely incorporating the Synthetic AF constitution could not realize the use of ultra-thin free layers therein for high-density recording.

As has been described in detail hereinabove, we, the present inventors have clarified, through many simulations in various current magnetic fields, that the film structures of Comparative Cases 1 to 4 could not attain stable bias point and satisfactorily high output for spin valve films having an ultra-thin free layer for high-density recording. Through further studies and investigations, we have achieved the present invention. The constitution of the invention is described in detail hereunder.

Figure 15:
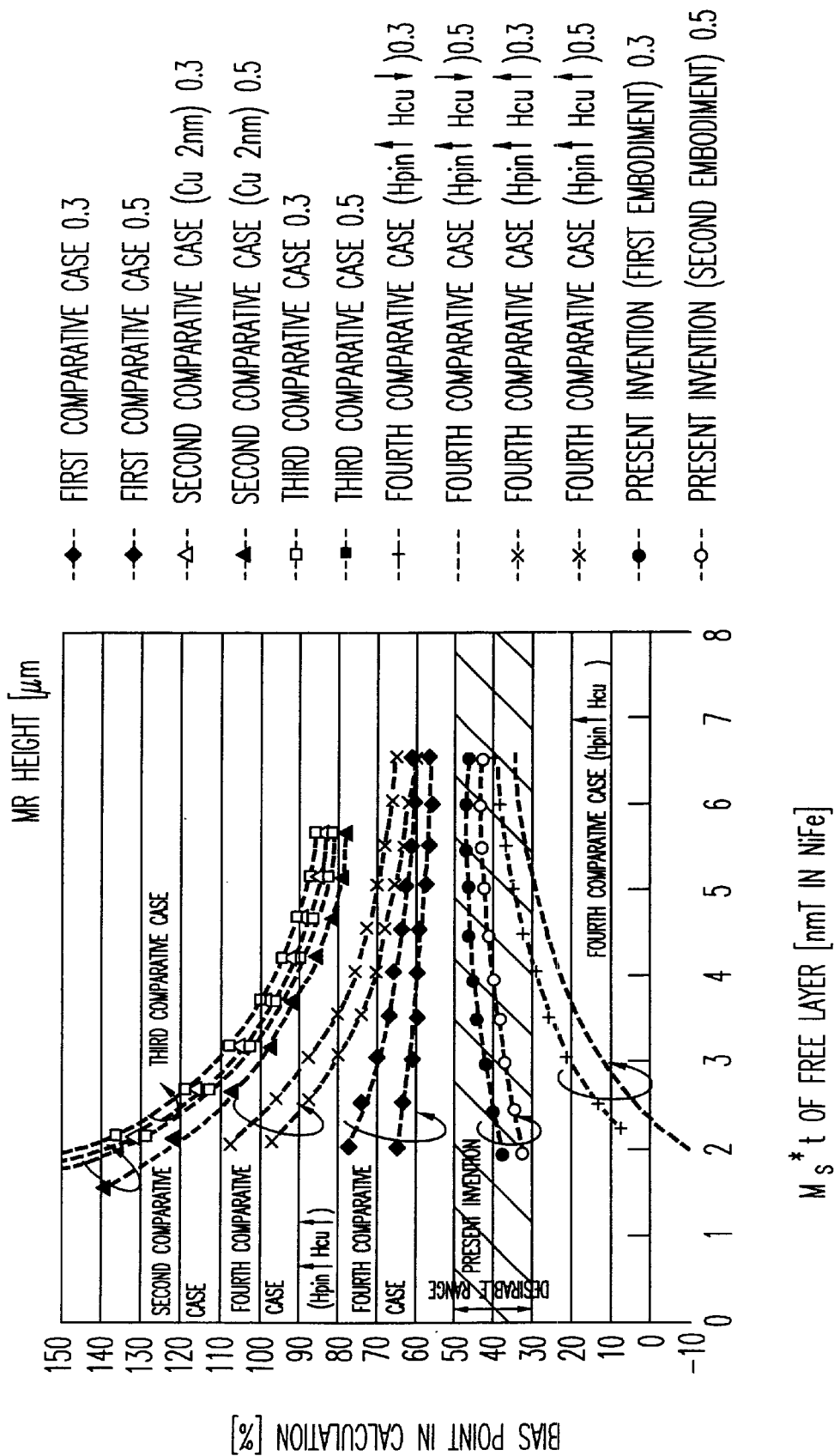
FIG. 15 is a graph of the free layer thickness dependence of the bias point in the spin valve films of the invention, as compared with that in the spin valve films of Comparative Cases.

FIG. 15 is a graph of the free layer thickness dependence of the bias point in the spin valve films of the invention, as compared with that in the spin valve films of the above-mentioned Comparative Cases. It is understood that the spin valve films of the Comparative Cases are all problematic in the bias point. The best bias point for spin valve films falls between 30 and 50%. For satisfactorily high sensitivity, the bias point must fall within the defined range at a low Ms×t free layer.

However, the bias point in the Comparative Cases significantly oversteps the preferred range in the condition of low Ms×t. In addition, in the Comparative Cases, the bias point fluctuation relative to Ms×t is extremely large, and it is understood that the bias point is difficult to control in those Comparative Cases.

As opposed to the films of the Comparative Cases, it is understood that, in the film of Example 1 of the invention, the bias point fluctuation is extremely small relative to Ms×t, and the bias point is all the time within the preferred range.

In FIG. 15, the calculated bias point values in Comparative Case 1 do not fall within the range between 30% and 50% even in the region where Ms×t is not smaller than 5 nanometer Tesla. This is because, in the actual region of low recording density for which a free layer having Ms×t of at least 5 nanometer Tesla is used, the MR height is large. Concretely, this is because the MR height for low recording density heads is larger than the range of from 0.3 $\mu$m to 0.5 $\mu$m for the high recording density to which the present invention is directed.

Anyhow, it is obvious that, in the region where Ms×t is at most 5 nanometer Tesla, the bias point designing for the films of the invention is much superior to that for the films of the Comparative Cases.

Figure 16:
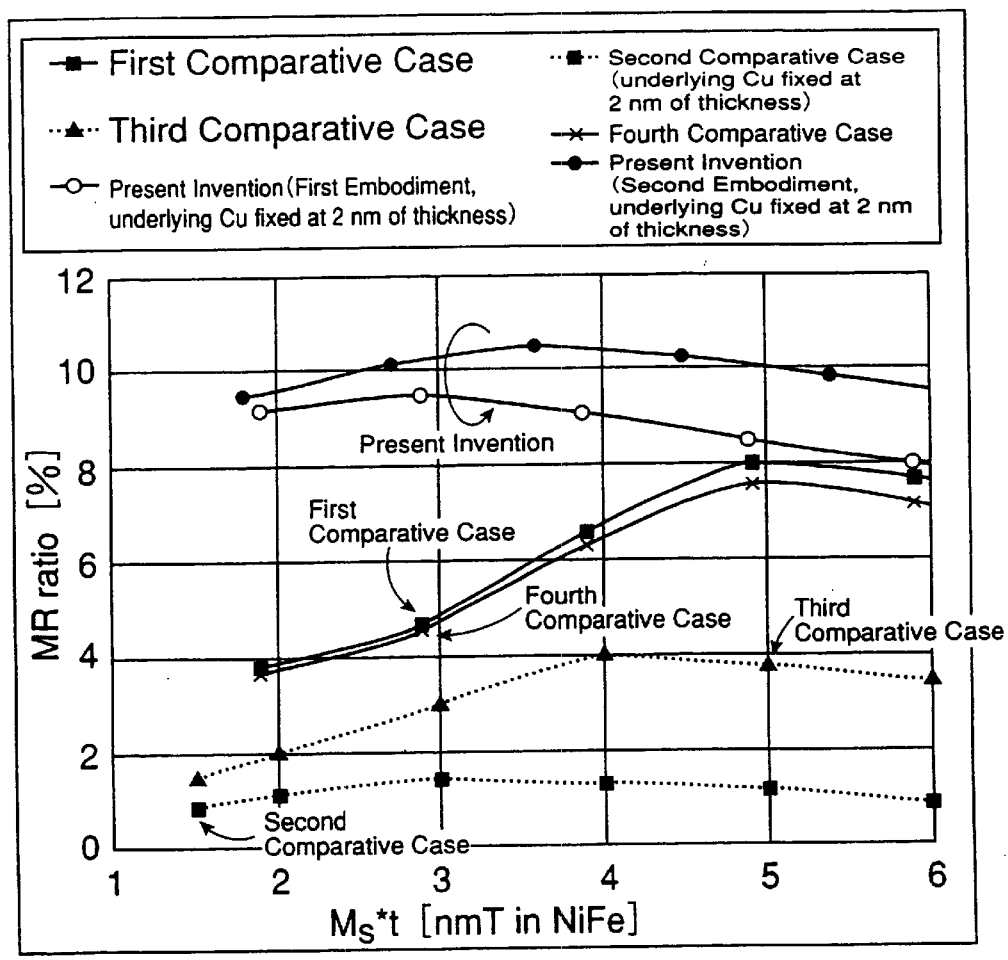
FIG. 16 is a graph of the MR ratio in the structures of Comparative Cases 1 to 4 with the product of Ms×t only in the free layer being reduced.

FIG. 16 is a graph of the MR ratio in the structures of Comparative Cases 1 to 4 with the product of Ms×t only in the free layer being reduced. In this, the MR ratio as plotted in the vertical axis is nearly proportional to the vertical axis of FIG. 9 for the transfer curve. For comparison, the data of Examples 1 and 2 of the invention to be mentioned hereunder are also plotted in FIG. 16.

The film samples of Comparative Cases 1 to 4 and those of Example 1 of the invention were prepared, in which the thickness of the free layer of NiFe was varied for the varying Ms×t. The film samples of Example 2 were prepared by varying the thickness of the free layer of CoFe. All the samples were thermally annealed at 270° C. for 10 hours in a magnetic field of 7 kOe, and their data were measured.

In Comparative Case 2 and Examples 1 and 2, the high-conductivity layer is of Cu, having a thickness of 2 nanometers. The points of Ms×t in the free layer as indicated by the arrows in FIG. 16 are for the films (1) to (4) of Comparative Cases mentioned above. For the Ms×t in the free layer in all samples, Ms of NiFe is 1 T and Ms of CoFe is 1.8 T. All the free layer thickness are expressed in terms of thickness with Ms of 1 Tesla.

In the films of Comparative Cases 1, 3 and 4 where no high-conductivity layer is provided on the free layer, MR ratio is greatly lowered with the reduction in Ms×t in the free layer. These films could hardly ensure high output capable of satisfying high-density recording.

In the film of Comparative Case 2 having a high-conductivity layer, the free layer Ms×t dependence of the MR ratio is relatively small. However, since the antiferromagnetic layer in this film is of FeMn, not containing a noble metal, the thermal stability for MR ratio in thermal treatment is low. With such small MR ratio, the film could not ensure high output for high-density recording.

In the films of Comparative Case 2 and Comparative Case 3, if a layer of Co or CoFe having a thickness of 0.5 nanometers is inserted between the spacer of Cu and the free layer of NiFe, the MR ratio will increase by 1 to 2% above the data in the graph of FIG. 16. Even if so, however, the Ms×t dependence of the MR ratio is still the same as that in the single-layer NiFe free layer. Anyhow, small MR ratio will do well in the region where Ms×t in the free layer is small.

On the other hand, in the films of the invention where a high-conductivity layer is provided adjacent to the free layer and the antiferromagnetic layer contains a noble metal, the thermal stability for the MR ratio after thermal treatment is good. The films of the invention produce high output well applicable to high-density recording. In particular, the difference in the MR ratio between the films of the invention and those of Comparative Cases is obvious in the region where Ms×t is smaller than 5 nanometer Tesla.

The magnetoresistance effect device of the invention is described in detail hereunder.

Figure 1:
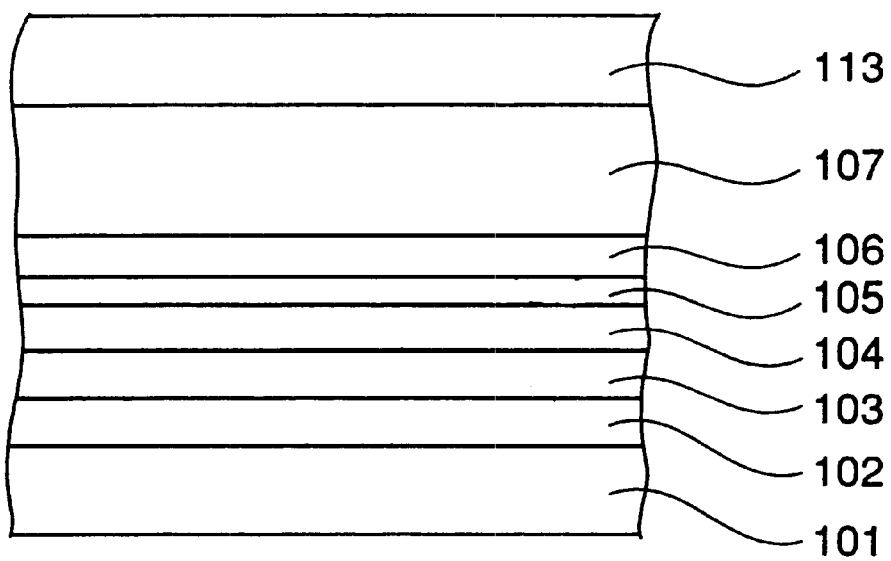
FIG. 1 is a sectional view for explaining the film constitution of the first magnetoresistance effect device of the invention.

FIG. 1 is a conceptual view showing the sectional constitution of the magnetoresistance effect device of the invention. As illustrated, the magnetoresistance effect device of the invention comprises a high-conductivity layer 101, a free layer 102, a spacer layer 103, a first ferromagnetic layer 104, a coupling film 105, a second ferromagnetic layer 106 and an antiferromagnetic film 107, all laminated in that order.

In the device with that constitution, the free layer 102 is much thinned. On the transfer curve where Hs is small due to ultra thin free layer, Hcu, Hpin and Hin are all small Hpin−Hin=Hcu, and a good bias point can be realized in the device. In general, in ultra-thin free layers, high MR ratio is difficult to realize. The device of the invention has overcome this problem. The device has good thermal stability for MR ratio, and therefore can realize high-output heads.

Specifically, even though having the ultra-thin free layer for high-density recording, the spin valve film constitution of the invention can realize good bias point and can maintain high MR ratio. Therefore, the film stably produces high output. Concretely, in bias point designing, the condition of Hpin−Hin=Hcu is realized, and the film has good bias point. Reducing all Hpin, Hin and Hcu is important for stably realizing the condition of Hpin−Hin=Hcu.

Regarding Hpin, the film has a so-called Synthetic AF structure where the two ferromagnetic layers are antiferromagnetically coupled to each other. In this, therefore, Hpin is derived from only the difference in the magnetic thickness between the two layers of the first and second ferromagnetic layers, and can be reduced.

From the formula (1-4), it is understood that reducing (Ms×t) pin in the pinned layer is effective for reducing Hpin.

However, for bias point designing in ultra-thin free layers, only the reduction in Hpin is meaningless. For this, the reduction in the current magnetic field Hcu is indispensable. Therefore, the nonmagnetic high-conductivity layer is provided on the free layer at the side opposite to the side of the spacer layer, whereby the center of the current distribution in the spin valve film can be near to the free layer and Hcu can be thereby reduced. This is because, in the formulae (1-5) and (1-5-1), when $I_3$ is increased for the top-type spin valve film (II is increased for the bottom-type spin valve film) and the current flow ratio C is lowered, then the current magnetic field Hcu can be reduced. Another significant function of the nonmagnetic high-conductivity layer is to maintain high MR ratio in the ultra-thin free layer, to which the invention is directed, owing to the spin filter effect. Specifically, by providing the nonmagnetic high-conductivity layer, the difference in the mean free path of up-spin can be kept large between the parallel condition and the antiparallel condition for the magnetization directions of the free layer and the pinned layer adjacent to the spacer.

For stably realizing the condition of Hpin–Hin=Hcu, the reduction in Hin is also important. For realizing the high MR ratio owing to the high-conductivity layer as provided adjacent to the ultra-thin free layer (spin filter effect), it is important to thin the spacer. However, in general, Hin will increase with the reduction in the spacer thickness and with the reduction in the free layer thickness. Overcoming this problem, it is important to use the device of the invention at Hin falling within a range of from 0 to 20 Oe or so.

Figure 2:
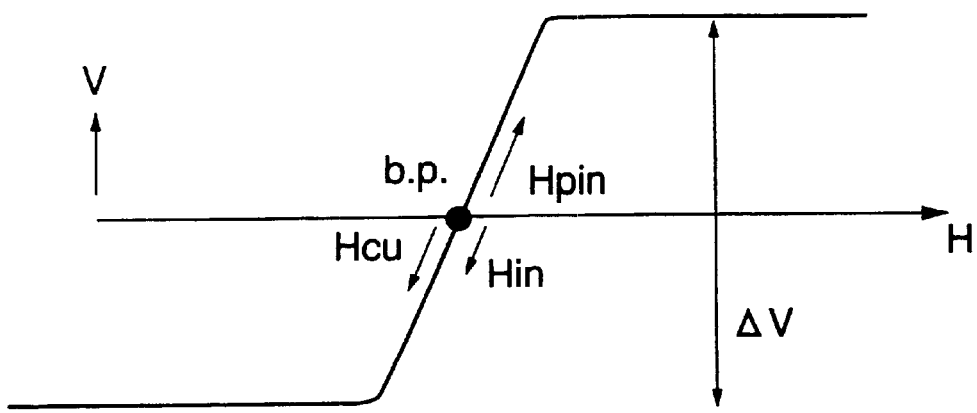
FIG. 2 is a transfer curve given by the first magnetoresistance effect device of the invention.

FIG. 2 is a schematic view of the transfer curve given by the spin valve film of the invention. Even in the small transfer curve for which the ultra-thin free layer is used to give small Hs, all of Hpin, Hcu and Hin are reduced, and it is possible to design the condition of Hpin–Hin=Hcu. Therefore, it is possible to settle the bias point in a good site of around 50%(good bias point around 40% in the value calculated by our method). In addition, since the film incorporates the high-conductivity layer exhibiting the spin filter effect, it still maintain high MR ratio even in the ultra-thin free layer. The value in the vertical axis in FIG. 2 is satisfactorily high.

Next, the determinant factors for the bias point, namely the parameters of Hpin, Hin and Hcu are described in detail.

Figure 3:
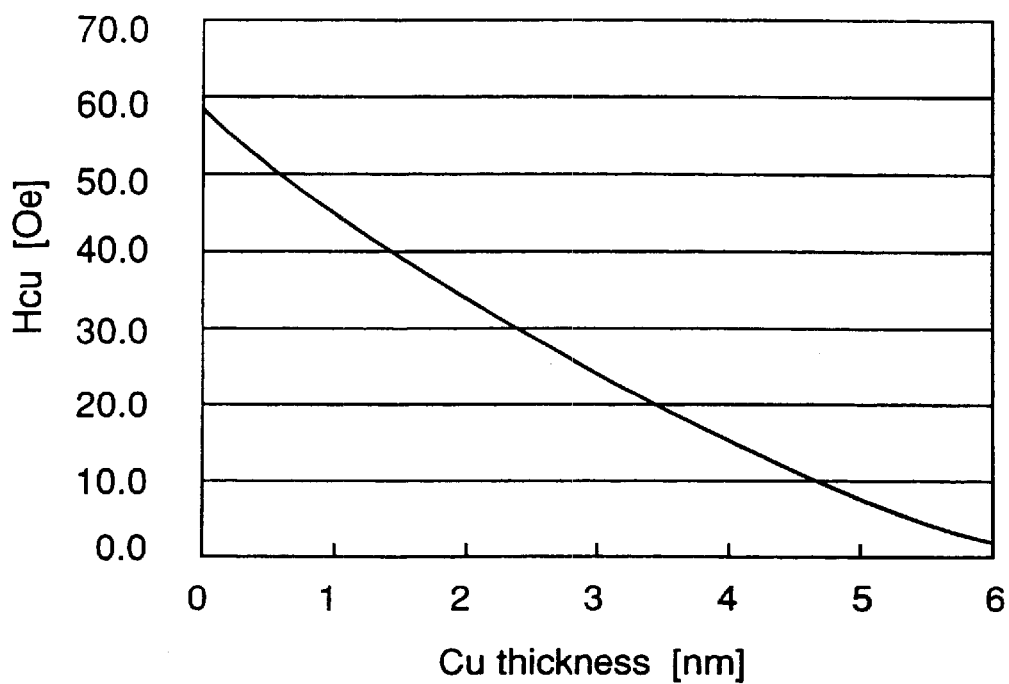
FIG. 3 is a graph of the Cu thickness of the high-conductivity layer adjacent to the free layer on the side opposite to the side at which the spacer is contacted with the free layer, versus the current magnetic field Hcu applied to the free layer.

First, low Hcu is referred to. As previously described hereinabove, the high-conductivity layer is provided on the free layer at the side opposite to the side of the spacer, whereby the value C in the formula (1-5) is reduced and the current magnetic field Hcu is reduced. One concrete example of the film constitution is mentioned below. 5 nanometer Ta/x nm Cu/2 nm CoFe/2 nm Cu/2.5 nm CoFe/ 0.9 nm Ru/2 nm CoFe/7 nm IrMn/5 nanometer Ta FIG. 3 is a graph of the Cu thickness of the high-conductivity Cu layer adjacent to the free layer on the side opposite to the side at which the spacer is contacted with the free layer, versus the current magnetic field Hcu applied to the free layer. The sense current is 4 mA. As illustrated, the value C of the formula (1-5) becomes small with the increase in the Cu film thickness, whereby the current magnetic field Hcu is reduced. When the current flow ratio in the upper and lower sides of the free layer is the same, the current magnetic field applied to the free layer is always zero irrespective of the intensity of the sense current applied thereto.

One key point of the invention is to reduce the current magnetic field. However, it is undesirable to make the current magnetic field Hcu zero. The invention satisfies the condition of Hpin–Hin=Hcu for bias point control. Therefore, designing the current magnetic field to reach zero, as in the Comparative Case 3 mentioned above, will make the intended bias point control impossible.

From the viewpoint of the current magnetic field, the suitable range of the nonmagnetic high-conductivity Cu layer may fall a broad scope of from 0.5 nanometers to 4 nanometers. Since Hs is smaller with the reduction in the free layer thickness, it is desirable that the current magnetic field Hcu is smaller. In this Example, the nonmagnetic high-conductivity layer is of Cu. Apart from this, when the layer is of any other metal material or of a laminate film, it thickness could be in terms of the thickness of the Cu layer. For example, where the nonmagnetic high-conductivity layer is a laminate film of 1.5 nm Ru/1 nm Cu, the specific resistivity of Ru therein is 30 $\mu\Omega$cm and that of Cu is 10 $\mu\Omega$cm, as measured through experiments. Therefore, the thickness of the laminate film will correspond to the Cu layer thickness of (1.5 nm×$\mu\Omega$cm/30 $\mu\Omega$cm)+1 nm=1.5 nm.

In the same manner, for other metallic laminate films for the nonmagnetic high-conductivity layer, the current flow ratio could be obtained on the basis of the experimental data of specific resistivity of the constituent metals, 10 $\mu\Omega$cm for Cu, 30 $\mu\Omega$cm for Ru, 10 $\mu\Omega$cm for Au, 10 $\mu\Omega$cm for Ag, 20 $\mu\Omega$cm for Ir, 70 $\mu\Omega$cm for Re, 20 $\mu\Omega$cm for Rh, 40 $\mu\Omega$cm for Pt, 40 $\mu\Omega$cm for Pd, 12 $\mu\Omega$cm for Al, and 30 $\mu\Omega$cm for Os. Where the nonmagnetic high-conductivity layer is of an alloy, its thickness could be also in terms of the Cu layer thickness, based on the specific resistance of the constituent elements as above, for which the specific resistance data may be proportionally partitioned according to the elemental composition.

As so mentioned hereinabove for the Comparative Cases, the specific resistance of the metals constituting the nonmagnetic high-conductivity layer will vary depending on the material with which the layer is contacted. However, the material to be contacted with the nonmagnetic high-conductivity layer does not differ so much in different spin valve films. Therefore, the suitable range of the thickness of the nonmagnetic high-conductivity layer could be determined on the basis of the data of the specific resistance of the metals constituting the layer.

As in the formula (1-5), Hcu depends on the current flow ratio of the upper and lower layers above and below the free layer. Therefore, for reducing Hcu, it is desirable that the thickness of the spacer layer as positioned at the side opposite to the side of the nonmagnetic high-conductivity layer is as small as possible. This meets the requirement for the spin filter effect on MR ratio, which will be mentioned hereunder. Concretely, it is desirable that the spacer film thickness falls between 1.5 nanometers and 2.5 nanometers or so.

The nonmagnetic high-conductivity layer also functions as the layer exhibiting the spin filter effect on MR ratio with the reduction in the current magnetic field Hcu. For its effect, the suitable range of the thickness of the layer will be limited in some degree. For example, where conductive electrons that move from the pinned layer to the free layer are taken into consideration, it is desirable that the mean free path for the electrons is large, depending on the magnetization direction of the free layer as to whether it is parallel or antiparallel to the magnetization direction of the pinned layer. Therefore, it is desirable that the spacer film is thinner, not depending on spin-up or spin-down. To avoid increasing Hin, the preferred range of the spacer thickness falls between 1.5 nanometers and 2.5 nanometers.

It is also desirable that the free layer thickness is larger than the mean free path for down spin but is much smaller than that for up spin. For example, since the free mean path for down spin of NiFe is around 1.1 nanometers, it is the best that the NiFe thickness falls between 1 nanometers and 4.5 nanometers or so, and that the CoFe thickness falls between 1 nanometers and 3 nanometers or so. The most preferred range of the high-conductivity layer thickness varies, depending on the pinned layer thickness, the spacer thickness and the free layer thickness. With the spacer layer thickness being smaller, and with the free layer thickness being smaller, the thickness of the high-conductivity layer for MR ratio peak is larger. For example, where the thickness of the pinned layer of CoFe is 2.5 nanometers, that of the spacer of Cu is 2 nanometers and that of the free layer of CoFe is 2 nanometers, the high-conductivity layer of Cu having a thickness of around 2 nanometers gives MR ratio peak. In experiences, when the total thickness of the free layer and the nonmagnetic high-conductivity layer of Cu falls between 4 and 5 nanometers or so, the high-conductivity layer gives MR ratio peak. Therefore, it is desirable that the thickness of the nonmagnetic high-conductivity layer is defined around the range. Where the nonmagnetic high-conductivity layer is of Cu, being adjacent to the free layer, the preferred range of the total thickness of the Cu layer and the free layer falls between 3 nanometers and 5.5 nanometers or so including the margin.

Next referred to is Hpin. For reducing Hpin, it is desirable that the effective thickness of the pinned layer of CoFe with Bs being 1.8 T is at most around 2 nanometers (at most around 3.6 nanometers in terms of NiFe), more preferably at most 1.7 nanometer (at most 3 nanometers in terms of NiFe), and most preferably at most 1 nanometer (at most 1.8 nanometers in terms of NiFe). For realizing the preferred condition, it is desirable that the pinned layer has a Synthetic AF structure. For example, the structure is composed of antiferromagnetic film/ferromagnetic film 1/0.9 nm Ru/ferromagnetic film 2, in which the ferromagnetic film 1 is antiferromagnetically coupled to the ferromagnetic film 2. One of the two ferromagnetic layer, the ferromagnetic film 1 as antiferromagnetically coupled to the other is magnetically pinned in one direction by the antiferromagnetic film. The magnetization directions of the ferromagnetic film 1 and the ferromagnetic film 2 are opposite to each other, and the coupling magnetic field between them is several kOe and is large. Therefore, as primary approximation, it is considered that the difference between Ms×t of the ferromagnetic film 1 and that of the ferromagnetic film 2 would contribute to the effective pinned layer stray magnetic field (U.S. Pat. No. 5,465,185).

For example, in the preferred constitution of IrMn/2 nm CoFe/0.9 nm Ru/2.5 nm CoFe, the effective thickness of the pinned layer will be 2.5 nanometers−2 nanometers=0.5 nanometers (the magnetic thickness will be 0.9 nanometer Tesla). Reducing the effective pinned layer thickness, if possible, brings about the reduction in Hpin, as in the formula (1-4). When the pinned layer of low Mst is realized by normal pinned structure, it is able to obtain the good bias point without synthetic AF structure.

Next referred to is Hin. From the viewpoint of the bias point and the spin filter effect, it is desirable the thickness of the Cu layer as the spacer is as small as possible, as so mentioned hereinabove. Concretely, it is desirable that, with such a thin spacer film, Hin falls between 0 and 20 Oe or so, more preferably between 5 and 15 Oe or so. In the invention, one resolution for the film constitution not increasing Hin even when the spacer is thin is a two-layered underlayer constitution or the like.

Next referred to is the thermal stability for MR ratio. When ultra-thin free layers are employed, it is extremely difficult to maintain good thermal stability for MR ratio in thermal treatment. Concretely, two measures may be taken for improving the thermal stability for MR ratio of spin valve films incorporating an ultra-thin free layer. One is to provide a nonmagnetic high-conductivity layer of a certain level, adjacent to the free layer. Needless-to-say, the nonmagnetic high-conductivity layer exhibits the spin filter effect. In addition, it has been found that the layer further acts to improve the thermal stability for MR ratio. It has been found that, though not so significant when the thickness of the neighboring free layer is around 4.5 nanometers, the total thickness of the free layer and the nonmagnetic high-conductivity layer must be indispensably at least 1 nanometer when the free layer is thinned to be around 2 nanometers. For example, when the nonmagnetic high-conductivity layer thickness is 0 nanometer, the MR ratio after thermal treatment (at 270° C. for 10 hours) will reduce by about 50% in terms of the relative ratio based on the MR ratio in the as-deposited condition. However, if the nonmagnetic high-conductivity layer of around 1 nanometer in thickness is provided, the MR ratio reduction is decreased to fall between 0 and 30%.

Even the first measure being taken, the thermal deterioration in MR ratio will still fluctuate. The second measure is to compensate for this, for which the material for the antiferromagnetic film is specifically defined. When the antiferromagnetic film is FeMn, the thermal deterioration is 30%. However, when it is IrMn, the thermal deterioration could be reduced to 0 to 15%. The MR ratio in the as-deposited film in which is used antiferromagnetic PtMn could not be measured, but the MR ratio in the film after thermal treatment is equal to that in the as-deposited film with IrMn. Namely, the thermal deterioration in MR ratio in the film with PtMn is almost 0%. The thermal stability to MR ratio depends on the noble metal content of the antiferromagnetic film. It has been found that antiferromagnetic films containing a noble metal, for example, those of IrMn, PtMn, PdPtMn or RuRhMn are especially preferred for the spin valve films of the invention comprising an ultra-thin free layer.

Figure 4:
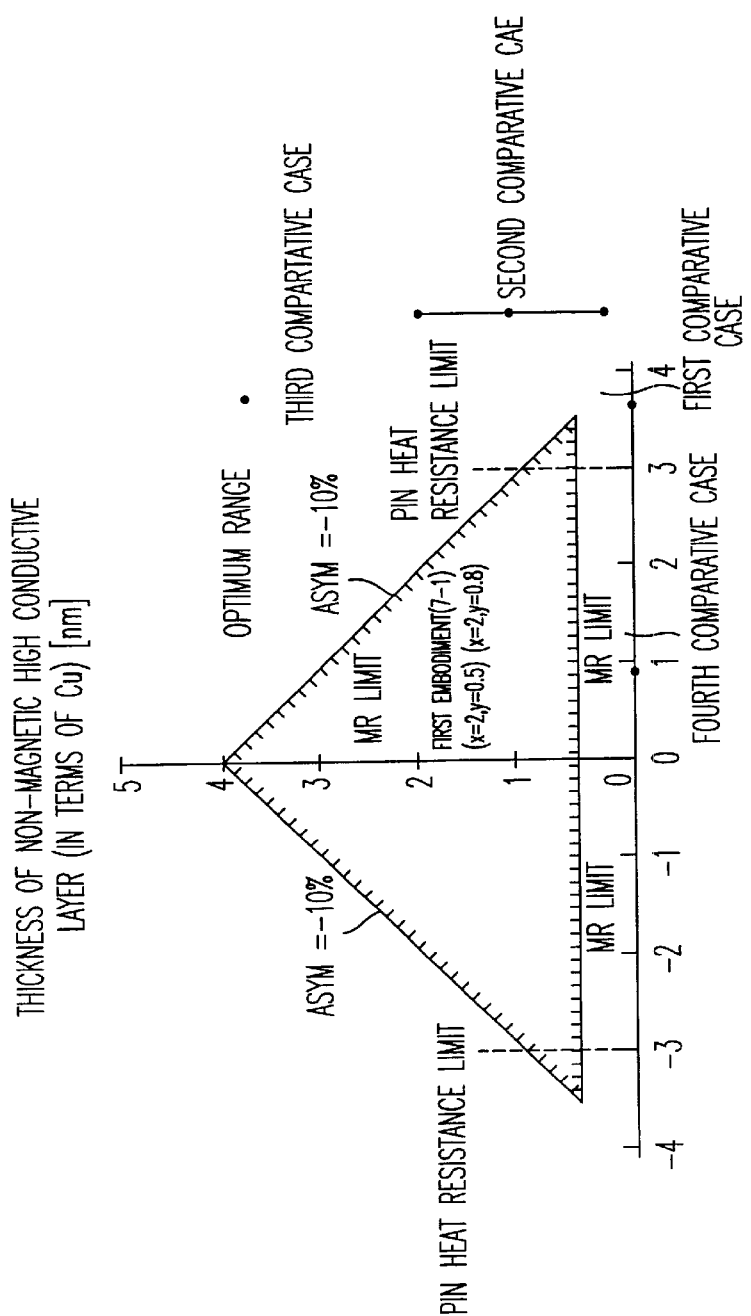
FIG. 4 is a graph concretely showing the range of the pinned layer thickness and the nonmagnetic high-conductivity layer thickness for realizing asymmetry of from −10% to +10%, or that is, for realizing bias points of from 30% to 50%.

Summarizing the above, FIG. 4 is a graph concretely showing the range of the pinned layer thickness and the nonmagnetic high-conductivity layer thickness in Synthetic AF for realizing asymmetry of from −10% to +10%, or that is, for realizing bias points of from 30% to 50% by our simplified calculation method. The "asymmetry" is defined as (V1−V2)/(V1+V2), in which V1 indicates the peak value of the reproduction output in a positive signal field and V2 indicates the peak value of the reproduction output in a negative signal field. The "asymmetry of from −10% to +10%" corresponds to "(V1−V2)/(V1+V2) falling between minus 0.1 and plus 0.1".

For realizing Hpin−Hin=Hcu, Hcu must be lowered when Hpin is small. In other words, as in the formulae (1-4) and (1-5), when the thickness of the upper and lower films of the pinned layer in Synthetic AF, (Ms×t)pin, is small, the thickness of the nonmagnetic high-conductivity layer must be large; but, on the other hand, when (Ms×t)pin is large, the thickness of the nonmagnetic high-conductivity layer must be small.

Concretely, the spin valve film with Synthetic AF of the invention shall satisfy the conditions of 0.5 nanometers≦tm(pin1)−tm(pin2)+t(HCL)≦4 nanometers and t(HCL)≧0.5 nanometers, in which tm(pin1) indicates the thickness of the pined layer constituting Synthetic AF, tm(pin2) indicates the thickness of the another pinned layer constituting it, and t(HCL) indicates the thickness of the nonmagnetic high-conductivity layer (in terms of the Cu layer having a specific resistance of 10 $\mu\Omega$cm). The condition of 0.5 nanometers≦tm(pin1)−tm(pin2)+t(HCL) is for the limit for the bias point of around 30%, or that is, for the asymmetry of +10%; and the condition of tm(pin1)−tm(pin2)+t(HCL) ≦4 nanometers is for the limit for the bias point of around 50%, or that is, for the asymmetry of −10%.

"tm(pin1)−tm(pin2)" indicates the magnetic thickness of the pinned layer in terms of NiFe with Ms of 1 T. For example, in a Synthetic AF structure of PtMn/2 nm CoFe/0.9 nm Ru/2.5 nm CoFe, the pinned layer thickness is (2.5−2)× 1.8T=0.9 nanometers. In the structure incorporating the single-layer pinned layer in the above-mentioned Comparative Cases, used is Msxt of the single-layer pinned layer.

t(HCL) indicates the thickness of the nonmagnetic high-conductivity layer in terms of Cu. Where the nonmagnetic high-conductivity layer is of any others except Cu, its thickness could be determined in terms of Cu, based on the above-mentioned data of the specific resistance of the constituent component.

The condition of t(HCL)≧0.5 nanometers is to define the lowermost limit of the thickness of the nonmagnetic high-conductivity layer indispensable for realizing high MR in the spin valve films in which the thickness of the free layer is smaller than 4.5 nanometers. More preferably, t(HCL)≦3 nanometers. This is because, when the thickness of the nonmagnetic high-conductivity layer is larger than 3 nanometers, ΔRs will lower. Also preferably, tm(pin1)–tm (pin2)≦3 nanometers. This is because, if the difference in the thickness between the upper and lower films of the pinned layer in Synthetic AF is larger than 3 nanometers, the thermal stability for the pinned magnetization of the pinned layer will lower.

In FIG. 4, plotted are the data of the Comparative Cases 1 to 4 mentioned above and those of Example 1 to be mentioned in detail hereunder. In the Synthetic AF structure, where the magnetic thickness of the pinned film adjacent to the spacer is larger than that of the other pinned film, the magnetic thickness of the pinned layer in the horizontal axis is in the plus side in the graph of FIG. 4; and where the magnetic thickness of the pinned film adjacent to the spacer is smaller than that of the other pinned film, the magnetic thickness of the pinned layer in the horizontal axis is in the minus side. In the conventional pin layer constitution with no Synthetic AF, the magnetic thickness of the pinned layer is all in the plus side.

As is known from FIG. 4, the films of the Comparative Cases are all outside the preferred range, or that is, their bias points are not good and their asymmetry is large; but those of the invention all within the preferred range, or that is, their bias points are all good and their asymmetry is small.

Examples of concrete film structures of the invention are mentioned below, in which the small Hpin in Synthetic AF is canceled by the small Hcu to realize Hpin–Hin=Hcu through specific bias point designing and the difficulties in improving the thermal stability for MR ratio that is peculiar to ultra-thin free layer-incorporated spin valve films are overcome.

Example 1

Top SFSV (with free layer of NiFe/Co(Fe))

5 nanometer Ta/x nm Cu/2 nm NiFe/0.5 nm CoFe/2 nm Cu/(2+y) nm CoFe/0.9 nm Ru/2 nm CoFe/7 nm IrMn/5 nanometer Ta (7-1).

This is to exemplify a so-called top-type spin valve film in which an antiferromagnetic layer is above a free layer.

Figure 5:
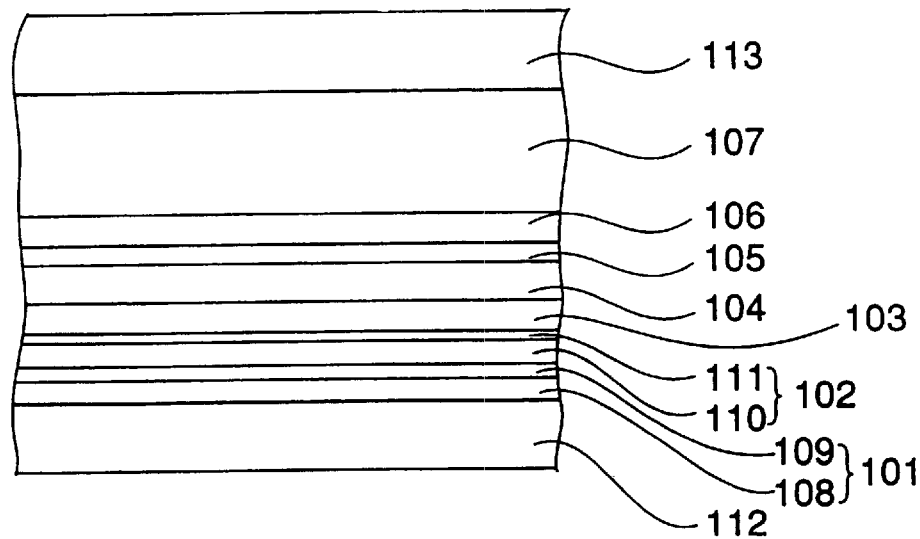
FIG. 5 is a sectional view of a typical film constitution of the first embodiment of the magnetoresistance effect device of the invention.

FIG. 5 is a conceptual view showing a typical film constitution of the magnetoresistance effect device of this Example. Precisely, the device illustrated comprises a high-conductivity layer 101 peculiar to the invention, a free layer 102 and a spacer layer 103 all laminated on a subbing buffer layer 112 in that order, and comprises pinned ferromagnetic layers 104 and 106 as antiferromagnetically Ed coupled to each other via a layer 105, in which the layer 106 is pinned in one direction by an antiferromagnetic layer 107. On the antiferromagnetic layer 107, formed is a cap layer 113. In the film structure of (7-1), the free layer 102 is of a laminate film composed of two layers 110 and 111, and the nonmagnetic high-conductivity layer 101 is a single layer of Cu.

The film (7-1) has achieved both good MR and good bias point control, owing to the MR spin filter effect of the subbing Cu layer and to the effect of the Synthetic AF structure to reduce Hpin. The bias point data for the film, as calculated according to the method mentioned above, are in Table 5.

TABLE 5

Calculated Bias Point Data

| MR height | x = 2 |
|---|---|
| (a) y = 0.5, Hin = 20 Oe | |
| 0.3 μm | 37% |
| 0.5 μm | 31% |
| 0.7 μm | 25% |
| (b) y = 0.8, Hin = 20 Oe | |
| 0.3 μm | 46% |
| 0.5 μm | 40% |
| 0.7 μm | 33% |
| (c) y = 0.5, Hin = 10 Oe | |
| 0.3 μm | 42% |
| 0.5 μm | 39% |
| 0.7 μm | 36% |

The subbing Cu layer has a thickness of 2 nanometers. In the structure where the underlayer is a simple, single-layered, high-conductivity layer of Cu, Hin is 20 Oe and is relatively large. In that structure, it is known from the data of Table 5-(a) where the difference in the thickness between the upper and lower pinned layers in the Synthetic AF is 0.5 nanometers, that the bias points are shifted to the minus side in some degree from the good bias point of 40%. The film with that structure is well practicable. The data of Table 5-(b) are for the case of y=0.8 nanometers (Hpin is increased in some degree). In the structure of this case, the bias point data are better than those in the structure of (a) in which the bias point data are shifted lower. The case of (c) in which Hin is lowered also gives good bias point data. Comparing the data of (a), (b) and (c) in Table 5, it is obvious that Hin is preferably as small as possible. This is because of the reduced MR height dependence of the bias point. In the Synthetic AF structure, the smaller thickness difference between the upper and lower pinned layers gives smaller Hpin, thereby resulting in smaller MR height dependence of the bias point. However, the difference of 0.3 nanometers between (a) and (b) could be negligible. Preferably, therefore, y=0 to 1 nanometer (Msxt=0 to 1.8 nanometer Tesla in NiFe), more preferably, y=0 to 0.5 nanometers (Msxt=0 to 0.9 nanometer Tesla in NiFe). Within the preferred range, the value y is easy to control for obtaining good bias points and for improving other characteristics of the film including ESD resistance, etc.

The subbing Cu layer is for bias point control and for MR spin filter effect. Increasing the subbing Cu thickness results in small Hcu, but also results in ΔRs reduction. Preferably, therefore, the Cu thickness falls between 0.5 nanometers and 4 nanometers, more preferably between 0.5 nanometers and 3 nanometers. The subbing Cu thickness enough for the MR spin filter effect depends on the constitution of the free layer. With the free layer being thin, the most preferred thickness of the subbing Cu layer enough for the MR spin filter effect will shift to a larger value. In experiments, the peak of MR ratio appeared when the total thickness of the subbing Cu layer and the free layer fell between 4 nanometers and 5 nanometers.

In the free layer constitution in (7-1) where the subbing Cu thickness is from 0 to 1.5 nanometers, the MR increase owing to the spin filter effect of the increased Cu thickness will cancel the Rs reduction to be caused by the increase in the Cu thickness, and ΔRs changes little. In another where the subbing Cu thickness is from 1.5 nanometers to 2 nanometers, however, ΔRs will decrease by about 0.1 Ω; and in still another where the subbing Cu thickness is from 1.5 nanometers to 3 nanometers, ΔRs will decrease by about 0.25 Ω. The ΔRs reduction shall be nearly proportional to the output reduction, and is therefore unfavorable. However, if thick subbing Cu is desired for bias point control, the subbing Cu thickness could be 3 nanometers in the free layer constitution illustrated. In this case, since the current magnetic field per the unit current is small and since the spin valve film resistance is lowered, the output reduction to be caused by the ΔRs reduction could be retarded by applying increased current. This is because the output is also proportional to the applied current. If ΔRs has decreased by 10% owing to the increase in the subbing Cu thickness, the calculated sense current of 4 mA maybe increased to 5 mA whereby the output will increase by 25%. In that manner, the output reduction caused by the ΔRs reduction could be well compensated for by the current increase.

For a thick free layer of 4 nm NiFe/0.5 nm CoFe, the subbing Cu thickness is preferably from 0.5 to 2 nanometers or so; but for a thin free layer of 1 nm NiFe/0.5 nm CoFe, the subbing Cu thickness is preferably from 1 to 4 nanometers or so. The thickness of the interlayer of CoFe may be varied within a range of from 0.3 to 1.5 nanometers. In place of CoFe, also employable is any of Co or other Co alloys. Where Co is used in place of CoFe, its thickness is preferably as small as possible. This is because the Co single substance could not be soft magnetic by itself.

For example, when NiFe is 4 nanometers thick, then Co is preferably from 0 to 1 nanometer thick; when NiFe is 2 nanometers thick, then Co is preferably from 0 to 0.5 nanometers thick; and when NiFe is 1 nanometer thick, then Co is preferably from 0 to 0.3 nanometers thick. If the interfacial diffusion from the subbing Cu is desired to be prevented, a layer of a material not forming a solid solution with Cu, for example, Co or CoFe could be put between the subbing Cu layer and the free layer. For example, the free layer may have a structure of 0.3 nm Co/2 nm NiFe/0.5 nm Co, or 0.5 nm CoFe/2 nm NiFe/0.5 nm CoFe.

In place of the ultra-thin, laminated films of magnetic layers, an alloy free layer of NiFeCo may also be employed.

Ultra-thin free layers to which the invention is directed could hardly realize low magnetostriction. One reason for the difficulty is that the magnetostriction of NiFe becomes larger in positive when the thickness of the NiFe layer is smaller. In order to overcome the problem, the NiFe composition could be $Ni_{80}Fe_{20}$ (at. %) in an ordinary free layer of 8 nm NiFe/1 nm CoFe. However, in the free layer of the invention having a magnetic thickness of not larger than 4.5 nanometer Tesla, it is desirable that the NiFe composition is an Ni-rich one over $Ni_{80}Fe_{20}$. Concretely, for the NiFe film having a thickness of 4 nanometers or so, desired is an Ni-rich composition over $Ni_{81}Fe_{19}$ (at. %); and for the NiFe film having a thickness of 3 nanometers or so, desired is an Ni-rich composition over $Ni_{81}Fe_{19}$ (at. %). It is desirable that the uppermost limit of the Ni content of NiFe is not over $Ni_{90}Fe_{10}$ (at. %).

As mentioned above, the subbing Cu layer is to attain two major objects. One is to reduce the current magnetic field Hcu for good bias point control even in ultra-thin free layers; and the other is to exhibit the MR spin filter effect without lowering the MR ratio even in ultra-thin free layers.

From the viewpoint of bias point control, the factors y and x in the film (7-1) are determined in mutuality but not independently. For example, when y is smaller, then Hpin is also smaller. In this case, the current magnetic field Hcu to cancel Hpin is preferably also smaller, and the value of x is preferably larger for the best results.

Concretely, one example of film thickness designing where the nonmagnetic high-conductivity layer is of Cu is as follows: When the pinned layer has 2 nanometer Tesla, the Cu layer thickness is from 0.5 to 1.5 nm; when the pinned layer has 1.5 nanometer Tesla, the Cu layer thickness is from 1 to 2 nm; when the pinned layer has 1 nanometer Tesla, the Cu layer thickness is from 1.5 to 2.5 nm; when the pinned layer has 0.5 nanometer Tesla, the Cu layer thickness is from 2 to 3 nm; and when the pinned layer has 0 nanometer Tesla, the Cu layer thickness is from 2.5 to 3.5 nm.

Where the pinned layer is of Co or CoFe, its thickness shall be t=(Ms×t)pin/1.8 T [nanometer]; and where the pinned layer is of NiFe, its thickness shall be t=(Ms×t)pin/1 T [nanometer].

In the example 1, thickness of the pinned layer disposed to the spacer layer is larger than that of the another pinned layer, however it is possible that the pinned layer disposed on the spacer layer is smaller that that of the another pinned layer. In that case, the direction of the current flow is opposite to the before case. In another wards, the direction of the Hpin and the Hcu should be always opposite to each other.

In place of Cu, the spacer layer may be of any other element of Au or Ag, or may be of an alloy comprising those elements. However, Cu is the best. For realizing high MR and for reducing as much as possible the thickness of the shunt layer that is on the free layer at the side opposite to the side of the underlayer to thereby reduce the current magnetic field, it is desirable that the spacer thickness is as small as possible. However, if the spacer is too small, the ferromagnetic coupling between the pinned layer and the free layer will increase to enlarge Hin. Preferably, therefore, the spacer thickness falls between 1.5 nanometers and 2.5 nanometers, more preferably between 1.8 nanometers and 2.3 nanometers.

The subbing high-conductivity layer to fill the significant roles of the spin filter effect and the current magnetic field reduction is herein a single layer of Cu. The layer may also be of a laminate film. In the top-type spin valve film, the layer acts also as an fcc seed layer. Therefore, the material of the underlayer is preferably an fcc or hcp metal material. Concretely, the layer may be an alloy layer of metals of Au, Ag, Al, Zr, Ru, Rh, Re, Ir, Pt, etc.; or it may be of a laminate layer of those metals. For only the MR spin filter effect and the current magnetic field reduction, the simple Cu underlayer will be satisfactory. The alloy layer or the laminate film for the underlayer has additional two effects; one for magnetostriction control in ultra-thin free layers and the other for Hin control therein. Concretely, the following example is mentioned.

5 nanometer Ta/1 nm Ru/1.5 nm Cu/2 nm NiFe/0.5 nm CoFe/2 nm Cu/2.5 nm CoFe/0.9 nm Ru/2 nm CoFe/7 nm IrMn/5 nanometer Ta (7-2).

With the Ru underlayer of 1 nanometer thick, the film smoothness is improved, and with the spacer of 2 nanometers thick, Ms×t of the free layer could be 2.9 nanometer Tesla in terms of NiFe. Thus, even though the free layer is an ultra-thin layer, it readily realizes low Hin of around 10 Oe. Such low Hin is desirable, as the MR height dependence of the bias point is reduced. In addition, it is also desirable, as capable of realizing good bias point control even in the absence of any complicated thickness difference between the upper and lower pinned layers in the Synthetic AF. In the illustrated case (7-2), the Ru thickness is 1 nanometer, but is preferably from 0.5 nanometers to 5 nanometers, more preferably from 1 nanometers to 3 nanometers or so. The preferred thickness range could apply to other materials except Ru.

In the film (7-2), Hcu corresponds to the sum of the electrical shunt layers of Ru and Cu. For example, for Ru, its specific resistance is 30 $\mu\Omega$cm and is about 3 times that of Cu. From the viewpoint of Hcu, the film (7-2) shall be equivalent to a film having a Cu thickness of 1.8 nanometers. However, from the viewpoint of MR, the resistance of Ru is high and shortens the mean free path for electrons. Therefore, if Ru is directly contacted with NiFe, the film structure could not almost exhibit a spin filter effect. Therefore, it is desirable that the layer to be contacted with the free layer is of a low-resistance material such as Cu, Au, Ag of the like. For Ru, it is desirable that it is contacted with the free layer via Cu, Au, Ag or the like in the form of a two-layered film. This is one reason why the underlayer is of a two-layered film.

In the illustrated case, the buffer layer of Ta is used. However, if the high conductance layer could exhibit the buffer effect by it self, the Ta layer will be not needed. For example, when a Zr layer is used in place of Ru, the Ta layer may be omitted.

For the buffer layer, any of Ti, Zr, W, Cu, Hf, Mo or their alloys may be employed in place of Ta. The thickness of the buffer layer made of any of them preferably falls between 1 nanometer and 7 nanometers, more preferably 2 nanometers and 5 nanometers or so.

In the illustrated case, the AF film is of IrMn (Ir:5 to 40 at. %). The IrMn film thickness preferably falls between 3 nanometers and 13 nanometers or so. The merits of IrMn are that, since the IrMn film could exhibit good pinning capabilities even though thin, it is suitable to narrow gap heads for high-density recording, and that, as containing the noble metal, it could maintain high MR ratio even after thermal treatment. The antiferromagnetic film of FeMn as in Comparative Case 2 could not maintain high MR ratio after thermal treatment. The demerit of the antiferromagnetic film of FeMn is especially remarkable in ultra-thin free layers such as those in the invention.

As the antiferromagnetic film, also employable is any of CrMn, NiMn and NiO. However, for realizing high MR ratio, AF films containing a noble metal are preferred. For example, in place of Ir, employable is Pd, Rh or the like. As compared with FeMn and NiMn films, the noble metal-containing AF films are more effective for improving MR ratio, and therefore could maintain high MR ratio even after annealing thermal treatment that is indispensable to heads. Still another preferred example of the materials for AF films is PtMn of which the noble metal content is much higher.

5 nanometer Ta/x nm Cu/2 nm NiFe/0.5 nm CoFe/2 nm Cu/2.5 nm CoFe/0.9 nm Ru/2 m CoFe/10 nm PtMn/5 nanometer Ta (7-3).

5 nanometer Ta/x nm Ru/y m Cu/2 nm NiFe/0.5 nm CoFe/2 nm Cu/2.5 nm CoFe/0.9 nm Ru/2 nm CoFe/10 nm PtMn/5 nanometer Ta (7-4)

Using PtMn (Pt: 40 to 65 at. %) is advantageous in that, since the noble metal content of this is much higher than that of IrMn noted above, the MR degradation in annealing is much lower and therefore high MR ratio could be realized to enlarge ΔRs, whereby the output could be increased. In the spin valve film having an ultra-thin free layer which can hardly realize good thermal stability for MR, most preferred for the best thermal stability for MR is a combination of a subbing Cu layer with a spin filter effect and a layer of PtMn.

In place of PtMn, also employable is PdMn or PdPtMn (noble metal content: 40 to 65 at. %).

From the viewpoint of thermal stability for MR, it is desirable that the subbing Cu layer has a thickness of at least 1 nanometer. This is because, if the thickness of the Cu layer is smaller than 1 nanometer, the thermal stability for MR will be poor. However, when the thickness of the NiFe layer is not smaller than 4 nanometers, the Cu layer may well be 0.5 nanometers thick for good thermal stability for MR.

The specific electric resistance of PtMn is large and is nearly the same as that of IrMn. Therefore, PtMn is favorable, as having little influence on the current magnetic field. For those reasons, the films (7-3) ad (7-4) are extremely favorable to practical applications.

However, one demerit of PtMn is that, since its critical thickness for producing a unidirectional anisotropic magnetic field is larger than the critical thickness of IrMn, it is difficult to thin the PtMn film to 5 nanometers or so. Therefore, when PtMn is used, it is desirable that the thickness of its film falls between 5 nanometers and 30 nanometers, more preferably between 7 nanometers and 15 nanometers or so. The same idea as in (7-4) where the underlayer below the free layer has a two-layered structure could apply also to PtMn.

As variations of the embodiments (7-1) to (7-4), a noble metal element film could be laminated on the antiferromagnetic film. For example, a single-layered or laminated film of any of Cu, Ru, Pt, Au, Ag, Re, Rh, Pd and the like may be used. The variations could realize low Hin even when the spacer is thin. However, if the noble metal film is too thick, the current flow ratio will increase in the upper layers over the free layer. Therefore, the thickness of the single-layered or laminated film preferably falls between 0.5 nanometers and 3 nanometers or so.

As has been mentioned hereinabove with reference to FIG. 15, the bias point control in the spin valve films of this Example is much better than that in those of Comparative Cases 1 to 4, and the films of this Example could ensure the best bias points.

As also mentioned with reference to FIG. 16, the spin valve films of this Example produce higher MR ratio than that to be produced by the films of Comparative Cases 1 to 4 essentially bellow 45 nanometer Tesla free layer.

Example 2

Top SFSV (with simple CoFe free layer)

5 nanometer Ta/x nm Cu/2 nm CoFe/2 nm Cu/2.5 nm CoFe/0.9 nm Ru/2 nm CoFe/7 nm IrMn/5 nanometer Ta (8-1)

5 nanometer Ta/x nm Cu/2 nm CoFe/2 nm Cu/2.5 nm CoFe/0.9 nm Ru/2 nm CoFe/10 nm PtMn/5 nanometer Ta (8-2)

In this Example 2, used is a simple free layer of a single-layer CoFe, being different from the laminate free layer of NiFe/Co or NiFe/CoFe as in Example 1. In FIG. 1, the structure of this Example 1 has a single-layer CoFe as the free layer 102 and a single-layer Cu as the high-conductivity layer 101.

As already mentioned ultra-thin free layers below 4.5 nanometer Tesla in NiFe face various difficulties. The single-layer CoFe free layer is advantageous in that the soft magnetic characteristics control is relatively easy even though the thickness of the layer is extremely small. A third additive element of B, Cu, Al, Rh, Pd. Ag, Ir, Au, Pt, Ru, Re, Os or the like could be added to CoFe, if desired. However, if pure Co is used in place of such CoFe alloys, soft magnetic characteristics characteristics could not be realized. CoFe preferably falls between $Co_{85}Fe_{15}$ (at. %) and $Co_{96}Fe_4$ (at. %). As will be mentioned hereunder, the defined composition range for CoFe is based on the magnetostriction control.

From the view point of soft magnetic characteristics, the CoFe free layer is preferably oriented in fcc(111). From the viewpoint of better spin filter effect, the layer is preferably oriented in fcc(111) so as to reduce the resistance. However, a microcrystalline or amorphous free layer of CoFeB is also employable.

Ms of the simple CoFe free layer is larger than that of NiFe. Therefore, for realizing the same degree of Ms×t, the CoFe layer could be thinner than the NiFe layer. From the viewpoint of the spin filter effect, the simple CoFe free layer is preferred. For example, for realizing a free layer of 4.5 nanometer Tesla, NiFe/CoFe must be 3.6 nm NiFe/0.5 nm CoFe, and its total thickness is about 4 nanometers. As opposed to this, the thickness of the simple CoFe free layer could be 2.5 nanometers. The latter is thinner by about 1.5 nanometers than the former, NiFe/CoFe. Where a high-conductivity layer is provided below the free layer of the two films, the down spin electrons will be filtered out, since they are thick as compared with the mean free path for down spin of about 1 nanometer. However, at a total thickness of around 4 nanometers of NiFe/CoFe, the mean free path for down spin will be near to that for up spin. In that condition, the underlying high-conductivity layer will produce a simple shunt effect. Therefore, increasing the high-conductivity layer thickness causes MR reduction owing to the shunt effect.

On the other hand, for the simple CoFe, the mean free path of up spin is longer than 2.5 nanometers. Therefore, providing a high-conductivity layer of which the thickness is not so large will results in the increase in the mean free path for up spin, thereby increasing MR. In experiences and through experiments, it is known that, where Cu is used for the high-conductivity layer, MR peaks appear when the total thickness of the Cu layer and the free layer of NiFe/CoFe or CoFe is 4 nanometers or so, or falls between 3 nanometers and 5 nanometers. In other words, when the high-conductivity layer that is necessary for bias point designing is relatively thick, NiFe/CoFe rather causes MR reduction owing to the shunt effect but not to the spin filter effect, while, on the other hand, CoFe satisfies both good bias point control and MR increase owing to the spin filter effect. Therefore, CoFe is advantageous. This is because, as so mentioned hereinabove, the MR peaks depend on the total thickness of the high-conductivity layer and the free layer. Therefore, when the CoFe layer thickness is smaller, then the Cu layer thickness to give MR peaks shall be larger, and the spin filter effect and the bias point control both could be augmented. For the reasons mentioned above, the simple CoFe free layer is preferred for spin valve films.

The thermal stability for MR of the laminated NiFe/CoFe free layer is worse than that of the simple CoFe free layer, and the simple CoFe free layer is better, as producing large MR.

The simple CoFe free layer is still better than the ultra-thin, laminated NiFe/CoFe layer, as its magnetostriction control is easy. In particular, the interfacial magnetostriction is important in ultra-thin free layers. Therefore, NiFe/CoFe is inferior to simple CoFe, as the former shall have one additional interface.

The bias point in the constitution of (8-1) could fall within a good range of from 30 to 50% or so, as in Example 1. Also like in Example 1, the MR height dependence of the free layer in (8-1) is small.

Regarding the Ms×t dependence of the free layer, smaller Ms×t gives smaller saturation magnetization Hs on the transfer curve, and requires severer bias point control. Concretely, much reducing the current magnetic field is important, and increasing the high-conductivity layer thickness is needed. As previously mentioned hereinabove, in the spin valve films of the invention, the thickness of the high-conductivity layer capable of producing MR peaks owing to the spin filter effect shall be larger with the reduction in the thickness of the free layer. This well matches with the constitution of this Example. It is understood that the idea of designing the spin valve films of the invention is favorable to heads for high-density recording.

Concretely, when Ms×t of the free layer is 4.5 nanometer Tesla and the thickness of the CoFe film is 2.5 nanometers, then the preferred range of the high-conductivity film thickness falls between 0.5 nanometers and 4 nanometers or so, more preferably between 0.5 nanometer and 3 nanometers or so in terms of the 10 microohm centimeter Cu; when Ms×t of the free layer is 3.6 nanometer Tesla and the thickness of the CoFe film is 2 nanometers, then the preferred range of the high-conductivity film thickness falls between 0.5 nanometer and 4 nanometers or so, more preferably between 1 nanometers and 3.5 nanometers or so in terms of Cu; when Ms×t of the free layer is 2.7 nanometer Tesla and the thickness of the CoFe film is 1.5 nanometers, then the preferred range of the high-conductivity film thickness falls between 0.5 nanometers and 4 nanometers or so, more preferably between 2 nanometers and 4.5 nanometers or so in terms of Cu; and when Ms×t of the free layer is 1.8 nanometer Tesla and the thickness of the CoFe film is 1 nanometer, then the preferred range of the high-conductivity film thickness falls between 0.5 nanometers and 4 nanometers or so, more preferably between 2 nanometers and 4 nanometers or so in terms of Cu.

In (8-1) IrMn is used as the antiferromagnetic film; while in (8-2), PtMn is used as the same. Using PtMn is more advantageous in that the thermal stability for MR is much more improved and the output is much more increased. This is the same as in the case of the NiFe/Co(Fe) free layer. However, PtMn is problematic in that Hin will readily increase. Therefore, for good bias point control, either the measure of more reducing the current magnetic field Hcu or the measure of more increasing Hpin will be needed for PtMn than for IrMn. For reducing Hcu, σt in the high-conductivity layer may be increased, or that is, the thickness of the high-conductivity layer may be increased. Because of large Hin, the difference in the thickness between the upper and lower pinned layer in the Synthetic AF may be increased more for PtMn than for IrMn. However, increasing the thickness of the high-conductivity layer will cause the reduction in ΔRs. Therefore, as compared with that for IrMn, it is desirable that the thickness of the high-conductivity layer may be controlled to fall between 0.5 and 3 nanometers or so in terms of Cu for PtMn. As previously mentioned herein, increasing At in the Synthetic AF structure is unfavorable since it increases the MR height dependence of the bias point. Therefore, as compared with that for IrMn, it is desirable that the intrinsic thickness of the pinned layer may be increased by from 0 to 1 nanometer or so in terms of CoFe for PtMn. The following variations of (8-1) and (8-2) are within the scope of the invention.

5 nanometer Ta/x nm Ru/y nm Cu/2 nm CoFe/2 nm Cu/2.5 nm CoFe/0.9 nm Ru/2 nm CoFe/7 nm IrMn/5 nanometer Ta (8-3)

5 nanometer Ta/x nm Ru/y nm Cu/2 nm CoFe/2 nm Cu/2.5 nm CoFe/0 .9 nm Ru/2 nm CoFe/10 nm PtMn/5 nanometer Ta (8-4)

In those variations, the high-conductivity layer is of a laminate film of Ru/Cu but not a single-layer Cu. The reasons for the laminate film are the following two.

1. CoFe magnetostriction control.
2. Hin reduction.

The CoFe magnetostriction control of 1 is to control the magnetostriction of CoFe through the distortion control of itself, as will be mentioned hereunder. Specifically, the fcc-d(111) spacing in CoFe is enlarged more than the that on go simple Cu, high conductivity layer magnetostriction in the CoFe free layer is controlled to be nearly zero. The magnetostriction of $Co_{90}Fe_{10}$ (at. %) is often enlarged in the negative side in an ordinary condition. Therefore, the material to be below the Cu layer preferably has a large atomic radius than Cu. For example, Ru is preferred. In addition to this, also preferred are Re, Au, Ag, Al, Pt, Rh, Ir, Pd, etc. For the magnetostriction control, the underlayer is made to have a two-layered structure, or the CoFe composition may be varied from 90-10 at. % to any others. Concretely, employable are CoFe alloy free layers having a varying composition of from $Co_{90}Fe_{10}$ to $Co_{96}Fe_{4}$.

The Hin reduction of 2 is because Ru has the ability to planarize the growing film. As previously mentioned hereinabove, Hin is preferably as small as possible for good bias point designing based on Hcu and Hpin. In particular, the spacer thickness is preferably as small as possible in two points of the MR spin filter effect and the shunt reduction in the upper free layer. For this, needed is a technique of using an ultra-thin spacer of Cu having a low Hin. In the constitution having a laminate Ru/Cu film, where the underlayer is of 1.5 nm Ru/1 to 2 nm Cu, the free layer of CoFe is an ultra-thin free layer having Ms×t of 3.6 nm and a thickness of 2 nanometers, and the spacer Cu has a thickness of 2 nanometers, Hin could be from 7 to 13 Oe or is low. Considering the fact that Hin in the embodiments of (7-1) and (7-2) is around 20 Oe, the Hin reduction in the embodiments (8-3) and (8-4) is significant.

For Hcu calculation, at shall be obtained from the specific resistance of Ru in terms of Cu having 10 microohm centimeter. The specific resistance of Ru as obtained in experiments is 30 $\mu\Omega$cm. For the shunt effect, the thickness of Ru could be ⅓ of that of Cu having a specific resistance of 10 $\mu\Omega$cm. For example, the shunt in the constitution of 1.5 nm Ru/1 nm Cu could be equivalent to that in Cu of (1.5 nanometers/3)+1 nanometer=1.5 nanometer in thickness.

In variations of the embodiments (8-1) to (8-4), a noble metal element film may be further laminated over the antiferromagnetic film. For example, employable is any of a single-layered or laminated films of Cu, Ru, Pt, Au, Ag, Re, Rh, Pd, etc. In those constitutions, low Hin could be realized even when the spacer film therein is thin. However, if the laminated film is too thin, the current flow ratio will be large in the upper free layer. Therefore, the thickness of the single-layered or laminated film preferably falls between 0.5 nanometers and 3 nanometers or so.

Example 3: Bottom SFSV (with NiFe/Co(Fe) free layer)
  5 nanometer Ta/2 nm Ru/10 nm PtMn/2 nm CoFe/0.9 nm Ru/2.5 nm CoFe/2 nm Cu/0.5 nm Co/2 nm NiFe/2 nm Cu/5 nanometer Ta (9-1)
  5 nanometer Ta/1 nm Ru/2 nm NiFeCr/7 nm IrMn/2 nm CoFe/0.9 nm Ru/2.5 nm CoFe/2 nm Cu/0.5 nm Co/2 nm NiFe/2 nm Cu/5 nanometer Ta (9-2).

Figure 6:
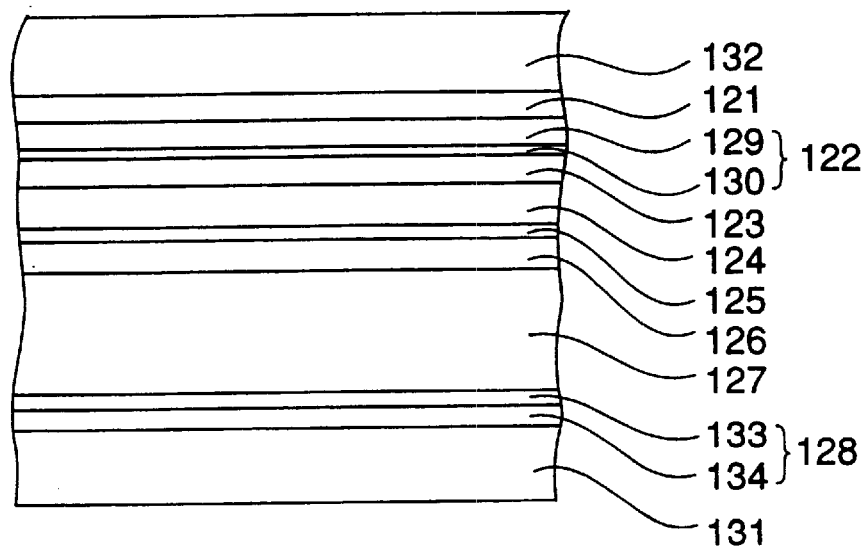
FIG. 6 is a sectional view of a film constitution of the spin valve film of one example of the invention.

This is to exemplify a so-called bottom-type spin valve film in which an antiferromagnetic layer is below a free layer. FIG. 6 is a conceptual view showing the spin valve film constitution of this Example. Precisely, the film illustrated comprises an antiferromagnetic film crystallization control layer 128 and an antiferromagnetic film 127 as laminated on a subbing buffer layer 131, and comprises pinned layers 126 and 124 as antiferromagnetically coupled to each other via a layer 125. On the layer 124, laminated are a spacer layer 123, a free layer 122 and a nonmagnetic high-conductivity layer 121 in that order. Finally provided is a cap layer 132 over them.

In the embodiment of (9-1), the antiferromagnetic film crystallization control layer 128 is a single layer of Ru, the antiferromagnetic film 127 is of PtMn, and the free layer 122 is of a laminate film composed of two layers 129 and 130. In the embodiment of (9-2), the antiferromagnetic film crystallization control layer 128 is a two-layered film composed of a film 133 of Ru and a film 134 of NiFeCr, the antiferromagnetic film 127 is of IrMn, and the free layer 122 is of a two-layered film composed of two layers 129 and 130.

In the bottom-type spin valve film, the antiferromagnetic film crystallization control layer is provided over the buffer layer of Ta or the like, and it is a subbing film of fcc or hcp having a thickness of from 1 nanometer to 5 nanometers or so. For example, employed are alloy films or laminate films of Cu, Au, Ru, Pt, Rh, Ag, Ni, NiFe, etc. The seed layer is important for increasing the function of the antiferromagnetic film. In the embodiment of (9-1) incorporating PtMn, used is a single-layered Ru layer; while in (9-2) incorporating IrMn, used is a laminate film of Ru/NiFeCr. In the constitution with the antiferromagnetic film crystallization control layer of that type, the blocking temperature for the antiferromagnetic film could be elevated to a satisfactorily high level, the film planarization could be promoted, and low Hin could be realized even for the ultra-thin spacers of from 1.5 to 2.5 nanometers thick or so that are needed in the invention.

The bias point control to be effected in the invention is not so much influenced by the type of the seed layer when the thickness of the seed layer falls within the range defined in this Example. However, low resistance materials having a small specific resistance are unfavorable to the seed layer. This is because, if the shunt current flow is increased in the layer, it would be difficult to make the current center near to the free layer. Therefore, for the seed layer, it is desirable to use materials having as high as possible resistance and capable of enhancing the function of the antiferromagnetic film. For example, in place of using low-resistance NiFe alone, any of Cr, N, Hf, W, Ta and the like may be added to NiFe so as to increase the specific resistance of the NiFe layer. In (9-2), used is NiFeCr in place of NiFe.

As the antiferromagnetic film, used is PtMn in (9-1), and IrMn in (9-2). PtMn is advantageous in that the blocking temperature is high, that Hu.a. is large, and that the thermal stability for MR is lowered little after thermal treatment. With PtMn being used, therefore, high MR and high ΔRs could be realized. Like in the top-type structure, the merit of the noble metal-containing antiferromagnetic film of PtMn in the bottom-type structure is significant in that high MR could be maintained still after thermal treatment and even when ultra-thin free layers are used. In place of PtMn, PdPtMn is also employable. The preferred thickness range of the layer falls between 5 nanometers and 30 nanometers, more preferably between 7 nanometers and 15 nanometers.

The merit of IrMn in (9-2) is that it can maintain its characteristics even when its thickness is smaller than the thickness of PtMn. Therefore, IrMn is suitable to narrow-gap heads for high-density recording. Preferably, the IrMn thickness falls between 3 nanometers and 13 nanometers. The IrMn film is also an antiferromagnetic film containing the noble metal Ir, and its thermal stability for good MR ratio is excellent. In place of IrMn, also employable is noble metal-containing RuRhMn.

As mentioned above, PtMn, IrMn and PdPtMn are the best for the antiferromagnetic film. However, the bias point control in the spin valve films of the invention is not limited by the material of the antiferromagnetic film. In the invention, also employable are any other antiferromagnetic films of NiO, CrMnPt, NiMn, $\alpha$-$Fe_2O_3$, etc.

As the ferromagnetic material for the two pinned layer in the Synthetic AF structure, herein used is an CoFe alloy. In place of this, also employable are Co, NiFe and even laminate films of NiFe with Co or CoFe. Regarding the constituent materials and the film thicknesses, the same as in the top-type structures of Examples 1 and 2 noted above could apply to the bottom-type structure herein. The most significant object of the Synthetic pinned layer structure, which is the key point in the invention, is to reduce the pinned stray magnetic filed, as so mentioned hereinabove. The difference in Ms×t between the upper and lower ferromagnetic layers shall be closely related to the thickness of the high-conductivity layer as provided adjacent to the free layer.

Regarding the spacer, the same idea as that for the top-type structure shall apply also to the bottom-type structure. Also in the bottom-type structure, the spacer layer is as thin as possible. Concretely, the spacer thickness preferably falls between 1.5 nanometers and 2.5 nanometers, more preferably between 1.8 nanometers and 2.3 nanometers.

In this Example, the free layer is of a laminate film of NiFe/Co. Regarding the thickness and the material of the free layer, the same as in the top-type structure shall apply to the bottom-type structure. However, the NiFe composition for the subbing film differs between the top-type structure and the bottom-type structure, and the preferred NiFe composition for realizing low magnetostriction in the bottom-type structure differs in some degree from that in the top-type structure. Concretely, in the case of a laminated free layer of NiFe/CoFe, the positive side shifting of the magnetostriction in the laminated NiFe/CoFe free layer to be caused by the reduction in the thickness of NiFe in the bottom-type structure is smaller than that in the top-type structure. Therefore, in the bottom-type structure, Ni-poorer NiFe compositions could well realize the reduction in the magnetostriction than in the top-type structure.

For example, in the case of a laminated free layer of 3 nm NiFe/0.5 nm CoFe, the NiFe composition of $Ni_{81}Fe_{19}$ (at. %) is not applicable to the top-type structure as the magnetostriction in the positive side is large, but is applicable to the bottom-type structure as the magnetostriction in the positive side is satisfactorily small in practical applications.

The high-conductivity layer is the second significant key point in the invention the same as the top type spin valve as mentioned before. In this Example, the high-conductivity layer is of a Cu film. The most significant role of the high-conductivity film is to make the current center near the free layer as much as possible thereby reduce the current magnetic field.

Still another role of the film is to exhibit the spin filter effect for MR owing to the conductivity of Cu. Therefore, even through the ultra-thin free layer is employed herein, the MR ratio degradation is small.

Regarding the optimum thickness range of the Cu layer, the same as in invention of the top type spin-valve may apply also to the bottom spin-valve of this Example. Like in the top-type structure, the optimum thickness range of the Cu layer varies also in bottom-type structure, depending on the thickness of the free layer, and on the difference in the thickness between the upper and lower pinned layers of the Synthetic AF. In addition to its role for bias point control and for high MR ratio retention, still another important role of the Cu cap layer is to realize low Hin in ultra-thin free layers.

For example, when Hin in a free layer is 30 Oe or more in the absence of the Cu cap layer, it could be reduced to about 10 Oe in the same free layer in the presence of the Cu cap layer.

In variations of (9-1) and (9-2), the high-conductivity layer may be of a laminate film composed of at least two layers, in place of the single-layer high-conductivity layer of Cu as disposed adjacent to the free layer of CoFe. For example, the laminate film for the high-conductivity layer may include Cu/Ru, Cu/Re, Cu/Rh, Cu/Pt, etc. The essential object of the two-layered high-conductivity layer is to control the magnetostriction $\lambda$s in the free layer. This is because, as so mentioned hereinabove for the top-type structure, the magnetostriction in the free layer of CoFe is influenced by the distortion of the free layer itself. Moreover reduction in Hin is important in the invention. For reducing Hin, the two-layered high-conductivity layer will be effective.

Embodiments of the variations are mentioned below.

5 nanometer Ta/2 nm Ru/10 nm PtMn/2 nm CoFe/0.9 nm Ru/2.5 nm CoFe/2 nm Cu/0.5 nm Co/2 nm NiFe/1.5 nm Cu/1.5 nm Ru/5 nanometer Ta (9-3).

5 nanometer Ta/1 nm Ru/1 nm NiFeCr/7 nm IrMn/2 nm CoFe/0.9 nm Ru/2.5 nm CoFe/2 nm Cu/0.5 nm Co/2 nm NiFe/1.5 nm Cu/1.5 nm Ru/5 nanometer Ta (9-4)

In those film structures, the specific resistance of Ru is 30 $\mu\Omega$cm while that of Cu is 10 $\mu\Omega$cm. For the electrical shunt effect, Cu of 1 nanometer Thick will be equivalent to Ru of 3 nanometer Thick. In other words, in the films (9-3) and (9-4), the thickness of the high-conductivity film is equivalent to 2 nanometers in terms of Cu. For the single-layer Cu, its thickness may fall between 0.5 nanometers and 4 nanometers. Therefore, for Ru, its thickness may fall between 0.5 nanometers and 12 nanometers. However, Ru has a higher specific resistance than Cu and its spin filter effect is much lower than that of Cu. Therefore, for the high-conductivity layer to be adjacent to CoFe, Cu is preferred to Ru. Too thick Ru is unfavorable, as not satisfying narrow gaps. For these reasons, therefore, it is desirable that Cu is positioned adjacent to CoFe, while having a thickness of from 0.5 to 2 nanometers or so, and the other additional metal layer is positioned over the Cu layer to give the laminated film for the high-conductivity layer.

Example 4

Bottom SFSV (with free CoFe layer)

5 nanometer Ta/2 nm Ru/10 nm PtMn/2 nm CoFe/0.9 nm Ru/2.5 nm CoFe/2 nm Cu/2 nm CoFe/2 nm Cu/5 nanometer Ta (10-1).

5 nanometer Ta/1 nm Ru/2 nm NiFeCr/7 nm IrMn/2 nm CoFe/0.9 nm Ru/2.5 nm CoFe/2 nm Cu/2 nm CoFe/2 nm Cu/5 nanometer Ta (10-2)

This is to exemplify other embodiments of the bottom-type structure of FIG. 6, in which the free layer 122 is of a single-layered CoFe. The others are the same as in Example 3. The materials of the other layers except the free Clayer and the thicknesses of those other layers are the same as in Example 3. The merits of the single-layered free layer of CoFe are the same as in the top-type structure. In this Example, Ms×t is 3.6 nanometer Tesla in terms of NiFe. When this is compared with Ms×t of 4.5 nanometer Tesla, the thickness of the single CoFe free layer could be 2.5 nanometers and is thin. Even so thin, the single CoFe free layer could enjoy good spin filter effect. However, the two-layered free layer of NiFe/Co (Fe) shall have a large thickness to be 4 nm NiFe/0.5 nm Co, and it could not enjoy the spin filter effect for MR but shall be a simple shunt layer.

In addition, NiFe itself also exhibits the shunt effect. Therefore, ΔRs in the two-layered free layer is reduced by 0 to 30%, based on that in the single-layered CoFe free layer.

As in the above, since the single-layered CoFe free layer in this Example could enjoy the MR spin filter effect in a broad range of Ms×t, it is better than the laminated free layer in Example 3.

In variations of (10-1) and (10-2), the high-conductivity layer may be of a laminate film composed of at least two layers, in place of the single-layer high-conductivity layer of Cu as disposed adjacent to the free layer of CoFe. For example, the laminate film for the high-conductivity layer may include Cu/Ru, Cu/Re, Cu/Rh, etc. The essential object of the two-layered high-conductivity layer is to control the magnetostriction $\lambda s$ in the free layer. This is because, as so mentioned hereinabove, the magnetostriction in the free layer of CoFe is influenced by the distortion of the free layer itself. Reduction in Hin is important in the invention. For reducing Hin, the two-layered high-conductivity layer will be effective. Embodiments of the variations are mentioned below.

5 nanometer Ta/2 nm NiFe/10 nm PtMn/2 nm CoFe/0.9 nm Ru/2.5 nm CoFe/2 nm Cu/2 nm CoFe/1.5 nm Cu/1.5 nm Ru/5 nanometer Ta (10-3).

5 nanometer Ta/2 nm NiFe/7 nm IrMn/2 nm CoFe/0.9 nm Ru/2.5 nm CoFe/2 nm Cu/2 nm CoFe/1.5 nm Cu/1.5 nm Ru/5 nanometer Ta (10-4).

In place of controlling the magnetostriction in CoFe by means of the laminated film for the nonmagnetic high-conductivity film as in the above, the magnetostriction in the free layer could also be controlled by varying the composition of CoFe for the free layer. In general, it is easy to modify the subbing film for distortion control in the free layer. However, in bottom-type structures, it is often difficult to freely select the material for the subbing film for the free layer. In bottom-type structures, CoFe is laminated on Cu. In those, if $Co_{90}Fe_{10}$ (at. %) is employed, the magnetostriction of the free layer in the negative side will increase. In order to correct the magnetostriction to the positive side, Co-rich CoFe is desired. Concretely, desired are CoFe free layers of $Co_{90}Fe_{10}$ (at. %) to $Co_{96}Fe_{4}$ (at. %). However, the Co content of the free layer is too large, the Co-rich composition will have an hcp phase whereby the soft magnetic characteristics of the free layer will be lowered (that is, Hc in the free layer is increased). Therefore, too Co-rich CoFe alloys such as $Co_{98}Fe_{2}$ are unfavorable.

In those film structures, the specific resistance of Ru is 30 $\mu\Omega$cm while that of Cu is 10 $\mu\Omega$cm. For the electrical shunt effect, Cu of 1 nanometer Thick will be equivalent to Ru of 3 nanometer Thick. In other words, in the films (10-3) and (10-4), the thickness of the high-conductivity film is equivalent to 2 nanometers in terms of Cu. For the single-layer Cu, its thickness may fall between 0.5 nanometers and 4 nanometers. Therefore, for Ru, its thickness may fall between 0.5 nanometers and 12 nanometers. However, Ru has a higher specific resistance than Cu and its spin filter effect is lower than that of Cu. Therefore, for the high-conductivity layer to be adjacent to CoFe, Cu is preferred to Ru. Too thick Ru is unfavorable, as not satisfying narrow gaps. For these reasons, therefore, it is desirable that Cu is positioned adjacent to CoFe, while having a thickness of from 0.5 to 1 nanometer or so, and the other additional metal layer is positioned over the Cu layer to give the laminated film for the high-conductivity layer. Second to Sixth Embodiments: improvement in high-temperature stability and reproduction output power The second to sixth embodiments of the invention are mentioned below, which are directed to the improvement in the high-temperature stability and the reproduction output power.

First mentioned is the outline of the technical idea common to the second to sixth embodiments.

Figure 17:
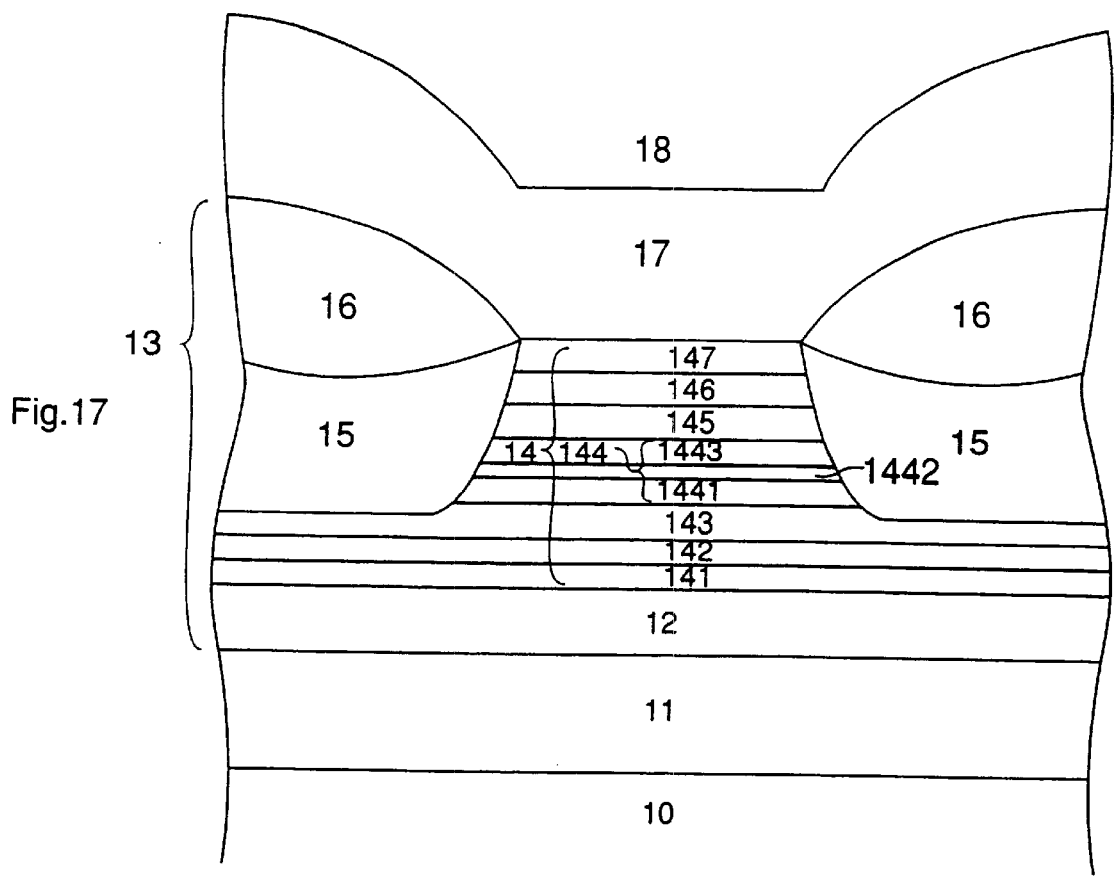
FIG. 17 is a sectional view of one embodiment of the magnetoresistance effect head of the invention.

FIG. 17 shows one example of the second to sixth embodiments of the invention. In FIG. 17, a lower shield 11 and a lower gap film 12 are provided on a substrate 10, and a spin valve device 13 is provided thereon. The spin valve device comprises a spin valve film 14 and a pair of longitudinal bias films 15 and a pair of electrodes 16. The spin valve film 14 comprises nonmagnetic underlayers 141, 142, an antiferromagnetic layer 143, a pinned magnetic layer 144, an interlayer 145, a free layer 146 and a protective film 147.

Table 6 shows the material composition of the antiferromagnetic layer to be coupled with the ferromagnetic layer in SyAF which is the pinned magnetic layer of the invention, the thickness of the antiferromagnetic layer, the magnetic coupling coefficient J at 200° C., the magnetic coupling bias field $H_{UA}{}^*$ or $H_{UA}$ at 200° C., the blocking temperature Tb, and the resistance change rate ΔR/R in the spin valve device. Table 7 shows the same data as in Table 6, but in Table 7, the pinned magnetic layer is a conventional, single-layered, pinned magnetic layer. Table 8 shows the half-value width of the diffraction peak from the close-packed plane of the antiferromagnetic layer as coupled to SyAF in its rocking curve, Δθ; the magnetic coupling coefficient J at 200° C. to the ferromagnetic layer adjacent to the antiferromagnetic layer in SyAF; and the blocking temperature Tb.

TABLE 6

Spin Valve Film Constitution:
Substrate/5 nanometer Ta/NiFe/CoFe/3 nm Cu/2.5 nm CoFe/0.9 nm Ru/2.5 nm CoFe/antiferromagnetic layer/5 nanometer Ta

| Antiferromagnetic Layer | | J (erg/ | | Blocking Tempera- | Resistance Change |
|---|---|---|---|---|---|
| Material | Thickness (nm) | cm²) at 200° C. | $H_{UA}{}^*$ (Oe) at 200° C. | ture Tb (° C.) | Rate ΔR/R (%) |
| Ir22Mn78 | 5 | 0.04 | 400 | 250 | 7.3 |
| (comp. | 7 | 0.045 | 450 | 270 | 7.3 |
| case) | 1 | 0.045 | 450 | 290 | 7 |
|  | 20 | 0.04 | 400 | 300 | 6.5 |
|  | 30 | 0.035 | 350 | 300 | 5.5 |
| Rh20Mn80 | 7 | 0.025 | 250 | 235 | 7.1 |
|  | 10 | 0.035 | 350 | 260 | 6.8 |
| Rh14Ru7Mn79 | 7 | 0.02 | 200 | 225 | 7.2 |
|  | 10 | 0.03 | 300 | 245 | 6.8 |
| Pt53Mn47 | 10 | 0.02 | 250 | 290 | 7.9 |
| (comp. | 15 | 0.025 | 400 | 320 | 7.4 |
| case) | 20 | 0.1 | >600 | 350 | 7 |
|  | 30 | 0.12 | >600 | 370 | 6.2 |
| Ni50Mn30 | 15 | 0.02 | 250 | 300 | 6.8 |
| CrMnPt | 15 | 0.02 | 200 | 240 | 6.9 |

Spin valve films with IrMn, RhMn, RhRuMn or CrMnPt: heat-seated at 270° C. for 1 hour.
Spin valve films with PtMn with PtMn or NiMn: heat-treated at 270° C. for 10 hours.

TABLE 7

Spin Valve Film Constitution:
Substrate/5 nanometer Ta/NiFe/CoFe/3 nm Cu/2.5 nm CoFe/antiferromagnetic layer/5 nanometer Ta

| Antiferromagnetic Layer | | J (erg/ | | Blocking Tempera- | Resistance Change |
|---|---|---|---|---|---|
| Material | Thickness (nm) | cm²) at 200° C. | $H_{UA}{}^*$ (Oe) at 200° C. | ture Tb (° C.) | Rate ΔR/R (%) |
| Ir22Mn78 | 5 | 0.04 | 170 | 250 | 6.6 |
|  | 10 | 0.045 | 190 | 290 | 6.2 |

TABLE 7-continued

Spin Valve Film Constitution:
Substrate/5 nanometer Ta/NiFe/CoFe/3 nm Cu/2.5 nm
CoFe/antiferromagnetic layer/5 nanometer Ta

| Antiferromagnetic Layer | | J (erg/ cm$^2$) at 200° C. | $H_{UA}$* (Oe) at 200° C. | Blocking Temperature Tb (° C.) | Resistance Change Rate ΔR/R (%) |
|---|---|---|---|---|---|
| Material | Thickness (nm) | | | | |
| Pt51Mn49 | 10 | 0.03 | 130 | 300 | 7.2 |
|  | 20 | 0.1 | 430 | 350 | 6.7 |
|  | 30 | 0.12 | 510 | 370 | 6.4 |

Spin valve films with IrMn: heat-treated at 270° C. for 1 hour.
Spin valve films with PtMn: heat-treated at 270° C. for 10 hours.

TABLE 8

| Antiferromagnetic Layer | | Half-value Width of the diffraction peak from the close-packed plane in its rocking curve, Δθ | J (erg/cm$^2$) at 200° C. | Blocking Temperature Tb (° C.) |
|---|---|---|---|---|
| Material | Thickness (nm) | | | |
| Ir22Mn78 | 5 | 12 | 0.1 | 210 |
|  | 5 | 8 | 0.025 | 230 |
|  | 5 | 5 | 0.045 | 250 |
|  | 5 | 3 | 0.05 | 250 |
| Rh20Mn80 | 7 | 13.5 | ~0 | 190 |
|  | 7 | 8 | 0.02 | 225 |
|  | 7 | 4 | 0.025 | 235 |

As in Table 6 and Table 8, we, the present inventors have found that (1) when the pinned magnetic layer as coupled to the antiferromagnetic layer has a structure of SyAF and when the composition of the antiferromagnetic layer is specifically selected, then the magnetic coupling coefficient J at 200° C. could be at least 0.02 erg/cm$^2$, (2) when the close-packed plane of the antiferromagnetic layer is so oriented that the half-value width of the diffraction peak from the close-packed plane of the layer in its rocking curve is reduced, preferably so that it appears at 8 degree or smaller, more preferably at 5 degrees or smaller, then the magnetic coupling coefficient J at 200° C. could be increased, (3) when the magnetic thickness of the antiferromagnetic layer is not larger than 20 nanometers, more preferably not larger than 10 nanometers, then the resistance change rate in the spin valve device having a multi-layered, pinned magnetic layer structure could be increased to be comparable to or higher than that in the spin valve device having a single-layered, pinned magnetic layer structure, and (4) when the magnetic coupling coefficient J at 200° C. is at least 0.02 erg/cm$^2$, then the magnetic coupling bias $H_{UA}$* at 200° C. could be at least 200 Oe, and, therefore, even though the maximum magnetic field to be applied to the reproduction device, spin valve film, from a recording medium or the like is 200 Oe, the pinned magnetic layer in the spin valve film is still kept stable. On the basis of these findings, we have completed the present invention.

Figure 18:
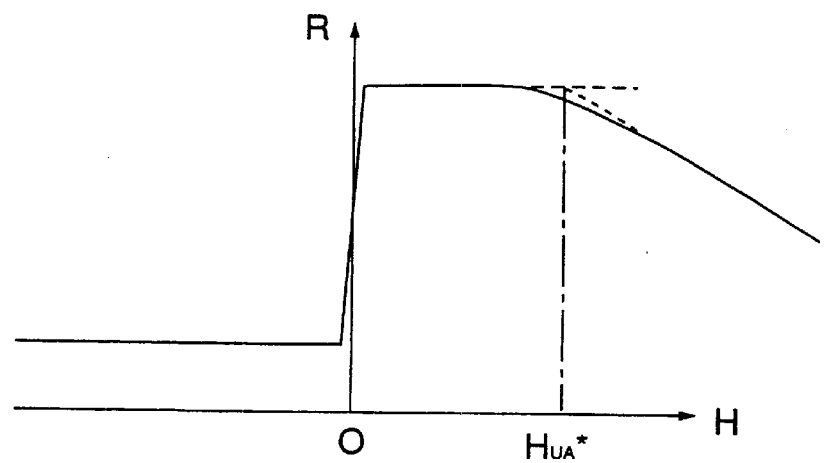
FIG. 18 is a schematic view of the magnetic coupling bias field HUA* versus the change in the resistance, R, of the spin valve film depending on the applied magnetic field.

FIG. 18 is a schematic view of the magnetic coupling bias field HUA* versus the change in the resistance of the spin valve film depending on the applied magnetic field. In FIG. 18, the magnetic coupling bias field $H_{UA}$* is defined as the maximum magnetic field at which the magnetization of the pinned magnetic layer does not substantially move, and this is obtained as the intersection of the extended line from the linear region in the low magnetic field side and the extended line from the linear region in the high magnetic field side. The magnetization of the pinned magnetic layer having a magnetic coupling bias field HUA* of at least 200 Oe moves little within the magnetic field range up to 200 Oe in the resistance-magnetic field characteristics for which an external magnetic field is applied to the magnetization pinned direction, and only the free layer responses to the magnetization to give resistance change.

In FIG. 18, seen is only the steep resistance change resulting from the magnetization response of the free layer in the vicinity of the magnetic field of zero which is the operating point for a magnetic field sensor, on the resistance-magnetic field characteristic curve. In this, no resistance change is admitted except the magnetization response of the free layer to the applied magnetic field of up to 200 Oe. After the free layer has been saturated, there occurs no substantial response to the magnetic field.

When conventional antiferromagnetic layers of NiO or FeMnCr are used, the constant J could not obtained little at 200° C. On the other hand, when an antiferromagnetic layer of CrMnPt having a thickness of 30 nanometers, the resistance change rate is lower than that in conventional pinned magnetic layers having a single-layered structure, and the layer of CrMnP of that type is unfavorable.

As in Table 7 showing the data of conventional pinned magnetic layers having a single-layered structure, PtMn gives high $H_{UA}$* when its thickness is at least 20 nanometers but its resistance change rate falls between 6.4 and 6.7% and is relatively low.

As opposed to those, in the samples of the invention shown in Table 6 in which the antiferromagnetic layer is of any of IrMn, RhMn, RhRuM-n, PtMn, NiMn or CrMnPt having a thickness of at most 20 nanometers, $H_{UA}$* at 200° C. is at least 200 Oe, or that is, these samples have excellent thermal stability. In addition, the resistance change rate in those samples is comparable to or higher than that in the conventional samples where the pinned magnetic layer has a single-layered structure. In the invention, the lowermost limit of the thickness of the antiferromagnetic layer is preferably at least 3 nanometers.

Figure 19:
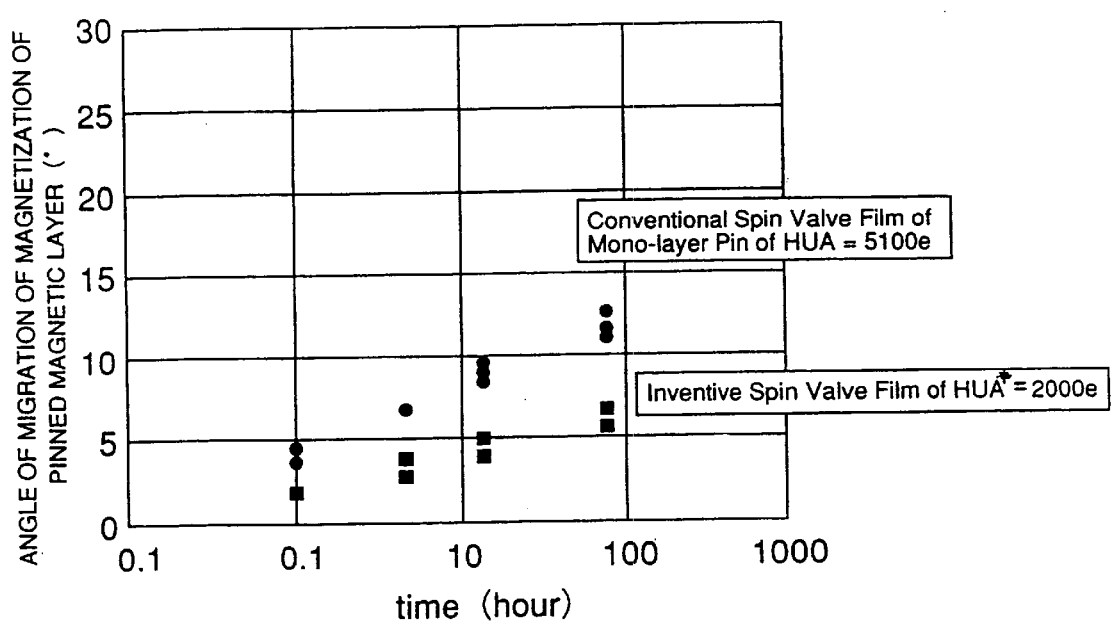
FIG. 19 is a graph of the angle of movement of the magnetization of the pinned magnetic layer, versus time, in the presence of a simulation bias field.

FIG. 19 is a graph of the angle of movement of the magnetization of the multi-layered, pinned magnetic layer of spin valve films of the invention with $H_{UA}$* of 200 Oe and that of the single-layered, pined magnetic layer of conventional spin valve films with $H_{UA}$ of 500 Oe, versus time, in the presence of abias field of 200 Oe at 200° C. perpendicular to the direction of the pinned magnetization. As in FIG. 19, it is understood that the time-dependent change at 200° C. in the pinned magnetization in the spin valve films of the invention is smaller than that in the pinned magnetization in the conventional spin valve films where the pinned magnetic layer has a single-layered structure, even though $H_{UA}$* at 200° C. in the former is 200 Oe and is smaller than that in the latter of being 510 Oe. This means that the spin valve films of the invention are stable.

The resistance change rate in the spin valve films of the invention where the antiferromagnetic layer is of an Mn-rich, γ-Mn based antiferromagnetic material such as IrMn, RhMn or RhRuMn and has a thickness of at most 10 nanometers is larger than that in the conventional spin valve films incorporating a single-layered, pinned magnetic layer. Those spin valve films of the invention are more preferred.

As in Table 6, the spin valve films of the invention with the antiferromagnetic layer having Tb of from 240 to 300° C. have good thermal stability for the magnetization pinning. Therefore, in those spin valve films of the invention, since both the ferromagnetic layer A and the ferromagnetic layer B could be saturated in the same direction by applying thereto a magnetic field larger than the coupling magnetic field of the antiferromagnetically coupling layer at around Tb to thereby freely control the magnetization direction of the pinned magnetic layer by the applied magnetic field, the intended magnetization pinning can be realized even at a temperature not higher than 300° C. at which the diffusion between the antiferromagnetically coupling layer and the ferromagnetic layers A and B could be negligible.

In order to prevent the diffusion between the antiferromagnetically coupling layer and the ferromagnetic layers A and B and to retard the influences of the diffusion, it is desirable that the antiferromagnetically coupling layer has a thickness of larger than 0.8 nanometers and contains any of Ru, Rh, Cr, Ir or the like. For that purpose, it is effective to use a Co alloy such as CoFe for the ferromagnetic layers A and B and to make the level of the surface roughness of the antiferromagnetically coupling layer comparable to or lower than the thickness of the layer itself.

In the thermal treatment for settling the magnetization direction of the pinned magnetic layer, both the magnetic layers A and B must be saturated in the same direction. Therefore, if the ferromagnetic layers A and B are so thinned that their thickness is around 2 nanometers and when the thickness of the antiferromagnetically coupling layer is not larger than 0.8 nanometers, the antiferromagnetically coupling magnetic field of the coupling layer will increase up to about 7 kOe or larger. In that condition, the thermal treatment for settling the magnetization direction of the pinned magnetic layer would be difficult in a practicable external magnetic field. For these reasons, it is desirable that the thickness of the antiferromagnetically coupling layer is larger than 0.8 nanometers. With such a thick coupling layer, the thermal treatment for settling the magnetization direction of the pinned magnetic layer could be attained in a practicable external magnetic field of, for example, 7 kOe.

In the samples of the invention in Table 6 all with an SyAF-type antiferromagnetically coupling layer, the thickness of the ferromagnetic layers A and B of a CoFe alloy is 2.5 nanometers each, and that of the antiferromagnetically coupling layer of Ru is 0.9 nanometers. In those, the antiferromagnetically coupling magnetic field is around 4 kOe, and good thermal stability could be ensured to the pinned magnetic layer in such an antiferromagnetic field.

In the device of the invention, it is desirable that the magnetic thickness of the ferromagnetic layer A is nearly the same as or larger than that of the ferromagnetic layer B. In the device where the magnetic thickness of the ferromagnetic layers A and B is nearly the same, the magnetization of the pinned magnetic layer is much more stable against the ambient magnetic field and against the longitudinal bias magnetic field than in the device where the magnetic thickness of the ferromagnetic layer A is larger than that of the ferromagnetic layer B.

On the other hand, the device where the magnetic thickness of the ferromagnetic layer A is larger than that of the ferromagnetic layer B could have better ESD resistance with little pinning magnetization reversal owing to ESD, than that where the magnetic thickness of the ferromagnetic layers A and B is nearly the same. In the former case, it is desirable that the ratio of the magnetic thickness of the ferromagnetic layer B to that of the ferromagnetic layer A falls between 0.7 and 0.9. For example, when the ferromagnetic layer A is of a CoFe alloy of 2.5 nanometers thick, then the ferromagnetic layer A is preferably of a CoFe alloy of 2 nanometers thick. Even though the magnetic thickness of the ferromagnetic layers A and B is nearly the same, and even when ESD occurs to cause pinning magnetization reversal, repinnable magnetic disc drives could be realized by incorporating thereinto a circuit capable of repinning the magnetization of the pinned magnetic layer in a predetermined direction in the presence of current force (for example, U.S. Pat. No. 5,650, 887). For realizing the value J at 200° C. of at least 0.02 erg/cm$^2$, it is desirable to employ an antiferromagnetic layer comprising, as the major phase, a γ-Mn phase of IrMn, RhMn, RhRuMn or the like or a ordered AuCUII-type phase that consists essentially of Mn (of which the Mn content is more preferably from more than 0 but less than 40%); or to employ an antiferromagnetic layer comprising a ordered, face-centered cubic system phase (of CuAuI type) of PtMn, PtPdMn, NiMn or the like (of which the Mn content is more preferably from 40 to 70%); or to employ a Cr-based antiferromagnetic layer of CrMn, CrAl or the like.

For ensuring a high value J at 200° C. of at least 0.02 erg/cm$^2$ to those alloys in thin antiferromagnetic layers capable of attaining a high resistance change rate, the alloys must have a crystal structure with an oriented close-packed plane.

From the data in Table 8 that indicate the relationship between the half-value width Δθ of the diffraction peak from the close-packed plane of the antiferromagnetic layer in its rocking curve (this is a parameter of the close-packed plane orientation), Tb and J, it is understood that the spin valve films of the invention have a value of J of at least 0.02 erg/cm$^2$ when the half-value width Δθ is not larger than 8 degrees. Therefore, it is understood that using those spin valve films realizes the intended magnetoresistance effect heads of the invention. Even for the antiferromagnetic layer of PtMn or the like having a ordered, face-centered cubic system phase or for the bcc-type antiferromagnetic layer of CrMn or the like, the layer could have a high Tb and a high J at 200° C. even if it is thin, so far as the close-packed plane therein is oriented in the same manner as above. The close-packed plane as referred to herein is meant to indicate the (111) peak for the fcc phase, the (002) peak for the hcp phase, and the (110) peak for the bcc phase. In the case of PtMn or the like containing a ordered, face-centered cubic system phase, the remaining fcc phase shall be oriented in the (111) plane, or the (111) plane of the ordered, face-centered cubic system phase shall be oriented. The fcc phase and the hcp phase may have lamination defects.

As in FIG. 20, the half-value width of the diffraction peak from the close-packed plane of the layer in its rocking curve could be represented by the fluctuation of the close-packed plane spots in the direction perpendicular to the film surface in the transmission electron microscopic images of the cross section of the head, and the half-value width in the rocking curve in X-ray diffractiometry nearly corresponds to the fluctuation angle of the close-packed plane spots in the transmission electron microscopic images.

To realize such good close-packed plane orientation, the spin valve films may be formed in an atmosphere with impurities such as oxygen gas and others therein being minimized as much as possible. For example, for forming the films, employable are a deposition method in which is used an apparatus capable of pre-degassing the system to a level of around 10$^{-9}$ Torr; a deposition method in which is used a sputtering target of which the oxygen content is lowered to at most 500 ppm; a substrate bias sputtering method in which a controlled degree of energy is applied to the sputtered atoms while the atoms are deposited on the substrate; and a deposition method in which a underlayer of a simple noble metal of, for example, Au, Cu, Ag, Ru, Rh, Ir, Pt, Pd or the like, or a underlayer of an alloy of any of those noble metals, of an Ni-based alloy layer of NiFe, NiCu, NiFeCr, NiFeTa or the like is provided between the alumina gap layer and the spin valve film.

The above is to explain the outline of the technical field common to the second to sixth embodiments of the invention as directed to the "improvement in the thermal stability and the reproduction output power".

The second to sixth embodiments of the invention are described in detail hereunder.

Second Embodiment:

FIG. 17 shows one example of the magnetoresistance effect head of this Embodiment. As in FIG. 17, a lower shield 11 and a lower gap film 12 are formed below an AlTiC ($Al_2O_3$ TiC) substrate, and a spin valve device 13 is formed thereon. The lower shield 11 may be of NiFe, a Co-based amorphous magnetic alloy, an FeAlSi alloy or the like having a thickness of from 0.5 to 3 $\mu$m, and it is desirable that NiFe or the FeAlSi alloy, if used, is polished to remove surface roughness. The lower gap layer 12 may be of alumina or aluminium nitride having a thickness of from 5 to 100 nanometers.

The spin valve device comprises a spin valve film 14, a pair of longitudinal bias films 15 and a pair of electrodes 16. The spin valve film comprises a nonmagnetic underlayer 141 of Ta, Nb, Zr, Hf or the like having a thickness of from 1 to 10 nanometers, an optional second underlayer 142 having a thickness of from 0.5 to 5 nanometers, an antiferromagnetic layer 143, a pinned magnetic layer 144, an interlayer 145 having a thickness of from 0.5 to 4 nanometers, a free layer 146, and an optional protective film 147 having a thickness of from 0.5 to 10 nanometers.

Above the spin valve device, formed are a gap layer 17 and an upper shield 18. Though not shown, a recording part is formed over them. The gap layer may be of alumina or aluminium nitride having a thickness of from 5 to 100 nanometers; and the upper shield 18 may be of NiFe, a Co-based amorphous magnetic alloy, an FeAlSi alloy or the like having a thickness of from 0.5 to 3 $\mu$m.

Where the antiferromagnetic layer 143 is of a γ-Mn-based, Mn-rich alloy of IrMn, RhMn, RhRuMn or the like, or of a ordered, face-centered cubic system alloy of PtMn, NiMn or the like, it is desirable that the underlayer 142 is of a metal film of, for example, Cu, Ag, Pt, Au, Rh, Ir, Ni or the like, or an alloy consisting essentially of those metals such as AuCu, CuCr or the like; Ni, an Ni-based alloy, NiFe, an NiFe-based alloy or the like such as those described in JP-A 9-229736; or Ru, Ti or the like, or an alloy consisting essentially of those metals.

Where the antiferromagnetic layer 143 is of a Cr-based antiferromagnetic alloy film, the underlayer 142 may be any of those mentioned above. For the underlayer 142, also suitable is any of bcc-phase metals of Cr, V, Fe and the like, or of alloys consisting essentially of those metals.

The pinned magnetic layer 144 is of a three-layered film, which comprises two layers of a ferromagnetic layer B, 1441, and a ferromagnetic layer A, 1443, as antiferromagnetically coupled to each other via an antiferromagnetically coupling layer 1442 existing therebetween. It is desirable to interpose a nonmetallic element such as oxygen, nitrogen or the like between the ferromagnetic layer B and the antiferromagnetic layer 143 or between the ferromagnetic layer B and the longitudinal bias film of the antiferromagnetic film, as producing large resistance change. In that case, the thickness of the interlayer into which the nonmetallic element is incorporated is preferably from 0.2 to 2 nanometers. For example, preferred is a structure of ferromagnetic layer A (or ferromagnetic layer B)/oxide layer/ferromagnetic layer B (or ferromagnetic layer A) in which an oxide interlayer is disposed between the ferromagnetic layers A and B.

The antiferromagnetically coupling layer 1442 may be of a metal of Ru, Rh, Ir or Cr. Preferred are Ru having an extremely large antiferromagnetically-coupling function; Ru capable of exhibiting its antiferromagnetically-coupling function in a broad film thickness range; and Cr capable of exhibiting its antiferromagnetically-coupling function in a broad film thickness range. The thickness of the antiferromagnetically coupling layer is not specifically defined, provided that it is suitable for making the layer exhibit its antiferromagnetically-coupling function. For this, referred to is the disclosure in Phy. Rev. Lett., 67, (1991), 3598.

Figure 21:
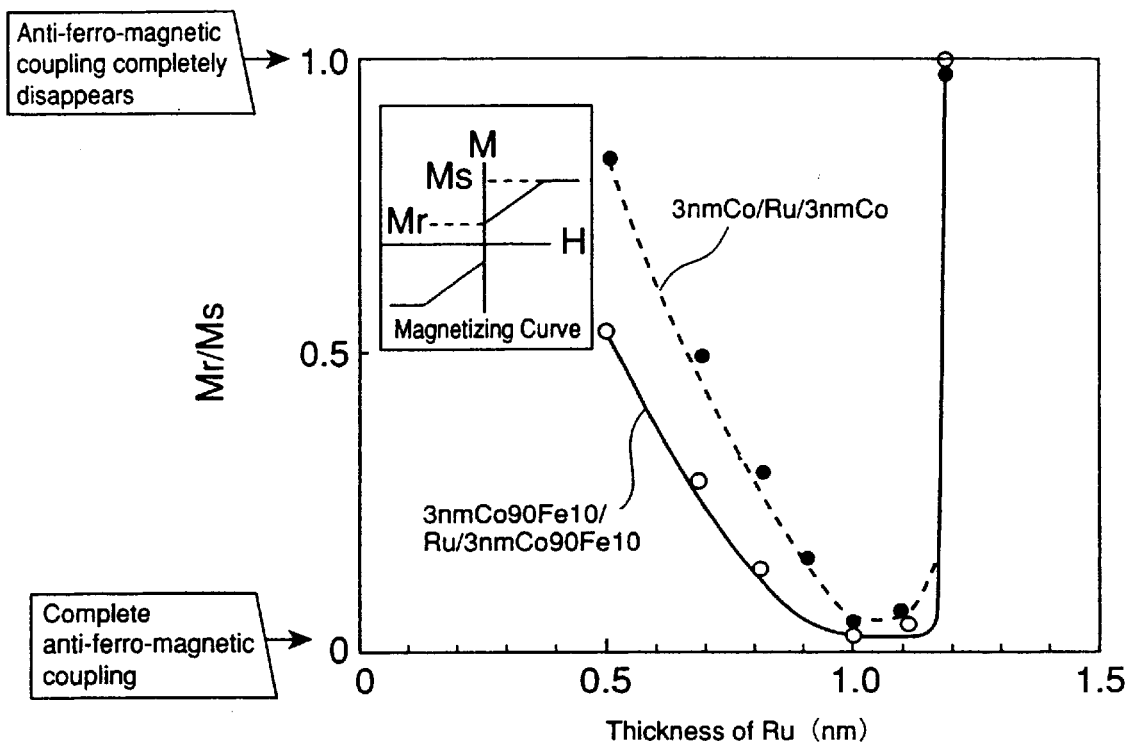
FIG. 21 is a graph of residual magnetization ratio, Mr/Ms, indicating the reduction in the antiferromagnetic coupling capability of the antiferromagnetically coupling layer of Ru after thermal treatment, relative to the thickness of the Ru layer.

FIG. 21 is a graph of residual magnetization ratio, Mr/Ms, indicating the reduction in the antiferromagnetic coupling capability of the antiferromagnetically coupling layer of Ru after thermal treatment, relative to the thickness of the Ru layer. In this, the antiferromagnetic coupling layer of Ru is to couple a ferromagnetic layer of Co and a ferromagnetic layer of a CoFe alloy. Mr/Ms=1 means that the coupling layer of Ru has completely lost its antiferromagnetic coupling capability; and Mr/Ms=0 means that the antiferromagnetic coupling of the ferromagnetic layers by the coupling layer of Ru is in a complete condition.

As in FIG. 21, it is understood that the thickness of the antiferromagnetic coupling layer of Ru is preferably from more than 0.8 nanometers up to 1.2 nanometers. With its thickness falling within the defined range, the characteristics including the antiferromagnetically-coupling function of the antiferromagnetic coupling layer of Ru are not degraded in any thermal treatment at 250 to 300° C. which may be needed for settling the magnetization direction of the pinned magnetic layer 144 or may be needed in any other steps of fabricating heads and which often induces mutual diffusion between the coupling layer and the neighboring ferromagnetic layers B and A. If the thickness of the Ru layer is not larger than 0.8 nanometers, some attention must be paid to the mutual diffusion to cause the degradation of the antiferromagnetically-coupling function of the Ru layer. On the other hand, if the thickness is larger than 1.2 nanometers, the antiferromagnetic coupling of the layers B and A by the Ru layer will be difficult. Where the antiferromagnetically coupling layer is of Cr, its thickness is also preferably from more than 0.8 nanometers up to 1.2 nanometers for the same reasons as those for the Ru layer. The ferromagnetic layers B and A are preferably of Co or a Co-based alloy.

Where the ferromagnetic layers B and A are of a $Co_{1-x}Fe_x$ alloy (0<x≦0.5), a large magnetic coupling coefficient could be ensured to them with the antiferromagnetic layer 143 of a γ-Mn-based, Mn-rich alloy of IrMn, RhMn, RhRuMn or the like, and, in addition, the mutual diffusion between Ru and the ferromagnetic layers B and A could be prevented. Therefore, the alloy is favorable to the layers B and A. If Co is used for the layers B and A in place of the CoFe alloy, J will be around 2/3. In addition, as in FIG. 21, the thickness range of the antiferromagnetically coupling layer capable of still maintaining the stable antiferromagnetically-coupling function even after thermal treatment at 270° C. for 1 hour or so is narrowed for the Co layers, as compared with that for the CoFe layers.

The surface smoothness of the antiferromagnetically coupling layer is also important for the purpose of maintaining the thermal stability for the antiferromagnetically-coupling function of the layer. If the level of the surface roughness of the layer is larger than the thickness of the layer itself even in a minor region of 10 nm² or so, the thermal stability for the antiferromagnetically-coupling function of the layer will be lowered. Therefore, it is desirable that the level of the surface roughness of the antiferromagnetically coupling layer is not larger than the thickness of the layer itself.

Figure 22A:
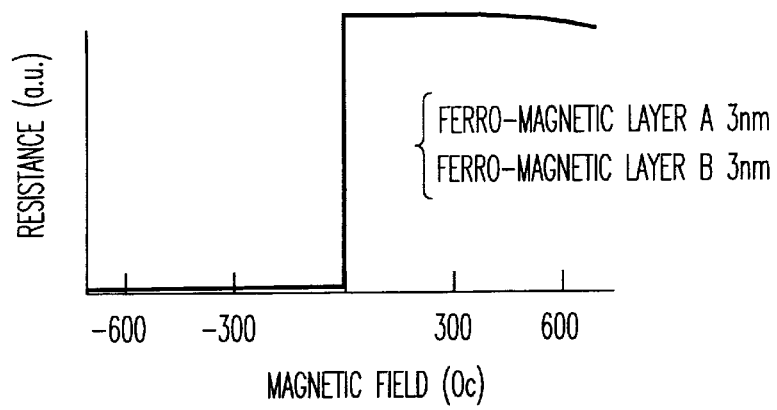
FIG. 22A, FIG. 22B and FIG. 22C are graphs of resistance change in spin valve films versus the applied magnetic field.
Figure 22B:
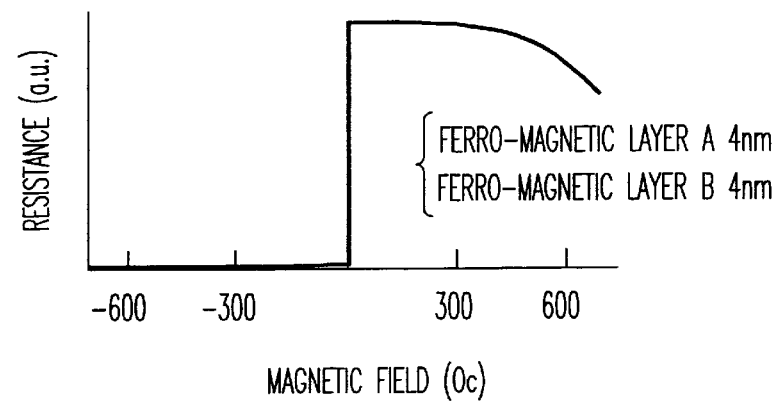
Figure 22C:
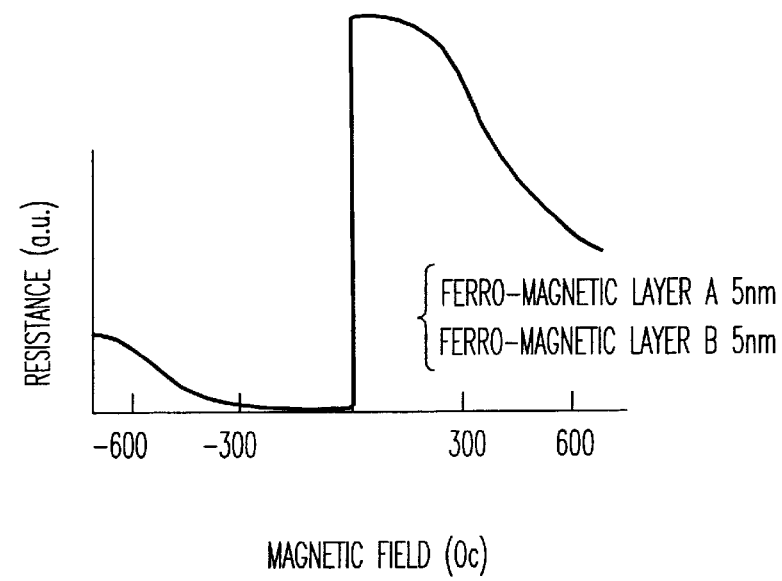

Table 9 shows the variation in the sheet resistance Rs of spin valve films, the sheet resistance change AR and the resistance change rate ΔR/R, relative to the varying thicknesses of the ferromagnetic layers A and B. FIG. 22A, FIG. 22B and FIG. 22C are graphs of resistance change in spin valve films versus the applied magnetic field.

TABLE 9

Spin Valve Film Constitution:
Ta/Au/CuMn/ferromagnetic layer A (CoFe)/0.9 nm Ru/ferromagnetic layer B (CoFe)/2.5 nm Cu/free layer (4 nm CoFe)/Ta
Thermal treatment: at 270° C. for 1 hour

| Thickness of Ferromagnetic Layer A (nm) | Thickness of Ferromagnetic Layer B (nm) | Resistance Change Rate ΔR/R (%) | Sheet resistance Rs (Ω) | Sheet resistance Change ΔRs (Ω) |
| --- | --- | --- | --- | --- |
| 7 | 7 | 7.2 | 7.5 | 0.54 |
| 5 | 5 | 8.0 | 9.8 | 0.78 |
| 3 | 3 | 8.6 | 12 | 1.03 |
| 2 | 2 | 8.4 | 14.1 | 1.18 |
| 1 | 1 | 8.0 | 15.3 | 1.22 |
| 0.5 | 0.5 | 5 9 | 15.6 | 0.92 |

As in Table 9, the thicknesses of the ferromagnetic layers B and A are preferably from 1 to 5 nanometers for obtaining a high resistance change rate, but more preferably from 1 to 3 nanometers. With the layers B and A each having a thickness to fall within the preferred range, the pinned magnetic layer is stable to the applied magnetic field (that is, the resistance decreases only a little even in the applied magnetic field of +600 Oe), as in FIGS. 22A to 22C), and, in addition, the sheet resistance Rs of the spin valve films is high and the sheet resistance change ΔRs is on a satisfactory level. The reproduction output is proportional to the product of the sense current and the resistance change, and the resistance change is proportional to the product of the resistance change rate and the sheet resistance of the spin valve film. Therefore, the cases in which only the resistance change rate is large could not produce high output if their sheet resistance is small. In other words, in order to attain high output, both the resistance change rate and the sheet resistance must be high.

Figure 23A:
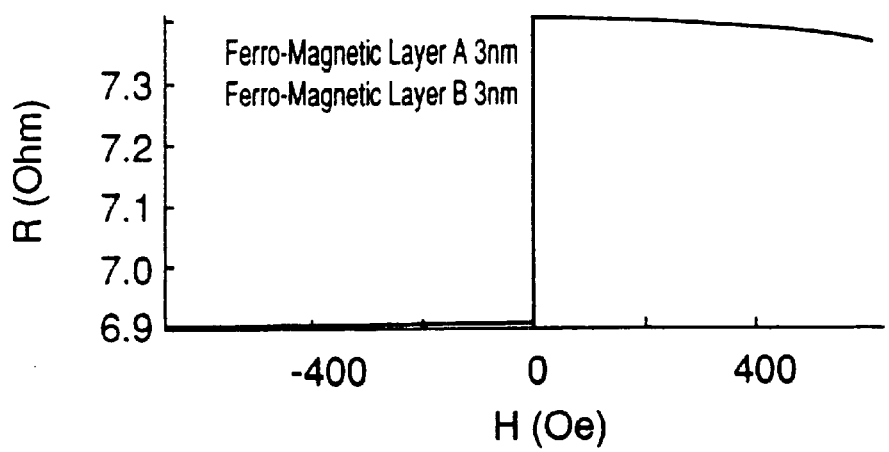
FIG. 23A, FIG. 23B and FIG. 23C are graphs of resistance change in spin valve films with the thicknesses of the ferromagnetic layer A and ferromagnetic layer B being varied, versus the applied magnetic field.
Figure 23B:
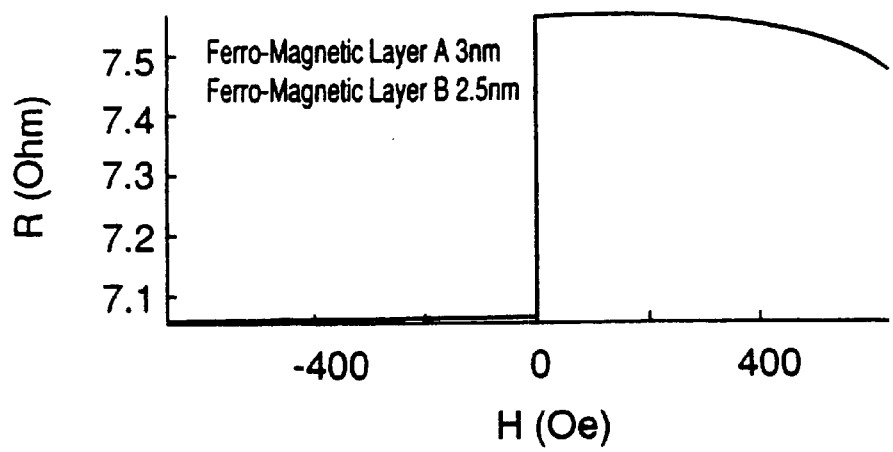
Figure 23C:
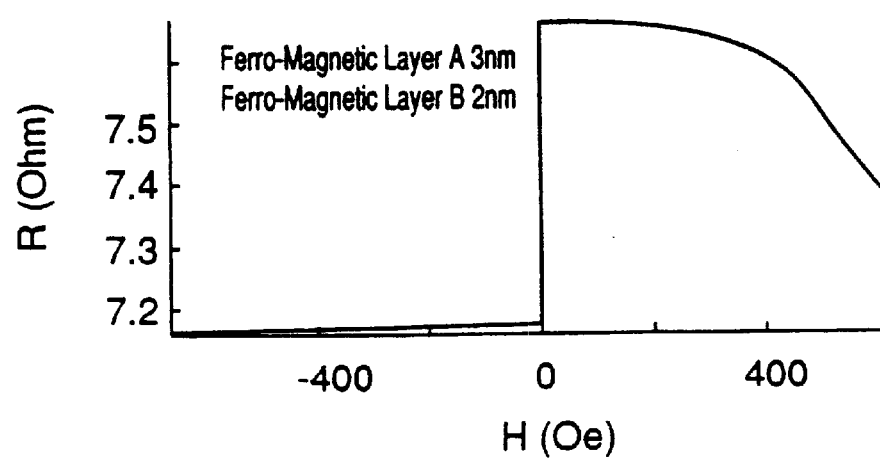
Figure 25A:
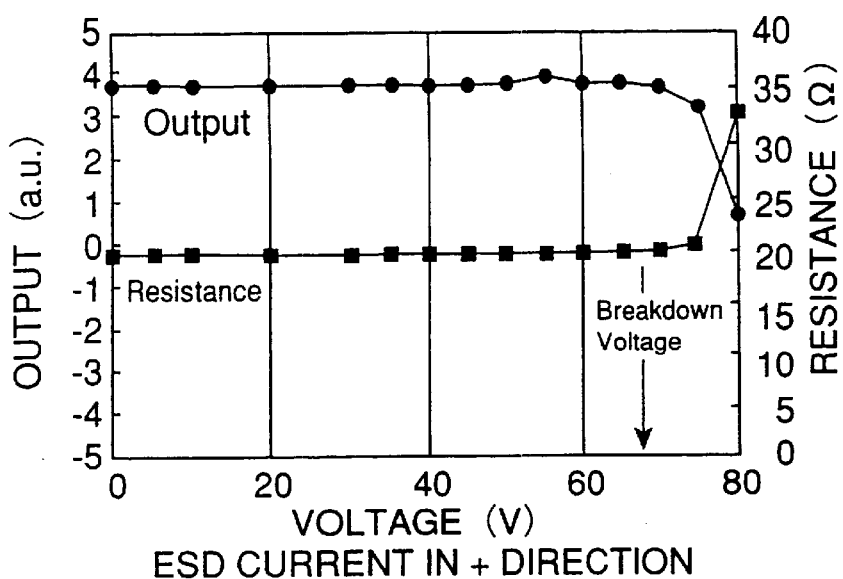
FIG. 25A and FIG. 25B are graphs of resistance versus output in another spin valve device to which has been applied a simulation ESD voltage by a human body model.
Figure 25B:
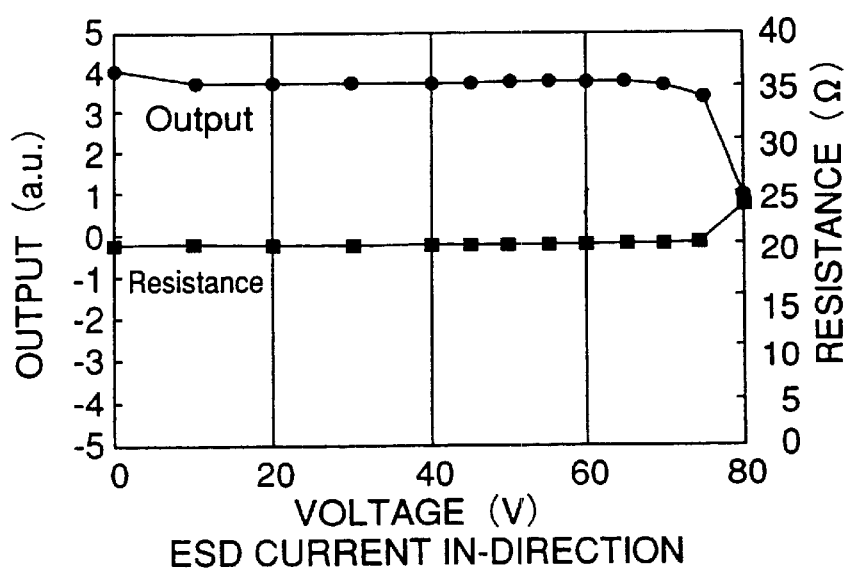

FIG. 23A, FIG. 23B and FIG. 23C are graphs of resistance change in spin valve films in which the thickness of the ferromagnetic layer A is fixed to be 3 nanometers and that of the ferromagnetic layer B is varied, versus the applied magnetic field.

As in FIGS. 23A to 23C, when the thickness of the ferromagnetic layer A is the same as that of the ferromagnetic layer B, the resistance change in the spin valve film in a high magnetic field of +600 Oe is small. In that case, therefore, the pinned magnetic layer is extremely stable to the ambient magnetic field, to the magnetic field from the longitudinal bias layers and to the applied magnetic field in thermal treatment for forming the recording part. As so mentioned hereinabove, the problem of magnetization reversal in the pinned magnetic layer to be caused by ESD could be solved by the current circuit as incorporated in the drive and capable of correcting the pinning magnetization direction to be in a predetermined direction.

On the other hand, the different thicknesses of the ferromagnetic layers A and B have the following advantages: The first is that the thermal treatment for magnetization pinning is easy, which is indispensable for ensuring the basic constitution of the spin valve film where the magnetization of the free layer is perpendicular to that of the pinned magnetic layer. The second is that, when the thickness of the ferromagnetic layer B is smaller than that of the ferromagnetic layer A, the resistance change rate is increased, as in Table 10 showing the relationship between the varying thickness of the ferromagnetic layer B and the resistance change rate. The third is that the magnetization reversal to be caused by ESD occurs little in the pinned magnetic layer, and stable reproduction output is possible even high voltage of around the breakdown voltage. The breakdown voltage as referred to herein is meant to indicate the voltage at which the spin valve device is broken and the spin valve device resistance begins to increase.

TABLE 10

Spin Valve Film Constitution:
5 nanometer Ta/2 nm AuCu/5 nm CoFe/3 nm Cu/ferromagnetic layer A (CoFe)/0.9 nm Ru/ferromagnetic layer B (CoFe)/10 nm IrMn/5 nanometer Ta

| Thickness of ferromagnetic Layer A (nm) | Thickness of ferromagnetic Layer B (nm) | Resistance Change Rate ΔR/R (%) |
| --- | --- | --- |
| 3 | 3 | 7.3 |
| 3 | 2.5 | 7.8 |
| 3 | 2 | 7.7 |

For example, when the ferromagnetic layer A, the ferromagnetic layer and the free layer are of any of Co, CoFe and NiFe, while the nonmagnetic spacer layer is of Cu, and when the ratio of the magnetic thickness of the layer A to that of the layer B is varied within a range between 0.7 and 0.9 while the thickness of the ferromagnetic layer B is 2.5 nanometers, then the spin valve films have good ESD resistance, as in FIGS. 24A and 24B, FIGS. 25A and 25B and Table 11. FIGS. 24A and 24B and FIGS. 25A and 25B are graphs of resistance versus output in spin valve devices to which has been applied a simulation ESD voltage by a human body model. In FIGS. 24A and 24B, the thickness of the ferromagnetic layer A is the same as that of the ferromagnetic layer B; and in FIGS. 25A and 25B, the former is larger than the latter. Table 11 shows the ESD data of spin valve devices in test patterns.

TABLE 11

Spin Valve Film Constitution:
5 namometer Ta/free layer/3 nm Cr/ferromagnetic layer A/0.9 nm Ru/ferromagnetic layer B/10 nm IrMn/5 nanometer Ta
Device Constitution: lead-overlaid structure (with no shield)
Subbing hard film/longitudinal bias of CoPt/FeCo is formed on the non-patterned lower shield and lower cap, and the electrode spacing is narrower than the longitudinal bias spacing.
Electrode spacing = 1.3 μm

| Magnetic Thickness Ratio (Ms.t) A/ (Ms.t) B | Ferromagnetic Layer A | Ferromagnetic Layer B | Free Layer | Spinning Magnetization Reversal Voltage | Breakdown Voltage |
| --- | --- | --- | --- | --- | --- |
| 0.75 | 2nmCoFe | 1.5nmCoFe | 3nmCoFe/ 1.5nmNiFe | not reversed | 70V |

TABLE 11-continued

Spin Valve Film Constitution:
5 nanometer Ta/free layer/3 nm Cr/ferromagnetic layer A/0.9
nm Ru/ferromagnetic layer B/10 nm IrMn/5 nanometer Ta
Device Constitution: lead-overlaid structure (with no shield)
Subbing hard film/longitudinal bias of CoPt/FeCo is formed on
the non-patterned lower shield and lower cap, and the electrode
spacing is narrower than the longitudinal bias spacing.
Electrode spacing = 1.3 μm

| Magnetic Thickness Ratio (Ms·t) A/ (Ms·t) B | Ferromagnetic Layer A | Ferromagnetic Layer B | Free Layer | Spinning Magnetization Reversal Voltage | Breakdown Voltage |
|---|---|---|---|---|---|
| 0.8 | 2.5nmCoFe | 2nmCoFe | 3nmCoFe/ 1.5nmNiFe | not reversed | 75V |
| 0.83 | 3nmCoFe | 2.5nmCoFe | 4nmCoFe/ 1.8nmNiFe | not reversed | 70V |
| 0.85 | 2nmCoFe | 1.7nmCo | 0.5nmCoFe/ 4nmNiFe | not reversed | 70V |
| 0.71 | 2.4nmCoFe | 1.7nmCoFe | 1nmCoFe/ 3nmNiFe | 65V | 75V |
| 0.88 | 2.4nmCoFe | 2.1nmCoFe | 1nmCoFe/ 3nmNiFe | 65V | 75V |
| 1 | 3nmCoFe | 3nmCoFe | 4nmCoFe/ 1.8nmNiFe | 50V | 75V |
| 0.667 | 3nmCoFe | 2nmCoFe | 3nmCoFe/ 1.5nmNiFe | 55V | 75V |
| 0.93 | 3nmCoFe | 2.8nmCoFe | 1nmCoFe/ 3nmNiFe | 55V | 70V |

In ESD, a magnetic field essentially of the current magnetic field is applied to the pinned magnetic layer in such manner that the magnetic field intensity to the ferromagnetic layer B is larger than that to the ferromagnetic layer A, while, on the other hand, the current magnetic field ratio, $H(current)_B/H(current)_A$ is nearly equal to the inverse ratio of magnetic thicknesses, $(Ms·t)_A/(Ms·t)_B$. In that condition, therefore, the magnetic energy changes due to the ESD current field of the ferromagnetic layers A and B cancel, thereby resulting in that the total energy change of: $\{(Ms·t)·H(current)\}_A - \{(Ms·t)·H(current)\}_B$ is reduced. As a result, the magnetization of the pinned magnetic layer could not be moved in the ESD current magnetic field.

Figure 26:
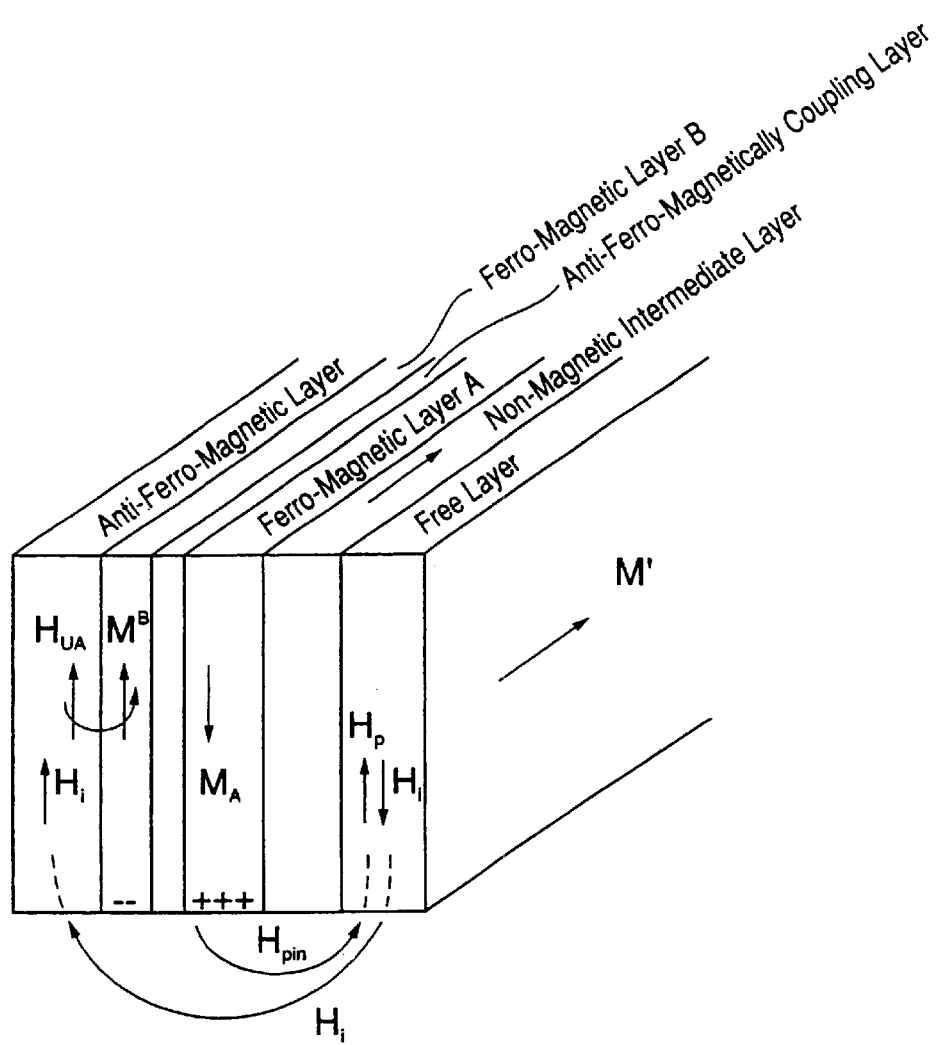
FIG. 26 is a perspective view of a spin valve film, indicating the stray magnetic field from the film.

As in FIG. 23C, when the ferromagnetic layer A is 3 nanometers thick and the ferromagnetic layer B is 2 nanometers thick and therefore $(Ms·t)_B/(Ms·t)_A=0.67$, then $H_{UA}*$ is lower than that in the case of FIG. 23A where both the ferromagnetic layers A and B are 3 nanometers thick, and therefore, the thermal stability of the pinned magnetic layer in the case of FIG. 23C is lower than that in the case of FIG. 23A. In that case where the magnetic thickness of the ferromagnetic layer B is smaller than that of the ferromagnetic layer A, it is desirable that the current flow direction of the sense current to the pinned magnetic field is so selected that the magnetic field from the sense current is in the same direction as that of the direction of the bias magnetic field from the antiferromagnetic field to be applied to the ferromagnetic layer B (or that is, in the same direction as the magnetization direction of the ferromagnetic layer B). The reason is because, when the magnetic thickness of the ferromagnetic layer A is larger than that of the ferromagnetic layer B, a stray magnetic field that corresponds to the magnetic thickness difference between the ferromagnetic field and the ferromagnetic field is applied to the free layer, like in conventional spin valve films having a single-layered pinned magnetic layer, and, as a result, the perpendicular magnetization configuration of the free layer and the pinned magnetic layer is disturbed by that stray magnetic field. This causes the problem of asymmetry of the reproduction waves, thereby bringing about reproduction output reduction. The stray magnetic field could be canceled by applying a sense current in such a manner that the magnetic field by the sense current could be in the same direction as the direction of the magnetic coupling bias magnetic field, as in FIG. 26 which shows the magnetization and the stray magnetic field in spin valve films.

It is desirable that a simple metal of Cu, Au or Ag or an alloy consisting essentially of those metals is used for the nonmagnetic spacer layer. Basically, the thickness of the nonmagnetic spacer layer may well be in a range between 1 and 10 nanometers or so, capable of ensuring the necessary resistance change rate. Especially in the spin valve films of the invention, it is desirable that the thickness of the nonmagnetic spacer layer falls between 1.5 nanometers and 2.5 nanometers, as being able to control the interlayer-coupling magnetic field that may be generated between the pinned magnetic layer and the free magnetic layer, to the level of at most 15 Oe, and as being able to produce a high resistance change rate.

For the free layer, employable is any of Co, a Co alloy such as CoFe, CoNi, CoFeNi or the like, or a laminate film of those metals and alloys. For example, employable is a laminate film composed of an NiFe alloy layer and a thin Co layer, in which the thin Co layer is to be adjacent to the nonmagnetic interlayer. It is desirable that the thickness of the free layer falls between 1 and 10 nanometers.

Table 12 shows a varying thickness of the free layer versus the resistance change rate ΔR/R, in which the thickness of the pinned magnetic layer is fixed to be 2.5 nanometers. As in Table 12, it is understood that, in the invention, the thickness of the free layer is more preferably from 2 to 5 nanometers, as giving high resistance change rates.

TABLE 12

| Thickness of Free Layer (nm) | Thickness of Ferromagnetic Layer A = Ferromagnetic Layer B (nm) | Resistance Change Rate ΔR/R* (%) (single-layered free layer of CoFe) | Resistance Change Rate ΔR/R** (%) (laminated free layer with 1 nm Co adjacent to interlayer) |
|---|---|---|---|
| 1 | 2.5 | 6.2 | 5.7 |
| 2 | 2.5 | 7.5 | 7.0 |
| 3 | 2.5 | 7.9 | 7.2 |
| 4 | 2.5 | 7.8 | 7.2 |
| 5 | 2.5 | 7.5 | 7.1 |
| 6 | 2.5 | 6.9 | 6.4 |
| 7 | 2.5 | 6.6 | 6.0 |

The ferromagnetic layers A and B have the same thickness and are both of CoFe.

Table 13 shows a varying thickness of the ferromagnetic layer A of the pinned magnetic layer versus the resistance change rate ΔR/R, in which the thickness of the free layer is fixed to be 4 nanometers. As in Table 13, it is desirable that the thickness, t(F), of the free layer of from 2 to 5 nanometer Thick and the thickness, t(P) of the ferromagnetic layer A satisfy the following condition:

−0.33 ≤ {t(F)−t(P)}/t(F) ≤ 0.67, for producing a high resistance change rate.

TABLE 13

| Thickness of Free Layer, t(F) (nm) | Thickness of Ferromagnetic Layer A, t(P) (nm) | Resistance Change Rate, ΔR/R (%) | (t(F)−t(P))/t(F) |
|---|---|---|---|
| 4.5 | 1 | 4.7 | 0.78 |
| 4.5 | 1.5 | 6.9 | 0.67 |
| 4.5 | 2 | 7.1 | 0.56 |
| 4.5 | 3 | 7.9 | 0.33 |
| 4.5 | 4 | 7.7 | 0.11 |
| 4.5 | 5 | 7.3 | −0.11 |
| 4.5 | 6 | 6.8 | −0.33 |
| 4.5 | 7 | 5.9 | −0.66 |

The free layer is of CoFe. The ferromagnetic layers A and B are both of CoFe. The thickness of the ferromagnetic layer B is 3 nm.

For the protective film, used is any of metals of Ta, Nb, Zr, Cr, Hf, Ti, Mo, W and the like, or their alloys, or their oxides, nitrides, etc. Preferred are high-resistance protective films of metal oxides or nitrides, for example, NiFe oxides, aluminium oxides, tantalum oxides and others, as giving high resistance change rates. Regarding its thickness, it is desirable that the protective film is as thin as possible and has a thickness of from 0.3 to 4 nanometers. This is because, as will be mentioned hereunder, such a thin protective film is easy to remove through etching for forming electrodes and longitudinal bias layers. As the protective layer, also usable are single-layered or laminated films of simple noble metals such as Ag, Au, Ru, Ir, Cu, Pt, Pd, Re and others, or of their alloys. For example, for the free layer of CoFe, usable are protective layers of Cu/Ru, Cu, Au, Cu alloys, etc.; for the free layer of NiFe, usable are protective layers of Ag, Ru, Ru/Ag, Ru/Cu, Cu, etc. Over the protective film of oxides, nitrides or noble metals, an additional, high-resistance protective film of Ta or the like may be optionally formed.

For making the magnetization direction of the pinned magnetic layer perpendicular to that of the free layer, for example, employable is the following method. Where the antiferromagnetic layer 143 is of a γ-Mn-based, Mn-rich alloy such as IrMn, RhMn, RhRuMn or the like, the deposition of the constituent layers of the spin valve film to the antiferromagnetically coupling layer 1442 is carried out in a magnetic field as applied in the direction of the width of the spin valve device to be produced, or that is, in the height direction, and thereafter the resulting layered structure is subjected to thermal treatment for unifying the coupling bias magnetic field due to the antiferromagnetic layer 143 in the height direction. The thermal treatment for unifying the coupling bias magnetic field in the height direction may be carried out immediately after the formation of the antiferromagnetic layer B. However, since the antiferromagnetically coupling layer of Ru or the like is more resistant to oxidation, it is more desirable that the thermal treatment is effected after the formation of the coupling layer 1442. Preferably, the thermal treatment is effected still in vacuum, or that is, without leaking the vacuum for the previous deposition, at a temperature higher than Tb and for a short period of time, more preferably within at most 10 minutes, in a magnetic field in which the ferromagnetic layer B could be completely saturated. For example, for IrMn having Tb of 300° C., the thermal treatment may be effected at 350° C. for 1 minute or so.

Next, still in vacuum, a magnetic field is applied in the direction of the track width of the spin valve device being formed, at least during the formation of the free layer, and thereafter, the remaining films of the spin valve device are formed. The same shall apply to the case where the antiferromagnetic layer is of a ordered alloy of PtMn or NiMn. For this case, however, the process will somewhat differ from that for the case of the γ-Mn-based antiferromagnetic layer noted above. In this case, the deposition step up to the formation of the antiferromagnetic layer B does not always require a magnetic field, but the thermal treatment after the step must be effected at high temperatures of at least 200° C., preferably falling between 270 and 350° C., for a few hours, preferably for 1 to 20 hours. After the thermal treatment, a magnetic field is applied during the step of forming the free layer and thereafter the remaining layers of the spin valve film are formed, in the same manner as in the previous case.

In any case, the thermal treatment for the antiferromagnetic layer may be effected after the formation of the spin valve film. When the thermal treatment is effected after the film formation, it is desirable that a magnetic field higher than the coupling magnetic field of the antiferromagnetically coupling layer 1442 is applied to the spin valve film being subjected to the thermal treatment so that the magnetizations of both the ferromagnetic layer A and the ferromagnetic layer B are saturated completely in the same direction (that is, in the height direction). For example, where the antiferromagnetic layer B/antiferromagnetic layer B is in the form of 2 nm CoFe/0.9 nm Ru/2 nm CoFe, the coupling magnetic field of Ru is about 6 kOe. Therefore, in this case, the magnetic field to be applied during the thermal treatment is preferably at least 7 kOe. In order to reduce the magnetic field for the thermal treatment, it is desirable to finish the thermal treatment before the spin valve film is worked into the form of a device. The thermal treatment of the device as worked from the film requires a stronger magnetic field for saturating the ferromagnetic layers A and B because of the reversal magnetic field intrinsic to the shape of the device.

In the method noted above, the magnetization of the pinned magnetic layer 144 is pinned in a predetermined direction. However, the heat treatment in the method is too strong, the easy axis of the free layer 146 and even that of the lower shield 11 will also be pinned in the height direction of the spin valve device, like in the pinned magnetic layer. If so, it will be difficult to make the magnetization direction of the free layer perpendicular to that of the pinned magnetic layer. In order to fix the easy axis of the free layer and that of the lower shield in the direction of the track width, it is desirable to apply to the free layer and the shield, the minimum magnetic field necessary for saturating the shield and the free layer in the direction of the track width, for example, a magnetic field of from 100 to 300 Oe or so, in the resist curing step for fabricating recording heads, thereby stabilizing the easy axis of the shield and that of the free layer in the direction of the track width. Also preferably, the lower shield is previously subjected to thermal treatment before the completion of the spin valve film, thereby stabilizing its easy axis in the direction of the track width.

In the abutted junction type device of FIG. 17, in which the track edges of the free layer are removed and longitudinal bias layers are provided in place of the removed edges, the longitudinal bias layers may be of a hard magnetic film of, for example, CoPt, CoPtCr or the like as formed on a underlayer of, for example, Cr, FeCo or the like, or maybe of a laminated, hard ferromagnetic film composed of a ferromagnetic layer 151 and an antiferromagnetic layer 152 as laminated in that order. Alternatively, the antiferromagnetic layer 152 may be formed first, and thereafter the ferromagnetic layer 151 may be laminated thereover. In order to obtain a steep reproduction sensitivity profile capable of meeting the coming narrow tracks in the art, at the track edges, it is desirable that the magnetic thickness ratio of the ferromagnetic, longitudinal bias layer, or that is, the hard magnetic layer or the ferromagnetic bias layer as magnetically coupled by an antiferromagnetic layer, to the free layer, $(Ms \cdot t)_{LB}/(Ms \cdot t)_F$, is defined to be at most 2. Where the free layer is thinned to have a thickness of from 2 to 5 nanometers and have a magnetic thickness of from 3 to 6 nanometer Tesla, the ferromagnetic, longitudinal bias layers shall also be thinned in order that the ratio $(Ms \cdot t)_{LB}/(Ms \cdot t)_F$ is made to be at most 2. For example, the ferromagnetic, longitudinal bias layer shall have a magnetic thickness of at most 12 nanometer Tesla.

In general, however, when the hard magnetic film is thinned to have a thickness of 10 nanometers or so, then it could hardly maintain high coercive force. For example, for a hard magnetic film of CoPt having Ms of 1 T, it has a high coercive force of 2000 Oe when its thickness is 20 nanometers, but its coercive force decreases to 800 Oe when its thickness is 10 nanometers. On the other hand, in the longitudinal bias layer of a type of ferromagnetic layer/ antiferromagnetic layer, the magnetic coupling bias field increases with the reduction in the thickness of the ferromagnetic layer 151, whereby the two layers are coupled more firmly. For example, for the longitudinal bias layer having a laminated structure of NiFe with Ms of 1 T and IrMn of 7 nanometers thick, its coercive force is 80 Oe when its thickness is 20 nanometers, but increases up to 160 Oe when its thickness is 10 nanometers. The value of 160 Oe is an effective value in conventional MR heads. Therefore, in the region where the free layer is thin, for example, having a thickness of at most 5 nanometers, it is desirable to employ the longitudinal bias layer of the type of ferromagnetic layer/antiferromagnetic layer.

In addition, in the longitudinal bias layer of the type of ferromagnetic layer 151/antiferromagnetic layer 152, it is further desirable that the saturation magnetization of the ferromagnetic layer 151 is nearly comparable to or larger than that of the free layer in order to completely remove the Barkhausen noise in a smallest possible longitudinal bias field. The ferromagnetic film 151 may be of an NiFe alloy, but is more preferably of an NiFeCo alloy, a CoFe alloy, Co or the like having a larger saturation magnetization. If a film having a small saturation magnetization is used for the ferromagnetic film 151 and if the Barkhausen noise is removed by increasing its thickness to enlarge the stray magnetic field, the reproduction output will lower especially in narrow track width.

In FIG. 17, the longitudinal bias layers are formed without completely removing the entire spin valve film. Apart from the illustrated case, even the underlayer 141 may be removed through etching. However, in order to maintain good crystallinity of the ferromagnetic layer, it is desirable that the etching depth before the formation of the longitudinal bias layers is at most above the underlayer 142 so as to take advantage of the crystallinity-improving effect of the layer 142. From the viewpoint of film thickness control, it is desirable that the thicker antiferromagnetic layer 143 is etched in some degree and thereafter the magnetic coupling bias is attenuated so as to obtain, longitudinal bias layers having good hard magnetic properties. As the case may be, after the nonmagnetic spacer layer is partly etched, and a longitudinal bias layers of ferromagnetic film 151/ antiferromagnetic film 152 may be formed thereover. For the purpose of improving the crystallinity or for the purpose of attenuating the magnetic coupling between the pinned magnetic layer or the antiferromagnetic layer 143 and the longitudinal bias layer, an extremely thin underlayer 153, like the underlayer 143, may be provided below the ferromagnetic film 151. For the purpose of minimizing the reduction in the magnetic coupling between the free layer and the longitudinal bias layer, the thickness of the underlayer 153 is preferably at most 10 nanometers.

Where the hard magnetic film is employed, it is also desirable that the saturation magnetization of the free layer is comparable to that of the hard magnetic layer. In general, however, it is difficult to prepare a hard magnetic film having high saturation magnetization that is comparable to the free layer of CoFe or the like generally having high saturation magnetization. For this, effective is a method of using a subbing film of FeCo or the like having high saturation magnetization for the hard magnetic film to thereby keep the good balance of saturation magnetization between the subbed hard magnetic film and the free layer, for the purpose of removing the Barkhausen noise in a small longitudinal bias magnetic field.

For the antiferromagnetic film 152, employable is the same antiferromagnetic substance as that for the spin valve film. However, the magnetic coupling bias field for the antiferromagnetic layer in the spin valve film is in the height direction while that for the antiferromagnetic film 152 in the longitudinal bias layer is in the track width direction, or that is, the two must be perpendicular to each other. Therefore, for example, the two are made to have a different blocking temperature Tb, and the magnetic coupling bias direction of the antiferromagnetic layer having a higher Tb is first settled through thermal treatment, and thereafter the antiferromagnetic film having a lower Tb is subjected to thermal treatment at lower temperatures. In that condition, while the magnetic coupling bias direction of the antiferromagnetic layer having a higher Tb is kept stable as it is, the magnetic coupling bias direction of the antiferromagnetic film having a lower Tb is settled, whereby the magnetic coupling bias fields of the two could be made perpendicular to each other.

Concretely, the antiferromagnetic film 152 may be an antiferromagnetic film of PtMn, PdPtMn or the like capable of expressing $H_{UA}$ through thermal treatment. For this, however, more preferred is any of RhMn, IrMn, RhRuMn, FeMn or the like having Tb of from 200 to 300° C., since they can be subjected to thermal treatment at temperatures at which the pinned magnetic layer is stable. For the antiferromagnetic layer in the spin valve film, preferred are antiferromagnetic substances having a higher Tb, such as IrMn, PtMn, PtPdMn, etc. Using those preferred antiferromagnetic substances, the magnetic coupling bias direction of the antiferromagnetic film 152 could be well settled in the track width direction without disturbing the magnetization direction of the pinned magnetic layer in the spin valve film in the step of thermal treatment for resist curing noted above. Specifically, because of the characteristic of the invention where the pinning magnetization is rapidly stabilized at temperatures not higher than the blocking temperature, the longitudinal bias and the magnetization of the pinned magnetic layer could be made well perpendicular to each other even though the difference in the blocking temperature between the both antiferromagnetic films is only tens ° C. When IrMn, FeMn, RhMn, RhRuMn, CrMnPt, CrMn or the like capable of producing a magnetic coupling bias field during deposition them in a magnetic field is used for the antiferromagnetic film 152, it does not require any additional thermal treatment. Therefore, the antiferromagnetic film 152 of any of those substances, not requiring additional heat treatment, does not disturb the bias magnetic field direction of the antiferromagnetic layer 143 in the spin valve film. To be combined with the film 152 of that type, any and every type of antiferromagnetic substances could be used for the antiferromagnetic layer 143 in the spin valve film, and in any combination of the two, the longitudinal bias direction and the magnetization direction of the pinned magnetic layer could be made well perpendicular to each other.

Figure 27:
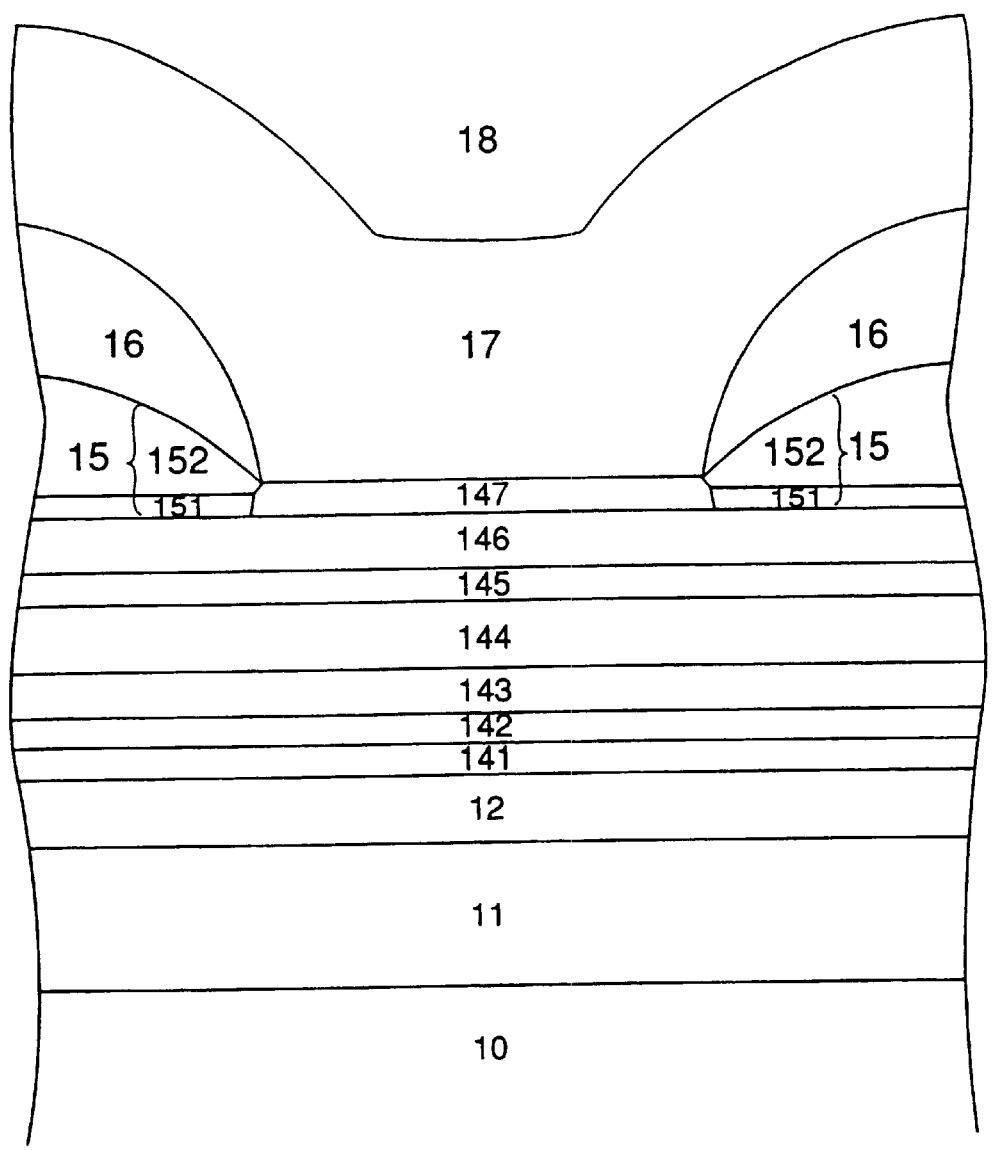
FIG. 27 is a sectional view of another embodiment of the magnetoresistance effect head of the invention.

On the other hand, as in FIG. 27, only the protective film 147 at the track edges of the free layer may be etched away, and an antiferromagnetic film may be laminated thereover through magnetic coupling to apply a longitudinal bias to the free layer. In this case, it is desirable that the longitudinal bias layer 15 comprises an antiferromagnetic layer 152 and a buffer layer 1511, which is a underlayer for enhancing the magnetic coupling with the free layer. The buffer layer 1511 is preferably a ferromagnetic layer of Fe, Co, Ni or the like. For settling the magnetization direction of the longitudinal bias in this case, the same as in the above-mentioned case of ferromagnetic layer 151/antiferromagnetic layer 152 could apply also to this case. The longitudinal biasing system using such a ferromagnetic layer is advantageous in that the Barkhausen noise is effectively removed therein, without generating any unnecessary longitudinal bias magnetic field to lower the sensitivity of heads as in the system using a hard magnetic film.

Figure 28:
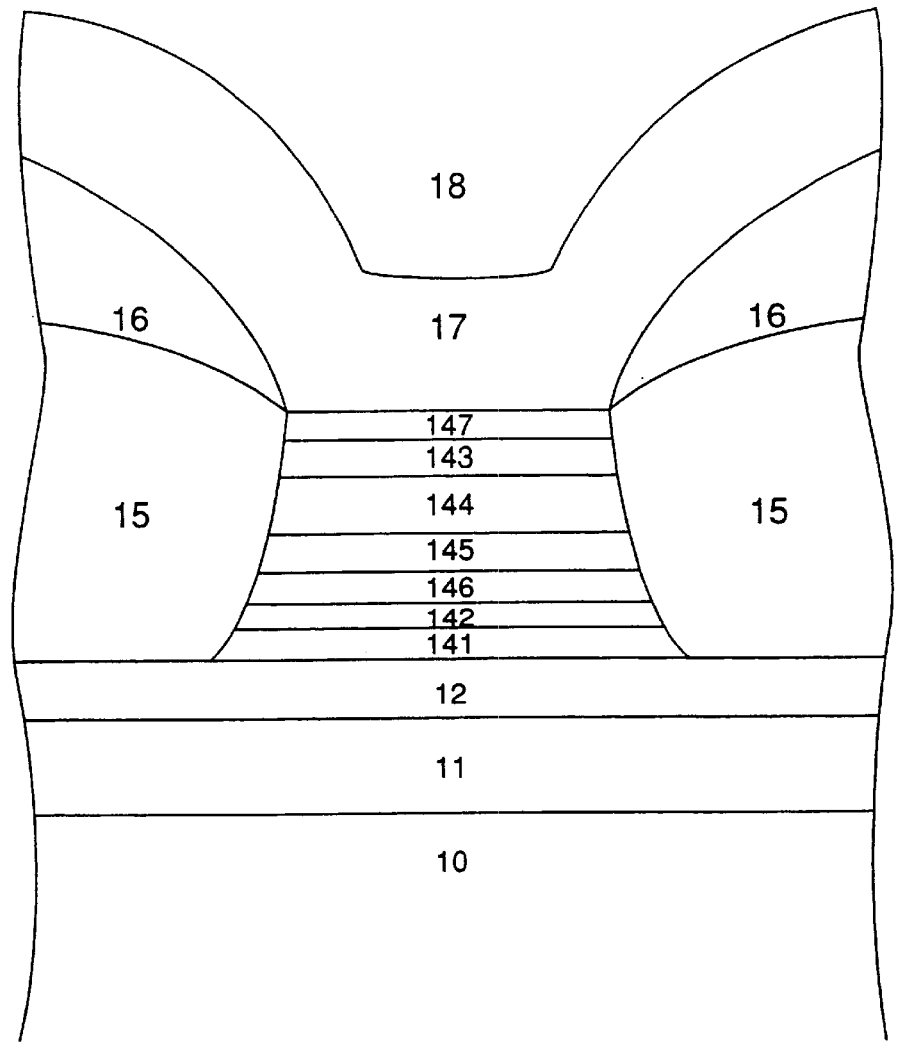
FIG. 28 is a sectional view of still another embodiment of the magnetoresistance effect head of the invention.

Third Embodiment:

FIG. 28 shows the third embodiment of the invention. In FIG. 28, the structure of the spin valve film differs from that in FIG. 21. In FIG. 27, a spin valve film 14 formed on a lower gap 12, and comprises a nonmagnetic underlayer 141 of Ta, Nb, Zr, Hf or the like having a thickness of from 1 to 10 nanometers, an optional second underlayer 142 having a thickness of from 0.5 to 5 nanometers, a free layer 146, an interlayer 145 having a thickness of from 0.5 to 4 nanometers, a pinned magnetic layer 144, an antiferromagnetic layer 143, and an optional protective film 147 having a thickness of from 0.5 to 10 nanometers. In this, free layer 146, the interlayer 145, the pinned magnetic layer 144 and the antiferromagnetic layer 143 are the same as those in the second embodiment.

Where the underlayer 142 is of Au, Cu, Ru, Cr, Ni, Ag, Pt or Rh, or an alloy consisting essentially of those metals, the thermal stability for the resistance change rate could be increased especially when the free layer is of a CoFe alloy.

In FIG. 27, a pair of longitudinal bias layers 15 and a pair of electrodes 16 which are the same as those in FIG. 21 constitute, along with the spin valve film 14, a spin valve device 13. Like in FIG. 21, an upper gap layer 17 and an upper shield 18 are formed to cover the device 13.

Figure 29:
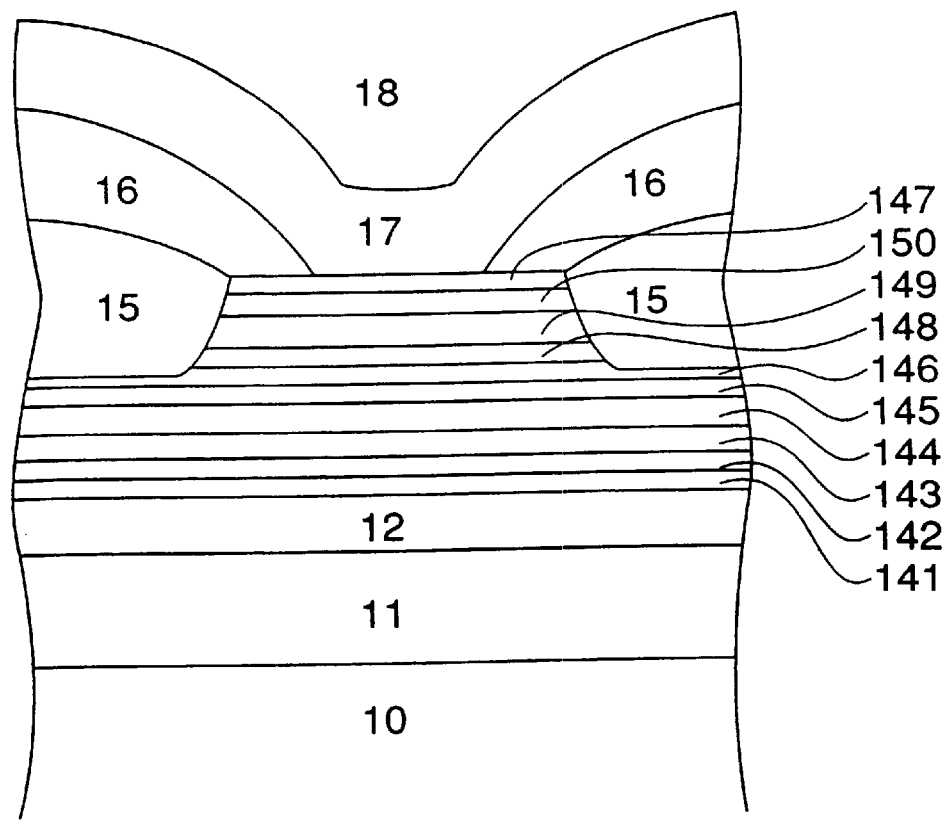
FIG. 29 is a sectional view of still another embodiment of the magnetoresistance effect head of the invention.

Fourth Embodiment:

FIG. 29 shows still another embodiment of the invention, which is applied to a dual-type spin valve structure.

In FIG. 29, a pair of longitudinal bias layers 15, a pair of electrodes 16, a longitudinal bias layer 15, and a spin valve device 13 comprising a spin valve film 14 are formed on a lower shield 11 and a lower gap 12, and an upper gap 17 and an upper shield 18 are formed over them, like in FIG. 21 for the second embodiment and in FIG. 27 for the third embodiment. However, the structure of FIG. 29 differs from those of FIG. 21 and FIG. 27 in point of the spacing between the electrodes 16 and of the constitution of the spin valve film 14.

The spin valve film 14 comprises a nonmagnetic underlayer 141 of Ta, Nb, Zr, Hf or the like having a thickness of from 1 to 10 nanometers, an optional second underlayer 142 having a thickness of from 0.5 to 5 nanometers, an antiferromagnetic layer 143, a pinned magnetic layer 144, an interlayer 145 having a thickness of from 0.5 to 4 nanometers, a free layer 146, a second interlayer 148 having a thickness of from 0.5 to 4 nanometers, a second pinned magnetic layer 149, a second antiferromagnetic layer 150, and an optional protective layer 147 having a thickness of from 0.5 to 10 nanometers.

At least one of the pinned magnetic layer 144 and the pinned magnetic layer 149 is a laminated, pinned magnetic layer, which comprises a ferromagnetic layer A, an antiferromagnetically coupling layer and a ferromagnetic layer B as in FIG. 17. In this, employable is any of 1) a combination of an SyAF-type pinned magnetic layer for the pinned magnetic layer 149 and a conventional, single-layered pinned magnetic layer for the pinned magnetic layer 144, 2) contrary to 1), a combination of an SyAF-type pinned magnetic layer for the pinned magnetic layer 144 and a conventional, single-layered pinned magnetic layer for the pinned magnetic layer 149, or 3) a combination of SyAF-type pinned magnetic layers for both the pinned magnetic layer 149 and the pinned magnetic layer 144.

The longitudinal bias layers 15 have a so-called abutted junction type device structure. These may be for med according to a lift-off method, like in FIG. 17, FIG. 27 and FIG. 28. Briefly, the track edges of the spin valve film are etched away via a photo-resist mask, and thereafter the longitudinal bias layers 15 are formed through sputtering, vapor deposition, ion beaming or the like. In this process, the etching removal of the spin valve film 14 is preferably so effected that at least the conductor layer part of the spin valve film 14 is left as it is without being removed. For example, when the antiferromagnetic layer 143 is of a γ-Mn-based alloy such as IrMn, it is desirable that at least a part of the antiferromagnetic layer 143 is left as it is.

If the conductor part is left in the track edges, the contact resistance of the abutted junction structure is lowered, and therefore the resistance of the spin valve device 13 could be lowered with ease. With the low-resistance spin valve device 13, heads could have high resistance to static electricity. Needless-to-say, the spin valve film at the track edges may be completely etched away with no problem to form the longitudinal bias layers.

The electrodes 16 may be formed along with the longitudinal bias layers in one and the same lift-off method. In this case, the spacing between the electrodes is nearly the same as that between the longitudinal bias layers. Alternatively, the formation of the electrodes may be effected separately from that of the longitudinal bias layers to form a so-called lead-overlaid structure in which the spacing between the electrodes is narrower than that between the longitudinal bias layers. The merit of the lead-overlaid structure is that, especially when the longitudinal bias layers are hard magnetic layers, the influence of the stray magnetic field from the hard magnetic layer could be trapped in the vicinity around the track edges in which the electrodes and the spin valve film are laminated, whereby the sensitivity profile of the reproduction track width (this is defined by the electrode spacing) in the track width direction could be sharper and its accuracy could be augmented. In particular, for high-density recording for which the reproduction track width shall be of a sub-micron level, the merit of the structure is more remarkable than in the prior art technique. Naturally, the lead-overlaid structure could apply to the embodiments of FIG. 21 and FIG. 27.

Figure 30:
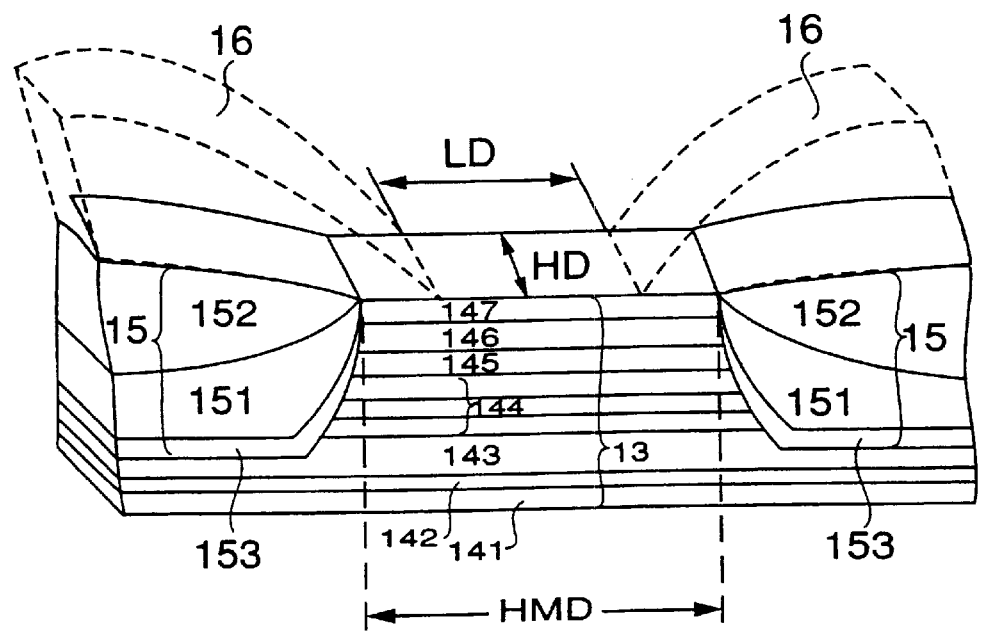
FIG. 30 is a sectional view of still another embodiment of the magnetoresistance effect head of the invention.

Fifth Embodiment:

FIG. 30 shows still another embodiment of the invention. Like in the second embodiment shown in FIG. 21, a lower shield and a lower cap (not shown) are formed on a substrate (not shown), a spin valve film 13 is formed thereover, and an upper cap, an upper shield and a recording part (all not shown) are formed still thereover. At the both track edges of the spin valve film 13, formed are a pair of longitudinal bias layers 15 and a pair of electrodes 16. One example of the longitudinal bias layers is illustrated, which is a laminate film comprising a underlayer 153, a ferromagnetic film 151 and an antiferromagnetic film 152. Naturally, the longitudinal bias layers may be of a hard magnetic film of CoPt or the like.

The electrodes 16 are formed of a material at least containing a low-resistance metal, such as Ta/Au/Ta or the like. In the illustrated case, the electrode spacing LD is narrower than the longitudinal bias layer spacing HMD, and the spin valve film 13 and the electrodes 16 have a region in which they are face-to-face contacted, in the vicinity of the both track edges. The longitudinal bias layers and the electrodes are generally formed in a lift-off method, but they maybe be also formed through ion milling, reactive ion etching or the like. Though complicated, a dry process is suitable for forming precision electrodes.

In the region of the spin valve film 13 just below the electrodes 16 where the longitudinal bias layers 15 do not exist, when the resistance of the electrodes is much smaller than that of the spin valve film, for example, when the former is at most 1/10 of the latter, then the reproduction sensitivity is greatly lowered in the region except the electrode spacing region, for example, in the region of the spin valve film just below the electrodes, if the magnetization of the free layer 146 in the spin valve film is settled nearly in the track width direction when the ambient magnetic field is zero. In that condition, therefore, the reproduction track width could be defined by the electrode spacing LD, whereby a steep reproduction sensitivity profile could be realizedat the track edges.

In addition, in the illustrated constitution, since the face-to-face contact region for the spin valve film 13 and the electrodes 16 could be much larger than in an ordinary abutted junction type constitution, the contact resistance between the electrodes and the spin valve film could be well minimized. With this, therefore, low-resistance spin valve devices could be realized, and even low-noise, ESD-resistant magnetoresistance effect heads could be realized.

For further narrowing the reproduction track width for the purpose of increasing the recording density in coming devices, the electrode spacing LD must be narrowed. On the other hand, however, if the electrode spacing is too narrow, it will be difficult to much more reduce the width or the height of the device. Therefore, it is desirable that HD is larger than LD for increasing the yield of heads. Concretely, regarding the height which will be a dimension-determinant factor in machine working for the purpose of increasing the yield of heads in mass production, the height must be at least around 0.5 gm or larger. When the reproduction track width is narrowed to 0.5 $\mu$m or smaller, it is desirable that HD is settled larger than LD. However, this will bring about the following problems.

The first is that, since the resistance of the spin valve film region for reproduction is reduced, the reproduction output is reduced. This problem could be overcome by increasing the sheet resistance of the spin valve film. In an ordinary SyAF-type pinned layer, the thickness of the pinned layer is larger than a conventional, single-layered pinned magnetic layer. Therefore, increasing the sheet resistance of the spin valve film having such an ordinary SyAF-type pinned layer is difficult. However, as in Table 14 and Table 15, since the sum total of the thicknesses of the pinned magnetic layer, the nonmagnetic spacer layer and the free layer is limited to at most 14 nanometers in the invention, both high sheet resistance of at least 16 $\Omega$ and high resistance change rate of at least 8% could be attained.

TABLE 14

Spin Valve Film Constitution:
5 nanometer Ta/2nm Au/7 nm IrMn/ferromagnetic layer B/antiferromagnetically coupling layer/ferromagnetic layer A/nonmagnetic spacer layer/free layer/Ta

| Thickness of Ferromagnetic Layer B (nm) | Thickness of Coupling Layer (nm) | Thickness of Ferromagnetic Layer A (nm) | Thickness of Nonmagnetic spacer layer (nm) | Thickness of Free Layer (nm) | Total Thickness of Ferromagnetic Layer to Free Layer (nm) |
|---|---|---|---|---|---|
| 2nmCoFe | 0.9nmRu | 2nmCoFe | 2nmCu | 0.5nmCoFe/2.5nmNiFe | 9.9 |
| 1.5nmCoFe | 0.8nmRu | 2nmCoFe | 2nmCu | 0.5nmCoFe/4nmNiFe | 10.8 |
| 1.5nmCoFe | 0.9nmRu | 2nmCoFe | 2.5nmCu | 3nmCoFe | 9.9 |
| 2nmCoFe | 0.9nmRu | 2nmCoFe | 2nmCu | 1nmCo/5nmNiFe | 12.9 |
| 1.5nmCoFe | 0.9nmRu | 1.5nmCoFe | 2nmCu | 1nmCo/3nmNiFe | 9.9 |
| 2nmCoFe | 0.9nmRu | 2.5nmCoFe | 2nmCu | 3nmCoFe | 10.4 |
| 2nmCoFe | 1nmRu | 2.5nmCoFe | 2.5nmCu | 1nmCo/4nmNiFe | 13 |
| 2.2nmCoFe | 0.8nmRu | 2.5nmCoFe | 2nmCu | 2nmCoFe/4.5nmNiFe | 14 |
| 3nmCoFe | 0.9nmRu | 3nmCoFe | 3nmCu | 1nmCoFe/7nmNiFe | 17.8 |
| 3nmCoFe | 0.9nmRu | 3nmCoFe | 3nmCu | 3nmCoFe/2nmNiFe | 14.8 |
| 2.5nmCoFe | 0.8nmRu | 3nmCoFe | 2.5nmCu | 1nmCoFe/7nmNiFe | 16.8 |
| 3nmCoFe | 0.7nmRu | 3nmCoFe | 3nmCu | 5nmCoFe | 14.7 |

TABLE 15

Spin Valve Film Constitution:
5 nanometer Ta/2nm NiFe/7.5 nm PtMn/ferromagnetic layer B/antiferromagnetically coupling layer/ferromagnetic layer A/nonmagnetic spacer layer/free layer/Ta

| Thickness of Ferromagnetic Layer B (nm) | Thickness of Coupling Layer (nm) | Thickness of Ferromagnetic Layer A (nm) | Thickness of Nonmagnetic spacer layer (nm) | Thickness of Free Layer (nm) | Total Thickness of Ferromagnetic Layer to Free Layer (nm) |
|---|---|---|---|---|---|
| 2nmCo | 0.9nmRu | 2nmCo | 2.5nmCu | 1nmCo/2nmNiFe | 10.4 |
| 2nmCo | 0.9nmRu | 2nmCo | 2.5nmCu | 0.5nmCo/2nmNiFe | 9.9 |
| 2nmCoFe | 0.9nmRu | 2nmCoFe | 2.5nmCu | 1nmCoFe/2nmNiFe | 9.7 |
| 2nmCoFe | 0.9nmRu | 2nmCoFe | 2.5nmCu | 3nmCoFe | 10.4 |

In order to realize high resistance change rates in such ultra-thin spin valve films, it is desirable that 1) the ferromagnetic layers A and B in the pinned magnetic layer are of an alloy of CoFe, CoNi or CoFeNi having a stable fcc phase, 2) even in the free layer, used is Co or an alloy of CoFe, CoNi or CoFeNi at least in the vicinity of the interface between the free layer and the nonmagnetic spacer layer, and 3) in the antiferromagnetic film, used is an antiferromagnetic layer containing a noble metal element, such as PtMn, PtPdMn, IrMn, RhMn, RhRuMn or the like.

The second problem with HD larger than LD is the Barkhausen noise. In a conventional abutted junction type spin valve device in which the electrode spacing is nearly the same as the longitudinal bias film spacing HMD, HMD is smaller than HD whereby the free layer is rectangular, having a longer side in the HD direction, and the magnetization direction of the free layer is readily oriented in the height direction in which the intensity of the antimagnetic field is smaller. As a result, a Barkhausen noise occurs in this. As opposed to this, since side of the rectangular spin valve film in the invention is longer in the track width direction as HMD is larger than HD therein, the magnetization direction of the free layer is prevented from being oriented in the height direction. As a result, removing the Barkhausen noise from the device of the invention is easy. For these reasons, the yield of heads comprising the device of the invention is high.

Concretely, cases of 1) HD=0.5 $\mu$m, LD=0.45 $\mu$m, HMD) =1.3 $\mu$m, and 2) HD=0.4 $\mu$m, LD=0.35 $\mu$m, HMD=0.8 $\mu$m much enjoy the effect of the invention.

In the constitution of FIG. 29, the pinned magnetic layer is disposed between the free layer and the substrate. The same mentioned herein shall apply to other cases where the free layer is disposed between the substrate and the pinned magnetic layer.

Figure 31:
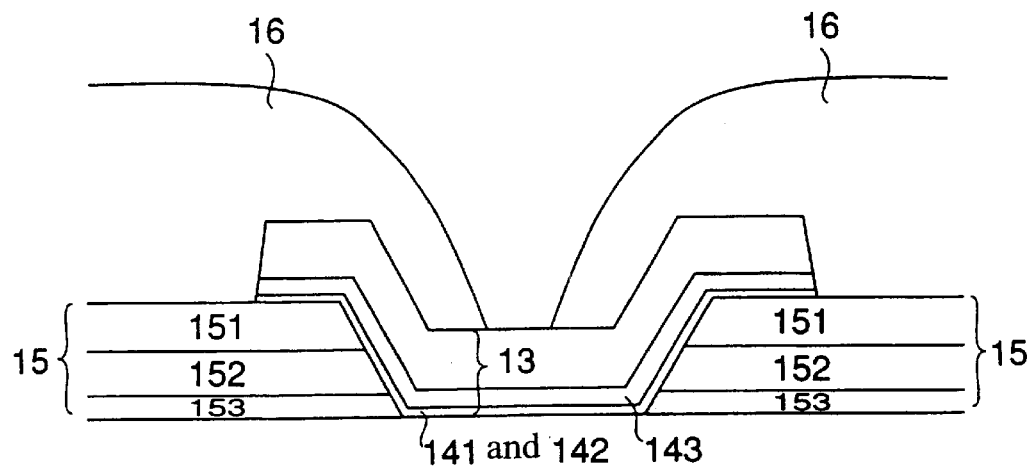
FIG. 31 is a sectional view of still another embodiment of the magnetoresistance effect head of the invention.

Sixth Embodiment:

FIG. 31 shows still another embodiment of the invention. A substrate, a lower shield and a lower gap (all not shown) are formed, and a pair of longitudinal bias layers 15 are formed thereon according to a lift-off method or to any other dry process of ion milling, reactive ion etching or the like. In FIG. 29, one example of the longitudinal bias layers is shown, which is a laminate comprising a underlayer 153 suitable to an antiferromagnetic layer, an antiferromagnetic film 152 of IrMn, RhMn, CrMn or the like, and a ferromagnetic film 151 of CoFe, NiFe, Co or the like, as in the second embodiment. To this case, any other types of longitudinal bias layers such as those illustrated in the second embodiment could apply.

A spin valve film 13 is formed over the structure formed in that manner. In the spin valve film 13, it is desirable that the free layer 143 is disposed nearer to the substrate than the pinned magnetic layer so as to facilitate the easy contact between the longitudinal bias layers 15 and the free layer 143. This is for the purpose of more effectively applying the bias magnetic field from the longitudinal bias layers to the free layer 143. It is also desirable that the thickness of the underlayers 141 and 142 below the free layer 143 is 10 nanometers. This is also for the purpose of more effectively applying the bias magnetic field from the longitudinal bias layers to the free layer 143. It is further desirable that the face-to-face contact region between the spin valve film 13 and the longitudinal bias layers 15 is minimized as much as possible to prevent the Barkhausen noise.

Above the spin valve film 13, formed are a pair of electrodes 16 according to a lift-off method, an ion milling method or a reactive ion etching method. Though not shown, an upper gap, an upper shield and a recording part are formed over the film 13.

Like in the fifth embodiment, HD is larger than LD but is smaller than HMD. With that constitution, reproducing heads suitable to narrow track width could be fabricated at high yields. Since the total thickness of the pinned magnetic layer, the nonmagnetic spacer layer and the free layer is at most 14 nanometers, the resistance of the spin valve film 13 is increased and the reproduction output is increased. With that constitution, high-sensitivity magnetoresistance effect heads can be obtained.

Seventh Embodiment: improvement in thermal stability and mirror reflectivity, and reduction in magnetostriction.

From the viewpoint of improving the thermal stability and the mirror reflectivity and of reducing the magnetostriction, the seventh embodiment of the invention is described below.

Prior to introducing this embodiment, the problems which we, the inventors have recognized in the process of achieving this embodiment are mentioned.

For practical use of high-performance spin valve films (hereinafter referred to as SV films), we, the inventors have recognized various problems such as the following:

(1) Poor thermal stability (especially in initial annealing)
(2) Insufficient MR ratio for much more increasing reproduction sensitivity.

(3) When the free layer is a single-layered CoFe alloy layer capable of giving relatively large MR ratio, then its magnetostriction control is impossible, and good soft magnetic characteristics could not be obtained.

These problems with SV films are mentioned in detail hereunder.

(1) Thermal stability:

As the general constitution of SV films, known is a few nm NiFe/about 1 nm Co or a few nm NiFe/about 1 nm CoFe. The SV film structure with such a free layer includes;

(a) 5 nanometer Ta/10 nm NiFe/1 nm Co/3 nm Cu/2 nm CoFe/7 nm IrMn/5 nanometer Ta, (b) 5 nanometer Ta/2 nm Cu/3 nm CoFe/3 nm Cu/2 nm CoFe/7 nm IrMn/5 nanometer Ta.

After annealed at 250° C. for 4 hours or so, the MR ratio of those SV films decreases by about 20% or more in terms of the relative ratio based on the as-deposited films. For example, the MR ratio in the as-deposited SV film (a) is 6.4%, but, after annealed at 250° C. for 3 hours, the MR ratio therein is 4.7%. Thus, the reduction in the MR ratio after the annealing is more than 20% in terms of the relative ratio based on the as-deposited film. The annealing step is indispensable in fabrication of heads. The MR ratio in the as deposited SV film (b) not having a free layer of NiFe is 8.1%, but, after annealed at 250° C. for 3 hours, the MR ratio therein is 6.5%. Even in the film (b), the reduction in the MR ratio after the annealing is about 20% in terms of the relative ratio based on the as-deposited film. At present, known is no means of preventing the MR ratio reduction without sacrificing the magnetic characteristics, or that is, any measure for improving the thermal stability for the MR ratio in SV films is not known.

For magnetic heads for high-density recording, desired are SV films with higher MR ratio. However, as mentioned above, the MR ratio in the conventional SV films in the as-deposited condition is greatly lowered in thermal annealing that is indispensable to fabrication of heads. This problem must be solved by all means for developing MR heads for high-density recording on a level of 10 Gdpsi or more.

(2) Increase in MR ratio by specular reflection:

In order to attain high MR ratio, another important matter, in addition to the means how to keep the original MR ratio in the as-deposited condition still after thermal treatment as discussed in the previous (1), is how to increase the peak value of the MR ratio or, even though the as-deposited film could not have a full-potential MR ratio, how to realize a film capable of having good MR ratio after thermal treatment.

Regarding the GMR effect, the frequency of spin-dependent scattering increases with the increase in the number of laminated layers of magnetic layers/nonmagnetic layers in a laminate film within the range narrower than the mean free path of electrons, and the increase in the number of laminated layers in the film brings about large MR ratio in the film. However, in the constitution of the GMR film that is actually used in practical heads, such as the constitution of Sv films, there exist only the units of pinned magnetic layer/nonmagnetic spacer layer/free layer. In general, therefore, the thickness of the GMR film including SV films is smaller than the mean free path of electrons, which is against the MR ratio increase to which the invention is directed.

In order to overcome this problem as much as possible, the number of the layers constituting the GMR film may be increased. One example of such GMR film constitution known in the art is a dual-spin valve film (or a symmetry spin valve, hereinafter referred to as D-SV film) in which the pinned magnetic layer is of a two-layered film composed of upper and lower layers and the upper and lower layers are separated by a free layer existing therebetween. This will be helpful in solving the problem, but at least at present could not solve all problems with practicable SV films. For example, in the D-SV film where the free layer is subbed with a nonmagnetic spacer layer, it is difficult to make the free layer have completely satisfactory soft magnetic characteristics characteristics with respect to, for example, the anisotropy field Hk and the level of magnetostriction $\lambda$. In addition, where the two upper and lower pinned magnetic layers are used, it is desirable that the two antiferromagnetic films for pinning the magnetization of those two layers have the same blocking temperature. In fact, however, it is difficult to make the lower antiferromagnetic film, which is positioned in the lower side, and the upper antiferromagnetic film, which is positioned in the upper side via a nonmagnetic spacer layer and a free layer, have the same characteristics. Therefore, from the viewpoint of the MR ratio, the D-SV film is preferred, but from the viewpoint of practical applications, it still has many problems to be solved.

Given that situation, improving the characteristics of the popular SV film having one antiferromagnetic film is being much investigated. One means for the improvement is to incorporate mirror reflectivity into the film. This is to dispose a reflective film on one or both sides of the basic unit of the GMR film of magnetic layer/nonmagnetic spacer layer/magnetic layer, so that electrons are elastically reflected on the reflective film to thereby prolong the mean free path of electrons in the basic unit of the GMR film.

On the upper and lower layers of the basic unit of the conventional GMR film, electrons are scattered non-elastically. In that unit, therefore, electrons could not move to the length of the mean free path intrinsic to them, and they could not enjoy the spin-dependent scattering over the thickness of the basic unit of the GMR film. As a result, the MR ratio in the film could not be increased to a desired degree. Contrary to this, if the GMR structure has upper and lower layers with ideal surface reflectivity, the basic unit of the GMR film could be apparently equivalent to the constitution of an infinite artificial lattice film, in which electrons could scatter spin-dependently to the length comparable to their mean free path. As a result, the MR ratio in this GMR constitution could increase. The reflective films to be disposed over the upper and lower magnetic layer on the nonmagnetic spacer layer may be or even may not be spin-dependent ones. Even the latter spin-independent reflective films could fully exhibit the intended effect.

The effect applies not only to ordinary SV film structures but also to D-SV film structures. However, the reflective films would be ineffective in artificial lattice films which naturally comprises a numerous and unlimited number of layers and in which electrons are naturally scattered in a spin-dependent manner to the length of their intrinsic mean free path. The specular reflection effect is greater in SV film structures comprising a small number of constituent layers.

Some SV films have heretofore been proposed, which positively incorporate the specular reflection noted above. The following are examples of those SV films. (c) Si substrate/5 nm NiO/2.5 nm Co/1.8 nm Cu/4 nm Co/1.8 nm Cu/2.5 m Co/50 nm NiO, (d) Si substrate/50 nm NiO/2.5 nm Cu/2 nm Co/3 nm Cu/3 nm Co/0.4 nm Au (Ref.; J. R. Jody et al., IEEE Mag. 33, No. 5, 3580 (1997)), (e) MgO substrate/10 nm Pt/5 nm Cu/5 nm NiFe/2.8 nm Cu/5 nm Co/1.2 nm Cu/3 nm Ag (Ref.; Y. Kawabu et al., Summary of Reports in Spring Meeting in 1997, p. 142, by the Japan Metal Society), (f) Si substrate/200 nm $Si_3N_4$/20 nm $Bi_2O_3$/4 nm Au/4 nm NiFe/3 .5 nm Cu/4 nm CoFe (Ref.; D. Wang et al., IEEE Mag. 32, No. 5, 4278 (1996)).

In those SV film structures, the underlined parts are those considered as specular reflection films.

In the SV film (c), the upper and lower specular reflection films are of an oxide. Simply, it is considered that insulating oxides having a high potential barrier are more effective than metals for electron wave reflection, as having higher mirror-reflectivity. In addition, since the NiO film is not only a reflective oxide film but also an antiferromagnetic film, it further acts to spin the magnetization of the magnetic layer adjacent to NiO. The above are D-SV films. It is believed that even normal SV films, reversal SV films and others having a single-layered antiferromagnetic film could enjoy the specular reflection on one side. However, these have some disadvantages and are not practicable in the current stage.

First, NiO has low magnetic coupling force and its practicability is low. This is because, in a weak magnetic coupling field, the magnetization direction of the pinned magnetic layer is unstable owing to the stray magnetic field from the recording media, and the output will fluctuate. In addition, irrespective of NiO and any other oxides for a cap layer, the contact resistance between the lead electrodes and the upper oxide layer is large. The increase in the contact resistance is unfavorable, as often causing ESD (electrostatic discharge). In addition, where CoFe is used as the free layer, it is understood that the CoFe layer could not exhibit soft magnetic characteristics if not oriented in fcc (111). Where the free layer is positioned in the lower side, a subbing oxide layer, if used, for the free layer shall not work well as a buffer layer for fcc(111)-orientation buffer for CoFe. With that constitution, the SV film could not have soft magnetic characteristics.

In the SV film (d), the underlayer of NiO is an antiferromagnetic film additionally acting for specular reflection, and the top Au layer is a reflective film. Also in the SV film (e), the top Ag film is a reflective film. In (e), the potential difference between the Ag film and the film surface induces specular reflection. The reason why the noble metal film of Au or Ag is effective as the surface reflective film is not clear. One reason is written in the reference for (d), in which they say that, since the surface diffusion of noble metal films is higher than that of transition metal films, the surface planarity of noble metal films is higher than that of transition metals, and therefore noble metal films will be ready to exhibit surface reflection.

The reflective films of metals are superior to those of oxides, as the former are free from the problem of contact resistance with lead electrodes, which problem, however, is inevitable in the latter. However, the mirror reflectivity of noble metal films of Au or Ag is often lost in practical devices. This is because, in practical MR devices or MR heads, the SV film is rarely exposed outside but is usually covered with any other additional film.

For example, in shielded MR heads, an upper magnetic gap film of alumina or the like is laminated on the SV film. As so written in the reference for (d), the specular reflection is much influenced by the surface or interface condition. Therefore, if any additional film is provided over the surface of the specular reflection film, the mirror reflectivity of the film shall naturally be varied by the overlying additional film. The film structure in which the MR characteristics of the SV film are varied by the additional film that overlies the SV film is problematic in its practical applications.

In fact, it is reported that, when a Ta film which is generally used as a protective film is laminated on the surface of the Au film in an SV film, then the Au film loses its mirror reflectivity. Accordingly, SV films utilizing the mirror reflectivity on their surface often lose their effect in device structures that are directed to practical applications, and are therefore not practicable.

The SV film (f) incorporates the Au film as the specular reflection film, like in (d). In (f), however, the Au film does not exhibit the reflective effect on its surface, but induces the mirror-reflective effect in the interface between the metal films. In this connection, it is understood that, when the Au film is directly formed on a substrate in the absence of a suitable underlayer therebetween, it often grows in islands. In order to prevent this, a particular underlayer is provided between the Au film and the substrate in (f). Above the underlayer, the smoothness of the Au film formed is enhanced as much as possible so as to ensure a sharp interface between the Au film and the overlying NiFe film.

However, the underlayer in (f) is not practicable. Briefly, in producing (f), an Au film is formed on the subbing $Bi_2O_3$ film having a thickness of 20 nanometers. This is to utilize the fact that the Au film formed on the subbing $Bi_2O_3$ film exhibits good reflectivity after it is annealed at 350° C. (Ref.; C. R. Tellier and A. J. Tosser, Size Ellects in Thin Films, Chapter I, Elsevier, 1982; L. I. Maissel et al., Handbook of Thin Film Technology, McGraw-Hill Publishing Company, 1983).

In addition, another underlayer of $Si_3N_4$ film having a thickness of 200 nanometers is provided below the $Bi_2O_3$ film. In other words, the two-layered underlayer having a total thickness of 220 nanometers is formed below the Au film, which is then annealed at a high temperature of 350° C. The thick underlayer having a thickness of 220 nanometers is extremely disadvantageous for narrow gaps that shall be much more narrowed for the coming, high-density recording systems, and will be almost impracticable. In addition, the high-temperature thermal treatment at 350° C. will cause interfacial diffusion at the interface of magnetic layer/nonmagnetic spacer layer, thereby disturbing the spin-dependent scattering of electrons which is intrinsic and indispensable to GMR films. As a result, the MR ratio in the film will be greatly lowered. The thermal treatment temperature for the film (f) will cause interfacial scattering even in other SV films that incorporate a laminate film of Co (CoFe) /Cu/Cu (CoFe) having good thermal stability.

(3) Magnetostriction control in CoFe:

Where a CoFe layer is used as a free layer, it is understood that an fcc(111)-oriented underlayer may be applied thereto so as to induce fcc(111) orientation of the CoFe layer, whereby the soft magnetic characteristics of the CoFe layer is improved. As the fcc(111)-oriented underlayer, used is a Cu layer or an Au layer. However, we, the inventors have found that, in the conventional technique, the magnetostriction which is another important factor of soft magnetic characteristics is not controlled at all, and that the thermal stability of the CoFe layer much depends on the underlayer. For example, the SV films based on the published patent specification noted above include the following:

(g) 5 nanometer Ta/2 nm Cu/2 nm CoFe/3 nm Cu/2 nm CoFe/7 nm IrMn/5 nanometer Ta, (h) 5 nanometer Ta/2 nm Au/3 nm CoFe/3 nm Cu/2 nm CoFe/7 nm IrMn/5 nanometer Ta.

In the film (g), the Cu layer is oriented in fcc(111), and the CoFe layer above the fcc(111)-oriented Cu layer is also oriented in fcc(111) to exhibit soft magnetic characteristics. However, the film (g) is problematic in that (i) its thermal stability is poor (the MR ratio in the as-deposited film of 8.1% is decreased to 6.5% after thermal treatment at 250° C.

for 4 hours, and the MR ratio reduction in the heat-treated film is 20% in terms of the relative ratio), and (ii) the magnetostriction $\lambda$ is $-14\times10^{-7}$, and its peak value is large. Thus, the film (g) is not always practicable. Regarding the magnetostriction $\lambda$, there is no definite standard in the art. As one standard, the preferred range of the magnetostriction $\lambda$ will fall between $-10\times10^{-7}$ and $+10\times10^{-7}$ or so.

In addition, even when Au is used as the fcc material in place of Cu (as in the film (h)), the film is still problematic in that (i) its thermal stability is poor (the MR ratio in the as-deposited film of 8.4% is decreased to 6.5% after thermal treatment at 250° C. for 4 hours, and the MR ratio reduction in the heat-treated film is 23% in terms of the relative ratio), and (ii) the magnetostriction $\lambda$ is $+33\times10^{-7}$, and its peak value is large. Thus, like that with a Cu layer, the film is still not always practicable.

XRD patterns of the spin valve films (g) and (h) are obtained through $\theta-2\theta$ scanning, and studied. In those patterns, the three layers of CoFe/Cu/CoFe had nearly the same d spacing value and gave one peak. This one peak is referred to herein. The fcc-oriented d-(111) spacing in the three layers CoFe/Cu/CoFe above Cu is 2.054 nanometers; and the fcc-oriented d-(111) spacing in the three layers CoFe/Cu/CoFe above Au is 2.086 nanometers. As will be mentioned hereunder, at the intermediate of the d-(111) spacing above Cu and Au, the magnetostriction in the films could be suitably controlled and reduced. Therefore, it has been found that the too small d-(111) spacing above Cu and the too large d-(111) spacing above Au are both unfavorable.

As mentioned above, it has been found that forming the free layer of CoFe on the merely fcc(111)-oriented underlayer is unsatisfactory in point of magnetostriction control. For reducing the magnetostriction, employable is a structure where CoFe is formed on an fcc(111)-oriented $Ni_{80}Fe_{20}$ at around zero magnetostriction level so that the entire free layer is made to have zero magnetostriction owing to that NiFe having nearly zero magnetostriction (e.g., the constitution (a) noted above). However, as so mentioned hereinabove, this structure is still problematic in that its MR characteristic is still degraded in thermal treatment.

As mentioned above, the MR ratio reduction in conventional spin valve films after thermal treatment is great, and the improvement in the thermal stability of the films is desired.

As one measure for increasing the MR ratio in spin valve films, specular reflection is widely noticed. However, the reflective film in conventional spin valve films is of an insulating material such as oxides, etc. In addition, some conventional spin valve films utilize the reflectivity on their surface. Therefore, the conventional spin valve films of those types often induce ESD, for example, owing to the increase in the contact resistance with lead electrodes, or protective films, if formed on the spin valve films, cancel the mirror reflectivity of the films. Thus, the conventional spin valve films have such various problems in their practical applications. Apart from those, another technique of utilizing interfacial specular reflection is being investigated. However, this requires a specific underlayer. Therefore, spin valve films utilizing such interfacial specular reflection are poorly practicable. For these reasons and in consideration of the practical applicability of spin valve films to devices and magnetic heads, it is desirable that the MR ratio in spin valve films is increased by specular reflection.

In addition, for improving the soft magnetic characteristics of spin valve films, it is desired to control and reduce the magnetostriction in Co-based magnetic layers of CoFe alloys or the like.

In particular, the mirror reflectivity of spin valve films to increase the MR ratio in the films and to reduce the magnetostriction therein must not be degraded in thermal treatment for ensuring the practical application of the films.

This embodiment of the invention is to solve the problems noted above, and its object is to provide a magnetoresistance effect device in which the MR characteristic of the spin valve film is prevented from being degraded in thermal treatment, and to provide a magnetoresistance effect device in which the MR ratio in the spin valve film is increased by specular reflection in consideration of its practical applications, in which the magnetostriction in the spin valve film is reduced, and in which the MR ratio reduction and the magnetostriction increase in the spin valve film in thermal treatment are both retarded. Another object is to provide a magnetic head and a magnetic recording/reproducing system incorporating the magnetoresistance effect device and therefore having improved recording/reproducing characteristics and improved practical applicability.

The embodiment to solve the problems noted above is described below with reference to the accompanying drawings.

Figure 32:
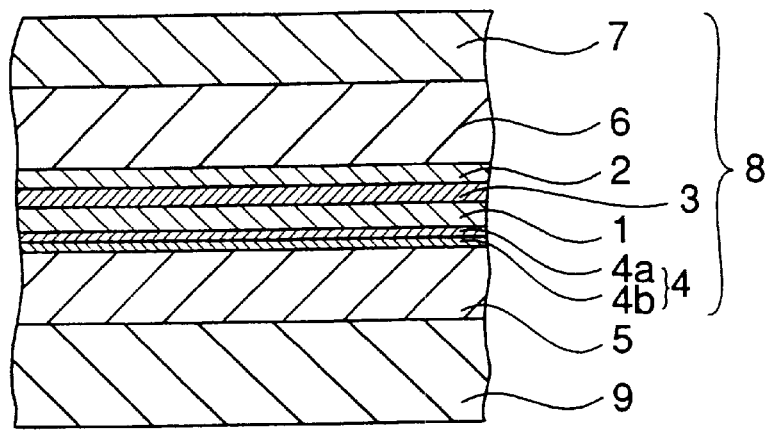
FIG. 32 is a sectional view of the essential structure of one embodiment of the magnetoresistance effect device of the invention.

FIG. 32 is a sectional view of the essential structure of one embodiment of the magnetoresistance effect device (MR device) of the invention. In FIG. 32, 1 is a first magnetic layer, and 2 is a second magnetic layer. These first and second magnetic layers 1 and 2 are laminated via a nonmagnetic spacer layer 3 existing therebetween. These first and second magnetic layers 1 and 2 are not antiferromagnetically coupled to each other, but form a non-coupled, laminated magnetic film.

The first and second magnetic layers 1 and 2 may be made of a Co-containing ferromagnetic material of, for example, simple Co or a Co alloy. The magnetic layers 1 and 2 may also be made of an NiFe alloy or the like. Of those materials, especially preferred is a Co alloy as being able to enlarge both the bulk effect and the interfacial effect, whereby the MR ratio in the MR device could be enlarged.

The Co alloy for constituting the magnetic layers 1 and 2 includes Co-based alloys containing at least one or more elements selected from Fe, Ni, Au, Ag, Cu, Pd, Pt, Ir, Rh, Ru, Os, Hf, etc. It is desirable that the additive element content of the alloys falls between 5 and 50 at. %, more preferably between 8 and 20 at. %. This is because, if the additive element content is too small, the bulk effect of the alloys will be poor; but, on the contrary, if the additive element content is too large, the interfacial effect of the alloys will lower. Of the additive elements, especially preferred is Fe, as giving large MR ratio.

Of the first and second magnetic layers 1 and 2, the lower first magnetic layer 1 is formed on a magnetoresistance effect-improving layer (MR-improving layer) 4. The MR-improving layer 4 is formed on a nonmagnetic layer having a subbing function (hereinafter referred to as nonmagnetic underlayer) 5. The nonmagnetic underlayer 5 is, for example, a layer containing at least one element selected from Ta, Ti, Zr, W, Cr, Nb, Mo, Hf and Al, for which are used any of simple metals or alloys of those metals, or compounds such as oxides or nitrides of those metals. Where the nonmagnetic underlayer 5 is of an oxide of Ta or the like, electrons that could not be reflected on the MR-improving layer 4 could be reflected on the interface of nonmagnetic underlayer 5/MR-improving layer 4, as will be described in detail hereunder.

The first magnetic layer 1 is a free layer of which the magnetization direction varies depending an applied magnetic field. On the second magnetic layer 2, formed is an antiferromagnetic layer 6 of any of IrMn, NiMn, PtMn, FeMn, RuRhMn, PdPtMn or the like. From the antiferromagnetic layer 6, a bias magnetic field is applied to the second magnetic layer 2, by which the magnetization of the layer 2 is pinned. Accordingly, the second magnetic layer 2 is a pinned magnetic layer.

Apart from the method of pinning the second magnetic layer noted above in which the second magnetic layer is directly contacted with the antiferromagnetic layer for thereby pinning its magnetization direction, a so-called Synthetic antiferromagnetic structure may also be employed for the intended pinning, though not shown in FIG. 32. Briefly, a third magnetic layer is laminated on the second magnetic layer via a layer of Ru, Cr or the like, and the second magnetic layer and the third magnetic layer are antiferromagnetically coupled to each other in a manner of RKKY. Using the Synthetic antiferromagnetic structure is preferred, as the bias point is stabilized and the stability of the pinning characteristic at high temperatures is enhanced. Concretely, examples of the structure comprising the second magnetic layer and the third magnetic layer include CoFe/Ru/CoFe, Co/Ru/Co, CoFe/Cr/CoFe, Co/Cr/Co, etc. The antiferromagnetic layers to be applied to the Synthetic antiferromagnetic structure may be the same as those mentioned above.

Examples of the material that constitutes the nonmagnetic layer 3 to be disposed between the first and second magnetic layers 1 and 2 include Cu, Au, Ag and their alloys; paramagnetic alloys comprising any of these metals and magnetic elements; and Pd, Pt and alloys consisting essentially of these.

On the antiferromagnetic layer 6, formed is a protective layer 7. The protective layer 7 may be made of metals or alloys which are the same as those for the nonmagnetic underlayer 5. These constituent layers form the spin valve film 8 of this embodiment. A pair of electrodes (not shown) for supplying sense current are connected to the spin valve film 8 to construct a spin valve GMR device. The spin valve GMR device may be provided with a bias magnetic field-applying film of a hard magnetic film or an antiferromagnetic film, which is to apply a bias magnetic field to the free layer In this case, it is desirable that the bias magnetic field is applied in the direction nearly perpendicular to the magnetization direction of the pinned magnetic layer 2. In FIG. 32, 9 is a substrate.

Of the layers constituting the spin valve film 8 noted above, the MR-improving layer 4 is the characteristic part of the invention. The MR-improving layer 4 in FIG. 32 is of a laminate film comprising a first metal film 4a and a second metal film 4b. The metal films 4a and 4b function as underlayers for the spin valve film 8, and these may contain at least one element selected from Cu, Au, Ag, Pt, Rh, Ru, Al, Ti, Zr, Hf, Pd and Ir.

Of those plural metal films, the essential element constituting the first metal film 4a that is adjacent to the first magnetic layer (free layer) 1 does not form solid solution with the essential element constituting the free layer 1. Preferably, the same shall apply also to the second metal film 4b. Specifically, it is desirable that the essential element constituting the second metal film 4b does not form solid solution with the essential element constituting the free layer 1. In particular, the essential elements each constituting those first and second metal films 4a and 4b may not form solid solution with each other. It is further desirable that the first metal film 4a to be adjacent to the free layer 1 is of a metal having a short electron wavelength, while the second metal film 4b adjacent to the first metal film 4a is of a metal having a longer electron wavelength (than that of the metal constituting the first metal film 1a).

The definition "not forming solid solution" as referred to herein is explained. For two different elements A and B, the condition in which one element A does not form solid solution with another element B (for the terminology "not forming solid solution") is meant to indicate the following condition: In a binary phase diagram (for example, see Binary Alloy Phase Diagram, 2nd edition, ASM International, 1990, etc.), when the amount by at. % of B capable of dissolving in a matrix of A to form solid solution at low temperatures around room temperature or so, and the amount by at. % of A capable of dissolving in a matrix B to form solid solution at such low temperatures are both at most 10%, the combination of those elements A and B is in the condition of "not forming solid solution".

Concretely mentioned are a case where the magnetic layer (for example, the free layer 1) is of Co or a Co alloy, and a case where the magnetic layer is of an Ni alloy. Since the subbing film is preferably of an fcc metal or an hcp metal for attaining the fcc orientation in the magnetic layer, the element constituting the MR-improving layer that is adjacent to the magnetic layer will be selected from Al, Ti, Cu, Zr, Ru, Rh, Pd, Ag, Hf, Ir, Pt, Au, etc. Of those elements, three elements of Cu, Ag and Au satisfy the requirement of not forming solid solution with Co. On the other hand, three elements of Ru, Ag and Au satisfy the requirement of not forming solid solution with Ni. For the magnetic layer of an Ni alloy, Cu will form solid solution with the Ni alloy from the relation of the two, Cu and Ni in the phase diagram. However, the present inventors' experiments have revealed the fact that, when Cu is used in the MR-improving layer, it forms less solid solution with Ni in the neighboring magnetic layer. Specifically, on the basis of the experimental data mentioned below, it is decided that an Ni alloy and Cu do not form solid solution with each other.

When the free layer is thin, the MR-improving layer acts as the nonmagnetic high-conductivity layer in the first embodiment mentioned hereinabove. However, once the interface between the nonmagnetic high-conductivity layer and the free layer has become diffusive owing to electron diffusion in that interface, the electron transmittance from the free layer to the nonmagnetic high-conductivity layer is lowered. In other words, even when the magnetization direction of the pinned layer is parallel to that of the free layer, the diffusive interface receives non-elastic electron scattering so that the mean free path of electrons for up-spin could not be prolonged. As a result, this induces MR ratio depression. This phenomenon is seen when the ultra-thin free layer forms solid solution with the nonmagnetic high-conductivity layer, and becomes more remarkable in thermal treatment. Accordingly, the MR ratio decreases after thermal treatment. To confirm this phenomenon, we, the present inventors made one experiment in which Cu is attached to an Ni alloy layer. In that experiment, less MR ratio depression was seen.

From the experimental results noted above, it is decided that Ni alloys do not form solid solution with Cu. Accordingly, Cu could be in the group of elements not forming solid solution with Ni alloys. For these reasons, in the invention, the group of elements not forming solid solution with Ni alloys shall include Cu in addition to the elements to be derived from the phase diagram. Concretely, the group includes Ru, Ag, Au and Cu. With any of those elements being disposed adjacent to the magnetic layer which does not form solid solution with any of those elements, the compositional steepness in the interface between the magnetic layer and the MR-improving layer is not lost in thermal treatment and good specular reflection could be expected.

The premise in this case is that the magnetic layer is fcc-oriented, which, however, is not imitative. Needless-to-say, the magnetic layer may be non-oriented or may have a microcrystalline structure, and the MR-improving layer may be applied to the magnetic layer of that type. Concretely, the magnetic layer may be any of amorphous magnetic layers or microcrystalline-structured magnetic layers of CoFeB, CoZrNb or Cr to which may be added any of Ti, Zr, Nb, Hf, Mo, Ta or the like.

In the invention, the MR-improving layer comprising the elements noted above may be partly in the form of a laminate film with any other metal films or of an alloy film with any other elements for the purpose of more ensuring the d-spacing control in the layer and the microcrystalline structure of the layer. The elements constituting the metal films to form the laminate film are desirably fcc metals and hcp metals, including, for example, Al, Ti, Cu, Zr, Ru, Rh, Pd, Ag, Hf, Ir, Pt, Au, etc.

Where the MR-improving layer is of a laminate film, metals of the metal films constituting it and not to be adjacent to the magnetic layer may be capable of forming solid solution with the metals of the other metal films to adjacent to the magnetic layer.

Examples of using a laminate film for the MR-improving layer 4 are mentioned below. Where the magnetic layer 1 is of Co or a Co alloy and the metal film 4a is of Cu not forming solid solution with the element(s) of the layer 1, it is possible that the metal film 4b comprises at least one element selected from Al, Au, Pt, Rh, Pd and Ir all capable of forming solid solution with Cu. Where the metal film 4a is of Ag, the metal film 4b may comprise at least one selected from Pt, Pd and Au. Where the metal film 4a is of Au, the metal film 4b may comprise at least one selected from Pt, Pd, Ag and Al. Where the magnetic layer 1 is of an Ni alloy and the metal film 4a is of Ru not forming solid solution with the elements of the layer 1, it is possible that the metal film 4b comprises at least one element selected from Rh, Ir and Pt all capable of forming solid solution with Ru. To Ag and Au for the film 4b, the same as above for the metal film 4a of Cu could apply.

Of the combinations noted above, it is desirable that the two elements constituting the MR-improving layer 4 could form solid solution to a level of at least 10%. For example, preferred are combinations of Au-Cu, Ag-Pt, Au-Pd, Pt-Cu, Au-Ag, etc. Regarding the combination of the metal film 4a and the metal film 4b, however, it is not always necessary that the two can form solid solution in some degree. For example, combinations of Cu-Ru, Cu-Ag and the like are also employable herein. The laminate film for the MR-improving layer 4 is not limited to only the two-layered laminate film composed of the first metal film 4a and the second metal film 4b, but may be composed of three or more layers.

The MR-improving layer 4 is not limited to the laminate film composed of the first metal layer 4a and the second metal layer 4b. For example, as in FIG. 33, the MR-improving layer 4 may be an alloy layer 4c that comprises elements not forming solid solution with the essential components constituting the magnetic layer 1. To the alloy layer 4c in this case, the same as above for the laminate film could apply. Concretely, for example, where the magnetic layer 1 is of Co or a Co alloy, the alloy layer 4c comprises, as the essential constituent element, at least one selected from three elements of Cu, Ag and Au. Where the magnetic layer 1 is of an Ni alloy, the alloy layer 4c comprises, as the essential constituent element, at least one selected from four elements of Ru, Ag, Au and Cu.

The alloy layer 4c may comprise at least one additional element in addition to the essential constituent elements noted above. As the additional elements, used are elements capable of forming solid solution with the essential constituent elements of the alloy layer 4c so as to prevent phase separation in the layer 4c. For example, when the essential constituent element of the alloy layer 4c is Cu, the alloy for the layer 4c shall contain a noble metal, including, for example, Cu-Au, Cu-Pt, Cu-Rh, Cu-Pd, Cu-Ir, etc. When the essential constituent element of the alloy layer 4c is Ag, the alloy for the layer 4c may be a noble metal alloy, including, for example, Ag-Pt, Ag-Pd, Ag-Au, etc. When the essential constituent element of the alloy 4c is Au, the alloy for the layer 4c may also be a noble metal alloy, including, for example, Au-Pt, Au-Pd, Au-Ag, Au-Al, etc.

Of the alloys noted above, it is desirable that the two elements constituting the alloy layer 4c for the MR-improving layer 4 could form solid solution to a level of at least 10%. For example, preferred are alloys of Au-Cu, Ag-Pt, Au-Pd, Au-Ag, etc. As mentioned above, various types of morphology could apply to the MR-improving layer 4. For example, the MR-improving layer 4 may also be a laminate film composed of the metal film 4a and the alloy layer 4c, as in FIG. 34.

Where the free layer 1 is of a Co-based magnetic material, it is desirable that the MR-improving layer 4 which acts as the underlayer for the free layer 1 is of a metallic material having the same f cc-crystal structure as the Co-based magnetic material has, or of an hcp-structured metallic material capable of readily orienting the overlying film in fcc-orientation. In view of those points, Cu, Au, Ag, Pt, Rh, Pd, Al, Ti, Zr, Hf, Ir and their alloys such as those mentioned above are preferable materials for constituting the MR-improving layer 4. Further, when the MR-improving layer 4 is of a laminate film or an alloy layer of those metals, it is effective for reducing the magnetostriction in the free layer 1 of a Co-based magnetic material such as Co-Fe alloys, etc., as will be described in detail hereunder.

It is desirable that the thickness of the MR-improving layer 4 is at least 2 nanometers, in order that the layer 4 could have the function as a underlayer. However, if too thick, the layer 4 will increase the shunt current flow to thereby reduce the MR ratio in the film 8. Therefore, it is desirable that the thickness of the MR-improving layer 4 is at most 10 nanometers, more preferably at most 5 nanometers.

The MR-improving layer 4 has the function of improving the thermal stability of the spin valve film 8, the function as a specular reflection film (interfacial reflection film) in the spin valve film 8, the function of still keeping high MR ratio even if the free layer is thin, the function of reducing the magnetostriction in the free layer 1 of a Co-based magnetic material, and the function of controlling the microcrystalline structure of the spin valve film 8. Based on those function, the MR-improving layer 4 improves the MR characteristics of the spin valve film 8. The functions of the MR-improving layer 4 are described in detail hereunder.

Figure 35A:
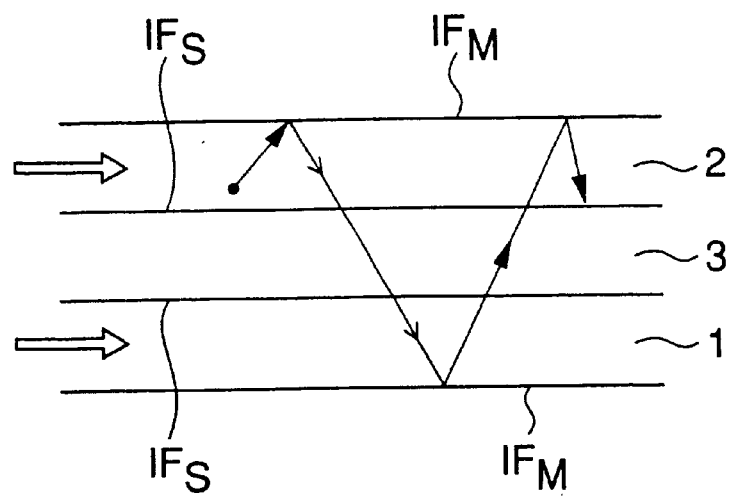
FIG. 35A, FIG. 35B and FIG. 35C are views showing the reduction in the MR ratio in conventional spin valve films after thermal treatment.
Figure 35B:
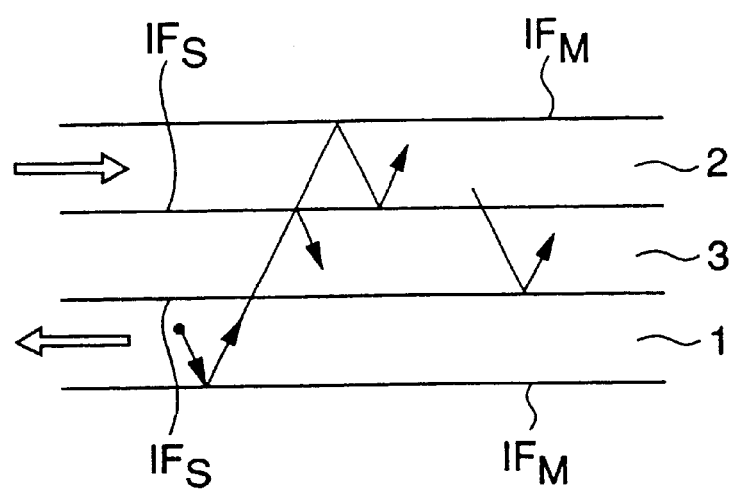
Figure 35C:
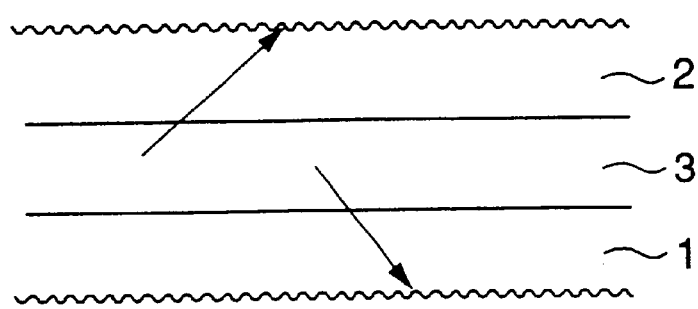

First referred to is the process of thermal degradation of spin valve films. One reason for the thermal degradation of the MR characteristics of spin valve films during annealing is that the specular reflection on the sides of the magnetic layers 1 and 2 not contacted with the nonmagnetic spacer layer 3 will vary during annealing. FIG. 35A to FIG. 35C show the reduction in the MR ratio in spin valve films after thermal treatment. In those, $IF_s$ indicates the interface with spin-dependent scattering thereon, and $IF_m$ indicates with no spin-dependent scattering but with specular reflection scattering thereon. Precisely, FIG. 35A and FIG. 35B schematically show an ideal condition (this corresponds to the as-deposited condition); and FIG. 35C schematically shows the condition after annealing.

As in FIG. 35A and FIG. 35B, specular reflection scattering occurs on the both sides of the three-layered laminate structure, free layer 1/nonmagnetic spacer layer 2/pinned magnetic layer 3, of the basic unit of the spin valve GMR in the as-deposited condition (even though the interface is between metal films). However, as in FIG. 35C, in the system that readily forms solid solution in a process of annealing, interfacial diffusion occurs, or that is, the interface becomes diffusive to lower its mirror-reflectivity after annealing. As a result, it is considered that, in that system, the MR characteristics are degraded in thermal treatment.

Few reports are found relating to the specular reflection on the interface between metal films, and any positive proof of the specular reflection on that interface has not been well established as yet. However, as will be mentioned hereunder, even on the interface between metal films with small potential difference therebetween, some ideal specular reflection will occur. For example, specular reflection occurs on the interface of NiFe/CoFe in the as-deposited condition in which mixing of the two is relatively small. However, after the system of NiFe-CoFe is annealed, interfacial diffusion occurs readily on that interface of NiFe/CoFe where the components will form solid solution, whereby the compositional steepness in the interface will be lost. As a result, it is considered that the MR ratio will lower in that system after thermal treatment.

Concretely, in a spin valve film incorporating a free layer of a laminate film of NiFe/CoFe, the specular reflection on the NiFe/CoFe interface is lost in annealing. As a result, for example, the MR ratio of 7.3% in the as-deposited film is lowered to 5.8% after annealing at 250° C. for 4 hours. One reason for this will be because the specular reflection coefficient at the NiFe/CoFe interface would be varied in annealing, whereby the MR ratio in the film would be also varied after annealing.

In the prior art technology, the interfacial specular reflection has not been taken into consideration since the NiFe/CoFe interface is the interface between metal films and since the two, NiFe and CoFe are in nearly the same electron condition. In the as-deposited condition, the interface could be uniform with relatively low-level mixing of elements thereon, and therefore specular reflection will occur even on the metal film interface of that type. However, since the NiFe/CoFe system forms solid solution in its interface, the interface will readily diffuse and mix when annealed, whereby the compositional steepness in the interface will be lost and the specular reflection coefficient therein will become small. As a result, the MR characteristics in the system will be degraded. In a different aspect, this means that the MR ratio in the as-deposited film is larger by the degree of specular reflection than that in the annealed film.

When the free layer is thin and MR-improving layer is disposed to the free layer, the MR-improving layer acts as the nonmagnetic high-conductivity layer in the first embodiment mentioned hereinabove. However, once the interface between the nonmagnetic high-conductivity layer and the free layer has become diffusive owing to atomic diffusion in that interface, the electron transmittance from the free layer to the nonmagnetic high-conductivity layer is lowered. In other words, even when the magnetization direction of the pinned layer is parallel to that of the free layer, the diffusive interface receives non-elastic electron scattering so that the mean free path of electrons for up-spin could not be prolonged. As a result, this induces MR ratio depression. This phenomenon is seen when the ultra-thin free layer forms solid solution with the nonmagnetic high-conductivity layer, and becomes more remarkable in thermal treatment. Accordingly, the MR ratio decreases after thermal treatment.

It is important to form a stable interface between the free layer and the nonmagnetic high-conductivity layer, which does not interfere with the up-spin transmission even after thermal treatment. Concretely, it is important that the material of the free layer does not form solid solution with the material of the nonmagnetic high-conductivity layer. For example, when the magnetic layer is of a Co alloy, then the nonmagnetic high-conductivity layer may be any of Cu, Au, and.

In view of the above, as one means of really preventing the MR characteristic degradation, it is important to dispose a metal material which does not form solid solution with the materials of the magnetic layers 1 and 2, at the both sides of the basic unit of the GMR film. In addition, for example, when a material of CoFe alloys and the like is used in forming the basic GMR unit, the insoluble metal material layer of that type must have an additional function as a seed layer capable of orienting the CoFe alloy layer in fcc(111) orientation. Therefore, it is understood that metal materials capable of readily orienting in fcc(111) orientation are preferred for the additional metal layers. Moreover, when the free layer is of a CoFe alloy, magnetostriction control in the layer is also important.

Another factor of the MR characteristic degradation in spin valve films in annealing is the change in the microstructure of the films in thermal treatment. The microstructure of spin valve films is one important factor for improving the thermal stability of the films. For this, the microstructure of the films is desirably such that, in the basic GMR unit of free layer/nonmagnetic spacer layer/pinned magnetic layer, all interposing interfaces and the both outer interfaces could be kept stable even after thermal annealing. This is because the interface between free layer/nonmagnetic spacer layer and that between nonmagnetic spacer layer/pinned magnetic layer are both important for ensuring strong, spin-dependent interfacial scattering thereon, and because the both outer interfaces of the two magnetic layers are also important for thermally stabilizing the spin-independent spectacular reflection scattering thereon. Where the magnetic layers are of laminate films, the interface between the constituent magnetic films, one being adjacent to the nonmagnetic spacer layer while the other being adjacent to that one, shall be the specular reflection interface for spin-independent scattering thereon.

In order to realize the condition noted above, it is naturally desirable that the materials for magnetic layer/nonmagnetic layer are so selected that the material of the magnetic layer does not form solid solution with that of the nonmagnetic layer (for example, CoFe/Cu, or Co/Cu). On the interface of that type, the two materials do not form solid solution. Therefore, it is important to prevent atomic diffusion on the interface of magnetic layer/nonmagnetic layer and on the outer interface of the magnetic layer not adjacent to the nonmagnetic spacer layer. For this, ideally, it is desirable that the crystals in the basic GMR unit moiety are single crystals. (In this connection, in one example of CoFe/Cu/CoFe, the constituent crystals do not differ so much in the lattice constant, and the crystal grains do not separately exist in each layer but form aggregated grains in the integrated constitution of CoFe/Cu/CoFe.) In fact, however, in the spin valve film 8 as formed on an amorphous layer of, for example, alumina or the like, single crystals are difficult to form.

Therefore, for practicable and realizable crystal structures, preferred are so-called pseudo-single-crystal film structures in which the intergranular boundaries, if any are not ordinary intergranular boundaries but are so-called sub-grain boundaries with little in-plane orientation gap. In the invention incorporating the MR-improving layer 4 noted above, spin valve films having small angle tilt boundaries of sub-grain boundaries are obtained and their reproducibility is high. Concretely, the spin valve films of the invention can be oriented in fcc(111) orientation, and the in-plane shift of the crystal orientation in the intergranular boundaries in the films could be limited within 30 degrees. The magnetoresistance effect characteristics of the spin valve films of the invention are greatly improved owing to the grain control in the films The crystal structures of the films will be described in detail hereunder.

Where the magnetization of the spin valve film is pinned with an Mn-based ferromagnetic layer, for example, as in CoFe/Cu/CoFe/IrMn, the MR characteristics of the film will be greatly degraded if Mn passes through the intergranular boundaries therein to penetrate through the CoFe layer and diffuses even into the Cu layer. Therefore, in the constitution of CoFe/Cu/CoFe/IrMn or the like, it is desirable that Mn is prevented from passing through the intergranular boundaries to diffuse into the Cu layer. On the other hand, since the interface of the magnetic layer not adjacent to the nonmagnetic spacer layer shall be the interface to induce specular reflection, the microstructure of the spin valve film is preferably such that the interface of the magnetic layer is difficult to disorder. For this, it is important that the material of the layer positioned outside of the ferromagnetic layer does not form solid solution with the essential constituent element of the magnetic layer.

In the case where the antiferromagnetic layer is of IrMn or the like in which the lattice spacing greatly differs from that in CoFe, significant lattice distortion occurs between the CoFe layer and the overlying IrMn layer. If so, atomic dislocation will occur in the interface of CoFe/IrMn to relieve the lattice distortion therein. For preventing such an unfavorable interfacial phenomenon, for example, an additional layer capable of stabilizing the lattice spacing in IrMn may be disposed on the IrMn layer. For the additional layer, for example, an fcc metal material in which the lattice spacing is nearly on the same level as in IrMn may be laminated over the IrMn layer. With that constitution, the thermal stability of the spin valve film could be improved.

Where the MR-improving layer is provided below the antiferromagnetic layer as the underlayer for the antiferromagnetic layer, it will be effective for controlling the lattice spacing in the antiferromagnetic layer and, in addition, for enhancing the pinning ability of the antiferromagnetic layer. Even to that case where the MR-improving layer is provided directly adjacent to the antiferromagnetic layer, not only ordinary pinned structures in which the pinned layer is directly contacted with the antiferromagnetic layer but also Synthetic antiferromagnetic structures with Ru, Cr and others such as those mentioned above are applicable. In the combined constitution with the antiferromagnetic layer, the antiferromagnetic layer and the MR-improving layer do not diffuse too much in thermal treatment. Therefore, it is desirable that the material of the MR-improving layer does not form solid solution with that of the antiferromagnetic layer, or, when an γ-Mn-based antiferromagnetic material such as IrMn, RuRhMn or the like is used for the antiferromagnetic layer, the MR-improving layer is of an fcc metal material or an hap metal material so as to stably keep the crystal structure of the antiferromagnetic layer.

Based on various advantages of specular reflection on the interface of metal film/metal film and others mentioned above, the magnetoresistance effect device of the invention is intended to have improved MR characteristics, improved thermal stability and improved magnetization-pinning characteristics. For that device with specular reflection on the metal/metal interface therein, the following two points must be taken into consideration. First, since there is small potential difference in the metal/metal interface, the interface could not ensure large specular reflection if based on the conventional idea. Secondly, when the film thickness is increased to some degree in order to ensure the specular reflection effect of the reflective film of a metal, the metal film will produce shunt current flows as having small resistance, whereby the current to flow in the basic GMR unit will decrease and the MR ratio in the device will be reduced.

It is believed that metal films are inferior to oxide films with respect to their reflectivity. Though inferior to oxide films, metal films could still have good reflectivity. From the viewpoint of industrial applicability, metallic reflective films are superior to reflective films of oxides. Based on this point, the invention has been herein completed.

Figure 36:
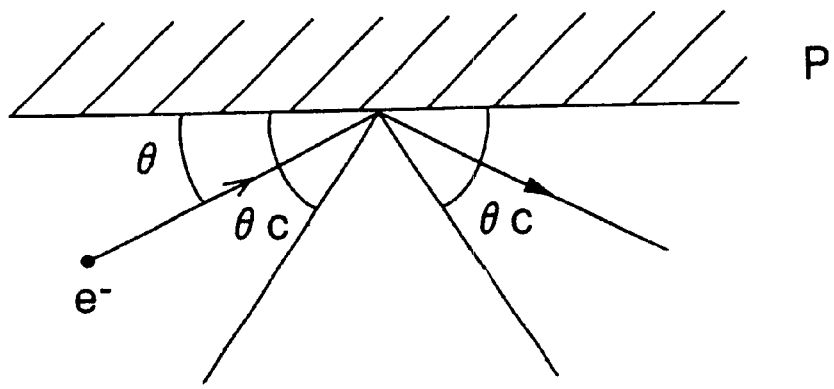
FIG. 36 is a view explaining specular reflection on metal/metal interface.

FIG. 36 is a schematic view of a model of metal/metal interface with good specular reflection thereon. In place of ordinary electron potential models generally employed in the art, herein used is an extremely simplified model for wave theory for facilitating the understanding of the invention. As in FIG. 36, when an electron having a predetermined Fermi wavelength has reached a metal/metal interface, then the wavelength of the electron shall change.

In that condition, when the Fermi wavelength of the electron is shorter in one metal film, the reflective film p, than the other metal film neighboring on the film p, then the electron as reached the film p at an angle θ smaller than the critical angle θc (θc >θ) shall be all the time completely reflected on the film p. With the difference between the Fermi wavelength of an electron in the reflective film p and that in the neighboring metal film being larger, the critical angle $θ_c$ for the electron shall be larger, and, as a result, the mean reflectivity p as averaged for all electrons that participate in electroconductivity shall be larger.

Figure 37A:
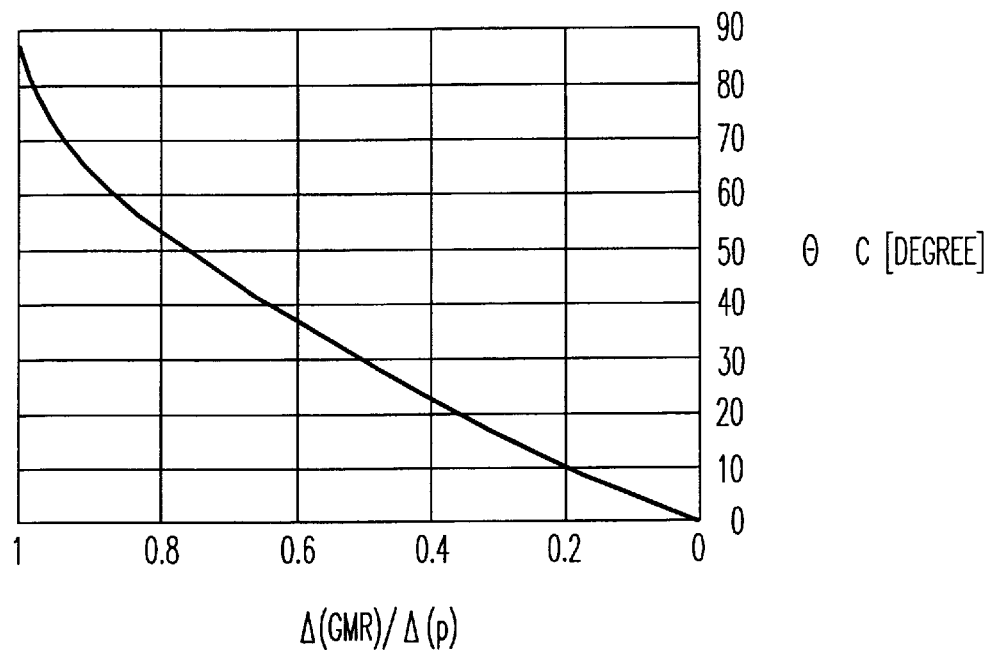
FIG. 37A and FIG. 37B are graphs showing two examples of the relationship between the ratio of the Fermi wavelength in a reflective film to the Fermi wavelength in a GMR film adjacent to the reflective film, and the critical angle θc.
Figure 37B:
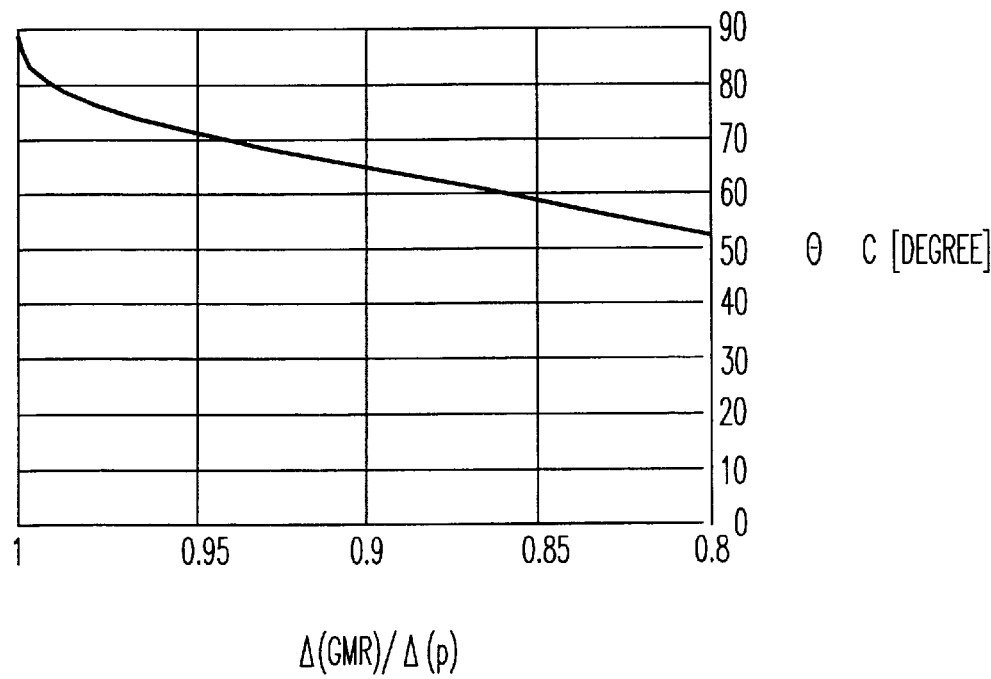
Figure 38:
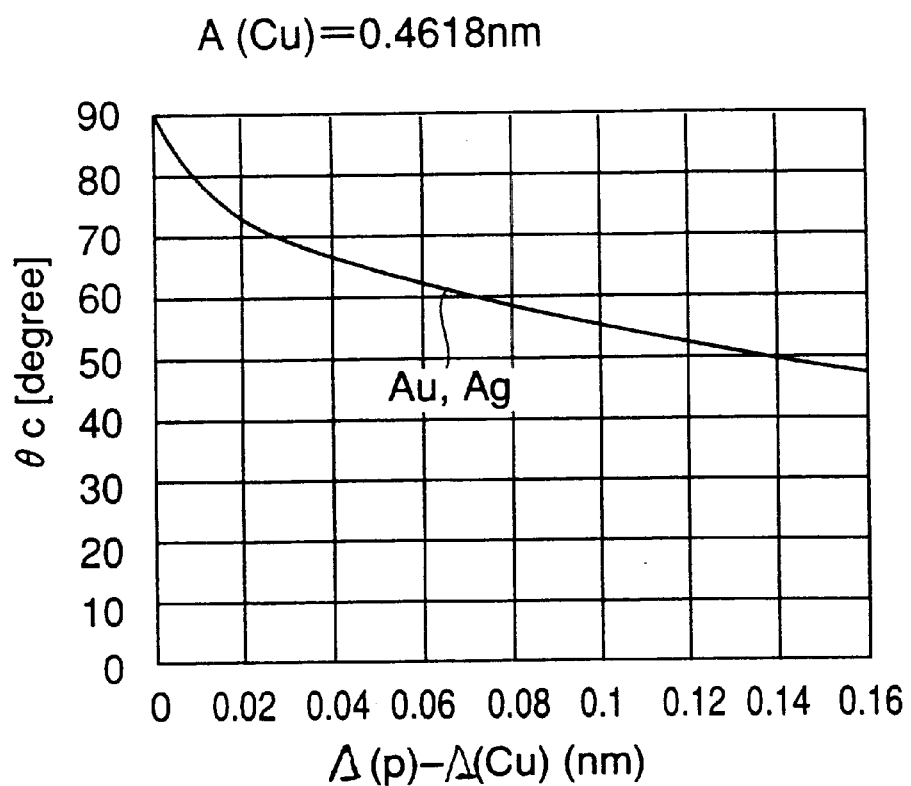
FIG. 38 is a graph of the data of the critical angle θc at which Au(Ag)/Cu interface produces specular reflection, as calculated from the Fermi wavelength at the interface.

FIG. 37A and FIG. 37B are graphs indicating the ratio of the Fermi wavelength, Λ(p), in the reflective film p to the Fermi wavelength, Λ(GMR), in a GMR film neighboring on the reflective film p, Λ(GMR)/Λ(p), versus the critical angle θc. As is known from FIGS. 37A and 37B, the metal/metal interface could reflect electrons thereon to a satisfactory degree even though the electron wavelength difference is not so significant. Needless-to-say, it is believed that the electron wavelength is infinite on a reflective film of an insulating material, and the critical angle θc for electrons on the reflective insulator film is large. However, even for metal/metal interface, electrons could reflect on the interface to a satisfactory degree. FIG. 38 is a graph of the data of the critical angle θc at which Au(Ag)/Cu interface produces specular reflection, as calculated from the Fermi wavelength at the interface. As is known from FIG. 38, the interface of Au(Ag)/Cu well produces satisfactory specular reflection thereon.

From the above, it is understood that, for the reflective film with metal/metal constitution, the important matters are that (1) the Fermi wavelength of electrons in one metal film is as long as possible and (2) the compositional steepness in the interface between the metal films is high. The Fermi wavelength is generally on the order of a few angstrom. Therefore, if the compositional steepness is lost owing to the interfacial diffusion over that order, the wave reflection will vary, depending on the wavelength, whereby the electron transmission probability will increase. Therefore, it is important how to increase the compositional steepness at the film interface and how to make the Fermi wavelength vary to a great extent on that interface. However, regarding (1), the relationship between the Fermi wavelength and the specular reflection is not as yet clarified, and the Fermi wavelength is difficult to calculate. Therefore, it is not clear as to whether or not the condition (1) is indispensable herein. Therefore, we, the present inventors have herein decided that the condition (2) is indispensable to the present invention.

For satisfying the condition (2), it is especially important that the different metals in the metal/metal film constitution do not form solid solution when combined. If in the metal/metal system, metal precipitation occurs easily on the interface through annealing, it will much increase the compositional steepness in the interface to further facilitate specular reflection on the interface. Since the Fermi wavelength of electrons is naturally on the order of a few angstroms, it is desirable that the compositional steepness in the metal/metal interface is dull on that order. Regarding the point (1) noted above, it is desirable that a metal film with a shorter electron wavelength is disposed on the outer side of the magnetic layer while another metal film with a longer electron wavelength is on the outer side of the previous metal layer, for enhancing the reflectivity of the metal/metal film constitution.

From the above, for really ensuring the specular reflection on the metal/metal interface, it is understood that one practicable method of material selection for the metal/metal film constitution is to dispose an MR-improving layer of a metal not forming solid solution with the element of the magnetic layer, on one side of the magnetic layer that is opposite to the side of the spacer layer. In addition, it is desirable to dispose the first metal film 4a with a shorter electron wavelength, for example, on the outer side of the free layer 1 and to dispose the second metal film 4b with a longer electron wavelength on the outer side of the film 4a.

Where an alloy film is used as the reflective film, its resistance is generally larger than that of pure metal films, if it does not form a completely regular alloy. In other words, the electron wavelength of the alloy film is long. This is advantageous for reflective films and is further advantageous in that the constituent elements of the alloy do not form solid solution with the elements of the neighboring film. The method of forming the alloy film of that type is not limited to direct formation of the alloy film. Alternatively, plural films of alloying systems may be formed through lamination, whereupon an alloy may be formed in the interface of the laminate. However, when the free layer is thin, it is desirable that the specific resistance of the MR-improving layer adjacent to the free layer is lower. (In this connection, when the free layer is thin, the MR-improving layer acts as the nonmagnetic high-conductivity layer in the first embodiment.) Therefore, in that case, it is rather undesirable to form the alloy layer directly on the free layer.

Figure 33:
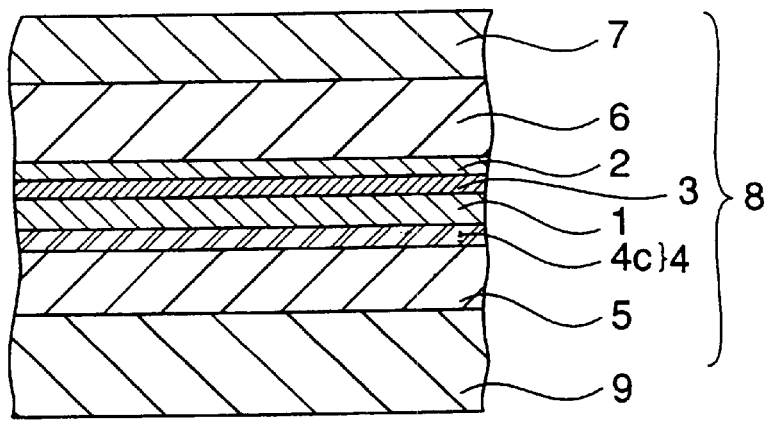
FIG. 33 is a sectional view of one modification of the embodiment of the magnetoresistance effect device of FIG. 32.
Figure 34:
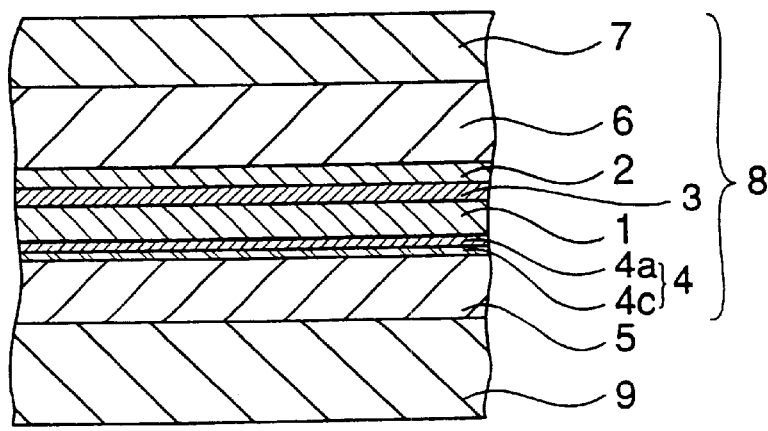
FIG. 34 is a sectional view of another modification of the embodiment of the magnetoresistance effect device of FIG. 32.

For the reasons noted above, in the spin valve films 8 as illustrated in FIG. 32, FIG. 33 and FIG. 34, the MR-improving layer 4 acting as the reflective film is so disposed that the metal film (concretely, the first metal film 4a) not forming solid solution with the magnetic layer (free layer 1) is adjacent to the magnetic layer (free layer 1); and the MR-improving layer 4 acting as the reflective film is of a laminate film composed of a plurality of metal films 4a and 4b, or the MR-improving layer 4 is of the alloy layer 4c. The materials for constituting the plural metal films 4a and 4b and the alloy layer 4c are selected on the basis of the knowledge noted above. Where the MR-improving layer 4 is of a laminate film, it is desirable that the first metal film having a shorter electron wavelength is disposed adjacent to the magnetic layer 1 for specular reflection. However when the free layer thickness is thin enough to have spin-filter effect, MR-improving layer 4 is preferred to have low resistivity. The knowledge noted above shall apply to the other constitutive conditions than this.

The MR ratio in the MR film based on the specular reflection, or spin-filter effect when the free layer thickness is thin, noted above, is still kept as such even after annealing. This is because, owing to the appropriate material selection for the MR-improving layer 4 (in that the specifically-selected material of the layer 4 does not form solid solution with the elements in the neighboring layers), the compositional steepness in the interface in the film could be still maintained as such even after annealing. In other words, the MR characteristics of conventional spin valve films are degraded in annealing owing to the interfacial diffusion or mixing, but the spin valve films of the invention can still maintain their as-deposited MR characteristics even after annealing. Accordingly, the spin valve films 8 of the invention have good thermal stability.

In the prior art spin valve film (e) mentioned above, the Cu/Ag laminate film is to enhance the specular reflection on its interface. This is because the surface roughness of the single-layered Cu film is large, and the Ag film is By laminated on the Cu film. The idea for the prior art film (e) is obviously different from that for the spin valve film of the invention in which the specular reflection on the metal/metal interface is intended to be augmented. Specifically, the prior art technique is for surface planarization, while the technique of the invention is for increasing the compositional profile in the metal/metal interface. Obviously, therefore, the material to be laminated differs between the prior art technique and the technique of the invention.

The MR-improving layer which is effective for improving the thermal stability of the MR device acts not only as the mirror-reflective film but also acts for microcrystalline film structure control, as so mentioned hereinabove, thereby contributing to the improvement in the MR characteristics of the spin valve films 8. The MR-improving layer is not limited to be below the free layer 1. Even when disposed above the antiferromagnetic layer 6, as in FIG. 39 and FIG. 40 (MR-improving layer 4B), the layer well exhibits its functions. In those cases, the MR-improving layer 4B does not directly participate in magnetostriction control in the free layer. The MR-improving layer 4B of a laminate film composed of a plurality of metal layers 4a and 4b or of an alloy layer 4c (these 4a, 4b and 4c are mentioned hereinabove) is disposed on the antiferromagnetic layer 6 of IrMn or the like such as that mentioned above, and this acts for stabilizing the lattice spacing in the antiferromagnetic layer. As a result, dislocation on the interface of magnetic layer 2/antiferromagnetic layer 6 is prevented, whereby the thermal stability of the spin valve films 8 is much more improved.

When the lattice spacing in the antiferromagnetic layer is suitably controlled by the MR-improving layer, the other magnetization pinning characteristics of the films 8 are also improved. More effectively for the lattice spacing control, the MR-improving layer acts as the underlayer for the antiferromagnetic layer. This is especially effective in bottom type spin valve films or dual spin valve films. Even in the films of those types, the lattice spacing in the antiferromagnetic layer could be freely and appropriately controlled by the laminated fcc metal or hcp metal film or alloy film specifically incorporated therein, whereby the magnetization pinning characteristics of the films could be improved (with respect to the magnetic coupling bias field and the thermal stability).

Where the MR-improving layer 4B of a laminate film composed of a plurality of metal films 4a and 4b is disposed on the antiferromagnetic layer 6, it is desirable that the second metal film 4b of a metal having small surface energy, such as Au or the like, is disposed to be adjacent to the antiferromagnetic layer 6. This is because, if the second metal film 4b of Au, Ag or the like is adjacent to the protective film 7 of Ta or the like, the constituent metal of Au, Ag or the like will diffuse into the protective film 7 to lower the thermal stability. Therefore, it is desirable that the first metal film 4a of Cu or the like is disposed adjacent to the protective film 7. The MR-improving layer 4B above the antiferromagnetic layer 6 may be of a laminate film of first metal film 4a /second metal film 4b /first metal film 4a.

As mentioned hereinabove, the MR-improving layer 4a of a metallic laminate film or an alloy layer is effective for reducing the magnetostriction in the free layer 1 of a Co-based magnetic material such as Co, a CoFe alloy or the like. If the single-layered magnetic layer 1 of CoFe is subbed with only a underlayer of simple Cu, negative magnetostriction in the layer 1 will be great over −1 ppm, since the lattice spacing in the layer 1 is too small. On the other hand, if the single-layered magnetic layer 1 of CoFe is subbed with only a underlayer of simple Au, positive magnetostriction in he layer 1 will be great over +1 ppm, since the lattice spacing in the layer 1 is too large.

As opposed to those, when the MR-improving layer 4 of a metallic laminate film or alloy layer 4c that comprises at least one element selected from Cu, Au, Ag, Pt, Rh, Pd, Al, Ti, Zr, Hf and Ir is provided as the underlayer for the free layer 1 of a Co-based magnetic material such as Co, a CoFe alloy or the like, the fcc(111) orientation in the layer 1 can be improved, and, in addition, the lattice spacing in the layer 1 can be controlled to fall within a range effective for magnetostriction reduction. For example, the d(111) lattice spacing in the layer 1 can be controlled to fall between 0.2055 and 0.2085 nanometers. It is desirable that, in the MR-improving layer 4 which acts as the underlayer below the free layer 1, fcc-d(111) is larger than 0.2058 nanometers. The d-(111) lattice spacing control in the layer 4 maybe effected, for example, as follows: When the layer 4 is of a laminate film of Au-Cu, the ratio of the Au thickness to the Cu thickness is varied for the intended control. When the layer 4 is of an alloy film of Au-Cu, the alloying compositional ratio of Au to Cu is varied for the intended control.

Concretely, it is desirable that the composition of the Au—Cu alloy for the layer 4 falls within a range of $Au_{25}Cu_{75}$ to $Au_{75}Cu_{25}$ (at. %). Where the layer 4 is of a laminate film of alloy layers and metal films, it is desirable that it has an Au-richer composition in some degree, as compared with the layer 4 of a single-layered Au—Cu alloy film. For example, the laminate film of the layer 4 may have a composition of $Au_{25}Cu_{75}$ to $Au_{95}Cu_{5}$ (at. %)

In the spin valve films 8 of FIG. 32, FIG. 33 and FIG. 34, the free layer 1 is positioned in the lower site. However, these are not imitative. The invention encompasses bottom type spin valve films 8 or dual element-type spin valve films 8 in which the free layer 1 is positioned in the upper site, for example, as in FIG. 41 and FIG. 42. In particular, in those bottom type spin valve films and dual spin valve films, the effect of the MR-improving layer as the subbing film for the antiferromagnetic layer is significant.

Figure 39:
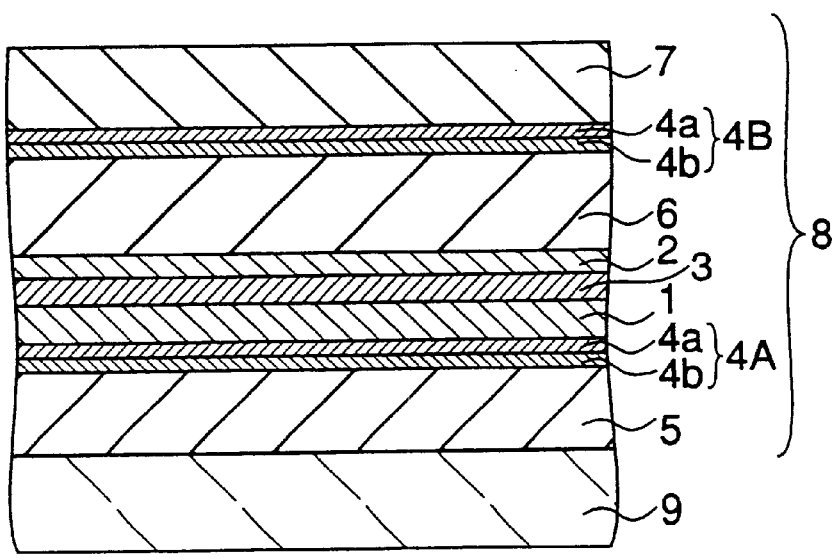
FIG. 39 is a sectional view of still another modification of the magnetoresistance effect device of FIG. 32.
Figure 40:
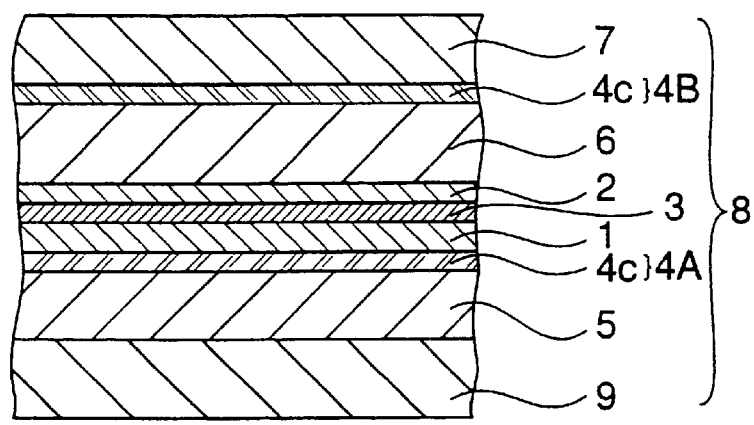
FIG. 40 is a sectional view of one modification of the magnetoresistance effect device of FIG. 39.
Figure 41:
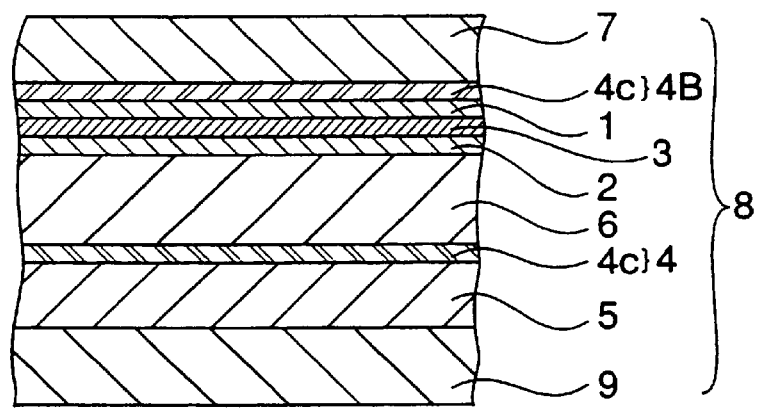
FIG. 41 is a sectional view of the essential part of the second embodiment of the magnetoresistance effect device of the invention.
Figure 42:
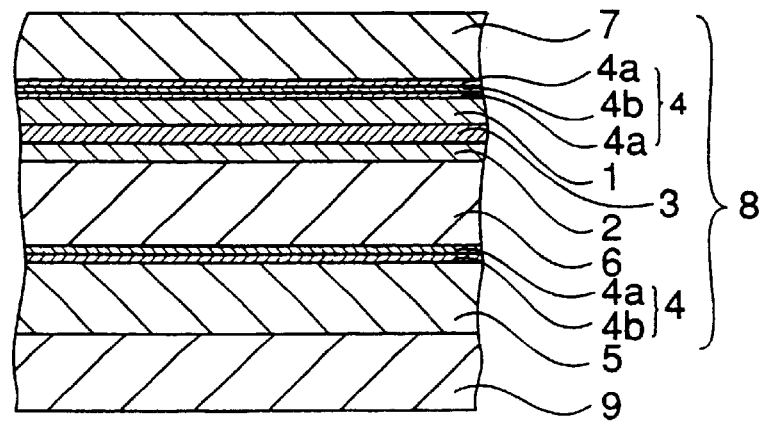
FIG. 42 is a sectional view of one modification of the magnetoresistance effect device of FIG. 41.

The spin valve films 8 of FIG. 41 and FIG. 42 has a structure of nonmagnetic underlayer 5/MR-improving layer 4/antiferromagnetic layer 6/pinned magnetic layer 2/nonmagnetic spacer layer 3/free layer 1/MR-improving layer 4/protective layer 7 as laminated in that order on the substrate 9. In the embodiment of FIG. 41, the MR-improving layer is of an alloy layer 4c. In the embodiment of FIG. 42, the MR-improving layer 4 is of a laminate film of a plurality of metal films 4a and 4b. As in FIG. 34, a laminate film of a metal film 4a and an alloy layer 4c is also employable for the layer 4 in those embodiments.

Where the MR-improving layer 4 as disposed above the free layer is of a laminate film, as in FIG. 42, it is desirable that the first metal layer 4a of Cu or the like is disposed adjacent to the protective layer 7, like in the upper MR-improving layer 4 in FIG. 39. Therefore, in FIG. 42, the MR-improving layer 4 above the free layer 1 is of a laminate film of first metal film 4a /second metal film 4b /first metal film 4a.

In the bottom type spin valve films, the MR-improving layer which is the underlayer for the antiferromagnetic layer acts for film growth control, thereby improving the thermal stability and the pinning characteristics of the films through lattice spacing control and microstructure control, and those effects of the MR-improving layer differ from the effects of the free layer for magnetostriction control and for specular reflection improvement. Therefore, so far as they are produced under the condition under which the microstructure of the antiferromagnetic layer therein is kept good, the bottom type spin valve films of the invention could fully exhibit their good capabilities only with the MR-improving layer being disposed adjacent to the free layer even in the absence of the MR-improving layer below the antiferromagnetic film or even when the antiferromagnetic layer is disposed above an ordinary buffer layer of Ta, Ti or the like as in the ordinary subbing constitution in conventional reverse structures.

In the bottom type spin valve films 8, where the MR-improving layer 4 as above is disposed adjacent to the free layer 1, the compositional steepness in the interface between the free layer 1 and the MR-improving layer 4 is kept to give specular reflection thereon, whereby the MR characteristics of the films could be ensured. When the free layer thickness is thin and the compositional steepness in the interface between the free layer and the MR-improving layer 4 is kept to give the spin-filter effect, whereby the MR characteristics of the films could be ensured. In those, as so mentioned hereinabove, the MR ratio supported by the specular reflection or by the spin-filter effect is still kept even after annealing, and the films could have good thermal stability.

In the reverse structure-type spin valve films 8 mentioned above, at the interface of free layer 1/MR-improving layer 4, and even at the interface of first metal film 4a/second metal film 4b at the interface of second metal film 4b/third metal film 4a in the MR-improving layer 4 (FIG. 42) reflect electrons. Therefore, the constitution of the films 8 differs from that of the prior art film (e) noted above having a Cu/Au laminate film in that the surface of the Ag film reflects electrons in the latter. In addition, the present invention has solved the problem with the prior art film (d) which loses the reflectivity when Ta is laminated on the surface of the Au film therein. This is because the present invention utilizes the specular reflection on the metal/metal interface, which being characterized in that each film thickness is specifically defined in consideration of the Fermi wavelength of electrons and that the components in the interface do not form solid solution.

In the prior art constitution (d), Ta is laminated on an extremely thin Au layer, of which the thickness is only 0.4 nanometers and is nearly the same as the Fermi wavelength, and Ta will form solid solution with Au. In this, therefore, it is obvious that, even when the Co-Au interface could be reflective, its reflection is lost as a whole. If the thickness of the Au film therein is made larger than the Fermi wavelength, such a thick Au film could be reflective as being influenced little by the interfacial diffusion of Ta thereinto, but, on the other hand, negative influences of shunt current flow on the Au film will be enlarged. In place of the Au/Ta interface as in the prior art constitution, if a laminate film of Au/Cu/Ta in which the Cu layer does not form solid solution with Ta is used, the Au interface is not disturbed in the laminate. In addition, if an ultra-thin Cu layer is inserted, for example, between the interface of CoFe and Au, long-term diffusion of Au into the nonmagnetic spacer layer could be prevented, and, in addition, the reflectivity of the resulting laminate could be enhanced since the Cu layer having a short Fermi wavelength is interposed between CoFe and Au.

In the embodiments mentioned above, the MR-improving layer is disposed adjacent to the free layer 1 or the antiferromagnetic layer 6. Different from those, other embodiments where the MR-improving layer 4 is disposed inside the free layer 1 or inside the pinned magnetic layer 2, for example, as in FIG. 43, could produce the same results as above.

Figure 43:
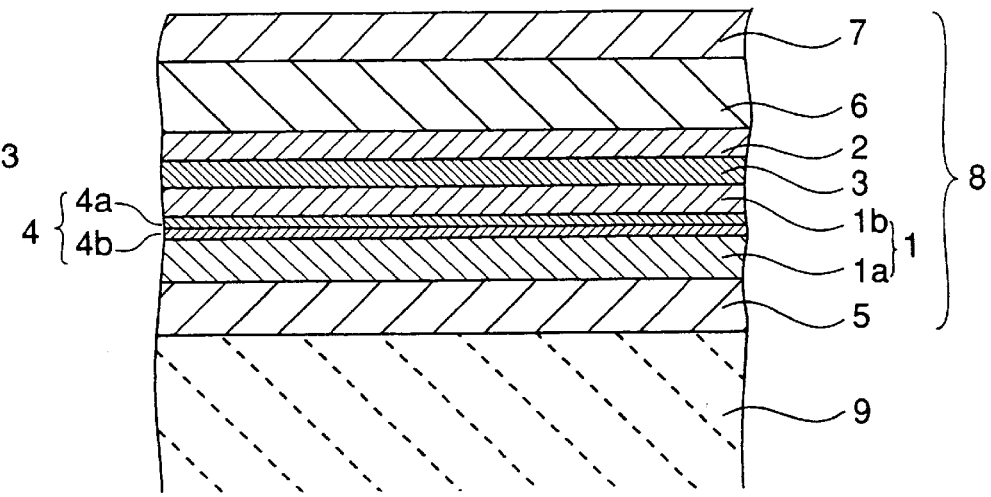
FIG. 43 is a sectional view of the essential part of the third embodiment of the magnetoresistance effect device of the invention.

In the spin valve film 8 of FIG. 43, the free layer 1 is composed of, for example, an NiFe layer 1*a* and a CoFe layer 1*b*, and the MR-improving layer 4 of a laminate film of a plurality of metal films 4*a* and 4*b* is interposed between the layers 1*a* and 1*b*. In this, the NiFe layer 1*a* and the CoFe layer 1*b* are ferromagnetically coupled to each other via the MR-improving layer 4 existing therebetween, and those plural layers are integrated and magnetically acts as the integrated free layer 1. Where the MR-improving layer 4 is interposed in the interface of NiFe layer 1*a*/CoFe layer 1*b* (in this case, the layer 4 does not form solid solution with both the layers 1*a* and 1*b* in the interface), the NiFe layer 1*a* and the CoFe layer 1*b* must be integrated to act as the integrated free layer 1. In this case, therefore, the MR-improving layer 4 to be interposed must be thin. The MR-improving layer may also be interposed in the pinned magnetic layer 2. In this case, two or more magnetic films constituting the pinned magnetic layer 2 are ferromagnetically or antiferromagnetically coupled to each other. The mode of ferromagnetic or antiferromagnetic coupling in the layer 2 shall be determined, depending on the material and the thickness of the MR-improving layer 4 to be interposed in the layer 2.

The magnetoresistance effect device of the embodiments mentioned hereinabove may be mounted on separated recording/reproducing magnetic heads, as the reproduction device part, for example, as in FIG. 44 and FIG. 45. Not limited to magnetic heads, the magnetoresistance effect device of the invention is also applicable to other various magnetic memory systems such as magnetoresistance effect memories (MRAM), etc.

Figure 44:
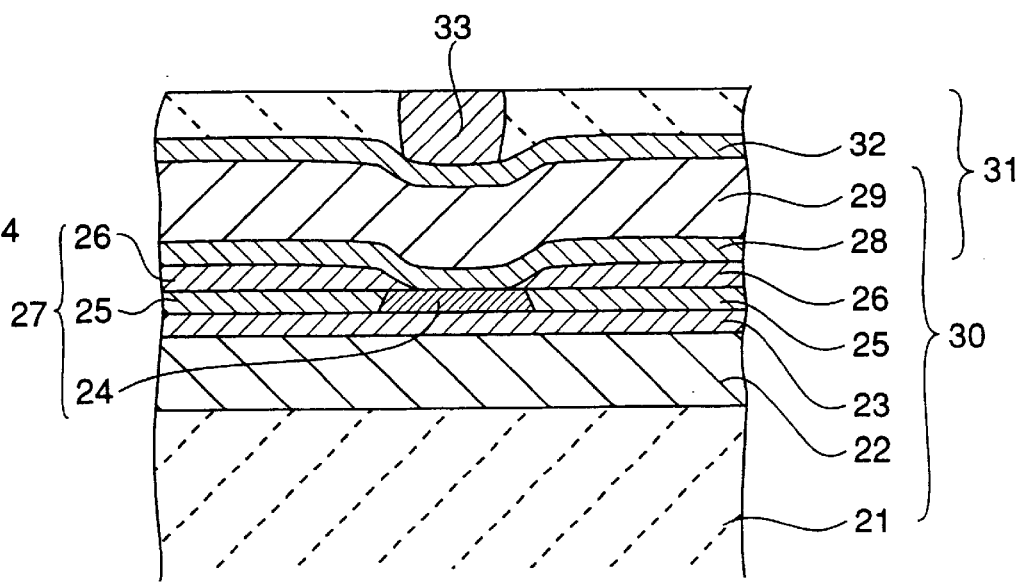
FIG. 44 is a sectional view of the structure of the first embodiment of a separated recording/reproducing magnetic head which incorporates the magnetoresistance effect device of the invention.
Figure 45:
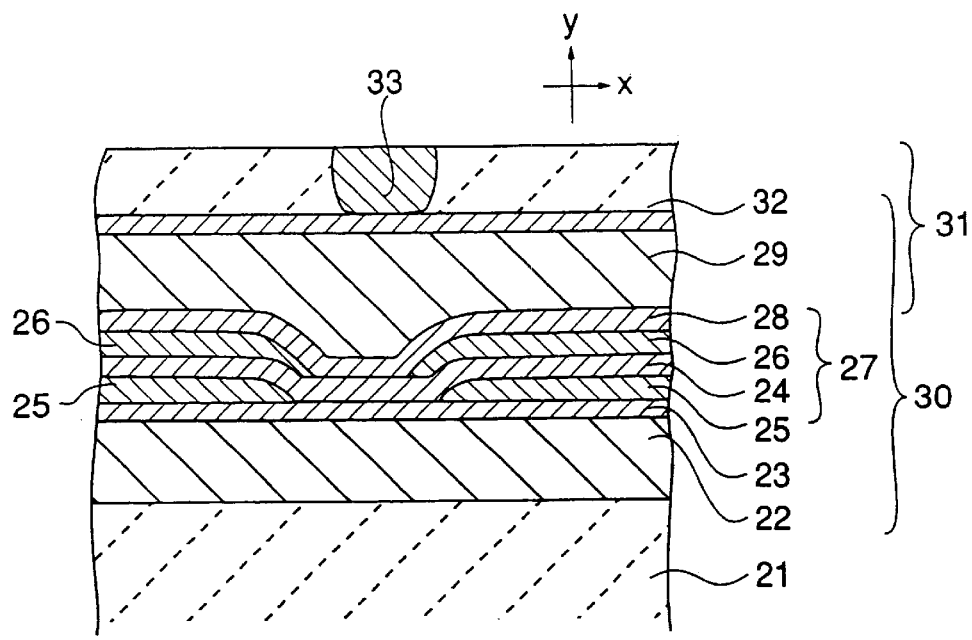
FIG. 45 is a sectional view of the structure of the second embodiment of a separated recording/reproducing magnetic head which incorporates the magnetoresistance effect device of the invention.

FIG. 44 and FIG. 45 show the structures of embodiments of a separated recording/reproducing magnetic head which incorporates the magnetoresistance effect device of the invention as the reproduction device part. These are sectional views of separated recording/reproducing magnetic heads as seen in the medium facing direction.

In those drawings, 21 is a substrate with a layer of $Al_2O_3$, such as $Al_2O_3 \cdot TiC$. On the main surface of the substrate 21, formed is a lower magnetic shield layer 22 of a soft magnetic material which includes NiFe alloys, FeSiAl alloys, amorphous CoZrNb alloys, etc. On the lower magnetic shield layer 22, formed is a spin valve GMR film 24 via a lower reproduction magnetic gap 23 of a nonmagnetic insulating material such as $A_2lO_3$ or the like. As the spin valve GMR film 24, used is the spin valve film 8 of any of the embodiments mentioned hereinabove.

In FIG. 44, the spin valve GMR film 24 is so etched that its profile could have a desired track width. The etching is to remove the outer region of the film 24 that oversteps the recording track width. At the both outer edges of the spin valve GMR film 24, disposed are films 25 which are to apply a bias magnetic field to the film 24. The pair of bias magnetic field applying films 25 are in abutted junction to the edges of the spin valve GMR film 24.

On the pair of bias magnetic field applying films 25, formed are a pair of electrodes 26 of Cu, Au, Zr, Ta or the like. To the spin valve GMR film 24, supplied is sense current from the pair of electrodes 26. These spin valve GMR film 24, paired bias magnetic field applying films 25 and paired electrodes 26 constitute a GMR reproduction device part 27. As mentioned above, the GMR reproduction device part 27 has a so-called abutted junction structure.

In FIG. 45, the pair of bias magnetic field applying films 25 which are to apply a bias magnetic field to the spin valve GMR film 24 are previously formed between the spin valve GMR film 24 and the lower reproduction magnetic gap 23 in the region not for the track width. The pair of bias magnetic field applying films 25 are separated by a predetermined space therebetween, and the layers of the part outside the reproduction track for the spin valve GMR film 24 are laminated thereover. On the spin valve GMR film 24, the bias magnetic field applying films 25 maybe laminated only at its both edges, if desired.

On the spin valve GMR film 24, formed are the pair of electrodes 26. The substantial reproduction track width of the spin valve GMR film 24 is defined by the distance between the pair of electrodes 26. These spinvalve GMR film 24, paired bias magnetic field applying films and paired electrodes 26 constitute the GMR reproduction device part 27 having an overlaid structure.

In FIG. 44 and FIG. 45, an upper reproduction magnetic gap 28 of a nonmagnetic insulating material, which may be the same as that of the lower reproduction magnetic gap 23, is formed on the GMR reproduction device part 27. On the upper reproduction magnetic gap 28, formed is an upper magnetic shield layer 29 of a soft magnetic material which may be the same as that of the magnetic shield layer 22. These constituent elements form a reproducing head, shield-type GMR head 30.

A recording head, thin-film magnetic head 31 is formed on the shield-type GMR head 30. The lower recording magnetic pole of the thin-film magnetic head 31 and the upper magnetic shield layer 29 form one and the same magnetic layer. In other words, the upper magnetic shield layer 29 of the shield-type GMR head 30 acts also as the lower recording magnetic pole of the thin-film magnetic head 31. On the lower recording magnetic pole 29 acting also as the upper magnetic shield layer, formed are a recording magnetic pole gap 32 of a nonmagnetic insulating material such as $Al_2O_3$ or the like, and an upper recording magnetic pole 33 in that order. Behind the medium-facing site, formed is a recording coil (not shown) which is to apply a recording magnetic field to the lower recording magnetic pole 29 and to the upper recording magnetic pole 33.

Figure 46:
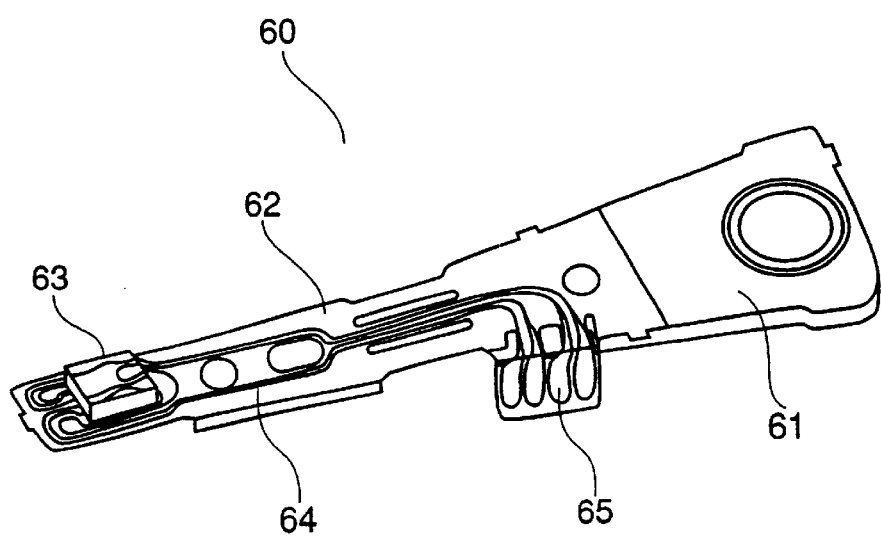
FIG. 46 is a perspective view of the structure of one embodiment of a magnetic head assembly which incorporates the separated recording/reproducing magnetic head of the invention.

The reproducing head, shield-type GMR head 30, and the recording head, thin-film magnetic head 31 constitute the separated recording/reproducing magnetic head. The separated recording/reproducing magnetic head of that type is combined with a head slider, and mounted on a magnetic head assembly, for example, as in FIG. 46. The magnetic head assembly 60 of FIG. 46 is provided with, for example, an actuator arm 61 having a bobbin part for holding a driving coil, and a suspension 62 is connected to one end of the actuator arm 61.

To the tip of the suspension 62, fitted is a head slider 63 which is provided with the separated recording/reproducing magnetic head of the embodiment mentioned above. The suspension 62 is provided with a lead 64 which is for writing and reading signals, and the lead 64 is electrically connected to each electrode in the separated recording/reproducing magnetic head as incorporated in the head slider 63. In the drawing, 65 are electrode pads in the magnetic head assembly 60.

Figure 47:
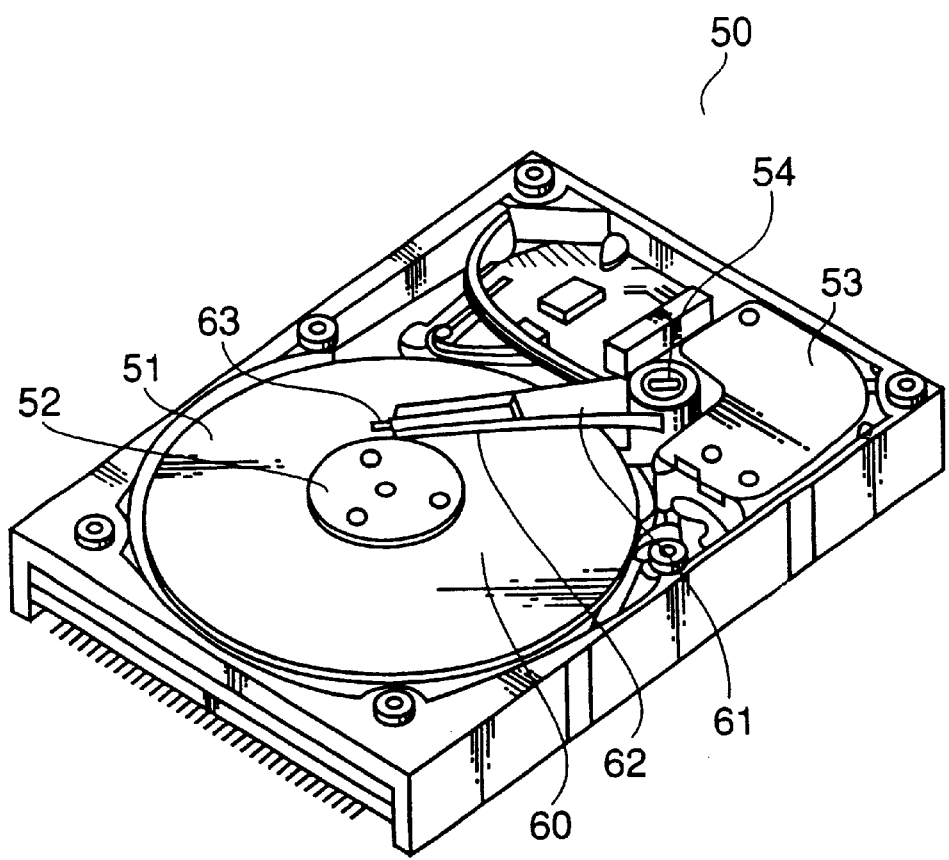
FIG. 47 is a perspective view of the structure of one embodiment of a magnetic disc system which incorporates the separated recording/reproducing magnetic head of the invention.

The magnetic head assembly 60 of the illustrated type is mounted on a magnetic recording/reproducing system such as a magnetic disc system or the like, for example, as in FIG. 47. FIG. 47 shows the outline structure of a magnetic disc system 50 incorporating a rotary actuator.

As illustrated, the magnetic disc 51 is fitted to a spindle 52, and is rotated by a motor (not shown) that responds to the control signal from a driving system control source (not shown). The magnetic head assembly 60 is so mounted on the system 50 that the head slider 63 as fitted to the tip of the suspension 62 could float above the magnetic disc 51 for the intended information recording and reproduction. While the magnetic disc 51 is rotated, the medium-facing site (ABS) of the head slider 63 is held above the magnetic disc 51 via a predetermined floating distance (from 0 to 100 nanometers).

The actuator arm 61 of the magnetic head assembly 60 is connected to a voice coil motor 51 which is one type of a linear motor. The voice coil motor 53 comprises a driving coil (this is coiled in the bobbin part of the actuator arm 61 and is not shown herein) and a magnetic circuit. The magnetic circuit comprises facing permanent magnets and facing yolks all disposed to sandwich the driving coil therebetween. The actuator arm 61 is held by ball bearings (not shown) as disposed in two sites, upper and lower sites of the fixed shaft 54, and is rotatable and slidable by the power of the voice coil motor 53.

The above is to exemplify one embodiment of the invention for separated recording/reproducing magnetic heads. Not limited to only such heads, the magnetoresistance effect device of the invention is applicable to any other head structures, for example, to an integrated recording/reproducing magnetic head that comprise one and the same magnetic yolk for both the recording head and the reproducing head. Still not limited to only magnetic heads, the magnetoresistance effect device of the invention is further applicable to any other magnetic memory systems such as magnetoresistance effect memories (MRAM), etc.

The invention is described in more detail with reference to the following Examples, in which the samples produced were tested and analyzed for their characteristics.

Example a:

In Example a, produced was a spin valve film of 5 nanometer Ta/1 nm Au/1nm Cu/4 nm CoFe/2.5 nm Cu/2.5 nm CoFe/7 nm IrMn/5 nanometer Ta, in a DC magnetron sputter. The vacuum degree in the sputter was at most $1\times10^7$ Torr, in which the argon pressure was from 2 to 10 mTorr. In fabricating magnetic heads, the film is formed on the $Al_2O_3$ gap on an AlTiC substrate. It has been confirmed that the properties of the film do not vary.

The spin valve film had an MR ratio of 9.6% in the as-deposited condition, but after having-been annealed at 250° C. for 4 hours in a magnetic field of 5 kOe, its MR ratio was still 9.0%. The magnetostriction in the film was on the order of at most $\pm10^{-6}$. Hk of a film sample having been annealed in a magnetic field applied in the direction of the easy axis is defined as saturation Hk of the film sample. Hk of the film produced herein was about 8 Oe and was small. This support the soft magnetic characteristics of the film. Hc of the film in the easy axis direction fell between 0 and 3 Oe, and was small.

In the film, the laminate film of Au/Cu is the MR-improving layer. In the interface between Au and Cu, formed is their alloy. In the interface between Cu and CoFe, formed is no solid solution. In the interface between Ta and Au, formed is their solid solution. However, since the thickness of the laminate of Au/Cu is much longer than the electron wavelength, the electron reflection on the interface is satisfactory. Therefore, the solid solution interface existing in the film causes no problem for electron reflection. In the presence of the fcc-structured Au/Cu underlayer, the layer of CoFe was well oriented in fcc(111) orientation. In addition, the d(111) spacing in CoFe is 0.2074 nanometers, and the magnetostriction therein was controlled to be small.

Figure 48:
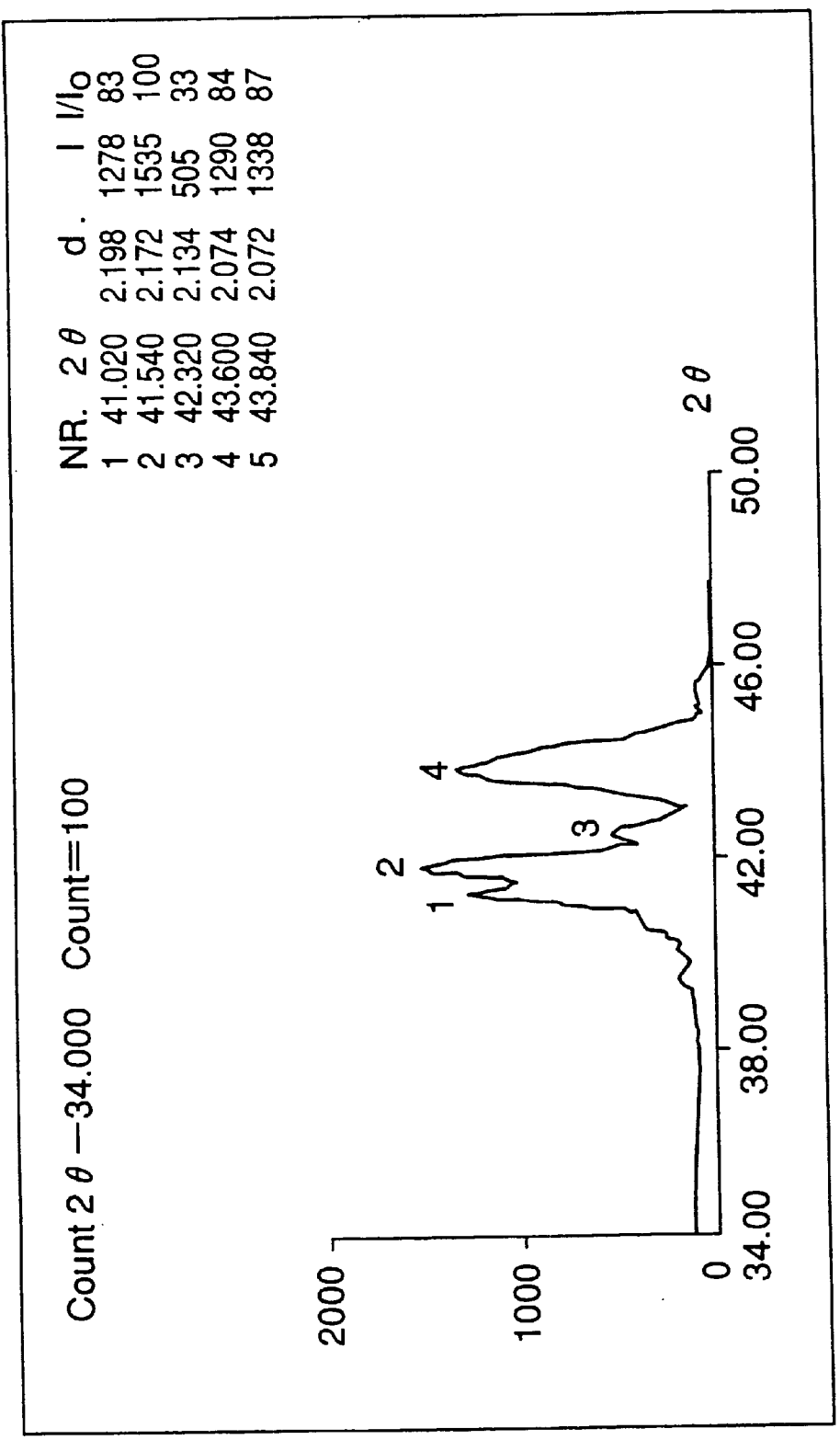
FIG. 48 is a graph of an XRD pattern of the spin valve film as produced in Example 1 of the invention.

The cross section of the spin valve film of this Example was observed through TEM (transmission electron microscopy). As a result, it was confirmed that the GMR basic unit moiety of CoFe/Cu/CoFe was formed on the underlayer of Au/Cu in regular layer by layer, and was oriented in fcc(111) orientation. In microdiffraction of the free layer, CoFe layer part, the fcc-d(111) spacing was found 0.2074 nanometers. The spacing is favorable to magnetostriction control. FIG. 48 shows the XRD pattern of the spin valve film. Through the X-ray diffraction of the film, the fcc-d(111) spacing in CoFe was found 0.2074 nanometers.

In the XRD profile in FIG. 48, the peaks 1, 2 and 3 are for IrMn, and the peak 4 will be the fcc(111) peak for the laminate film of CoFe/Cu/CoFe. The d-spacing in the free layer only is difficult to determine. In this case, the d-spacing for the peak 4 is considered as the d-spacing in the free layer.

In place of the underlayer of 1 nm Au/1 nm Cu, when a underlayer of 2 nm Cu only was used, then the fcc-d(111) spacing in CoFe decreased to 0.2054 nanometers and the magnetostriction increased in the negative side. On the other hand, when a underlayer of 2 nm Au only was used, then the fcc-d(111) spacing in CoFe increased to 0.2086 nanometers and the magnetostriction increased in the positive side. Only when the underlayer of Au/Cu was used, the suitable spacing of 0.2074 nanometers was realized.

The thermal stability of the prior art film (g) where the underlayer is of Cu is not good. However, the thermal stability of the film of this Example where the underlayer is of a laminate film of Au/Cu is good. One reason will be because of the difference in the lattice spacing between the two which will have some influence on the magnetostriction of the films. Precisely, the lattice spacing is narrowed on the Cu underlayer, whereby the lattice unconformity in the interface to IrMn is augmented and the distortion is enlarged. When the film with such large distortion is annealed, the distortion is relaxed whereby the interface between the pinned magnetic layer and the antiferromagnetic film becomes diffusive. This influence is larger when the IrMn layer is thicker. On the other hand, the lattice spacing in the underlayer of Au/Cu is nearer to that in IrMn. Therefore, the film of CoFe/Cu/CoFe to be laminated on the Au/Cu layer is, contrary to the case having the simple Cu underlayer, to have a distorted lattice of which the lattice constant is near to that of IrMn. As a result, the influence of annealing on the distortion relaxation in the case having the laminate underlayer of Au/Cu will be smaller.

In the other prior art constitution (h) having an Au underlayer, the lattice spacing is larger, contrary to that in (g). In the case (h), therefore, the distortion energy of CoFe/Cu/CoFe is too large so that the interfacial dislocation occurs with ease. As a result, the film (h) is degraded in initial annealing. When the Au layer is directly laminated on the CoFe layer, Au will diffuse even into the nonmagnetic spacer layer of Cu while passing through the intergranular boundaries. If Au reaches the nonmagnetic spacer layer, the MR ratio in the film immediately decreases. The MR ratio reduction worsens the long-term thermal stability of the film. However, if the laminate film of Au/Cu is disposed as the underlayer below CoFe, the Cu layer acts as a stopper to prevent Au diffusion, and the long-term thermal stability of the film is thereby stabilized.

The underlayer of Ta is a buffer layer necessary for two-dimensional growth of Au. If Au is directly formed on amorphous $Al_2O_3$, it will island-wise grow. In that condition, where the pinned magnetic layer and the free layer are magnetically coupled to each other via the spacer layer, Hin will increase. In producing practical devices, the films are formed on processed substrates. For the devices, therefore, the buffer layer is indispensable for stable film formation. In this Example, Ta was used for the underlayer. Apart from this, any others of Ti, Zr, Cr, W, Hf, Nb, their alloys, and their oxides and nitrides are usable for the underlayer.

In the prior art film (f), the underlayer below Au has a total thickness of 220 nanometers. As opposed to this, in this Example, the Ta underlayer is enough to prevent island-like growth of Au and to planarize the Au surface. The interface between Au and the overlying Cu/CoFe film is also planarized. In addition, the film of this Example does not require high-temperature thermal treatment at 350° C. The best thermal treatment to which the film of this Example is subjected is at 270° C. and for 4 hours or so. In that thermal treatment, the compositional steepness in the interlayer is kept best. For these reasons, the nonmagnetic underlayer of Ta is important. When combined with any other ordinary underlayer, the Ta underlayer planarizes the Au film formed thereon.

When any of 5 nanometer Ti, 5 nm Zr, 5 nm W, 5 nm Cr, 5 nm V, 5 nm Nb, 5 nm Mo, 5 nm Hf and their alloys (5 nanometer Thick) was used as the nonmagnetic underlayer, the same results as above were also obtained. When any of 0.5 to 2 nm Au/0.5 to 2 nm Cu, 0.3 to 1 nm Au/0.3 to 1 nm Cu/0.3 to 1 nm Au/0.3 to 1 nm Cu, or 0.5 to 5 nm AuCu/0.5 to 2 nm Cu was used as the MR-improving layer, the same results as above were also obtained.

The MR-improving layer may be of a two-layered or even more multi-layered film, or a single-layered alloy film. However, when it does not contain an additive element capable of increasing resistance and if its thickness is large, the shunt current flow will increase. Therefore, the thickness of the MR-improving layer is preferably at most 5 nanometers. However, it must have an additional seed effect for fcc orientation as the underlayer, it is desirable that the MR-improving layer to be disposed below the magnetic layer has a thickness of from 2 to 5 nanometers or so.

Except the combination of Au-Cu, other examples of the laminate film and the alloy layer that may be-combined with the magnetic layer of a Co-based alloy include Ru-Cu, Au-Cu, Pt-Cu, Rh-Cu, Pd-Cu, Ir-Cu, Ag-Pt, Ag-Pd, Ag-Au, Au-Pt, Au-Pd, Au-Al, etc. In those combinations, the essential element in the MR-improving layer to be disposed adjacent to the Co-based magnetic layer is any of Cu, Au and Ag.

Regarding the film constitution, any of two-layered laminates, such as Au-Cu, Ru-Cu illustrated herein, or three-layered or more multi-layered laminates, or even single-layered or multi-layered alloy films are employable. Regarding the film thickness, the same as that for the film of Au—Cu illustrated herein shall apply to those modifications. When the films do not contain a third element, their thickness is preferably from 2 to 3 nanometers or so in terms of the total thickness.

Preferred combinations to be applied to the Co-based magnetic layer are Au-Cu, Ag-Pt, Au-Pd, Au-Ag, Pt-Cu and the like, as they ensure microstructure films and as they form solid solution with ease. Of those combinations, the best one ensuring good lattice constant control is determined.

Like in the case where the magnetic layer is of a Co-based material, the combinations for the laminate films or alloy layers for the MR-improving layer to be disposed adjacent to the magnetic layer of an Ni-based material include Au-Pt, Au-Pd, Au-Ag, Au-Al, Ag-Pt, Ag-Pd, Ru-Rh, Ru-Ir, Ru-Pt, etc. In those combinations, the essential element in the MR-improving layer to be disposed adjacent to the Ni-based magnetic layer is any of Au, Ag and Ru. Regarding the film constitution and the film thickness, the same as that for the Co-based magnetic layer could apply also to the case of the Ni-based magnetic layer.

The two elements constituting the MR-improving layer may be those not forming solid solution. For example, in the case of Co-based magnetic layer, the MR-improving layer may be of a laminate film of Cu-Ru or Cu-Ag. Those combinations not forming solid solution are not suitable for alloy layers. This is because alloy layers of those combinations will readily give separated two phases. Therefore, those combinations are preferably used for laminate films. Specific examples of the Ni-based magnetic layer include NiFe, NiFeCr, NiFeNb, NiFeRh, etc.

Regarding the pinned magnetic layer constitution, the pinned magnetic layer is directly laminated on the antiferromagnetic layer in the case illustrated herein. In place of the simple structure, also employable are Synthetic antiferromagnetic structures. For example, in place of 2.5 nm CoFe/7 nm IrMn, employable are 3 nm CoFe/0.9 nm Ru/3 nm CoFe/7 nm IrMn, 3 nm CoFe/0.9 nm Cr/3 nm CoFe/7 nm IrMn, etc. The thickness of two pinned layer may be different each other.

The antiferromagnetic film may be of any material of PtMn, NiMn, RuRhMn, CrMn, FeMn, NiO, etc. The material of the pinned magnetic layer may be any of Co or NiFe.

The nonmagnetic underlayer is not limited to only metal films of Ta, etc. For example, oxide films of $TaO_x$ or the like are also employable. Using the underlayer of $TaO_x$ in place of Ta gave the same good results. In this case, electrons not reflected on the MR-improving layer could be reflected on the interface of $TaO_x$ underlayer/MR-improving layer in which the potential difference is large, whereby the MR ratio in the film was much more increased. However, if CoFe is formed directly on the underlayer of $TaO_x$, it could not be oriented in fcc(111) orientation or couldnothavea satisfactory fcc-d(111) spacing favorable to magneto striction control. As opposed to the case, a underlayer of $TaO_x$/Au/Cu is good in practical applications. In place of $TaO_x$, also employable are other oxides of Ti, Zr, Cr, W, Hf, Nb, etc. Further employable are nitrides such as TiN, TaN.

Example b:

In this Example b, produced was a spin valve film of 5 nanometer Ta/1 nm Au/1 nm Cu/4 nm CoFe/2.5 nm Cu/2.5 nm CoFe/7 nm IrMn/0.5 nm Au/0.5 nm Cu/5 nanometer Ta, in the same manner as in Example a.

The lattice constant of the Au/Cu laminate film, which is the upper MR-improving layer, is nearer to that of IrMn, than that of the laminate film of CoFe/Cu/CoFe. Therefore, forming the laminate of Au/Cu on IrMn stabilizes more the lattice constant of IrMn, whereby the thermal stability of the film is much more improved. Disposing the Au layer directly below the protective film of Ta gives a structure where the Au layer having small surface energy is directly below the Ta layer having large surface energy. In that structure, Au readily diffuses into Ta to degrade the thermal stability of the film. Therefore, disposing Au or Ag directly below Ta is unfavorable. Like in this Example, it is desirable that the Ta protective film is formed via the Cu layer. An alloy layer of AuCu gives the same good results.

Example c:

In this Example c, produced was a spin valve film of 5 nanometer Ta/5 nm NiFeCr/1 nm Au/1 nm Cu/3 nm CoFe/ 2.5 nm Cu/2.5 nm CoFe/7 nm IrMn/5 nanometer Ta, in the same manner as in Example 1. In this spin valve film, the free layer is of a laminate film of 5 nm NiCoFe and 3 nm CoFe as separated by Au/Cu existing therebetween.

As one comparative case to this Example, prepared was a spin valve film of 5 nanometer Ta/5 nm NiFeCr) /3 nm CoFe/2.5 nm Cu/2.5 nm CoFe/7 nm IrMn/5 nanometer Ta also in the same manner as above.

The comparative spin valve film had an MR ratio of 8.6% in the as-deposited condition, but after having been annealed at 250° C. for 4 hours, its MR ratio lowered to 6.6%. The MR ratio reduction was 23%. This is because CoFe and NiFeCr form solid solution in this structure. In the as-deposited comparative film, the constituent elements are not mixed so much in the CoFe/NiFeCr interface and the film had a high MR ratio. However, after annealed at 250° C. for 4 hours, the CoFe/NiFeCr interface was readily disturbed. In this comparative case, added was about 4% of Cr to NiFe for current shunting in NiFeCr. The same results were also obtained in the case having $Ni_{81}Fe_{19}$ (at. %).

As opposed to the comparative case, interposing the Au/Cu laminate film between CoFe and NiFeCr as in the case of this Example 3 prevents the element diffusion in the interface therebetween. As a result, the as-deposited film of Example 3 had an MR ratio of 8.7%, and even after annealed at 250° C. for 4 hours, the annealed film still had an MR ratio of 8.1%. This, in this film, the MR ratio reduction after annealing is well retarded. One reason for this is that, owing to the diffusion preventing effect of the interposed Au/Cu layer, the interfacial reflection on the CoFe layer was still kept good even after annealing.

In place of 1 nm Au/1 nm Cu, also employable is any of 0.5 nm Au/0.5 nm Cu, 0.5 nm Cu/0.5 nm Au, 0.3 nm Au/0.3 nm Cu/0.3 nm Au, 0.3 nm Au/0.3 nm Cu/0.3 nm Au/0.3 nm Cu, 0.5 nm AuCu/0.5 nm Cu, 1 nm AuCu/0.5 nm Cu/0.5 nm Ag/0.5 nm Cu, 0.5 nm Cu/0.5 nm Ag, 0.3 nm Ag/0.3 nm Cu/0.3 nm Ag, 0.3 nm Ag/0.3 nm Cu/0.3 nm Ag/0.3 nm Cu, 0.3 nm Pt/0.3 nm Cu, 0.5 nm Cu/0.5 nm Pt, 0.5 nm Pt/0.5 nm Cu, 0.5 nm Pt, 0.5 nm Pt/0.5 nm Cu/0.5 nm Pt/0.5 nm Cu, 0.5 to 1.5 nm AuCu, etc. Those gave the same good results as herein.

The reason why NiFeCr was used as the second magnetic layer herein is as follows: Adding Cr to NiFe increases resistivity ρ, without drastic reducing Ms, whereby the shunt current is reduced. In order to prevent the increase in the magnetostriction, λ, in the positive site, which is caused by the Cr addition, it is desirable that the ratio of Ni to Fe is shifted to the Ni-rich site in some degree from the ordinary zero-magnetostriction composition of Ni:Fe=81:19. One preferred composition is $Ni_{81}Fe_{15}Cr_4$, which satisfactorily controls all Ms, ρ and magnetostriction. Apart from this, also employable are $Ni_{80}Fe_{20}$, NiFeNb, NiFeRh, etc.

Example d:

In this Example d, produced was a spin valve film of 5 nanometer Ta/1 nm Au/1 nm Cu/7 nm IrMn/2.5 nm CoFe/ 2.5 nm Cu/4 nm CoFe/0.5 nm Cu/0.5 nm Au/0.5 n Cu/5 nanometer Ta, in the same manner as in Example a.

The film produced herein is a so-called bottom type spin valve film in which the pinned magnetic layer is below the nonmagnetic spacer layer. The upper Cu/Au/Cu layer is the MR-improving layer, by which the thermal stability of the film and also the MR ratio in the film are increased. The lower Au/Cu layer is the subbing film for IrMn, while additionally acting as the MR-improving layer for stabilizing the lattice constant of IrMn. The as-deposited film had an MR ratio of 10%, and after annealed at 250° C. for 4 hours, the annealed film had an MR ratio of 9.5%. The Cu/Au interface formed an alloy of AuCu.

The upper Ta in the film of this Example d is the protective film, and this is not intended to be reflective. In this Example d, the Cu/Au/Cu layer is the MR-improving layer. Therefore, in this, the CoFe/Au interface and the Cu/Au interface (or the AuCu alloy layer) shall be reflective. Thus, the constitution of the film of this Example obviously differs from the prior art constitution of (e) or (d) mentioned above. In addition, in this, the ultra-thin Cu layer is interposed in the CoFe/Au interface, by which long-term diffusion of Au into the nonmagnetic spacer layer of Cu is prevented. Moreover, in this, since the Au layer is disposed via the layer having a short Fermi wavelength, the interlayer reflection is much augmented.

In place of the MR-improving layer of 1 nm Au/1 nm Cu, also employable is any of 0.5 to 3 nm Au/0.5 to 3 nm Cu, 0.5 to 3 nm Cu/0.5 to 3 nm Au/0.5 nm Cu, 0.5 to 3 nm AuCu/0.5 to 3 nm Cu, 0.5 to 3 nm Cu/0.5 to 3 nm AuCu/0.5 to 3 nm Cu, 0.5 to 3 nm Ag/0.5 to 3 nm Cu, 0.5 to 3 nm Cu/0.5 to 3 nm Ag/0.5 to 3 nm Cu, 0.5 to 3 nm Pt/0.5 to 3 nm Cu, 0.5 to 3 nm Cu/0.5 to 3 nm Pt/0.5 to 3 nm Cu, 0.5 to 3 nm PtCu/0.5 to 3 nm Cu, 0.5 to 3 nm Cu/0.5 to 3 nm PtCu/0.5 to 3 nm Cu, etc. All those layers gave the same good results as herein.

Regarding the materials for the other layers, the same as in Example a may be referred to. The MR-improving layer as laminated above the free layer in this Example d is not needed to act additionally as a seed layer. Therefore, in this, the thickness of this MR-improving layer may be thin to have a thickness of 1 nanometer or so. However, if the layer is too thick, it will unfavorably increase shunt current, as in Example a. Therefore, the thickness of this layer is preferably at most 5 nanometers.

The MR-improving layer below the antiferromagnetic layer is to control the lattice spacing in the antiferromagnetic layer, thereby preventing the interfacial mixing in the interface between the pinned magnetic layer of CoFe and the antiferromagnetic layer (the interfacial mixing will be caused by lattice misfit between the two layers). In addition, while controlling the lattice spacing in the antiferromagnetic layer, the MR-improving layer is to improve the pinning characteristics of the pinned magnetic layer. Concretely, the MR-improving layer may be any of laminate films or alloy films of Al-Cu, Pt-Cu, Rh-Cu, Pd-Cu, Ir-Cu, Ag-Pt, Ag-Pd, Ag-Au, Au-Pt, Au-Pd, Au-Al, Ru-Rh, Ru-Ir, Ru-Pt, Ru-Cu, or Ag-Au.

As the MR-improving layer suitable to each antiferromagnetic layer, laminate films or alloy films of two elements selected from Cu, Au, Ag, Pt, Rh, Ru, Pd, Al, Ti, Zr and Hf exhibit the subbing effect. When only the pinned magnetic layer is targeted, the MR-improving layer as laminated above the free layer in the bottom type spin valve film illustrated herein could be omitted. For the MR-improving layer that acts as the underlayer for the antiferromagnetic layer herein, the pinned film constitution may have the Synthetic antiferromagnetic structure such as that mentioned above. One example of the SyAF structure employable herein is 5 nanometer Ta/2 nm AuCu/7 nm IrMn/3 nm CoFe/0.9 nm Ru/3 nm CoFe/3 nm Cu/1 nm CoFe/5 nm NiFe/5 nanometer Ta.

In place of the Ta protective film, any of Ti, Zr, Cr, W, Hf, Nb and the like is employable. Those protective films gave the same good results as herein.

Example e:

In this Example e, produced was a bottom type spin valve film of 5 nanometer Ta/2 nm AuCu/7 nm IrMn/2.5 nm CoFe/2.5 nm AuCu/4 nm CoFe/2 m AuCu/5 nanometer Ta, in the same manner as in Example a. In this, the AuCu layer disposed between the lower CoFe layer (pinned magnetic layer) and the upper CoFe layer (free layer) is a nonmagnetic spacer layer acting also as an MR-improving layer for magnetostriction control in the free layer.

In bottom type spin valve films, the fcc-d(111) spacing in the free layer as formed in the nonmagnetic spacer layer of Cu or the like is narrow and therefore the magnetostriction in the free layer is enlarged. However, in the film of this Example e in which the free layer of CoFe is laminated on the AuCu alloy layer acting as a nonmagnetic spacer layer and also as an MR-improving layer, the fcc-d(111) spacing in the free layer of CoFe is controlled on a suitable level whereby the magnetostriction in the free layer could be reduced.

The spin-dependent scattering on the interface between the nonmagnetic spacer layer of AuCu and the CoFe layer is attenuated in some degree, as compared with that on the interface between AuCu and a single-layered Cu, whereby the MR ratio in the film will decrease in some degree. This problem could be solved, for example, by using a laminate film of 0.8 nm Cu/0.8 nm AuCu/0.8 nm Cu as the nonmagnetic spacer layer.

The nonmagnetic spacer layer acting also as an MR-improving layer is effective not only in the bottom type spin valve film as herein but also in ordinary spin valve films and in dual element-type spin valve films. One example of dual element-type spin valve films incorporating such a nonmagnetic spacer layer that acts also as an MR-improving layer is 5 nanometer Ta/2 nm AuCu/7 nm IrMn/2.5 nm CoFe as pinned magnetic layer/2.5 nm AuCu as nonmagnetic spacer layer and also as MR-improving layer/3 nm CoFe as free layer/2.5 nm Cu/2.5 nm CoFe as pinned magnetic layer/7 nm IrMn/5 nanometer Ta. One example of ordinary spin valve films incorporating such a nonmagnetic layer that acts also as an MR-improving layer is 5 nanometer Ta/2 nm AuCu/4 nm CoFe/0.8 nm Cu/0.8 nm AuCu/0.8 nm Cu/2.5 nm CoFe/7 nm IrMn/5 nanometer Ta.

In bottom type spin valve films and dual element-type spin valve films, where the fcc-d(111) spacing in the free layer of CoFe is well controlled by the effect of the AuCu layer which is used as the underlayer for the antiferromagnetic layer of IrMn or the like, any ordinary Cu layer or the like may be used as the nonmagnetic spacer layer.

The following are other examples of bottom type spin valve films and dual element-type spin valve films:

5 nanometer Ta/1 nm Au/1 nm Cu/7 nm IrMn/2.5 nm CoFe/0.9 nm Ru/3 nm CoFe/3 nm Cu/4 nm CoFe/5 nanometer Ta, 5 nanometer Ta/1 nm Au/1 nm Cu/7 nm IrMn/2.5 nm CoFe/3 nm Cu/4 nm CoFe/5 nanometer Ta, 5 nanometer Ta/1 nm Au/1 nm Cu/7 nm IrMn/2.5 nm CoFe/0.9 nm Ru/3 nm CoFe/3 nm Cu/2 nm CoFe/2 nm NiFe/5 nanometer Ta, 5 nanometer Ta/1 nm Au/1 nm Cu/7 nm IrMn/2.5 nm CoFe/3 nm Cu/2 nm CoFe/2 nm NiFe/5 nanometer Ta, 5 nanometer Ta/1 nm Au/1 nm Cu/7 nm IrMn/3 nm CoFe/3 nm Cu/3 nm CoFe/2 nm Cu/3 nm CoFe/7 nm IrMn/5 nanometer Ta, 5 nanometer Ta/1 nm Au/1 nm Cu/7 nm IrMn/3 nm CoFe/3 nm Cu/1 nm CoFe/2 nm NiFe/1 nm CoFe/3 nm Cu/3 nm CoFe/7 nm IrMn/5 nanometer Ta, 5 nanometer Ta/1 nm Au/1 nm Cu/7 nm IrMn/2.5 nm CoFe/0.9 nm Ru/3 nm CoFe/3 nm Cu/3 nm CoFe/3 nm CU/3 nm CoFe/0.9 nm Ru/2.5 nm CoFe/7 nm IrMn/5 nanometer Ta, 5 nanometer Ta/1 nm Au/1 nm Cu/7 nm IrMn/2.5 nm CoFe/0.9 nm Ru/3 nm CoFe/3 nm Cu/1 nm CoFe/2 nm NiFe/1 nm CoFe/3 nm Cu/3 nm CoFe/0.9 nm Ru/2.5 nm CoFe/7 nm IrMn/5 nanometer Ta.

In place of the underlayer of Au/Cu as in the above, other various laminate films and alloy layers such as those mentioned hereinabove are also employable herein.

Other examples are substrate/5 nanometer Ta/7 nm IrMn/2.5 nm CoFe/0.9 nm Ru/3 nm CoFe/3 nm Cu/2.5 nm CoFe/MR-improving layer/2.5 nm CoFe/3 nm Cu/3 nm CoFe/0.9 nm Ru/2.5 nm CoFe/7 nm IrMn/5 nanometer Ta. In this structure, the moiety of CoFe/MR-improving layer/ CoFe is the free layer, in which the constituent films are ferromagnetically coupled to each other.

In these examples, the antiferromagnetic layer is of IrMn, which, however, is not imitative. In place of IrMn, other various antiferromagnetic materials of NiMn, PtMn, PdPtMn, RhRuMn, CrMn, NiO and the like are also usable to produce the same good results as herein.

Spin valve films in which the pinned magnetic layer is of an antiferromagnetically coupled structure of, for example, CoFe/Ru/CoFe/IrMn (in this, two CoFe layers are as laminated via Ru therebetween are antiferromagnetically coupled to each other) also produce good results of the invention. In the laminate films illustrated herein, the constituent layers each having a predetermined thickness are antiferromagnetically coupled to each other.

In the laminate films, the interlayer may be the MR-improving layer of the invention. For example, the laminate films are 2.5 nm CoFe/1 nm AuCu/2 nm CoFe/ IrMn (in which the layers are antiferromagnetically coupled to each other), IrMn/2 nm CoFe/1 nm AuCu/2 nm CoFe (in which the layers are antiferromagnetically coupled to each other), etc. Apart from those, a laminate film of 1 nm CoFe/0.5 nm AuCu/2 nm CoFe/7 nm IrMn is also employable, in which the layers are ferromagnetically coupled to each other. The AuCu layer as disposed between the pinned magnetic layers is to antiferromagnetically couple the both magnetic layers to each other, while making the interface between the coupled layers have mirror-reflectivity and stabilizing the lattice constitution in IrMn, whereby the thermal stability and the MR characteristics of the spin valve film are improved. It is desirable that the thickness of the MR-improving layer in the spin valve film of that type falls between 0.5 and 2 nanometers.

Example f:

For realizing crystal structures with good thermal stability, which have few ordinary intergranular boundaries (ordinary intergranular boundaries in spin valve films worsen thermal stability of the films) but may have some small angle tilt boundaries and which are not of completely single crystals, the MR-improving layer of a laminate film or an alloy layer of Au/Cu or the like is effective. One example of the structure is thermally-oxidized silicon substrate/5 nanometer Ta/1 nm Au/1 nm Cu/3 nm CoFe/3 nm Cu/2 nm CoFe/7 nm IrMn/5 nanometer Ta. This was analyzed through sectional TEM and diffractiometry. The spot size in diffractiometry was so defined that the spot diameter could cover all region of the laminate film to be analyzed, in its thickness direction. For more detailed analysis, the spot diameter may be more reduced as in microdiffractiometry.

The diffractiometry of the film gave a diffraction pattern indicating a single-crystal-like structure in the entire region of 1 $\mu$m or more, from which it is understood that the film seemingly has a single-crystal-like structure. Except for Ta forming the underlayer and the protective layer, all the layers constituting the film were in fcc(111) orientation. In the diffraction pattern, another spot was seen in the site spaced from the center point by a radius, R. This indicates the difference in the fcc(111) spacing size between IrMn and CoFe/Cu/CoFe. In the lattice images, highly ordered fcc(111) orientation was confirmed. Some lattice points were found discontinued in the lateral direction. In the entire region, the diffraction pattern gave a single spot. It is believed that the lattice discontinuity will be for sub-grain boundaries such as small angle tilt boundaries.

The single-crystal-like structure confirmed herein is favorable, since the film with the structure has good thermal stability for the MR ratio and the magnetic characteristics and since the structure has few intergranular boundaries that may cause electron scattering. In that structure, the mean free path of electrons is long, and the peak value of the MR ratio is increased. The technique of producing the film having such a single-crystal-like structure on an amorphous substrate such as thermally-oxidized silicon or amorphous alumina is one characteristic aspect of the invention. In this Example, used was a thermally-oxidized silicon substrate, which, however, is not imitative. The film formation according to the technique of the invention may also be effected on an amorphous $AlO_x$ film formed on an AlTiC substrate, or even on any other amorphous oxide films, amorphous nitride films or diamond-like carbon.

In the film of this Example, the underlayer for Au does not always need to be Ta. However, Au needs the subbing buffer layer of some type. Depositing Au directly on the thermally-oxidized silicon substrate does not give a single-crystal-like structure such as that in this Example. As other materials except Ta usable for subbing Au, mentioned are Ti, W, Zr, Mo, Hf and alloys comprising any of them. In the underlayer constitution of Ta/Au/Cu as herein, Ta and Au form an alloy. In this, therefore, island growth of Au is prevented, and the Au grains could easily undergo secondary growth. In other words, the bonding forth of the grains to the substrate stronger than the aggregation forth thereof has favorable influences on the film growth.

The subbing film constitution of Ta/Au/Cu is effective for promoting single-crystal-like growth of grains. As in this case, when the alloying materials are formed into a laminate film, Au grains to be formed into a film do not grow as they are on Cu but form single-crystal grains as their bonding forth to the underlayer is enlarged. The underlayer structure like herein could not be formed in a simple Ta/Cu underlayer such as that in 5 nanometer Ta/2 nm Cu/4 nm CoFe/3 nm Cu/2 nm CoFe/7 nm IrMn/5 nanometer Ta.

As other examples of good layer constitution, mentioned are laminate films or alloy films of Al-Cu, Pt-Cu, Rh-Cu, Pd-Cu, Ir-Cu, Ag-Pt, Ag-Pd, Ag-Au, Au-Pt, Au-Pd and Au-Al for Co-based magnetic layers, as in Example a. The number of layers for the laminate films is not limited, so far as two or more layers constitute one laminate film. For Ni-based magnetic layers, mentioned are laminate films or alloy films of Au-Pt, Au-Pd, Au-Ag, Au-Al, Ag-Pt, Ag-Pd, Ru-Rh, Ru-Ir and Ru-Pt. Like for Co-based magnetic layers, the number of layers for Liz the laminate films is not also limited, so far as two or more layers constitutes one laminate film. Of the combinations of two metals, Au-Cu, Ag-Pt, Au-Pd, Au-Ag and Pt-Cu have a lot of latitude in their solid solution. Laminate films of Ru-Cu and Ag-Cu not forming solid solution could also be employed herein.

Other structures of the subbing film employable herein include Ta/Cu/Au/Cu, Ta/Pt/Cu, Ta/Cu/Pt, Ta/Rh/Cu, Ta/Cu/Rh, Ta/Pd/Cu, Ta/Cu/Pd, etc. In those, the number of the layers to be on the buffer layer of Ta may be increased. In place of Ta, any of Ti, W, Zr, Mo, Hf or alloys comprising them may also be used. It is desirable that the fcc metal layer moiety in the subbing film is not so thick if no element capable increasing resistance is added to the film. This is for the purpose of preventing the MR reduction to be caused by the increase in the shunt current in the spin valve films comprising it. However, if too thin, the effect of the subbing film as a seed layer will be attenuated. Therefore, it is also desirable that the fcc metal layer moiety is not too thin. Concretely, it is desirable that the subbing seed layer exclusive of the subbing buffer layer of Ta or the like has a thickness of from 2 to 5 nanometers or so. However, when an additive element capable of increasing resistance is added to the subbing seed layer to reduce the shunt current, the thickness of the subbing seed layer may be larger than 5 nanometers.

In place of the fcc metal laminate films capable of forming alloys such as those mentioned above, further employable herein are alloys of the fcc-forming combinations additionally containing any additive elements. Still other examples also employable herein are fcc alloys containing Ni but not Cu, such as PtNi alloys (of which the Pt content is preferably larger than 26 at. % for Pt-rich alloys), RhNi alloys, PdNi alloys (as being magnetic in almost all compositions, adding a third element to these is preferred), IrNi alloys (of which the Ir content is preferably larger than 12 at. % for Ir-rich alloys), etc. Also for those alloys, the buffer metal may be any of Ti, W, Zr, Mo, Hf or alloys comprising them, in place of Ta. Like the laminate films mentioned above, it is also desirable that those fcc alloy films have a thickness of from 2 to 5 nanometers. If their resistance is increased by some additive elements added thereto, their thickness may be larger than 5 nanometers.

Specific examples of the constitution discussed herein are;

5 nanometer Ta/1 nm Pt/1 nm Cu/2 to 8 nm CoFe/3 nm Cu/2.5 nm CoFe/7 nm IrMn/5 nanometer Ta, 5 nanometer Ta/2 nm PtCu/2 to 8 nm CoFe/3 nm Cu/2.5 nm CoFe/7 nm IrMn/5 nanometer Ta, 5 nanometer Ta/1 nm Au/1 nm Cu/7 nm IrMn/3 nm CoFe/1 nm Ru/3 nm CoFe/3 nm Cu/1 nm CoFe/5 nm NiFe/5 nanometer Ta, 5 nanometer Ta/1 nm Au/1 nm Cu/7 nm IrMn/2.5 nm CoFe/3 nm Cu/1 nm CoFe/5 nm NiFe/5 nanometer Ta, 5 nanometer Ta/1 nm Au/1 nm Cu/7 nm IrMn/3 nm CoFe/1 nm Ru/3 nm CoFe/3 nm Cu/4 nm CoFe/5 nanometer Ta, 5 nanometer Ta/1 nm Au/1 nm Cu/7 nm IrMn/3 nm CoFe/1 nm Ru/3 nm CoFe/3 nm Cu/4 nm CoFe/3 nm Cu/3 nm CoFe/1 nm Ru/3 nm CoFe/7 nm IrMn/5 nanometer Ta, 5 nanometer Ta/2 nm Cu/7 nm IrMn/3 nm CoFe/1 nm Ru/3 nm CoFe/3 nm Cu/4 nm CoFe/3 nm Cu/3 nm CoFe/1 nm Ru/3 nm CoFe/7 nm IrMn/5 nanometer Ta, etc.

Figure 49:
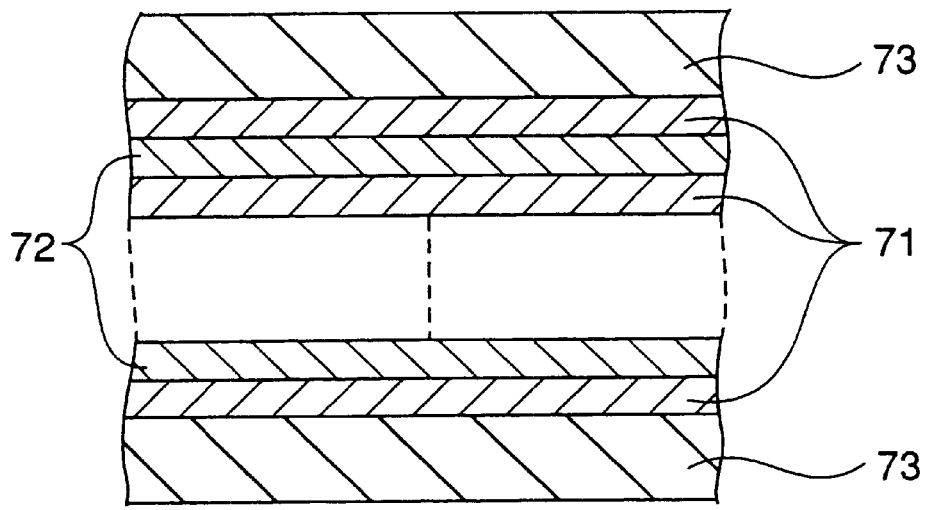
FIG. 49 is a sectional view of the essential part of one embodiment of an artificial lattice film which incorporates the magnetoresistance effect device of the invention.

Example g:

The MR-improving layer mentioned hereinabove is applicable even to artificial lattice sensors such as that in FIG. 49. In the illustrated case, the number of the magnetic layers 71 of, for example, Co-containing films or Ni-containing films as combined with the nonmagnetic layers 72 is larger than the number of the layers constituting the spin valve film. In the case, the MR-improving layers 73 are disposed each adjacent to any of the uppermost magnetic layer and the lowermost magnetic layer. For the materials constituting the layers, the same as in Example a shall apply to this case.

The first to seventh embodiments of the invention are described in detail hereinabove with reference to the Examples, which, however, are not intended to restrict the scope of the invention.

Figure 50:
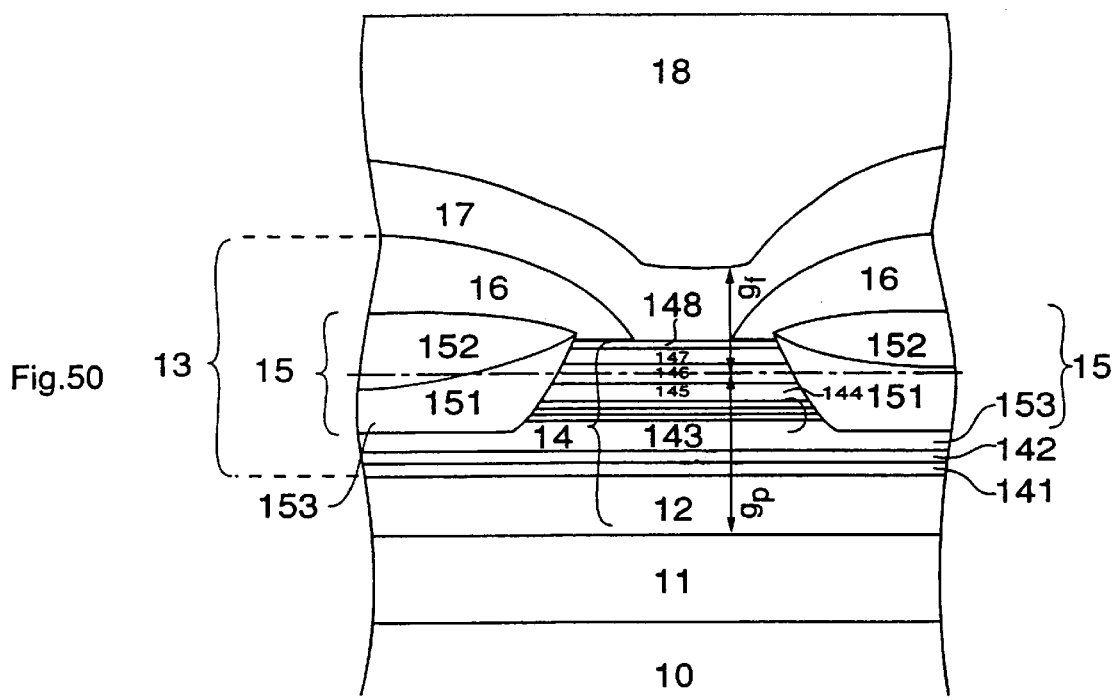
FIG. 50 is a conceptual view showing the cross section of a spin valve device part as seen from its ABS (air baring surface). ABS may comprise a protective film formed thereon.
Figure 51:
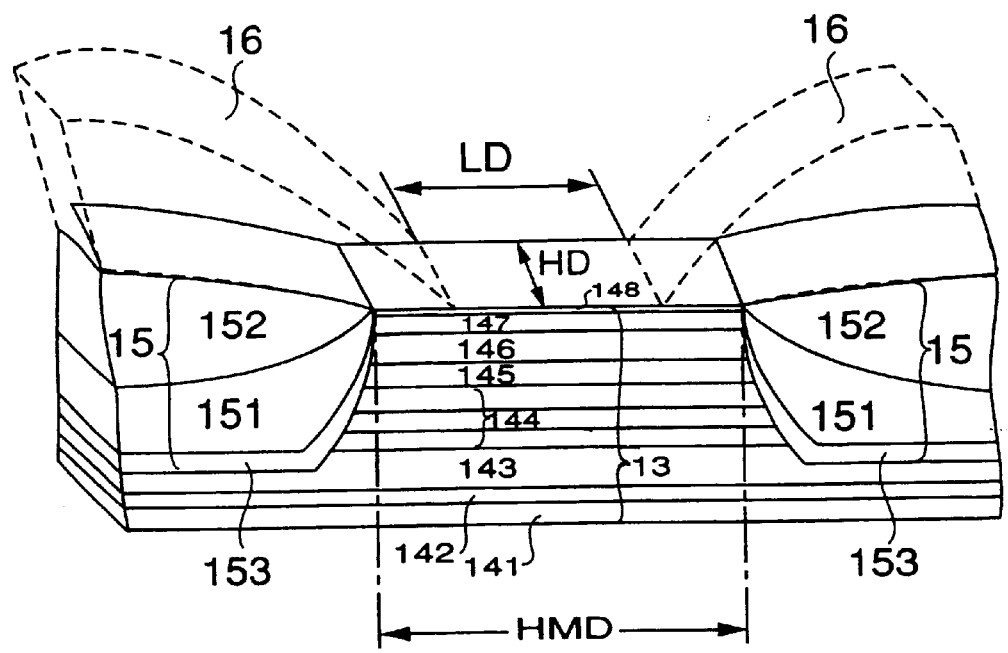
FIG. 51 is a perspective view of a spin valve device with its gap film and shield film being removed.
Figure 52:
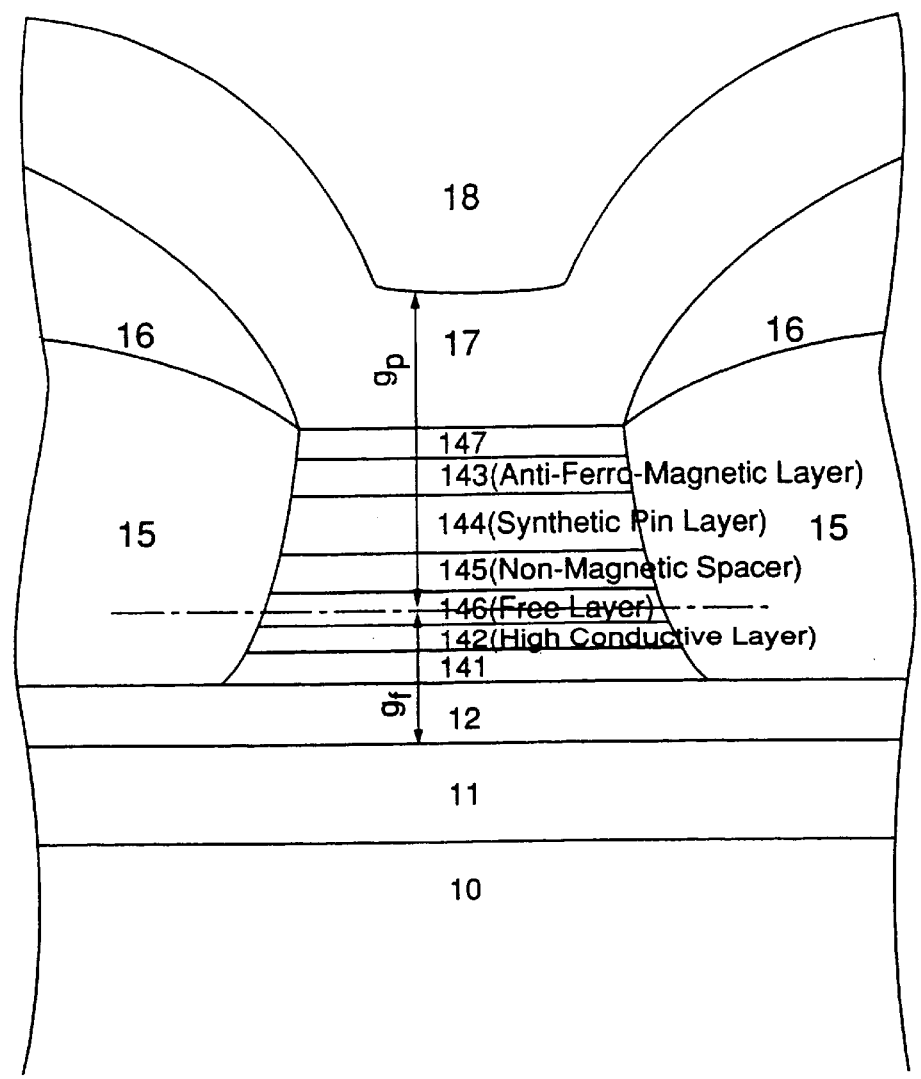
FIG. 52 is a conceptual view of one embodiment of a head which is suitable to the top-type spin valve film of FIG. 1 and FIG. 5.

For example, FIG. 50 to FIG. 52 are conceptual views showing still other modifications of the invention.

Specifically, FIG. 50 shows the cross section of a spin valve device part as seen from its ABS (air baring surface) FIG. 51 is a perspective view of a spin valve device with its gap film and shield film being removed.

On an AlTiC substrate 10, formed are a lower shield 11 and a lower gap film 12. In this, the lower shield 11 may be of NiFe, a Co-based amorphous magnetic alloy, an FeAlSi alloy or the like, and its thickness may fall between 0.5 and 3 $\mu$m. For NiFe and FeAlSi alloys, it is desirable that the surface of the lower shield 11 is polished so that its roughness height could be smaller than the thickness of the antiferromagnetically coupling interlayer of the Synthetic pinned magnetic layer. The lower gap film 12 maybe of alumina, aluminium nitride or the like. On the film 12, formed is a spin valve device 13. The spin valve device 13 comprises a spin valve film 14, a pair of longitudinal bias films 15 and a pair of electrodes 16. The spin valve film 14 may be a bottom-type SV such as that in Example 4. Briefly, it comprises a nonmagnetic underlayer 141 of Ta, Nb, Zr, Hf or the like (thickness; 1 to 10 nanometers), an optional second underlayer 142 of Ru, NiFeCr or the like (thickness: 0.5 to 5 nanometers), an antiferromagnetic layer 143, a Synthetic pinned layer 144 of ferromagnetic layer/ antiferromagnetically coupling layer/ferromagnetic layer, a nonmagnetic spacer 145, a free layer 146, a high-conductivity layer 147, and an optional protective film 148 (thickness: 0.5 to 10 nanometers). On the spin valve film 14, formed are an upper gap layer 17 (of alumina, aluminium nitride or the like), an upper shield layer 18 (of NiFe, a Co-based amorphous magnetic alloy, and an FeAlSi alloy or the like, having a thickness of from 0.5 to 3 $\mu$m). Though not shown, a recording part is formed thereover. The spin valve device 13 is of a so-called abutted junction type structure device, which is produced by removing the track edges of the spin valve film 14 followed by forming the longitudinal bias films in the removed sites. The longitudinal bias layers 15 may be of hard magnetic films (comprising CoPt, CoPtCr or the like as formed on a underlayer of Cr, FeCo or the like), or of laminates of a ferromagnetic layer 151 and an antiferromagnetic layer 152 as laminated in that order, for which the ferromagnetic layer is hardened. For the laminates, the antiferromagnetic layer 152 may be formed first, and thereafter the ferromagnetic layer 151 is formed thereon. For producing steep reproduction sensitivity profiles at the track edges for the coming narrow-track devices, it is desirable that the magnetic thickness ratio of the longitudinal bias ferromagnetic layer (hard magnetic layer, or a combination of ferromagnetic layers as magnetically coupled to each other via an antiferromagnetic layer) to the free layer, Ms×t (longitudinal bias)/Ms×t (free) is defined to be at most 7, more preferably at most 5. If the free layer is so thinned that its thickness is not larger than 4.5 nanometers (therefore having a magnetic thickness of at most 5 nanometer Tesla), the longitudinal bias ferromagnetic layer shall be also thinned (to have a magnetic thickness of at most 25 nanometer Tesla) so as to satisfy the condition of Ms×t (longitudinal bias)/ Ms×t (free)≦5.

In general, thin hard magnetic layers could hardly have high coercive force. On the other hand, longitudinal bias layers of the type of ferromagnetic film/antiferromagnetic film could be more firmly coupled when the ferromagnetic layer 151 is thinner, since the magnetic coupling bias field is enlarged. Therefore, longitudinal bias layers of the type of ferromagnetic film 151/antiferromagnetic layer 152 are preferred. More preferably, in the longitudinal bias layers of the type of ferromagnetic layer 151/antiferromagnetic layer 152, the saturation magnetization of the ferromagnetic layer 151 is nearly comparable to or higher than that of the free layer for the purpose of realizing complete BHN (Barkhausen noise) removal in a smallest possible longitudinal bias magnetic field. For this, NiFe alloys may be used, but more preferred are CoFe, Co and the like having larger saturation magnetization. If the ferromagnetic film 151 used has small saturation magnetization and if the stray magnetic field is enlarged by increasing the thickness of the film 151 for realizing BHN removal, such will cause reproduction output reduction especially in narrow tracks.

In the case of FIG. 50, the spin valve film 14 is not completely etched but the antiferromagnetic layer 143 is left as it is to form the longitudinal bias layers. Apart from this case, even the underlayer 141 may be etched away. Forming the longitudinal layers 15 on the remaining antiferromagnetic layer 143 is advantageous in that the electrical contact between the longitudinal bias layers and the spin valve film is good. In an ordinary abutted junction structure where the length of the electrode 16 is nearly the same as that of the longitudinal bias layer 15, the electrode could not keep direct face contact with the spin valve film. In that case, therefore, the merit of the remaining antiferromagnetic film 143 is great. On the other hand, it is desirable that the pinned magnetic layer 144 above the antiferromagnetic film is completely removed and the longitudinal bias layers are formed directly on the antiferromagnetic film. The reason is because, as will be mentioned hereunder, the magnetization direction of the pinned magnetic layer 144 must be perpendicular to that of the longitudinal bias layers 15. If so, the magnetization of the longitudinal bias layers 15 will be unstable owing to the magnetic interaction between the pinned magnetic layer 144 and the overlying longitudinal bias layers 15. Alternatively, the etching removal may reach the high-conductivity layer 147 but not the free layer, and the longitudinal bias layers may be formed on the remaining free layer.

For improving the crystallinity of the layers, or for attenuating the magnetic coupling force between the antiferromagnetic layer 143 and the longitudinal bias layers 15, an extremely thin underlayer 153 (this may be the same as the underlayer 142) may be disposed below the ferromagnetic layer 151. Even though thin, a nonmagnetic layer existing between ferromagnetic layers will readily make the ferromagnetic layers coupled magnetically to each other. As opposed to this, in the combination of an antiferromagnetic layer and a ferromagnetic layer, a nonmagnetic layer existing therebetween, even though thin, cancels the magnetic coupling of the antiferromagnetic layer and the ferromagnetic layer. In order to effectively apply the bias magnetic field from the longitudinal bias layers to the free layer, the thickness of the underlayer 153 is preferably at most 10 nanometers. For the hard magnetic film, it is also desirable that the saturation magnetization of the hard magnetic film is comparable to that of the free layer. However, in general, it is difficult to prepare hard magnetic films with high saturation magnetization of which the saturation magnetization is comparable to that of free layers of CoFe or the like with high saturation magnetization.

Therefore, it is desirable that a underlayer of FeCo or the like with high saturation magnetization, of which the saturation magnetization is comparable to that of CoFe, is formed below the hard magnetic film to thereby keep good balance of saturation magnetization between the hard magnetic film and the free layer, for the purpose of removing BHN in a weak longitudinal bias magnetic field. The antiferromagnetic materials for the antiferromagnetic film 152 may be the same as those for the spin valve film.

However, the magnetic coupling bias direction of the antiferromagnetic layer of the spin valve film must be perpendicular to that of the antiferromagnetic film 152 of the longitudinal bias layer. (The magnetic coupling bias direction of the antiferromagnetic layer of the spin valve film is in the device width (height) direction, while that of the antiferromagnetic film 152 of the longitudinal bias layer is in the track width direction.) For example, the two antiferromagnetic films are made to have different blocking temperatures Tb. First, the magnetic coupling bias direction of one antiferromagnetic film having a higher Tb is pinned through thermal treatment, and thereafter Tb of the other antiferromagnetic film is defined to be around a temperature at which the magnetization direction of the ferromagnetic film (this is pinned by the magnetic coupling bias of the antiferromagnetic film whose Tb has been previously defined) is stable and which is lower than the temperature for the previous thermal treatment, whereby the magnetic coupling bias directions of the two antiferromagnetic films could be perpendicular to each other. For the magnetic coupling bias application to the antiferromagnetic layer 152, preferably used is a film-forming method in a magnetic field (in which is used IrMn, RhMn or the like), or a resist-curing thermal treatment method at 200 to 250° C. such as that for forming a recording region (in which is used PtMn, PdPtMn, IrMn or the like). For the antiferromagnetic layer of the spin valve film, an antiferromagnetic film having a higher Tb (e.g., IrMn, PtMn, PdPtMn, etc.) may be used. In that case, the magnetic coupling bias direction of the antiferromagnetic film 152 could be pinned in the track width direction according to the resist-curing thermal treatment method, without disturbing the magnetization direction of the pinned magnetic layer of the spin valve film.

For conventional spin valve films having a single-layered, pinned magnetic layer, the direction of the magnetic coupling bias field for pinning the magnetic layer is disordered if the temperature for the thermal treatment for magnetic coupling bias application to the antiferromagnetic film 152 is not lowered to a significant degree. In this respect, conventional spin valve films are poorly practicable. However, based on the properties of the Synthetic AF structure of which the thermal stability for pinning magnetization is greatly stabilized at temperatures not higher than the blocking temperature of the pinned magnetic layer in the structure, the magnetization direction of the longitudinal bias layer could be readily perpendicular to that of the pinned magnetic layer even when the difference in the blocking temperature between the two antiferromagnetic films is only tens ° C. or so. Where the antiferromagnetic layer 152 is of a ordered antiferromagnetic film of PtMn or PdPtMn, it is desirable that the film could be ordered at resist-curing temperatures (200 to 250° C.).

It is desirable that the spacing LD between the electrodes 16 is narrower than the spacing HMD between the longitudinal bias layers for lowering the reproduction device resistance and for realizing heads resistant to ESD. LD generally defines the reproduction track, and it may be on a level of submicrons of from 0.1 to 0.7 $\mu$m for high-density recording (at least 10 Gbpsi) to which the invention is directed. On the other hand, HMD may be larger than LD by approximately from 0.3 to 1 $\mu$m so as to realize steep sensitivity profiles in the track width direction with few influences of the hard film magnetic field thereon even though the track width is narrow, thereby enabling high-sensitivity reproduction. In the condition of HD (device width)>LD and also HMD>HD, the spin valve device resistance between the electrodes can be reduced and, in addition, since the free layer in the spin valve film could have a rectangular profile of which the side in the track width direction is longer, the Barkhausen noise control is easy. Concretely, it is desirable that the device width HD is around 0.4 $\mu$m in view of the ESD resistance of the device. For the narrow track width for which the electrode spacing is at most 0.4 $\mu$m, it is desirable that the hard film spacing HMD is enlarged up to about 0.8 $\mu$m.

In the case of FIG. 50 where the distance between the center of the free layer in its thickness direction and the surface of the upper shield is represented by gf and the distance between that center and the surface of the lower shield is by gp, preferred is gf<gp for attenuating the current magnetic field Hcu to be applied to the free layer. This is because, since the free layer is nearer to the lower shield than to the upper shield, it is more influenced by the magnetic field from the lower shield than from the upper shield, and, in addition, since the center through which sense current passes is shifted to the side of the nonmagnetic spacer 145, the free layer receives the magnetic field from the lower shield (this is generated by the lower shield as magnetized by sense current) in the direction opposite to the sense current magnetic field direction (see FIG. 50). With the sense current magnetic field being attenuated, a larger sense current may be applied to the device, whereby higher reproduction output and better BP are obtained, or that is, the asymmetry in the vertical direction of the reproduction wave form is reduced. Concretely, gp may fall between 35 and 80 nanometers and gf may fall between 25 and 50 nanometers with gf<gp. In that condition, the gap insulation could be kept, and the total reproduction gap length may fall between 60 ad 130 nanometers to realize an extremely narrow gap.

FIG. 52 is a conceptual view of one embodiment of a head which is suitable to the top-type spin valve film of FIG. 1 and FIG. 5. The case of FIG. 52 differs from that of FIG. 50 in that, in the former, the longitudinal bias layers 15 are formed on the lower gap film 12 after the spin valve film has been completely etched away. In the case of FIG. 52, it is desirable that the distance, gf, between the center of the free layer in its thickness and the surface of the lower shield is smaller than the distance, gp, between that center and the surface of the upper shield. This is because, since the free layer is nearer to the lower shield than to the upper shield, it is more influenced by the magnetic field from the lower shield than from the upper shield, and, in addition, since the center through which sense current passes is shifted to the side of the nonmagnetic spacer 145, the free layer receives the magnetic field from the lower shield (this is generated by the lower shield as magnetized by sense current) in the direction opposite to the sense current magnetic field direction. With the sense current magnetic field being attenuated, a larger sense current maybe applied to the device, whereby higher reproduction output and better BP are obtained, or that is, the asymmetry in the vertical direction of the reproduction wave form is reduced. Concretely, gp may fall between 35 and 80 nanometers and gf may fall between 25 and 50 nanometers with gf<gp. In that condition, the gap insulation could be kept, and the total reproduction gap length may fall between 60 ad 130 nanometers to realize an extremely narrow gap.

The film constitution of the magnetoresistance effect device of the invention can be identified in various analyzing methods.

Figure 53:
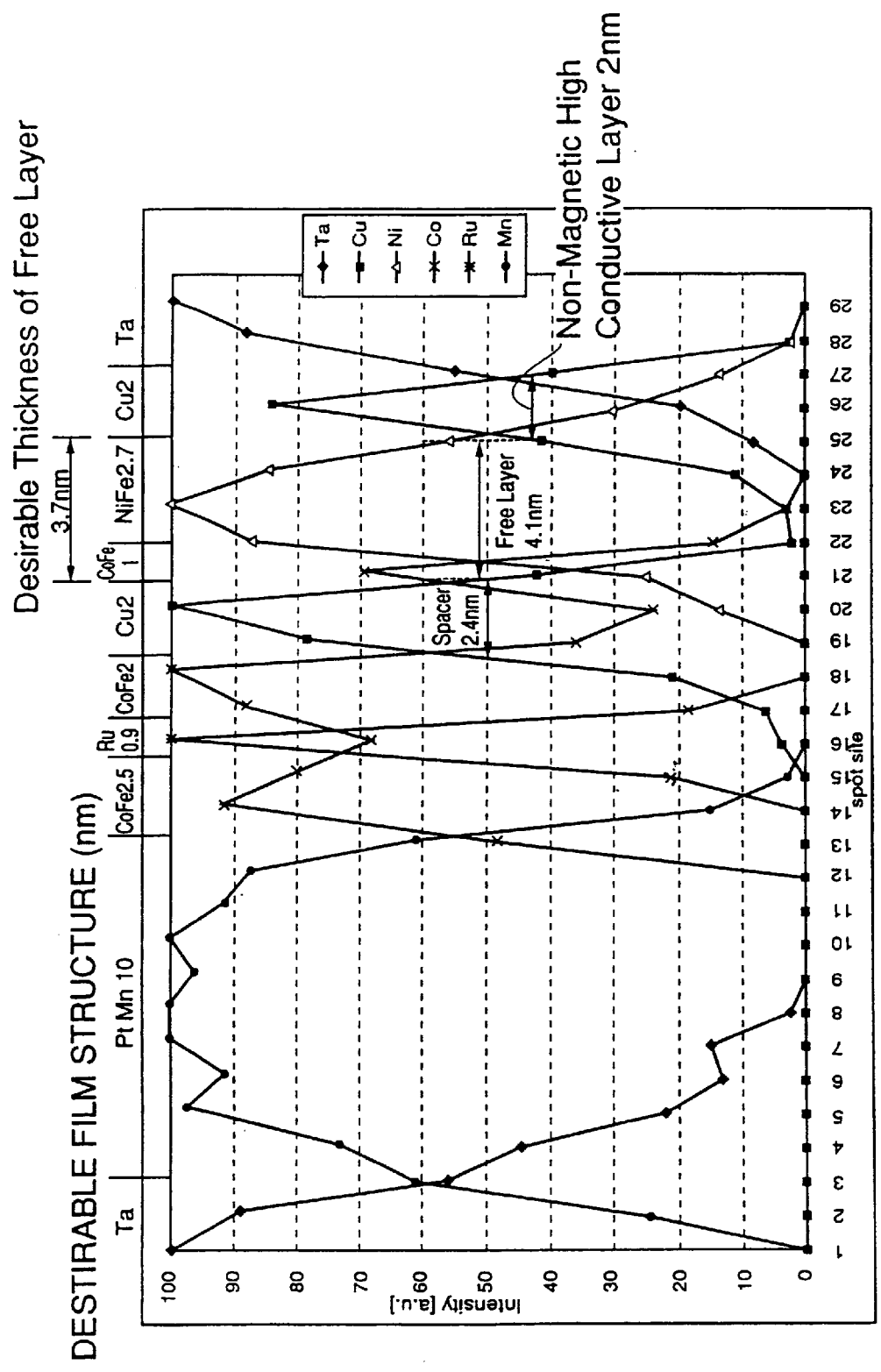
FIG. 53 is a graph of the data of nano-EDX analysis of the cross section of a magnetic head which incorporates the magnetoresistance effect device of the invention.

FIG. 53 is a graph of the data of nano-EDX analysis of the cross section of a magnetic head which incorporates the magnetoresistance effect device of the invention. For example, samples for cross section TEM (transmission electron microscopy) are prepared, and subjected to nano-EDX with a beam of about 1 nanometer in diameter being applied to the cross section of each sample, whereby the materials constituting the magnetoresistance effect device and the film thicknesses can be identified. Considering the measurement limit and the influence of interfacial diffusion in thermal treatment, the film constitution could be almost reproduced. In particular, as will be understood from FIG. 53, the interface between the free layer and the spacer Cu and the interface between the free layer and the nonmagnetic high-conductivity layer of Cu are relatively sharp, and the film thicknesses are easy to identify.

Regarding the definition of the film thickness, the half-value width of the peak for the material of the main element constituting the film of which the thickness is intended to be determined is defined as the thickness of the film. For example, the spacer Cu and the nonmagnetic high-conductivity layer (underlayer) of Cu give a sharp peak, their thicknesses are easy to determine. Based on these, therefore, the thickness of the free layer is defined as the region sandwiched between the upper and lower Cu layers. In the example of FIG. 53, the thickness of the spacer Cu is determined to be 2.4 nanometers, and that of the nonmagnetic high-conductivity layer to be 2 nanometers. The total thickness of the free layer as sandwiched between the two Cu layers could be 4.1 nanometers. The thus-calculated thickness of the free layer is to nearly reproduce the intended free layer thickness of 3.7 nanometers. Through the analyses noted above, the film constitution of the spin valve film of the invention could be identified, and the thicknesses of the spacer layer, the nonmagnetic high-conductivity layer and the free layer (even though it is extremely thin) could be measured relatively accurately.

The invention can be carried out in the manner of the embodiments mentioned hereinabove, and has the following advantages.

According to the first embodiment of the invention, provided is a spin valve film with good bias point control, high MR and high ΔRs, which, however, could not be realized by merely thinning the free layer in conventional spin valve films. The margin for process latitude in producing the spin valve film of the invention is broad. Thus, the spin valve film of the invention is favorable to the coming new-generation devices in the art.

According to the second to sixth embodiments of the invention, provided are a magnetoresistance effect device (MR device), especially a giant magnetoresistance effect device (GMR device), in which the pinned magnetic layer is kept stable even at high temperatures of around 200° C., and also a magnetic head incorporating the device. With coming hard disc drives being directed higher density recording, the temperature of the magnetic head in operating disc drives will be often high. The magnetic head of the invention is operable at such high temperatures. In addition, even when electrostatic discharge current flows into the MR or GMR device of the magnetic head, the pinned magnetization of the pinned magnetic layer in the device is not disturbed by it and is kept stable. In addition, since the shunt of sense current is small in the device, high resistance change is kept in the device to ensure good reproduction sensitivity. Therefore, with the magnetic head of the invention, much higher density recording is possible, and much higher reproduction output can be attained.

According to the seventh embodiment of the invention, the degradation of MR ratio in the spin valve films in thermal treatment such as annealing can be prevented, and, in addition, MR ratio in the device can be improved through improved specular reflection in the layers constituting the spin valve film in the device. Even when the free layer in the spin valve film in the device is thin, the interlayer between the MR-improving layer and the free layer is kept stable. Therefore, after thermal treatment, the electron transmission through the interface is kept high, and the spin valve film can maintain high MR ratio. Moreover, the magnetostriction in the free layer of, for example, a Co-based magnetic material can be reduced by the MR-improving layer, and the microcrystalline structure of the free layer can be well controlled. With these advantages, the MR device of the invention is characterized by its high output power, few noise troubles and high thermal stability.

As has been described in detail hereinabove, the invention realizes high-performance and high-reliability MR devices, and its industrial advantages are great.

While the invention has been described in detail and with reference to specific embodiments thereof, it will be apparent to one skilled in the art that various changes and modification can be made therein without departing from the spirit and scope thereof.

What is claimed is:

1. A magnetoresistance effect element, comprising:

a nonmagnetic spacer layer;

first and second ferromagnetic layers separated by the nonmagnetic spacer layer, the first ferromagnetic layer having a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned and remain antiparallel with one another in the presence of a magnetic field signal, the magnetization of the first ferromagnetic layer being freely rotatable in response to the magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the nonmagnetic high-conductivity layer and the second ferromagnetic layer have a film thickness so that wave asymmetry, $(V1-V2)/(V1+V2)$, is in the range of negative 0.1 and positive 0.1, in which V1 is the peak value of reproduction output in a positive magnetic field signal and V2 is the peak value of reproduction output in a negative magnetic field signal.

2. The magnetoresistance effect element of claim 1, wherein the first ferromagnetic layer has a film thickness between 0.5 nanometers and 4.5 nanometers.

3. A magnetoresistance effect element, comprising:

a nonmagnetic spacer layer;

first and second ferromagnetic layers separated by the nonmagnetic spacer layer, the first ferromagnetic layer having a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned and remain antiparallel with one another in the presence of a magnetic field signal, the magnetization of the first ferromagnetic layer being freely rotatable in response to the magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the first ferromagnetic layer responses to a magnetic field Hin of interlayer coupling between the first and second ferromagnetic layers, a stray magnetic field Hpin of second ferromagnetic layer, and a current magnetic field Hcu of electric current applied to the first ferromagnetic layer, and a sum of Hpin, Hin, and Hcu is substantially zero in center of film thickness of the first ferromagnetic layer.

4. A magnetoresistance effect element, comprising:

a nonmagnetic spacer layer;

first and second ferromagnetic layers separated by the nonmagnetic spacer layer, the first ferromagnetic layer having a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned and remain antiparallel with one another in the presence of a magnetic field signal, the magnetization of the first ferromagnetic layer being freely rotatable in response to the magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the second ferromagnetic film is disposed adjacent to the nonmagnetic spacer layer via the first ferromagnetic film, the nonmagnetic high-conductivity layer has a film thickness t (HCL) in terms of copper (Cu) layer of specific resistance 10 microohm centimeter, the first and second ferromagnetic films have a magnetic film thickness tm (pin1) and tm(pin2), respectively, in terms of saturation magnetization of 1 Tesla, and t(HCL), tm (pin1) and tm(pin2) satisfy conditions of 0.5 nanometers<tm(pin1)−tm) (pin2)+t(HCL)<4 nanometers and t(HCL)>0.5 nanometers.

5. A magnetoresistance effect element, comprising:

a nonmagnetic spacer layer;

first and second ferromagnetic layers separated by the nonmagnetic spacer layer, the first ferromagnetic layer having a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned and remain antiparallel with one another in the presence of a magnetic field signal, the magnetization of the first ferromagnetic layer being freely rotatable in response to the magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the nonmagnetic high-conductivity layer is formed of a material having a bulk resistivity at room temperature not larger than 10 microohm centimeter.

6. A magnetoresistance effect element, comprising:

a nonmagnetic spacer layer;

first and second ferromagnetic layers separated by the nonmagnetic spacer layer, the first ferromagnetic layer having a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned and remain antiparallel with one another in the presence of a magnetic field signal, the magnetization of the first ferromagnetic layer being freely rotatable in response to the magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the nonmagnetic high-conductivity layer is formed of a material having a resistivity so that a substantially large number of majority carriers having a spin parallel to the magnetization direction of the first ferromagnetic layer exist in the nonmagnetic high-conductivity layer.

7. The magnetoresistance effect element of claim 1, wherein the nonmagnetic high-conductivity layer contains a metal element selected from the group consisting of copper (Cu) , gold (Au), silver (Ag), ruthenium (Ru), iridium (Ir), rhenium (Re), rhodium(Rh), platinum (Pt), palladium (Pd), aluminium (Al), osmium (Os), and nickel (Ni).

8. The magnetoresistance effect element of claim 1, wherein the first ferromagnetic layer includes a laminate film, and the laminate film comprises a layer containing nickel iron (NiFe) alloy and a layer containing cobalt (Co).

9. The magnetoresistance effect element of claim 1, wherein the first ferromagnetic layer contains cobalt iron (CoFe) alloy.

10. The magnetoresistance effect element of claim 1, wherein the nonmagnetic spacer layer contains copper (Cu) and the nonmagnetic spacer layer has a film thickness between 1.5 nanometers and 2.5 nanometers.

11. A magnetoresistance effect element, comprising:

a nonmagnetic spacer layer;

first and second ferromagnetic layers separated by the nonmagnetic spacer layer, the first ferromagnetic layer having a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned and remain antiparallel with one another in the presence of a magnetic field signal, the magnetization of the first ferromagnetic layer being freely rotatable in response to the magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein one of the first and second ferromagnetic films disposed adjacent to the nonmagnetic spacer layer has a film thickness equal to or thicker than another one of the first and second ferromagnetic films, and a difference in magnetic thickness between the first and second ferromagnetic films falls between 0 nanometers Tesla and 3 nanometers Tesla.

12. A magnetoresistance effect element, comprising:

a nonmagnetic spacer layer, first and second ferromagnetic layers separated by the nonmagnetic spacer layer, the first ferromagnetic layer having a magnetization direction at an angle relative to a magnetization direction of the second ferromagnetic layer at zero applied magnetic field, the magnetization of the first ferromagnetic layer freely rotating in response to a magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the nonmagnetic high-conductivity layer and the second ferromagnetic layer have a respective film thickness so that wave asymmetry, $(V1-V2)/(V1+V2)$, is in the range of negative 0.1 and positive 0.1, in which V1 is the peak value of reproduction output in a positive magnetic field signal and V2 is the peak value of reproduction output in a negative magnetic field signal.

13. The magnetoresistance effect element of claim 12, wherein the first ferromagnetic layer has a film thickness between 0.5 nanometers and 4.5 nanometers.

14. The magnetoresistance effect element of claim 12, wherein the nonmagnetic high-conductivity layer has a film thickness t (HCL) in terms of copper (Cu) layer of specific resistance 10 microohm centimeter, the second ferromagnetic layer has a magnetic film thickness tm (pin1) in terms of saturation magnetization of 1 T and the t (HCL) and tm (pin1) satisfy conditions of 0.5 nanometers$\leq$tm (pin1)+t (HCL)$\leq$4 nanometers and t (HCL)$\geq$0.5 nanometers.

15. The magnetoresistance effect element of claim 12, wherein the second ferromagnetic film is disposed adjacent to the nonmagnetic spacer layer via the first ferromagnetic film, the second ferromagnetic layer comprises first and second ferromagnetic films antiferromagnetically coupled to one another and an antiferromagnetically coupling film located between and in contact with the first and second ferromagnetic films for coupling the first and second ferromagnetic films together antiferromagnetically, the nonmagnetic high-conductivity layer has a film thickness t (HCL) in terms of copper (Cu) layer of specific resistance 10 microohm centimeter, the first and the second ferromagnetic films have a magnetic film thickness tm(pin1) and tm(pin2), respectively, in terms of saturation magnetization of 1 Tesla and, t (HCL), tm (pin1), and tm (pin2) satisfy conditions of 0.5 nanometers$\leq$tm (pin1)−tm (pin2)+t (HCL)$\leq$4 nanometers and t (HCL)$\geq$0.5 nanometers.

16. A magnetoresistance effect element, comprising:

a nonmagnetic spacer layer, first and second ferromagnetic layers separated by the nonmagnetic spacer layer, the first ferromagnetic layer has a magnetization direction of the first ferromagnetic layer at an angle relative to a magnetization direction of the second ferromagnetic layer at zero applied magnetic field, the magnetization of the first ferromagnetic layer freely rotating in a magnetic field signal; and a nonmagnetic high-conductivity layer disposed in contact with the first ferromagnetic layer so that the first ferromagnetic layer is disposed between the nonmagnetic spacer layer and the nonmagnetic high-conductivity layer, wherein the nonmagnetic high-conductivity layer has a film thickness t (HCL) in terms of Cu layer of specific resistance 10 microohm centimeter, the pair of ferromagnetic films have a magnetic film thickness tm (pin1) in terms of saturation magnetization of 1 Tesla and t (HCL) and tm (pin1) satisfy conditions of 0.5 nanometers$\leq$tm (pin1)+t (HCL)$\leq$4 nanometers and t(HCL)$\geq$0.5 nanometers.

17. The magnetoresistance effect element of claim 16, wherein the nonmagnetic high-conductivity layer contains a metal element selected from the group consisting of copper (Cu), gold (Au), silver (Ag), ruthenium (Ru), iridium (Ir), rhenium (Re), rhodium (Rh), platinum (Pt), palladium (Pd), aluminium (Al), osmium (Os), and nickel (Ni).

18. A magnetoresistance effect element, comprising:

a nonmagnetic spacer layer, first and second ferromagnetic layers separated by the nonmagnetic spacer layer, the first ferromagnetic layer has a magnetization direction at an angle relative to a magnetization direction of the second ferromagnetic layer at zero applied magnetic field, the second ferromagnetic layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned antiparallel with one another and remain antiparallel in the presence of an applied magnetic field, the magnetization of the first ferromagnetic layer freely rotating in signal magnetic field; and an antiferromagnetic layer disposed in contact and exchange coupled with one of the ferromagnetic films, a closed packed plane of the antiferromagnetic layer being oriented so that a half-value width of the diffraction peak from the close-packed plane of the antiferromagnetic layer in its rocking curve is 8 or less.

19. The magnetoresistance effect element of claim 5, wherein the first ferromagnetic layer has a film thickness between 0.5 nanometers and 4.5 nanometers.

20. The magnetoresistance effect element of claim 5, wherein the nonmagnetic high-conductivity layer contains a metal element selected from the group consisting of copper (Cu), gold (Au), silver (Ag), ruthenium (Ru), iridium (Ir), rhenium (Re), rhodium(Rh), platinum (Pt), palladium (Pd), aluminium (Al), osmium (Os), and nickel (Ni).

21. The magnetoresistance effect element of claim 5, wherein the first ferromagnetic layer includes a laminate film, and the laminate film comprises a layer containing nickel iron (NiFe) alloy and a layer containing cobalt (Co).

22. The magnetoresistance effect element of claim 5, wherein the first ferromagnetic layer contains cobalt iron (CoFe) alloy.

23. The magnetoresistance effect element of claim 5, wherein the nonmagnetic spacer layer contains copper (Cu) and the nonmagnetic spacer layer has a film thickness between 1.5 nanometers and 2.5 nanometers.

24. The magnetoresistance effect element of claim 11, wherein the first ferromagnetic layer has a film thickness between 0.5 nanometers and 4.5 nanometers.

25. The magnetoresistance effect element of claim 11, wherein the nonmagnetic high-conductivity layer contains a metal element selected from the group consisting of copper (Cu), gold (Au), silver (Ag), ruthenium (Ru), iridium (Ir), rhenium (Re), rhodium(Rh), platinum (Pt), palladium (Pd), aluminium (Al), osmium (Os), and nickel (Ni).

26. The magnetoresistance effect element of claim 11, wherein the first ferromagnetic layer includes a laminate film, and the laminate film comprises a layer containing nickel iron (NiFe) alloy and a layer containing cobalt (Co).

27. The magnetoresistance effect element of claim 11, wherein the first ferromagnetic layer contains cobalt iron (CoFe) alloy.

28. The magnetoresistance effect element of claim 11, wherein the nonmagnetic spacer layer contains copper (Cu) and the nonmagnetic spacer layer has a film thickness between 1.5 nanometers and 2.5 nanometers.

29. The magnetoresistance effect element of claim 18, wherein the total thickness of the first and second ferromagnetic layers and the magnetic spacer layer is 14 nm or below.

30. The magnetoresistance effect element of claim 18, wherein the first ferromagnetic layer is between 2 nm and 5 nm in thickness.

31. The magnetoresistance effect element of claim 18, further comprising:

a magnetic gap layer; and a layer disposed between the magnetic gap layer and one of the first ferromagnetic layer and the antiferromagnetic layer, the layer made of a material selected from a group consisting of NiFe, NiCu, NiFeCr, and NiFeTa.

32. The magnetoresistance effect element of claim 18, wherein the antiferromagnetic layer contains PtMn or PtPdMn.

33. The magnetoresistance effect element of claim 18, wherein the antiferromagnetic layer contains IrMn, PhMn or RhRuMn.

34. The magnetoresistance effect element of claim 18, wherein the antiferromagnetically coupling film contains Ru, and has a thickness of 0.8–1.21 nm.

35. The magnetoresistance effect element of claim 18, further comprising a longitudinal bias layer that includes an antiferromagnetic film.

* * * * *